(12) United States Patent
Terasawa et al.

(10) Patent No.: US 6,867,922 B1
(45) Date of Patent: Mar. 15, 2005

(54) PROJECTION OPTICAL SYSTEM AND PROJECTION EXPOSURE APPARATUS USING THE SAME

(75) Inventors: Chiaki Terasawa, Utsunomiya (JP); Hiroyuki Ishii, Utsunomiya (JP); Takashi Kato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 82 days.

(21) Appl. No.: 09/593,584

(22) Filed: Jun. 12, 2000

(30) Foreign Application Priority Data

Jun. 14, 1999 (JP) .......................................... 11-167421
Jun. 14, 1999 (JP) .......................................... 11-167422
Jun. 14, 1999 (JP) .......................................... 11-167426
Jun. 14, 1999 (JP) .......................................... 11-167427

(51) Int. Cl.$^7$ .............................................. G02B 9/00
(52) U.S. Cl. ..................................... 359/649; 359/754
(58) Field of Search ................................ 359/649, 650, 359/651, 754, 755, 756

(56) References Cited

U.S. PATENT DOCUMENTS

| | | | |
|---|---|---|---|
| 4,948,238 A | 8/1990 | Araki .......................... | 350/469 |
| 5,345,292 A | 9/1994 | Shiozawa et al. .............. | 355/67 |
| 5,555,479 A | 9/1996 | Nakagiri ...................... | 359/355 |
| 5,642,229 A | 6/1997 | Kaneko et al. ............... | 359/649 |
| 5,805,344 A | 9/1998 | Sasaya et al. ................. | 359/649 |
| 5,831,770 A | 11/1998 | Matsuzawa et al. ......... | 359/649 |
| 5,956,182 A | 9/1999 | Takahashi .................... | 359/649 |
| 5,990,926 A | 11/1999 | Mercado ...................... | 347/258 |
| 6,008,884 A | 12/1999 | Yamaguchi et al. ...... | 355/53.54 |
| 6,014,267 A | 1/2000 | Tsurutani et al. ............ | 359/689 |
| 6,104,472 A | 8/2000 | Suzuki .......................... | 355/53 |
| 6,377,338 B1 | 4/2002 | Suenaga ....................... | 355/67 |
| 6,636,410 B2 | 10/2003 | Ide et al. ...................... | 361/152 |
| 2002/0036832 A1 | 3/2002 | Schultz et al. ............... | 359/649 |

FOREIGN PATENT DOCUMENTS

| | | |
|---|---|---|
| DE | 196 53 983 A1 | 6/1998 |
| DE | 198 18 444 A1 | 10/1998 |
| EP | 0 828 172 | 3/1998 |
| EP | 0 851 304 A2 | 7/1998 |
| EP | 1 006 373 | 10/1999 |
| JP | 63-311223 | 12/1988 |
| JP | 1-315709 | 12/1989 |

(List continued on next page.)

OTHER PUBLICATIONS

Robert A. Jones, "Computer–controlled polishing of telescope mirror segments", *Optical Engineering*, 22(2), Mar./Apr. 1983, pp. 236–240.

European Search Report dated Jan. 12, 2004, issued in corresponding European patent appln. No. 00 30 5028, forwarded in a Communication dated Jan. 19, 2004.

Korean Office Action dated Mar. 13, 2004, issued in a corresponding Korean patent application, No. 10–2000–32810, with a filing date of Jun. 14, 2000.

*Primary Examiner*—Scott J. Sugarman
(74) *Attorney, Agent, or Firm*—Fitzpatrick, Cella, Harper & Scinto

(57) ABSTRACT

A projection optical system includes a plurality of positive lens groups having a positive refractive power, and at least one negative lens group having a negative refractive power, wherein, when L is a conjugate distance of the projection optical system and $\phi_0$ is the sum of powers of the or each negative lens group, a relation $|L \times \phi_0| > 17$ is satisfied, wherein, when h is a height of an axial marginal light ray and $h_b$ is a height of a most abaxial chief ray, at least two aspherical surfaces are formed on surfaces which satisfy a relation $|h_b/h| > 0.35$, wherein, when $\Delta ASPH$ is an aspherical amount of each aspherical surface, a relation $|\Delta ASPH/L| > 1.0 \times 10^{-6}$ is satisfied, and wherein the at least two aspherical surfaces include regions in which, from a central portion toward a peripheral portion of the surface, their local curvature powers change with mutually opposite signs.

18 Claims, 88 Drawing Sheets

FOREIGN PATENT DOCUMENTS

| | | |
|---|---|---|
| JP | 2-220015 | 9/1990 |
| JP | 5-34593 | 2/1993 |
| JP | 7-48089 | 5/1995 |
| JP | 7-128590 | 5/1995 |
| JP | 7-128592 | 5/1995 |
| JP | 8-179204 | 7/1996 |
| JP | 9-105861 | 4/1997 |
| JP | 10-48517 | 2/1998 |
| JP | 10-79345 | 3/1998 |
| JP | 10-154657 | 6/1998 |
| JP | 10-197791 | 7/1998 |
| JP | 10-325922 | 12/1998 |
| JP | 10-333030 | 12/1998 |
| JP | 11-6957 | 1/1999 |
| JP | 11-95095 | 4/1999 |
| JP | 11-97347 | 4/1999 |
| JP | 11-119091 | 4/1999 |
| JP | 2000-121934 | 4/2000 |
| JP | 2000-133588 | 6/2000 |
| JP | 2000-231058 | 8/2000 |
| JP | 2000-235146 | 8/2000 |
| JP | 2000-249917 | 9/2000 |

PROJECTION OPTICAL SYSTEM AND PROJECTION EXPOSURE APPARATUS USING THE SAME

FIELD OF THE INVENTION AND RELATED ART

This invention relates to a projection optical system and a projection exposure apparatus using the same. More particularly, the invention is suitably applicable to a projection exposure process for printing a reticle pattern on a photosensitive substrate in accordance with a step-and-repeat method or a step-and-scan method, for the manufacture of large-integration microdevices or semiconductor devices of submicron or quarter-micron order, such as ICs, LSIs, CCDs, or liquid crystal panels, for example.

Generally, in a projection exposure apparatus, a reticle having an electronic circuit pattern formed thereon is illuminated with light (exposure light) from an illumination system (illumination optical system) and the pattern is projected onto a wafer through a projection optical system.

With an increasing density of a semiconductor device, strict requirements have been applied to the performance or specifications of a projection optical system. Generally, for a higher resolution, attempts have been made in relation to shortening the wavelength of the exposure light, better correction of aberrations of a projection optical system, or enlargement of the numerical aperture (NA) of a projection optical system.

As regards the exposure light, light if an i-line lamp or a laser light of an excimer laser such as a KrF or an ArF, for example, is used. Further, use of light from an $F_2$ excimer laser has been proposed.

As regards enlargement of the numerical aperture (NA) of a projection optical system, he NA is being increased from 0.6 to 0.65, and then to 0.7.

As regards aberration correction, many attempts have been made so that a dual-telecentric system (being telecentric on object and image sides) is defined to reduce image distortion resulting from a warp of a reticle or a wafer and, on the other hand, distortion attributable to the projection optical system is reduced as much as possible. Also, the image plane width (field curvature amount) of best image points at each of a plurality of image heights is minimized, while the contrast gain at each of the image heights is made uniform as much as possible.

On the other hand, semiconductor device manufacturing processes use many reticle patterns or linewidths and, in accordance with them, the illumination condition is changed variously to obtain a best pattern image. In order to minimize differences in distortion or image plane flatness, for example, under different illumination conditions, coma aberrations at each of the image heights are reduced to attain registration of the image plane.

Further, while the throughput of a projection exposure apparatus is an important factor, the chip size has been enlarged to increase the throughput. The exposure region of the projection optical system is enlarged to meet this.

As regards a projection optical system for use in a projection exposure apparatus, Japanese Laid-Open Patent Applications, Laid-Open No. 105861/1997, No. 48517/1998, and No. 79345/1998 have proposed projection optical systems wherein all lens systems are defined by spherical surfaces.

Japanese Published Patent Application Publication No. 48089/1995 and Japanese Laid-Open Patent Applications, Laid-Open No. 128592/1995, No. 179204/1996, No. 34593/1993, No. 197791/1998, No. 154657/1998, No. 325922/1998, No. 333030/1998, and No. 6957/1999, have proposed projection optical systems wherein an aspherical surface is used for aberration correction.

In projection optical systems, in order that the shortening of the exposure wavelength and enlargement of the numerical aperture as well as a relatively large exposure region are satisfied while a good optical performance with less change in performance over various illumination modes is held, it is necessary to appropriately set the refractive powers of lens groups (lens units) as well as the lens structures of them.

Generally, in order to obtain a good optical performance with less performance change, the refractive power of each lens group (unit) should be made smaller to reduce the aberration amount to be produced in each lens group or, alternatively, the number of lenses to be used in each lens group should be enlarged to expand the degree of freedom in regard to aberration correction.

Therefore, if use of a shortened exposure wavelength and an enlarged numerical aperture (NA) as well as a wide exposure area are all desired, it necessarily results in enlargement of the lens conjugate distance (object-to-image distance) or an increase in the lens diameter or in the number of lenses, which causes inconveniences such as bulkiness in weight or thickness of the whole lens system.

Then, on that occasion, there arises a problem of deterioration of the imaging performance due to lens deformation of the imaging performance due to lens deformation attributable to an environmental change or a lens assembling precision. With enlargement of the lens diameter, deformation of a lens due to the weight thereof becomes large. Additionally, if a desired performance is to be accomplished within a certain conjugate distance, a larger number of lenses has to be used. Therefore, the thickness of each lens has to be reduced, and the lens deformation due to the weight thereof grows more. With a large lens deformation, the curvature radius of each surface of a lens is deviated from a design value, which causes degradation of the imaging performance. Further, while lenses are held by a metal holding element, in a strict sense and due to a machining precision, it is difficult for such a metal holding element to hold the lenses uniformly. Therefore, if the lens deformation due to the weight thereof becomes large and the lens deforms asymmetrically with respect to an optical axis, an asymmetric aberration is produced thereby. This is a large factor for deterioration of the imaging performance.

Further, with regard to the design performance, there are problems in relation to changes in the best imaging position depending on the linewidth (pattern linewidth), changes in the image point position or contrast depending on the image height, changes in distortion between different illumination conditions, and changes in image plane flatness, for example.

A change in the best imaging position depending on the linewidth is attributable mainly to a remaining spherical aberration not corrected. A change in image point position or contrast depending on the image height is attributable to a change in sagittal and meridional image planes at each image height, or to a change in astigmatism and coma. A change in distortion or in image plane flatness between different illumination conditions results from a remaining distortion amount or an aberration amount in a region upon a pupil plane, passed by light rays, under different illumination conditions. The change in aberration such as described above becomes very noticeable if the shortening of exposure wavelength, the enlargement of numerical aperture and a wide exposure area are pursued more.

There is another problem that, in the short wavelength region of a light source such as an excimer laser, a usable lens material is limited to silica (quartz) and fluorite. This is mainly because of a decreased transmission factor. In an optical system having many lenses and a large total glass thickness, the exposure amount upon a wafer becomes very small such that the throughput is lowered very much. Further, there may occur a shift of the focal point position or a change in aberration.

In order to meet enlargement in the integration of a semiconductor chip, further shortening of the wavelength of the exposure light as well as further enlargement of the numerical aperture of a projection optical system are desired. However, it is very difficult to accomplish a required optical performance while suppressing enlargement in weight and thickness of the whole lens system and production of lens deformation due to the weight thereof. Currently, design optimization is made such that the refractive power of each lens group is made smaller and the number of lenses to be used is made larger.

In the projection optical systems disclosed in Japanese Laid-Open Patent Applications, Laid-Open No. 105861/1997, No. 48517/1998, and No. 79345/1998, all lenses are formed with spherical surfaces. The number of lenses is 27 to 30. The numerical aperture (NA) is about 0.6.

With such a structure, however, if the NA is made larger, aberration correction becomes very difficult to accomplish as long as the same lens number is held. Alternatively, the total lens length has to be enlarged, and also the lens diameter has to be made larger. Even if the lens number is made much larger for correction of aberration, since there is substantially no space for additional lenses, the thickness of each lens must be made small or, alternatively, the total lens length has to be made quite large.

Anyway, the lens deformation due to the weight thereof becomes notable, and the whole lens system becomes bulky. Moreover, if a light source of a short wavelength region is used, the transmission factor decreases due to large absorption by the lens material. In an optical system having lenses of a large number such as disclosed in these documents, the exposure amount upon a wafer decreases much more and the throughput is lowered considerably. Further, the shift of the focal point position of the change in aberration becomes large.

The projection optical systems disclosed in Japanese Published Patent Application, Publication No. 48089/1995 and Japanese Laid-Open Patent Application, Laid-Open No. 128592/1995, have a small numerical aperture (NA). Also, the exposure area is narrow. Because the power of a negative lens group used is small, the optical system is disadvantageous with respect to correction of the Petzval sum. If enlargement of the NA or expansion of the exposure region is attempted in this optical system, particularly, the field curvature would be much worse. Further, since, in both cases, the projection optical system is not made telecentric on the object side, any curvature of a reticle would directly produce image distortion.

In the projection optical system disclosed in Japanese Laid-Open Patent Application, Laid-Open No. 179204/1996, an aspherical surface is formed on the surface closest to the wafer side. However, no particular discussion is made in relation to the aspherical surface. As for the imaging performance, correction of distortion, field curvature and astigmatism is insufficient. There remain large aberrations such as distortion of 26.7 nm and 11.7 nm as well as abaxial astigmatism of 1.262 micron and 0.896 micron.

The projection optical system disclosed in Japanese Laid-Open Patent Application, Laid-Open No. 34593/1993 uses an aspherical surface, and the lens system is provided by a smaller number of lenses to keep the lens transmission factor and for correction of aberrations. However, as regards the numerical aperture (NA) which largely contributes to the resolution, it may be as small as 0.45. Also, the lens system has a very small exposure area of 10×10 to 15×15. According to the disclosure, aspherical surfaces are introduced into a negative second group and a positive fourth group, mainly for correction of spherical aberration. The power of the negative second group is enlarged while, on the other hand, an aspherical surface is added to the second group for correction of spherical aberration based on the balance with other positive lens groups. Also, an aspherical surface is introduced into a fourth group having a large axial light flux diameter, for correction of spherical aberration.

However, in the projection optical system, the height of an axial marginal light ray of the second group is very low as compared with those of the third and fourth groups and, therefore, correcting the spherical aberration with the introduction of an aspherical surface is practically very difficult. The reason is that the third-order spherical aberration coefficient is proportional to the fourth power of the height "h" of an axial margin light ray.

Also, the height of an outermost abaxial chief ray of the second group is very low, and the light goes just along the optical axis. Therefore, although the aspherical surface itself may function to correct aberrations such as distortion, field curvature or astigmatism while keeping the telecentricity on the object side, the effect is small. The reason is that the third-order astigmatism coefficient or field curvature coefficient is proportional to the second power of the chief ray height, and the distortion coefficient is proportional to the third power of the chief ray height.

According to this example, even if it is attempted to meet a larger numerical aperture (about 0.65) or enlargement of the exposure region (ϕ is about 27.3 mm), since the power of the second group which bears most of the negative power is made very small, the Petzval sum cannot be corrected. As a result, field curvature and astigmatism become worse. Additionally, as the light flux on the object side becomes large with enlargement of the numerical aperture, since the positive first group and negative second group on the object side (which function mainly to correct the field curvature, distortion and telecentricity on the object side) are provided by only a single lens, respectively, the load for aberration correction to be borne by these lens groups becomes considerably heavy. Thus, it becomes very difficult to keep good imaging performance.

The projection optical system disclosed in Japanese Laid-Open Patent Application, Laid-Open No. 197791/1998, provides a relatively wide exposure area and a relatively high resolution with the use of a smaller number of lenses. While the exposure area is about ϕ25–ϕ29, the numerical aperture is 0.48–0.50. However, this is still insufficient.

The projection optical system disclosed in Japanese Laid-Open Patent Application, Laid-Open No. 154657/1998, uses an aspherical surface. However, as stated, this aspherical surface is not designed to correct aberrations to provide a projection optical system of particular specifications. Rather, it is designed to correct higher order aberrations resulting from an error in production or adjustment of the components of the projection optical system.

Since the optical design is made entirely on a spherical system, even if the manufacturing error can be corrected by the aspherical surface, a performance higher than the design performance of the spherical system is not be attainable thereby. In fact, the aspherical amount is very small. Therefore, it is very difficult to solve the above-described problem, in an attempt to meet a larger numerical aperture.

The projection optical system disclosed in Japanese Laid-Open Patent Application, Laid-Open No. 325922/1998, comprises five lens groups, wherein one of first and second lens groups is provided with one aspherical surface, and one of fourth and fifth lens groups is provided with one aspherical surface. It is intended that, with a smaller number of lenses, mainly distortion and spherical aberration are corrected.

In the embodiments disclosed therein, the numerical aperture is 0.6. Moreover, no aspherical surface is used for the fourth lens group. While field curvature and astigmatism may be corrected well, there remain higher order components of "under" spherical aberration. Also, the distortion aberration is as large as about 30 nm at the largest image height.

In this document, it is proposed to use an aspherical surface for a surface by which a large aberration correction effect is attainable. However, further details are not discussed any more. Therefore, aberrations may become worse if it is attempted to meet the numerical aperture enlargement.

If use of additional lenses is attempted to expand the degree of freedom for correction, although there is a small space at the image plane side and the spherical aberration may be corrected, in the region of the first to third groups at the object side, there are lenses disposed tightly. Thus, no lens can be added there. It is difficult to correct field curvature, astigmatism and distortion, for example. If the lens thickness is made small and an additional lens is inserted, then, the deformation will occur due to the weight of the lens.

The projection optical system disclosed in Japanese Laid-Open Patent Application, Laid-Open No. 333030/1998 uses aspherical surfaces and, according to the disclosure, it accomplishes an NA of 0.63–0.75 and an exposure area of $\phi\mathcal{C}27$–30 mm, with a smaller number of lenses of about fifteen (15). According to the disclosure, the lens system comprises positive two groups, wherein a first group at a wafer side is a microscope objective lens and a second group at a reticle side is a Gaussian type lens, by which sagittal comas produced in these lens groups are cancelled with each other. At least one aspherical surface is introduced into the wafer side group, and also an aspherical surface of the second group, for correction of spherical aberration.

However, the sagittal coma is not illustrated, and details of its correction are unclear. According to simulations made by the inventors of the subject application, changes in sagittal halo due to the image height or meridional coma aberration (transverse aberration) are large.

Further, while spherical aberration and astigmatism may be correct, as regards the distortion aberration, there remain large higher order components. The largest values in the first to fourth embodiments disclosed are 12 nm, 45 nm, 26 nm and 46 nm. As regards the telecentricity on the wafer side, in the first to fourth embodiments, changes in image height per a focal depth of 1 micron are 24 nm, 22 nm, 19 nm and 19 nm.

Furthermore, since the distance from the wafer to the lens is as short as 11–12 mm, there is a large possibility of mechanical interference with a mechanism such as an autofocusing unit.

The projection exposure apparatus disclosed in Japanese Laid-Open Patent Application, Laid-Open No. 6957/1999 provides a large NA (NA=0.75 to 0.80) by use of aspherical surfaces. According to the disclosure, at least one aspherical surface is formed in the fourth or fifth lens group, for correction of aberrations very influential to enlargement of the NA, that is, sagittal coma aberration and higher order spherical aberration.

In the embodiments disclosed therein, however, sagittal coma is not illustrated. The number of lenses is as large as 27 to 29. The optical conjugate distance is as long as 1200–1500 mm.

Therefore, if the light source has a wavelength in the short wavelength region as an ArF excimer laser, for example, the exposure amount upon a wafer would be considerably lowered due to large absorption by the lens material, and the throughput becomes very low. Further, the thermal absorption of the lens causes shift of the focal point position or a change in aberration. Moreover, because of the large NA and long lens conjugate distance, the lens diameter is large as $\phi$284–400 mm. Lens deformation due to the weight will be large. There is no space available, and thus suppressing the deformation by reducing the lens conjugate distance or increasing the number of lenses is difficult to do.

The lens number may be reduced by increasing the number of aspherical surfaces. However, in the first to fifth embodiments disclosed, while the number of aspherical surfaces used is increasing, the lens systems use twenty-nine (29) lenses. Even in the fifth embodiment wherein a largest number of aspherical surfaces of six is used, there remains a sagittal image plane at the outermost abaxial image height of $-0.484$ micron. Further, distortion aberration is 13.1 nm, and also there remains higher order spherical aberration.

In the sixth and seventh embodiments disclosed, the distortion aberration is 33 nm and 58 nm, respectively. In the eighth and ninth embodiments, while the performance cannot be confirmed due to insufficient data disclosure, the lens conjugate distance is as extraordinarily large as 1500 mm.

SUMMARY OF THE INVENTION

It is an object of the present invention to provide a projection optical system and/or a projection exposure apparatus using the same, by which a larger numerical aperture and a wider exposure area can be well accomplished.

In accordance with a first aspect of the present invention, there is provided a projection optical system, comprising: a plurality of positive lens groups (units) having a positive refractive power; and at least one negative lens group (unit) having a negative refractive power; wherein, when L is a conjugate distance of said projection optical system and $\phi_0$ is the sum of powers of the or each negative lens group, a relation $$|L \times \phi_0| > 17 \tag{1}$$

($\phi_0 = \Sigma \phi_{0i}$ where $\phi_{0i}$ is the power of the i-th negative group) is satisfied; wherein, when h is a height of an axial marginal light ray and $h_b$ is a height of a most abaxial chief ray, at least two aspherical surfaces are formed on surfaces which satisfy a relation $$|h_b/h| > 0.35 \tag{2}$$

wherein, when $\Delta$ASPH is an aspherical amount of each aspherical surface, a relation $$|\Delta \text{ASPH}/L| > 1.0 \times 10^{-6} \tag{3}$$

is satisfied; and wherein said at least two aspherical surfaces include regions in which, from a central portion toward a peripheral portion of the surface, their local curvature powers change with mutually opposite signs.

In a second aspect based on the first aspect, said at least two aspherical surfaces are formed on those surfaces up to one, in an order from the object side, which satisfies a relation $$|h_b/h|>0.35 \quad (2)$$

In a third aspect based on the first or second aspect, at least one of said at least two aspherical surfaces is provided in a negative lens group and includes a region in which, from the central portion to the peripheral portion of the surface, the local curvature power thereof gradually increases in the negative direction or gradually decreases in the positive direction.

In a fourth aspect based on the first to third aspects, the following relations $$|L \times \phi_0| < 70 \quad (1a)$$

$$|h_b/h| < 15 \quad (2a)$$

$$|\Delta ASPH/L| < 0.02 \quad (3a)$$

are satisfied.

In accordance with a fifth aspect of the present invention, there is provided a projection optical system, comprising: a plurality of positive lens groups having a positive refractive power; and at least one negative lens group having a negative refractive power; wherein, when L is a conjugate distance of said projection optical system and $\phi_0$ is the sum of powers of the or each negative lens group, a relation $$|L \times \phi_0| > 17 \quad (1)$$

is satisfied; wherein, when h is a height of an axial marginal light ray $h_b$ is a height of a most abaxial chief ray, at least one aspherical surface is formed on a surface in the negative lens group which satisfies a relation $$|h_b/h|>0.35 \quad (2)$$

wherein, when $\Delta ASPH$ is an aspherical amount of the aspherical surface, a relation $$|\Delta ASPH/L| > 1.0 \times 10^{-6} \quad (3)$$

is satisfied; and wherein said at least one aspherical surface includes a region in which, from a central portion toward a peripheral portion of the surface, a local curvature power thereof increases in the negative direction or decreases in the positive direction.

In a sixth aspect based on the fifth aspect, at least one aspherical surface is provided in a positive lens group and is formed upon one of the surfaces up to one, in an order from the object side, which satisfies a relation $$|h_b/h|>0.35 \quad (2)$$

and wherein said at least one aspherical surface includes a region in which, from the central portion to the peripheral portion of the surface, the local curvature power thereof gradually increases in the positive direction or gradually decreases in the negative direction.

In a seventh aspect based on the fifth or sixth aspect, the following relations $$|L \times \phi_0| < 70 \quad (1a)$$

$$|h_b/h| < 15 \quad (2a)$$

$$|\Delta ASPH/L| < 0.02 \quad (3a)$$

are satisfied.

In accordance with an eighth aspect of the present invention, there is provided a projection optical system, comprising: three lens groups of a lens group having a positive refractive power, a lens group having a negative refractive power, and a lens group having a positive refractive power, which are disposed in this order from the object side; wherein, when L is a conjugate distance of said projection optical system and $\phi_0$ is the power of said second negative refractive power lens group, a relation $$|L \times \phi_0| > 17 \quad (1)$$

is satisfied; wherein, when h is a height of an axial marginal light ray and $h_b$ is a height of a most abaxial chief ray, at least two aspherical surfaces are formed on surfaces which satisfy a relation $$|h_b/h|>0.35 \quad (2)$$

wherein, when $\Delta ASPH$ is an aspherical amount of each aspherical surface, a relation $$|\Delta ASPH/L| > 1.0 \times 10^{-6} \quad (3)$$

is satisfied.

In a ninth aspect based on the eighth aspect, said at least two aspherical surfaces include regions in which, from a central portion toward a peripheral portion of the surface, their local curvature powers change with mutually opposite signs.

In a tenth aspect based on the eighth or ninth aspect, an aspherical surface is provided in the positive lens group closest to the object side, which aspherical surface includes a region in which, from the central portion to the peripheral portion of the surface, the local curvature power thereof gradually increases in the positive direction or gradually decreases in the negative direction.

In an eleventh aspect based on the eighth to tenth aspects, an aspherical surface is provided in the positive lens group closest to the image plane side, which aspherical surface includes a region in which, from the central portion to the peripheral portion of the surface, the local curvature power thereof gradually increases in the negative direction or gradually decreases in the positive direction.

In a twelfth aspect based on the eighth to eleventh aspects, a or each lens group disposed after, in an order from the object side to the image plane side, the sign of an abaxial chief ray height is reversed, has at least one aspherical surface formed thereon.

In a thirteenth aspect based on the eighth to twelfth aspects, in the positive lens group disposed closest to the image plane side, a second lens thereof in an order from the image plane side comprises a negative lens having a concave surface facing to the image side, and a lens of that lens group, which lens is closest to the image plane side, comprises a positive lens having a concave surface facing to the image plane side.

In a fourteenth aspect based on the eighth to thirteenth aspects, at least one aspherical lens with an aspherical surface has a plane surface formed on its side opposite to the aspherical surface thereof.

In a fifteenth aspect based on the eighth to thirteenth aspects, each aspherical lens with an aspherical surface has a plane surface formed on its side opposite to the aspherical surface thereof.

In a sixteenth aspect based on the eighth to thirteenth aspects, at least one aspherical lens provided in said projection optical system has two aspherical surfaces formed on the opposite sides thereof.

In a seventeenth aspect based on the eighth to thirteenth aspects, each aspherical lens provided in said projection optical system has two aspherical surfaces formed on the opposite sides thereof.

In an eighteenth aspect based on the eighth to seventeenth aspects, the following relations $$|L \times \phi_0| < 70 \tag{1a}$$

$$|h_b/h| < 15 \tag{2a}$$

$$|\Delta ASPH/L| < 0.02 \tag{3a}$$

are satisfied.

In accordance with a nineteenth aspect of the present invention, there is provided a projection optical system, comprising: a first lens group L1 having a positive refractive power, a second lens group L2 having a negative refractive power, a third lens group L3 having a positive refractive power, a fourth lens group L4 having a negative refractive power, and a fifth lens group L5 having a positive refractive power, which are disposed in this order from the object side; wherein, when h is a height of an axial marginal light ray and $h_b$ is a height of a most abaxial chief ray, at least two aspherical surfaces are formed on surfaces which satisfy a relation $$|L \times \phi_0| > 17 \tag{1}$$

wherein, when ASPH is a largest aspherical amount of each asperical surface from an optical axis to a lens effective diameter and L is an object-to-image distance, each aspherical surface satisfies a relation $$|h_b/h| > 0.35 \tag{2}$$

wherein said aspherical surfaces include regions in which, from a central portion to a peripheral portion of the surface, their local curvature powers change with mutually opposite signs.

In a twentieth aspect based on the nineteenth aspect, at least one of said at least two aspherical surfaces includes a region in which, from the central portion to the peripheral portion of the surface, the local curvature power thereof gradually increases in the negative direction.

In a twenty-first aspect based on the eighteenth or nineteenth aspect, at least one of said at least two aspherical surfaces is provided in a lens group having a negative refractive power.

In accordance with a twenty-second aspect of the present invention, there is provided a projection optical system, comprising: a first lens group L1 having a positive refractive power, a second lens group L2 having a negative refractive power, a third lens group L3 having a positive refractive power, a fourth lens group L4 having a negative refractive power, and a fifth lens group L5 having a positive refractive power, which are disposed in this order from the object side; wherein, when h is a height of an axial marginal light ray and $h_b$ is a height of a most abaxial chief ray, at least one aspherical surface is formed on a surface which satisfies a relation $$|L \times \phi_0| > 17 \tag{1}$$

wherein, when $\Delta ASPH$ is a largest aspherical amount of said aspherical surface from an optical axis to a lens effective diameter and L is an object-to-image distance, said aspherical surface satisfies a relation $$|h_b/h| > 0.35 \tag{2}$$

wherein said aspherical surface includes a region in which, from a central portion to a peripheral portion of the surface, a local curvature power thereof gradually increases in the negative direction.

In a twenty-third aspect based on the nineteenth to twenty-second aspects, at least one aspherical lens provided in said projection optical system has a plane surface formed on its side opposite to the aspherical surface thereof.

In a twenty-fourth aspect based on the nineteenth to twenty-second aspects, each aspherical lens provided in said projection optical system has a plane surface formed on its side opposite to the aspherical surface thereof.

In a twenty-fifth aspect based on the nineteenth to twenty-second aspects, at least one aspherical lens provided in said projection optical system has aspherical surfaces formed on the opposite sides thereof.

In a twenty-sixth aspect based on the nineteenth to twenty-second aspects, each aspherical lens provided in said projection optical system has aspherical surfaces formed on the opposite sides thereof.

In a twenty-seventh aspect based on the nineteenth to twenty-second aspects, the following relations $$|h_b/h| < 15 \tag{2a}$$

$$|\Delta ASPH/L| < 0.02 \tag{3a}$$

are satisfied.

In a twenty-eighth aspect based on the nineteenth to twenty-seventh aspects, when L is an object-to-image distance of said projection optical system and $\phi_0$ is the sum of powers of the negative lens groups, a relation $$|L \times \phi_0| < 70 \tag{3}$$

($\phi_o = \Sigma \phi_{oi}$ where $\phi_{oi}$ is the power of the i-th negative group) is satisfied.

In a twenty-ninth aspect based on the twenty-eighth aspect, a relation $$|L \times \phi_0| < 70 \tag{1a}$$

is satisfied.

In accordance with a thirtieth aspect of the present invention, there is provided a projection optical system, comprising: a first lens group L1 having a positive refractive power, a second lens group L2 having a negative refractive power, a third lens group L3 having a positive refractive power, a fourth lens group L4 having a negative refractive power, a fifth lens group L5 having a positive refractive power, a sixth lens group having a negative refractive power, and a seventh lens group having a positive refractive power, which are disposed in this order from the object side; wherein one or more aspherical surfaces are formed in said projection optical system; and wherein, when $\Delta ASPH$ is a largest aspherical amount of each aspherical surface from an optical axis to a lens effective diameter and L is an object-to-image distance, at least one aspherical surface satisfies a relation $$|\Delta ASPH/L| > 1.0 \times 10^{-6} \tag{3}$$

In a thirty-first aspect based on the thirtieth aspect, at least one aspherical surface is provided between a first lens surface closest to the object side and a stop position.

In a thirty-second aspect based on the thirtieth or thirty-first aspect, when h is a height of an axial marginal light ray and $h_b$ is a height of a most abaxial chief ray, at least one aspherical surface is formed on a surface which satisfies a relation $$|h_b/h| > 0.35 \quad (2)$$

In a thirty-third aspect based on the thirty-second aspect, at least two aspherical surfaces are formed in said projection optical system.

In a thirty-fourth aspect based on the thirtieth to thirty-third aspects, the aspherical surface is provided in a lens group having a negative refractive power, and at least one aspherical surface in the lens group of negative refractive power includes a region in which, from a central portion to a peripheral portion of the surface, a local curvature power thereof gradually increases in the negative direction.

In a thirty-fifth aspect based on the thirtieth to thirty-fourth aspects, at least two aspherical surfaces include regions in which, from a central portion to a peripheral portion of the surface, their local curvature powers change with mutually opposite signs.

In a thirty-sixth aspect based on the thirtieth to thirty-fifth aspects, at least one aspherical lens provided in said projection optical system has a plane surface formed on its side opposite to the aspherical surface thereof.

In a thirty-seventh aspect based on the thirtieth to thirty-fifth aspects, each aspherical lens provided in said projection optical system has a plane surface formed on its side opposite to the aspherical surface thereof.

In a thirty-eighth aspect based on the thirtieth to thirty-fifth aspects, at least one aspherical lens provided in said projection optical system has aspherical surfaces formed on the opposite sides thereof.

In a thirty-ninth aspect based on the thirtieth to thirty-fifth aspects, each aspherical lens provided in said projection optical system has aspherical surfaces formed on the opposite sides thereof.

In a fortieth aspect based on the thirtieth to thirty-ninth aspects, when L is an object-to-image distance of said projection optical system and $\phi$ is the sum of powers of the negative lens group, a relation $$|L \times \phi_0| < 70 \quad (1)$$

($\phi_o = \Sigma \phi_{oi}$ where $\phi$ is the power of the i-th negative group) is satisfied.

In a forty-first aspect based on the thirtieth to thirty-third aspects, a relation $$|\Delta ASPH/L| < 0.02 \quad (3a)$$

is satisfied.

In a forty-second aspect based on the thirty-second to thirty-third aspects, a relation $$|h_b/h| < 15 \quad (2a)$$

is satisfied.

In a forty-third aspect based on the fortieth aspect, a relation $$|L \times \phi_0| < 70 \quad (1a)$$

is satisfied.

In accordance with a forty-fourth aspect of the present invention, there is provided a projection exposure apparatus for projecting a pattern of a first object, illuminated with light from a light source, onto a second object by use of a projection optical system as recited above.

In accordance with a forty-fifth aspect of the present invention, there is provided a projection exposure apparatus for projecting pattern of a first object, illuminated with light from a light source onto a second object by use of a projection optical system as recited above, while scanningly moving the first and second objects in a direction perpendicular to an optical axis of said projection optical system, in synchronism with each other and at a speed ratio corresponding to a projection magnification of said projection optical system.

In accordance with a forty-sixth aspect of the present invention, there is provided a device manufacturing method, comprising the steps of: exposing a wafer to a device pattern of a reticle by use of a projection exposure apparatus as recited above; and developing the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
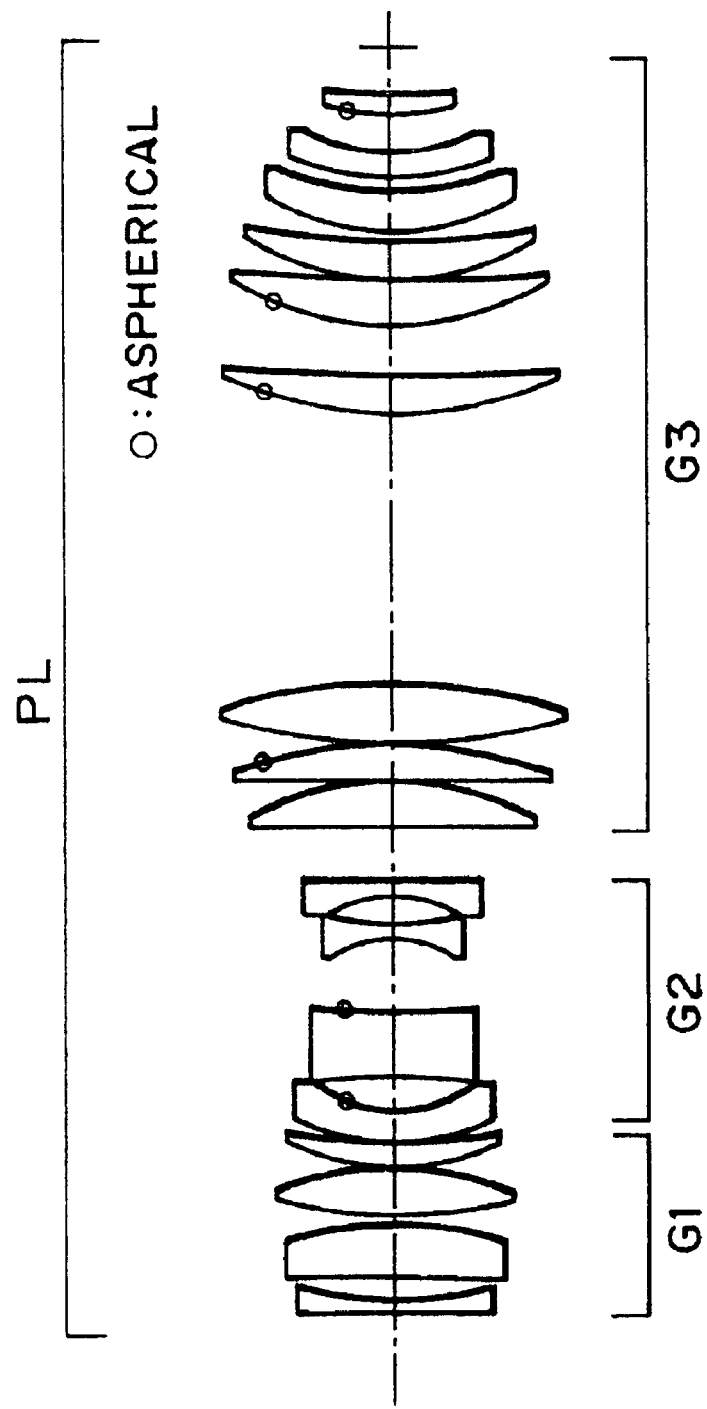
FIG. 1 is a lens sectional view of a projection optical system for use in a projection exposure apparatus, according to Numerical Example 1 of the present invention.

Preferred embodiments of the present invention will now be described with reference to the accompanying drawings.

In these lens sectional views, a reference character PL denotes a projection optical system, and a reference character Gi denotes the i-th lens group (i-th group) of the projection optical system, in an order from the object side (conjugate side of longer distance).

Denoted at IP is an image plane which corresponds to a wafer surface, when the projection optical system is used in a projection exposure apparatus. In the lens groups Gi, those lens groups having an odd number assigned for "i" are lens groups having a positive refractive power, while those lens groups having an even number assigned for "i" are lens groups having a negative refractive power.

Also, those lens surfaces with a small circle added thereto are aspherical surfaces.

In each of Numerical Examples 1–5 and 18 and 19 shown in the lens sectional views of FIGS. 1, 4, 7, 10 and 13 and FIGS. 55 and 56, respectively, the projection optical system comprises three lens groups or lens units (three-group type) which have positive, negative, and positive refractive powers, respectively, in an order from the object side.

In each of Numerical Examples 6–11 and 20–24 shown in the lens sectional view of FIGS. 16, 19, 22, 25, 28 and 31 and FIGS. 61, 64, 67, 70 and 73, respectively, the projection optical system comprises five lens groups or lens units (five-group type) which have positive, negative, positive, negative, and positive refractive powers, respectively, in an order from the object side.

In each of Numerical Examples 12–17 and 25–28 shown in the lens sectional view of FIGS. 34, 37, 40, 43, 47 and 50 and FIGS. 76, 79, 82 and 85, respectively, the projection optical system comprises seven lens groups or lens units (seven-group type) which have positive, negative, positive, negative, positive, negative, and positive refractive powers, respectively, in an order from the object side.

In these numerical examples, while appropriate power sharing is made through the whole lens system, aspherical surfaces are introduced to appropriate lens faces, by which a good optical performance is accomplished.

Projection optical systems according to the present invention provide a large numerical aperture and a wide exposure area.

To this end, the optical system as a whole comprises a plurality of lens groups including a lens group having a positive refractive power and a lens group having a negative refractive power, wherein the power sharing (refractive power sharing) is set appropriately.

In one preferred form of the present invention, for appropriate setting of power sharing, the condition as defined by equation (1) is set in regard to the product of the conjugate distance L of the lens system and the sum φ of powers of the negative lens group or groups. Generally, if the conjugate distance (object-to-image distance) L becomes longer, the total power φ of the negative lens groups becomes smaller. If, on the other hand, the conjugate distance becomes shorter, the total power φ of the negative lens groups becomes larger.

In one preferred form of the present invention, the product of the conjugate distance and the total power is set to be not less than 17. The total power of the negative refractive power lens group is therefore made larger, mainly for satisfactory correction of the curvature of image field and the astimagtism. If the lower limit of the condition of equation (1) is exceeded, the Petzval sum increases in the positive direction, such that satisfactory correction of the curvature of image field or astimagtism becomes difficult to accomplish.

The condition of equation (2) defines an appropriate surface for introduction of an aspherical surface, based on satisfaction of the condition (1). In conventional reduction projection optical systems, it is very difficult to satisfactorily correct distortion, curvature of image field, and astimagtism as well as transverse aberrations of meridional and sagittal, while maintaining the telecentricity.

This is because of the following reason. The telecentricity, distortion, curvature of image field, and astimagtism are all aberration amounts related to a principal ray passing through the center of a light flux. Although these aberrations depend on the placement and shape of lenses on the object side where, in the lens system as a whole, the height of the principal ray is high, practically it is very difficult to maintain, on one hand, the telecentricity with respect to principal rays from every object point on the object and, on the other hand, to refract the same principal ray so as to correct the distortion, the curvature of image field and the astigmatism.

Further, since on a lens surface those rays below the meridional are refracted at a height still higher than the principal ray, it is difficult to balance the meridional transverse aberration and aberration concerning these principal rays. Simultaneously, in order to correct the curvature of image field which has a tendency that it is "under" with higher image height, sually a concave lens is used to refract the light strongly. Then, however, the peripheral portion (sagittal halo) of the sagittal transverse aberration at high image heights further changes "over". Thus, it is difficult to balance them satisfactority.

Enlarging the numerical aperture and widening the exposure area under these situations directly lead to further enlargement of the object side light flux and image height, and it amplifies the difficulties in aberration correction.

In one preferred form of the present invention, in consideration of the above, the condition of equation (2) is satisfied and an aspherical surface is formed on such surface having a large influence to abaxial principal rays, thereby to concentratedly and effectively correct the above-described aberrations to be improved. This effectively reduces the load for correction of other aberrations, and accomplishes a good optical performance.

If the lower limit of the condition of equation (2) is exceeded, the influence to axial marginal light rays increases, rather than to the abaxial principal rays, and therefore, the effect of correcting the aberrations to be improved diminishes. Thus, it becomes difficult to attain an enlarged numerical aperture and a wider exposure area.

Figure 52:
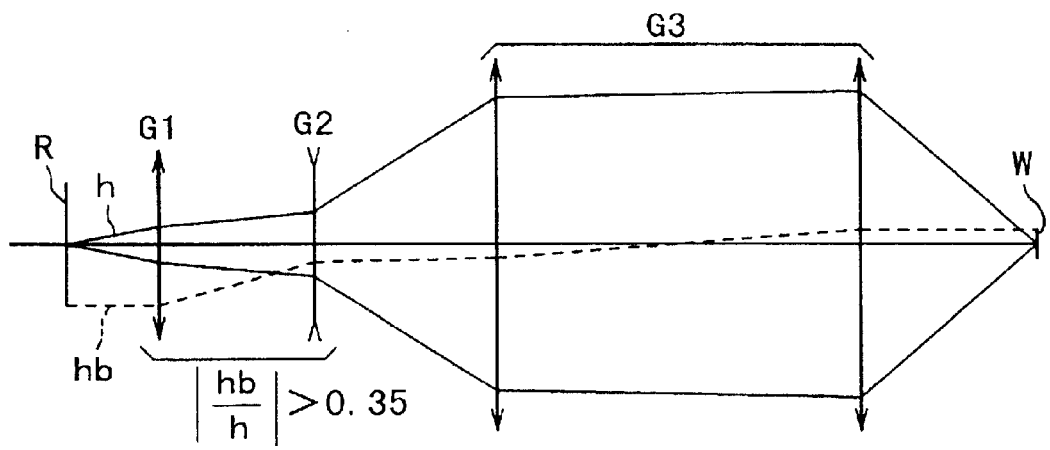
FIG. 52 is a schematic view for explaining an optical function of a three-group system into which the present invention is applied.
Figure 53:
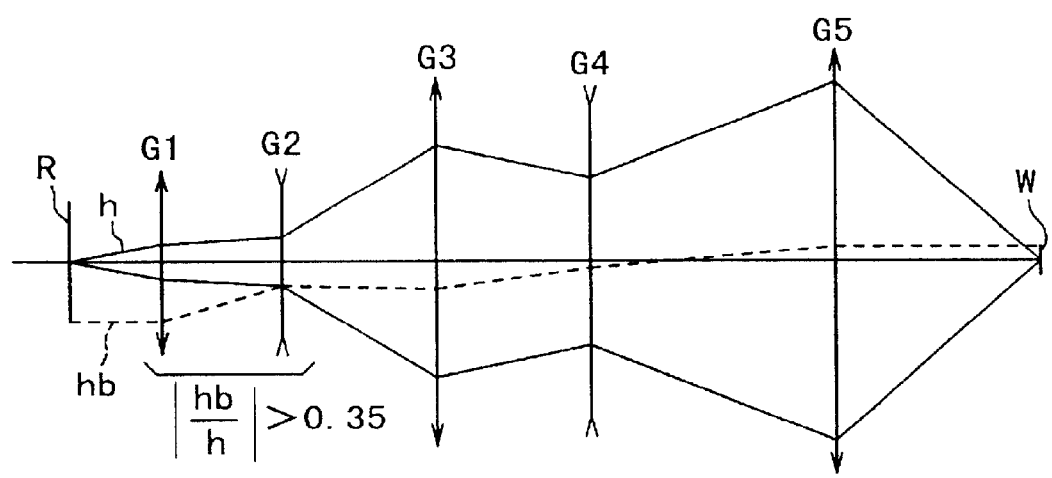
FIG. 53 is a schematic view for explaining an optical function of a five-group system into which the present invention is applied.
Figure 54:
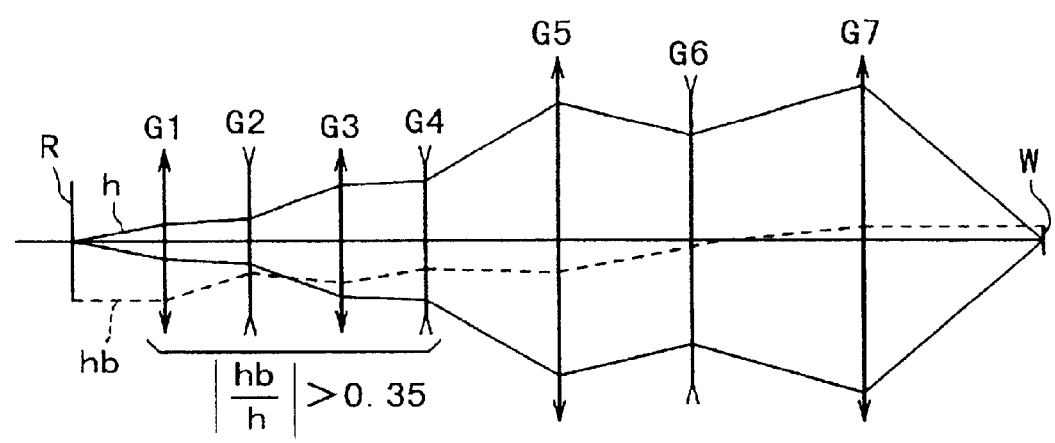
FIG. 54 is a schematic view for explaining an optical function of a seven-group system into which the present invention is applied.

For better understanding of the present invention, an optical function of a projection optical system when an aspherical surface is introduced thereto will now be described. FIGS. 52, 53 and 54 are schematic views, respectively, of power arrangement in examples wherein the whole lens system comprises three lens groups, five lens groups and seven lens groups, respectively.

Denoted in these drawings at R is a reticle as an object, and denoted at W is a wafer as an image plane. Solid lines depict axial marginal light rays and the surface height thereof is denoted by h. Broken lens depict most abaxial chief rays and the surface height thereof is denoted by $h_b$. The optical system is bi-telectnric, both on the object side and the image side.

In the reduction projection systems shown in FIGS. 52, 53 and 54, the object side numerical aperture corresponds to the product of the projection magnification and the image side numerical aperture (the term "numerical aperture" referred to in this specification means the image side numeral aperture). Therefore, the axial marginal light is small at the object side and it is large at the image side.

For this reason, the height h is small at the object side, and it is large at the image side. To the contrary, because of the projection magnification, the height $h_b$ of the most abaxial chief ray is high at the object side, and it is low at the image side.

Generally, at a surface where third order aberrations are large, there exist large higher-order aberrations. Thus, it is necessary for better aberration correction that an absolute value of the third order aberration coefficient at each surface is made small and that the value as a whole is made small. The distortion aberration coefficient is influential with the third power of $h_b$ and the first power of h and the curvature of field and astigmatism coefficients are influential with the second power of $h_b$ and second power of h. The coma aberration coefficient is influential with the first power of $h_{b1}$ and third power of h, and the spherical aberration coefficient is influential with the fourth power of h.

In FIG. 52, the heights h and $h_b$ that satisfy condition (2) are from the object surface to the lens groups GI and G2. Thus, introducing at least one aspherical surface into the group G1 or G2 is a condition for better optical performance. When an aspherical surface is introduced into the lens group G1, the height $h_b$ becomes highest and, therefore, it is very effective to control the distortion aberration coefficient.

Introducing an aspherical surface into the lens group G2 having a negative refractive power is effective to control mainly the field curvature and astigmatism aberration coefficients. Since however it is in a cancelling relation with the lens group G1 having a positive refractive power, the distortion aberration coefficient can also be controlled effectively.

Generally, at a surface having a large height h, using an aspherical surface contributes to the spherical aberration coefficient or the coma aberration coefficient. Therefore, introducing an aspherical surface to the lens group G3 having a positive refractive power is effective for correction of spherical aberration or coma aberration.

Also, in FIG. 53, while condition (2) is satisfied between the object surface to the lens groups G1 and G2, since there are two lens groups of negative refractive power, it is advantageous with respect to correction of the Petzval sum (because the necessity of refracting light rays at low positions so as to enlarge the power of the negative lens group is diminished). Further, the spacing between the lens groups G1 and G2 is made small. Therefore, the value of condition (2) in the group G2 is large as compared with the three-group type of FIG. 52.

Thus, while introducing at least one aspherical surface into lens group G1 or G2 is a condition for better optical performance, the aberration correcting ability is larger than that of the three-group type lens system of FIG. 52. The controllability of aberration coefficients in the lens groups G1 and G2 is similar to that of the three-group type lens system of FIG. 52.

Here, because there are two negative lens groups included, correction of field curvature or astigmatism is easier than with the three-group type lens system of FIG. 52. The load for aberration correction applied to the lens group G2 is smaller. As an alternative, aspherical surfaces may be introduced into lens groups G3, G4 and G5 of a large height h, for correction of spherical aberration or coma aberration.

In FIG. 54, condition (2) can be satisfied between the object surface and the lens groups G1, G2, G3 and G4. As compared with the three-group type lens system of FIG. 52 and the five-group type lens system of FIG. 53, the most abaxial chief ray can easily keep a high position relative to the axial marginal light ray. This is because there are three negative lens groups included which is advantageous for correction of the Petzval sum, and because the spacings among the lens groups G1, G2, G3 and G4 are made small.

Thus, an aspherical surface can be introduced more effectively, and better optical performance can be accomplished.

Particularly, by introducing an aspherical surface to the lens groups G1 or G2 showing a large value with respect to condition (2), distortion aberration, curvature of field and astigmatism can be corrected successfully. As regards lens groups G3 and G4, they are suitable mainly for correction of coma aberration and sagittal transverse aberration.

Using an aspherical surface in the lens group G5, G6 or G7 having a large height h is effective to correct spherical aberration or coma aberration.

While the optical function in relation to introducing of an aspherical surface has been described above, for more effective introduction of an aspherical surface in obtaining better imaging performance, the condition of equation (3) should preferably be satisfied.

Equation (3) defines a condition for the aspherical amount. If the lower limit of condition (3) is exceeded, the effect of aspherical surface does not function well even though the aspherical surface is used in design to obtain a good imaging performance. For example, if the conjugate distance is 1000 mm and the wavelength used is 193 nm, from equation (2), $\Delta$ASPH is equal to 0.0001 mm which corresponds to about ten Newton's rings. This is a sufficiently large value as an aspherical surface to be used in a projection optical system. Further, for more effective use of an aspherical surface, the following relation may be satisfied $$|\Delta ASPH/L| > 1.0 \times 10^{-5}$$

to enlarge the aspherical amount.

The present invention enables effective introduction of an aspherical surface. However, there is a limit to apply a desired change in refractive power for aberration correction, by using a single aspherical surface to plural light beams from an object. Thus, preferably, at least two aspherical surfaces satisfying the above-described condition may be used, to share the aberration correcting function. A better result is attainable with this.

Further, conditions as defined by equations (1a), (2a) and (3a) mentioned above may preferably be satisfied, for much better correction of aberrations.

If the upper limit of the condition of equation (1a) is exceeded, the power of a negative lens group or groups having a negative refractive power becomes too strong. Therefore, the Petzval sum is over-corrected, and it becomes difficult to mainly correct the curvature of image field and astigmatism, satisfactorily.

Further, the lens diameter of a positive lens group having a positive refractive power becomes larger, or the number of lenses increases.

If the upper limit of the condition of equation (2a) is exceeded, lenses become too close to the object plane and the working distance cannot be kept. If the magnification of the projection optical system is extraordinarily small, the working distance may be kept even though the condition is exceeded. However, an optical system having such an extraordinarily small magnification is not practical for use in lithography.

When the upper limit of the condition of equation (3a) is exceeded, the aspherical amount becomes too large, causing a large increase in the time necessary for lens machining.

Further, higher order aberrations produced at the aspherical surface become strong, which makes the satisfactory correction of aberration very difficult.

Further, in relation to the change in curvature of an aspherical surface, the effect of using an aspherical surface can be enhanced significantly when at least one of the following conditions is satisfied.

(a1) There should be at least two aspherical surfaces having regions in which, from a central portion to a peripheral portion of the surface, their local curvature powers change with mutually opposite signs.

(a2) At least one aspherical surface provided in a negative lens group should include a region in which, from a central portion to a peripheral portion of the surface, the local curvature power thereof gradually increases in the negative direction, or gradually decreases in the positive direction.

(a3) At least one aspherical surface among the aspherical surfaces of (a1) and (a2) and provided in a positive lens group, should include a region which, from a central portion to a peripheral portion of the surface, the local curvature power thereof gradually increases in the positive direction, or gradually decreases in the negative direction.

As regards correction of aberration by use of an aspherical surface, generally, an aspherical surface is introduced to a certain lens surface so as to reduce production of aberration at that surface (i.e., auxiliary introduction). An example is that, in a case of a convex single lens, since the spherical aberration is "under", an aspherical surface whose curvature becomes smaller in the peripheral portion is used to correct the spherical aberration.

In the present invention, as compared therewith, while reducing the number of lenses is aimed at on one hand, spherical surfaces are introduced so as to cancel aberration in combination with other surfaces, to thereby accomplish good performance as well (i.e., positive introduction). By doing so, aberrations are corrected successfully.

More specifically, by satisfying the condition (a1), a relation of cancelling two aspherical surface powers is defined. By this, it is assured that a change in refractive power applied to an arbitrary light from an object produces a refractive power change with which plural aberrations can be minimized simultaneously, which are not attainable with use of only spherical surfaces or a lens having only one aspherical surface.

Higher order aberrations which can not be easily corrected, such as distortion, curvature of field, astigmatism, sagittal transverse aberration or meridional transverse aberration, in higher order regions, for example, can be well corrected by the function of the condition (a1) above.

Particularly, two aspherical surfaces are so distributed that one aspherical surface is provided in the first lens group G1 while another aspherical surface is provided in the second lens group G2, the telecentricity, distortion aberration, field of curvature can be corrected very well.

When both of the two aspherical surfaces are introduced into the second lens group G2, curvature of field, meridional and sagittal transverse aberrations, and distortion aberration can be corrected very well.

When two aspherical surfaces are introduced into the third lens group G3 and fourth lens group G4 of a seven-group type lens system of FIG. 54, sagittal transverse aberration and coma aberration can be corrected very well.

Further, satisfying the condition (a2) is particularly effective for correction of curvature of field and meridional and sagittal transverse aberrations.

This is because, if the Petzval sum is well corrected, it is still difficult to correct sagittal field curvature having a tendency of "under" and, therefore, as described, it is difficult to balance it with the meridional or sagittal transverse aberrations. In the present invention, by satisfying the condition (a2), particularly the power in the negative refractive power direction is made large to thereby correct the "under" portion of the field curvature toward the "over" side. This provides an additional advantage that the degree of freedom for correction of aberrations at surfaces other than the aspherical surface can be expanded significantly, such that meridional or sagittal transverse aberrations and distortion aberrations, for example, can be corrected very well.

As an important feature, satisfying the condition (a3) is particularly effective for correction of the object-side telecentricity and higher order distortion aberrations.

More specifically, in the present invention, the condition of equation (1) for making the power of a negative lens group large, enables correction of astigmatism or curvature of image field which relates to the Petzval sum. However, it influences the balance of telecentricity on the object side because of higher order negative powers, and higher order "under" distortion aberration is produced. When the condition (a3) is satisfied, the object-side telecentricity is well accomplished again. Simultaneously, an "over" distortion aberration in an opposite direction is produced to cancel it. Thus, the correction can be done well.

In addition, if plural aspherical surfaces are introduced, aberration correction can be done more successfully over the whole system. The spherical aberration and coma aberration can be corrected satisfactorily when aspherical surfaces are introduced into a lens group having a large axial marginal light ray height, that is, the third lens group G3 of FIG. 52, the third, fourth and fifth lens groups G3, G4 and G5 of FIG. 53, the fifth, sixth, and seventh lens groups G5, G6 and G7 of FIG. 54, wherein each aspherical surface includes a region in which, from a central portion to a peripheral portion of the surface, the local curvature power thereof gradually increases in the negative direction (or decreases in the positive direction).

As described, in accordance with the present invention, the power sharing is set appropriately and an aspherical surface is provided at a suitable position. Also, an appropriate aspherical amount is set thereto, and the aspherical surface shape is determined to satisfy a predetermined condition or conditions. With this arrangement, distortion aberration, curvature of filed, astigmatism, coma aberration and spherical aberration, for example, are well corrected while maintaining the dual-telecentricity. Thus, a projection optical system having a better optical performance is accomplished.

In a three-group type lens system, the effect of using an aspherical surface can be enhanced significantly when at least one of the following conditions is satisfied.

(b1) There should be at least two aspherical surfaces having regions in which, from a central portion to a peripheral portion of the surface, their local curvature powers change with mutually opposite signs.

(b2) At least one of aspherical surfaces provided in a positive lens group G1 which is closest to the object side, should include a region in which, from a central portion to a peripheral portion of the surface, the local curvature power thereof gradually increases in the positive direction, or gradually decreases in the negative direction.

(b3) At least one of aspherical surfaces provided in a positive lens group G3 which is closest to the image plane side, should include a region in which, from a central portion to a peripheral portion of the surface, the local curvature power thereof gradually increases in the negative direction, or gradually decreases in the positive direction.

(b4) A lens which is disposed after, in an order from the object side to the image plane side, the sign of the abaxial chief ray height is reversed, should have at least one aspherical surface.

As regards correction of aberration by use of an aspherical surface, generally, an aspherical surface is introduced to a certain lens surface so as to reduce production of aberration at that surface (i.e., auxiliary introduction). An example is that, in a case of a convex single lens, since the spherical aberration is "under", an aspherical surface whose curvature becomes smaller in the peripheral portion is used to correct the spherical aberration.

In one preferred form of the present invention, as compared therewith, a three-group lens structure is basically used and, while reducing the number of lenses is aimed at on one hand, aspherical surfaces are introduced so as to cancel aberration in combination with other surfaces, to thereby accomplish good performance as well (i.e., positive introduction). By doing so, aberrations are corrected successfully.

More specifically, by satisfying the condition (b1) in the lens groups G1 and G2, a relation of cancelling two aspherical surface powers is defined. By this, it is assured that a change in refractive power applied to an arbitrary light from an object produces a refractive power change with which plural aberrations can be minimized simultaneously, which are not attainable with use of only spherical surfaces of a lens having only one aspherical surface.

Higher order aberrations which can not be easily corrected, such as distortion, curvature of field, astigmatism, sagittal transverse aberration or meridional transverse aberration, in higher order regions, for example, can be well corrected by the function of the condition (b1) above.

Satisfying the condition (b2) above is particularly effective for correction of the object-side telecentricity and higher order distortion aberrations.

More specifically, in the present invention, the condition of equation (1) for making the power of a negative lens group G2 large, enables correction of astigmatism or curvature of image field which relates to the Petzval sum. However, it influences the balance of telecentricity on the object side because of higher order negative powers, and higher order "under" distortion aberration is produced.

When the condition (b2) is satisfied, the object-side telecentricity is well accomplished again. Simultaneously, an "over" distortion aberration in an opposite direction is produced to cancel it. Thus, the correction can be done well.

Further, satisfying condition (b3) is effective to mainly correct spherical aberration. That is because, in the positive third lens group G3 which bears the imaging function, "under" spherical aberration is produced. By satisfying condition (b3), "over" spherical aberration is positively produced by which the aberration correction is done successfully.

Satisfying condition (b4) is effective to mainly correct coma aberration and lower order distortion aberration. Across a stop, the sign of the height $h_b$ of the chief ray is reversed. Before the stop (i.e., object side), use of an aspherical surface is effective for correction of lower light rays of the abaxial light, whereas, after the step (image side), it is effective for correction of upper light rays. Thus, an aspherical surface is introduced into a lens after the stop, to thereby correct coma aberration satisfactorily.

Additionally, in a reduction projection system, lenses at the image side have a relatively large lens diameter for the sake of the numerical aperture, whereas the lenses have a small image height. Thus, by using an aspherical surface, lower order distortion aberration is corrected.

The face of an aspherical surface lens opposite to its aspherical surface side may be a flat surface. This facilitates lens axial alignment during lens production, assembling and adjustment, and provides an advantage with respect to easy manufacture.

The face of an aspherical surface lens opposite to its aspherical surface side may be an aspherical surface. This expands the degree of freedom for aberration correction. Further, when the curvature change in these aspherical surfaces is set in the same direction, the influence of any eccentricity of the aspherical surface lens can be reduced.

As described, in a three-group type lens system according to one preferred form of the present invention, the power sharing is set appropriately in a lens structure having a smaller number of lenses, and an aspherical surface is provided at a suitable position. Also, an appropriate aspherical amount is set thereto, and the aspherical surface shape is determined to satisfy a predetermined condition or conditions. With this arrangement, distortion aberration, curvature of filed, astigmatism, coma aberration and spherical aberration, for example, are well corrected while maintaining the dual-telecentricy. Thus, a projection optical system having a better optical performance is accomplished.

A five-group type lens system shown in the lens sectional view of FIG. 53 comprises, in an order from the object side, a first lens group G1 having a positive refractive power, a second lens group G2 having a negative refractive power, a third lens group G3 having a positive refractive power, a fourth lens group G4 having a negative refractive power, and a fifth lens group G5 having a positive refractive power. An aspherical surface or surfaces are applied to suitable surfaces, by which good optical performance is provided. A stop is disposed between the fourth and fifth lens groups G4 and G5, or adjacent the fourth or fifth lens group G4 or G5.

Particularly, the whole lens system includes two negative lens groups, by which a strong negative refractive power required is distributed in the optical system. With this arrangement, the curvature of field can be corrected effectively and, also, an optical system having a short total length is accomplished.

Where five lens groups having positive and negative refractive powers are disposed alternately, if a larger numerical aperture and a higher resolution are attempted while all the lenses are formed with spherical surfaces, it inevitably results in an increase in the number of lenses used.

Thus, in the refractive power structure of the optical system shown in FIG. 53, and in order to accomplish an optical system having a large numerical aperture and including a smaller number of lenses and being well aberration corrected, at least one aspherical surface is introduced into the optical system.

More specifically, in one preferred form of the present invention, a projection optical system of a five-group type lens system, for projecting an image of an object upon an image plane, comprises, in an order from the object side, a first lens group G1 having a positive refractive power, a second lens group G2 having a negative refractive power, a third lens group G3 having a positive refractive power, a fourth lens group G4 having a negative refractive power, and a fifth lens group G5 having a positive refractive power, wherein, when h is a height of an axial marginal light ray and $h_b$ is a height of a most abaxial chief ray, at least one aspherical surface is formed on a surface which satisfies a relation $$|h_b/h| > 0.35 \quad (2)$$

wherein, when $\Delta$ASPH is a largest aspherical amount of the aspherical surface from an optical axis to a lens effective diameter and L is an object-to-image distance, the aspherical surface satisfies a relation $$|\Delta ASPH/L| > 1.0 \times 10^{-6} \quad (3)$$

The condition of equation (2) defines an appropriate surface for introduction of an aspherical surface. In conventional reduction projection optical systems, it is very difficult to satisfactorily correct distortion, curvature of image field, and astigmatism as well as transverse aberrations of meridional and sagittal, while maintaining the telecentricity.

This is because of the following reason. The telecentricity, distortion, curvature of image field, and astigmatism are all aberration amounts related to a principal ray passing through the center of a light flux. Although these aberrations depend on the placement and shape of lenses on the object side where, in the lens system as a whole, the height of the principal ray is high, practically it is very difficult to maintain, on one hand, the telecentricity with respect to principal rays from every object points on the object and, on the other hand, to refract the same principal ray so as to correct the distortion, the curvature of image field and the astigmatism.

Further, since on a lens surface those rays below the meridional are refracted at a height still higher than the principal ray, it is difficult to balance the meridional transverse aberration and aberration concerning these principal rays. Simultaneously, in order to correct the curvature of image field which has a tendency that it is "under" with higher image height, usually a concave lens is used to refract the light strongly. Then, however, the peripheral portion (sagittal halo) of the sagittal transverse aberration at high image heights further changes "over". Thus, it is difficult to balance them satisfactorily.

Enlarging the numeral aperture and widening the exposure area under these situations directly lead to further enlargement of the object side light flux and image height, and it amplifies the difficulties in aberration correction.

In a five-group type lens system according to one preferred form of the present invention, in consideration of the above, the condition of equation (2) is satisfied and an aspherical surface is formed on such a surface having a large influence to abaxial principal rays, thereby to concentratedly and effectively correct the above-described aberrations to be improved. This effectively reduces the load for correction of other aberrations, and accomplishes a good optical performance.

If the lower limit of the condition of equation (2) is exceeded, the influence to axial marginal light rays increases, rather than to the abaxial principal rays, and therefore, the effect of correcting the aberrations to be improved diminishes. Thus, it becomes difficult to attain an enlarged numerical aperture and a wider exposure area.

In FIG. 53, the condition of equation (2) is satisfied in a range from the object surface up to the lens groups G1, G2 and G3. Thus, at least one aspherical surface may be introduced to a surface in the range of lens groups G1, G2 and G3, satisfying the equation (2), by which better optical performance can be accomplished.

Particularly, if an aspherical surface is introduced into the lens group G1, since the height $h_b$ becomes highest, it is very effective to control the distortion aberration coefficient.

Introducing an aspherical surface into the negative second lens group G2 is effective to control mainly the field curvature and astigmatism aberration coefficients. Since however it is in a cancelling relation with the first lens group G1 having a positive refractive power, the distortion aberration coefficient can also be controlled effectively.

The third lens group G3 has a large height h, and using an aspherical surface contributes to the spherical aberration coefficient or the coma aberration coefficient. Therefore, introducing an aspherical surface there is effective for correction of spherical aberration or coma aberration.

While the optical function in relation to introduction of an aspherical surface has been described above, in order to obtain much better imaging performance as a result of introduction of an aspherical surface, the condition as defined by equation (3) should preferably be satisfied.

Equation (3) defines a condition concerning the aspherical amount. If the lower limit of condition (3) is exceeded, the effect of aspherical surface does not function well even through the aspherical surface is used in design to obtain a good imaging performance.

For example, if the conjugate distance is 1000 mm and the wavelength used is 193 nm, from equation (2), ΔASPh is equal to 0.001 mm which corresponds to about ten Newton's rings. This is a sufficiently large value as an aspherical surface to be used in a projection optical system.

Further, for more effective use of an aspherical surface, at least one aspherical surface which satisfies the following relation may preferably be used:

$$|\Delta ASPH/L| > 10 \times 10^{-5} \quad (3b)$$

Further, in one preferred form of the present invention, when L is an object-to-image distance of said projection optical system and $\phi_0$ is the sum of powers of the negative lens groups the following relation is preferably satisfied:

$$|L \times \phi_0| > 17.$$

Generally, if the conjugate distance (object-to-image distance) L becomes longer, the total power φ becomes larger.

In one preferred form of the present invention, the product of the conjugate distance and total power is set to be not less than 17. The total power of the negative refractive power lens group is therefore made larger, mainly for satisfactory correction of the curvature of image field and the astigmatism. If the lower limit of this condition is exceeded, the Petzval sum increases in the positive direction, such that satisfactory correction of the curvature of image field or astigmatism becomes difficult to accomplish.

Further, conditions as defined by equations (1a), (2a) and (3a) may preferably be satisfied, for better correction of aberrations.

If the upper limit of the condition of equation (2a) is exceeded, lenses become too close to the object plane and the working distance can not be kept. If the magnification of the projection optical system is extraordinarily small, the working distance may be kept even though the condition is exceeded. However, an optical system having such extraordinarily small magnification is not practical for use in lithography.

When the upper limit of the condition of equation (3 a) is exceeded, the aspherical amount becomes too large, causing a large increase in the time necessary for lens machining. Further, higher order aberrations produced at the aspherical surface become strong, which makes the satisfactory correction of aberration very difficult.

If the upper limit of the condition of equation (1a) is exceeded, the power of a negative lens group or groups having a negative refractive power becomes too strong. Therefore, the Petzval sum is over-corrected, and it becomes difficult to mainly correct the curvature of image field and astigmatism, satisfactorily.

Further, the lens diameter of a positive lens group having a positive refractive power becomes larger, or the number of lenses increases.

In a five-group type lens system, at least one of the following conditions may preferably be satisfied. This improves the effect of using an aspherical surface, and accomplishes a better aberration correction.

(c1) There should be at least two aspherical surfaces formed on surfaces satisfying the conditions of equations (2) and (3), and they should include regions in which, from a central portion to a peripheral portion of the surface, their local curvature powers change with mutually opposite signs.

(c2) At least one of aspherical surfaces satisfying conditions (2) and (3) and being provided in a negative lens group should include a region in which, from a central portion to a peripheral portion of the surface, the local curvature power thereof gradually increases in the negative direction.

(c3) At least one of aspherical surfaces provided in a positive lens group should include a region in which, from a central portion to a peripheral portion of the surface, the local curvature power thereof gradually increases in the positive direction.

As regards correction of aberration by use of an aspherical surface, generally, there are two ways. One is that the aspherical surface is introduced to a certain lens surface so as to reduce production of aberration at that surface (auxiliary introduction). The other is that an aspherical surface is introduced so as to cancel an aberration in the relationship with other surfaces (positive introduction). The present invention is fundamentally based on the latter, and aberrations are well corrected thereby.

By establishing a cancelling relation between local powers of the two aspherical surfaces while satisfying the condition (c1) above, it becomes easy to produce a change in refractive power such that plural aberrations can be minimized simultaneously.

Particularly, higher order aberrations which can not be easily corrected, such as distortion, curvature of field, astigmatism, sagittal transverse aberration or meridional transverse aberration, in higher order regions, for example, can be well corrected by the function of the condition (c1) above.

More preferably, two aspherical surfaces satisfying the condition (c1) may be provided in one of the lens groups G1 and G2. Alternatively, these two aspherical surfaces may be introduced into the lens groups G1 and G2, respectively. This is preferable for better performance.

By introducing aspherical surfaces of the above-described condition into the one or both of the lens groups G1 and G2, mainly distortion aberration and image plane can be corrected effectively.

Satisfying the condition (c2) is particularly effective for correction of curvature of field and meridional and sagittal transverse aberrations.

This is because, if the Petzval sum is well corrected, it is still difficult to correct field curvature of large image height, particularly, sagittal field curvature having a tendency of "under" and, therefore, as described, it is difficult to balance it with the meridional or sagittal aberrations.

In one preferred from of the present invention, by introducing an aspherical surface satisfying the condition (c2), the power in the negative refractive power direction of the peripheral portion is made large, without excessively enlarging the paraxial power. As a result, the "under" portion of the filed curvature is corrected toward the "over" side.

This provides an additional advantage that the degree of freedom for correction of aberrations at surfaces other than the aspherical surface can be expanded significantly, such that meridional or sagittal transverse aberrations and distortion aberrations, for example, can be corrected very well.

More preferably, one or more aspherical surfaces satisfying the condition (c2) may be provided in the lens group G1 or G2. This is desirable for better performance. By introducing an aspherical surface into one of or both of the lens groups G1 and G2, mainly distortion aberration and image plane can be corrected effectively.

The provision of an aspherical surface having a region, as defined in condition (c3), in which, from a central portion to a peripheral portion of the surface, the local curvature power thereof gradually increases in the positive direction, is desirable for further improvement of performance.

Use of an aspherical surface such as described above, is effective mainly for correction of the object-side telecentricity and higher order distortion aberration.

In the example described above, of the lens system having five lens groups, the power of the two lens groups having a strong negative refractive power is enlarged to enable correction of astigmatism or curvature of image field which relates to the Petzval sum. However, it influences the balance of telecentricity on the object side because of higher order negative powers, and higher order "under" distortion aberration is produced.

In consideration of it, the object-side telecentricity is well accomplished again and, simultaneously, an "over" distortion aberration in an opposite direction is provided to cancel it. Thus, the correction can be done well.

As described above, with the provision of an aspherical surface which satisfies at least one of the conditions (c1) and (c2), an optical system having a high resolution and being well aberration-corrected can be accomplished. Further, the provision of an aspherical surface satisfying the condition (c3) is effective to provide an optical system of better performance.

Of course, plural aspherical surfaces may be introduced, by which better aberration correction is attained through the whole lens system. When an aspherical surface having a region in which, from a central portion to a peripheral portion of the surface, the local curvature power thereof decreases in the same direction, is introduced into a lens group of positive refractive power wherein the height of the axial marginal light ray is high, that is, the lens group G3 or G5, successful correction of spherical aberration or coma aberration is attainable.

In one preferred form of the present invention, the stop may be disposed in the fourth lens group G4 or the fifth lens group G5. It may be disposed in a lens group or between lens groups.

As regards an aspherical surface lens, the face thereof on the opposite side of its aspherical surface may not always be spherical. If that face comprises a plane surface, the production and assembling operation of such aspherical surface element becomes easier. This is particularly effective where an aspherical surface is to be formed on a lens having a large effective diameter. Some of all aspherical lenses used in a projection optical system may have a flat surface at the face on the opposite side of its aspherical surface. Further, all the aspherical surface lenses may have a flat surface at the face on the opposite side of the aspherical surface.

The face of an aspherical surface lens on the side opposite to its aspherical surface may be formed into an aspherical surface. Namely, a bi-aspherical surface lens may be used. On that occasion, all the aspherical surface lenses in a projection optical system may comprise bi-aspherical surface lenses, or only some of them may comprise bi-aspherical surface lenses.

In the refractive power arrangement of a seven-group type lens system of a projection optical system shown in FIG. 54, at least one aspherical surface which satisfies the condition (3) is introduced to a surface within the optical system, so as to accomplish an optical system wherein aberration are well corrected without excessively increasing the number of element lenses.

Equation (3) defines a condition for effective use of an aspherical surface. With the introduction of at least an aspherical surface satisfying this condition, the effect of using an aspherical surface well functions, and aberrations are corrected successfully.

If the condition (3) is not satisfied, aberration correction becomes difficult unless the number of lenses is made larger.

For example, if the object-to-image distance is 1000 mm and the wavelength used is 193 nm, from equation (3), the aspherical amount $\Delta\text{ASPH}$ becomes equal to 0.001 mm which corresponds to about ten Newton's rings. This is a sufficiently large value as an aspherical surface to be used in a projection optical system.

Further, for more effective use of an aspherical surface in a projection optical system, of seven-group structure, the condition (3) should preferably be changed to:

$$|\Delta\text{ASPH}/L| > 1 \times 10^{-5} \tag{3a}$$

The projection optical system shown in FIG. 54 comprises, from the first lens surface of the object side to the top plane, a first lens group L1 having a positive refractive power, a second lens group L2 having a negative refractive power, a third lens group L3 having a positive refractive power, a fourth lens group L4 having a negative refractive power, a fifth lens group L5 having a positive refractive power, and a sixth lens group L6 having a negative refractive power.

Within this range near the object, the height of the abaxial light ray is high, and the axial light ray is low. Also, adjacent the stop, the height of the abaxial light ray becomes lower, while the axial light ray becomes higher than that at adjacent the object surface.

Thus, before the stop and in the vicinity of the stop, the relation between the height of the principal ray and the height of the axial light ray largely changes. Particularly, accomplishing a large numerical aperture means that, near the object, the numerical aperture light becomes wider.

In consideration of it, before the stop, particularly the production of abaxial aberrations such as distortion aberration, astigmatism, and coma aberrations should be made small as much as possible. If this is not attained, the axial aberrations and abaxial aberrations are not balanced, and the aberration correction for an optical system becomes very difficult. Therefore, preferably, at least one aspherical surface set within the range as defined by equation (3) should be introduced, by which abaxial aberrations such as distortion aberration, astigmatism, and coma aberrations can be corrected effectively.

The stop may be disposed in or adjacent the sixth lens group L6, or in or adjacent the fifth lens group L5.

In the seven-group structure described above, at least one aspherical surface may preferably be provided between the first lens, at the object side, to the position of the stop.

Further, in the seven-group structure, when $h_b$ is a height of a most abaxial chief ray, at least one aspherical surface may preferably be formed on a surface which satisfies a relation $$|h_b/h|>0.35 \qquad (2)$$

In conventional reduction projection optical systems, it is very difficult to satisfactorily correct distortion, curvature of image field, and astigmatism as well as transverse aberrations of meridional and sagittal, while maintaining the telecentricity.

This is because of the following reason. The telecentricity, distortion, curvature of image field, and astigmatism are all aberration amounts related to a principal ray passing through the center of a light flux. Although these aberrations depend on the placement and shape of lenses on the object side where, in the lens system as a whole, the height of the principal ray is high, practically it is very difficult to maintain, on one hand, the telecentricity with respect to principal rays from every object point on the object and, on the other hand, to refract the same principal ray so as to correct the distortion, the curvature of image field and the astigmatism.

Further, since on a lens surface those rays below the meridional are refracted at a height still higher than the principal ray, it is difficult to balance the meridional transverse aberration and aberration concerning these principal rays. Simultaneously, in order to correct the curvature of image field which has a tendency that it is "under" with higher image height, usually a concave lens is used to refract the light strongly. Then, however, the peripheral portion of the sagittal transverse aberration at high image heights further changes "over". Thus, it is difficult to balance them satisfactorily.

Enlarging the numerical aperture and widening the exposure area under these situations directly lead to further enlargement of the object side light flux and image height, and it amplifies the difficulties in aberration correction.

In a projection optical system of seven-group structure according to one preferred form of the present invention, in consideration of the above, the condition of equation (2) is satisfied and an aspherical surface is formed on such surface having a large influence to abaxial principal rays, thereby to concentratedly and effectively correct the above-described aberrations to be improved. This effectively reduces the load for correction of other aberrations, and accomplishes a good optical performance.

If the lower limit of the condition of equation (2) is exceeded, the influence to axial marginal light rays increases, rather than to the abaxial principal rays, and therefore, the effect of correcting the aberrations to be improved diminishes. Thus, it becomes difficult to attain an enlarged numerical aperture and a wider exposure area.

In FIG. 54, condition (2) is satisfied in a range from the object surface to the lens groups G1–G4. Thus, introducing at least one aspherical surface into this range is a condition for better optical performance.

Particularly, when an aspherical surface is introduced into the lens group G1, since the height $h_b$ of the abaxial chief ray is highest, it is very effective to control the distortion aberration coefficient.

Introducing an aspherical surface into the lens group G2 having a negative refractive power is effective to control mainly the field curvature and astigmatism aberration. Since however it is in a cancelling relation with the lens group G1 having a positive refractive power, the distortion aberration coefficient can also be controlled effectively. Since in the positive lens group G3, the height h of the axial light ray is high and using an aspherical surface contributes to the spherical aberration coefficient or the coma aberration coefficient, an aspherical surface may well be introduced to this lens group, for better correction of spherical aberration or coma aberration.

In one preferred form of the present invention, when L is an object-to-image distance of said projection optical system and $\phi$ is the sum of powers of the negative lens groups, a relation $$|L \times \phi_0|>17$$

may preferably be satisfied.

Generally, if the conjugate distance (object-to-image distance) L become longer, the total power $\phi$ of the negative lens groups becomes smaller. If on the other hand the conjugate distance becomes shorter, the total power $\phi$ of the negative lens groups becomes larger.

In one preferred form of the present invention, the product of the conjugate distance and the total power is set to be not less than 17. The total power of the negative refractive power lens group is therefore made larger, mainly for satisfactory correction of the curvature of image field and the astigmatism. If the lower limit of the condition is exceeded, the Petzval sum increases in the positive direction, such that satisfactory correction of the curvature of image field or astigmatism becomes difficult to accomplish.

Further, also in the seven-group structure, conditions as defined by equations (1a), (2a) and (3a) described hereinbefore may preferably be satisfied, for better correction of aberrations.

If, for example, the upper limit of the condition of equation (3a) is exceeded, the aspherical amount becomes large, and the lens processing time becomes long. Further, large higher-order aberrations may be produced at the aspherical surface, which may make the aberration correction difficult.

If the upper limit of the condition of equation (2a) is exceeded, lenses become too close to the object plane and the working distance cannot be kept. If the magnification of the projection optical system is extraordinarily small, the working distance may be kept even though the condition is exceeded. However, an optical system having such an extraordinarily small magnification is not practical for use in lithography.

If the upper limit of the condition of equation (1a) is exceeded, the power of a negative lens group or groups having a negative refractive power becomes too strong.

Therefore, the Petzval sum is over-corrected, and it becomes difficult to mainly correct the curvature of image field and astigmatism, satisfactorily.

Further, the lens diameter of a positive lens group having a positive refractive power becomes larger, or the number of lenses increases.

In a seven-group type lens system, at least one of the following conditions may preferably be satisfied. This improves the effect of using an aspherical surface, and accomplishes a better aberration correction.

(d1) There should be at least two aspherical surfaces which include regions in which, from a central portion to a peripheral portion of the surface, their local curvature powers change with mutually opposite signs.

(d2) At least one of aspherical surfaces provided in a negative lens group should include a region in which, from a central portion to a peripheral portion of the surface, the local curvature power thereof gradually increases in the negative direction or gradually decreases in the positive direction.

(d3) At least one of aspherical surfaces provided in a positive lens group should include a region in which, from a central portion to a peripheral portion of the surface, the local curvature power thereof gradually increases in the positive direction or gradually decreases in the negative direction.

As regards correction of aberration by use of an aspherical surface, generally, there are two ways. One is that an aspherical surface is introduced to a certain lens surface so as to reduce production of aberration at that surface (auxiliary introduction). The other is that an aspherical surface is introduced so as to cancel an aberration in the relationship with other surfaces (positive introduction). The present invention is fundamentally based on the latter, and aberrations are well corrected thereby.

By establishing a cancelling relation between local powers of two aspherical surfaces while satisfying the condition (d1) above, it becomes easy to produce a change in refractive power such that plural aberrations can be minimized simultaneously.

Particularly, higher order aberrations which can not be easily corrected, such as distortion, curvature of field, astigmatism, sagittal transverse aberration or meridional transverse aberration, in higher order regions, for example, can be well corrected by the function of the condition (d1) above.

More preferably, two aspherical surfaces satisfying the condition (d1) may be provided in one of the lens groups G1 and G2. Alternatively, these two aspherical surfaces may be introduced into the lens groups G1 and G2, respectively. This is preferable for better performance.

By introducing aspherical surfaces of the above-described condition into the one or both of the lens groups G1 and G2, mainly distortion aberration and image plane can be corrected effectively.

Satisfying the condition (d2) is particularly effective for correction of curvature of field and meridional and sagittal transverse aberrations.

This is because, if the Petzval sum is well corrected, it is still difficult to correct field curvature of large image height, particularly, sagittal field curvature having a tendency of "under" and, therefore, as described, it is difficult to balance it with the meridional or sagittal transverse aberrations.

In one preferred form of the present invention, by introducing an aspherical surface satisfying the condition (d2), the power in the negative refractive power direction of the peripheral portion is made large, without excessively enlarging the paraxial power. As a result, the "under" portion of the field curvature is corrected toward the "over" side.

This provides an additional advantage that the degree of freedom for correction of aberrations at surfaces other than the aspherical surface can be expanded significantly, such that meridional or sagittal transverse aberrations and distortion aberrations, for example, can be corrected very well.

More preferably, one or more aspherical surfaces satisfying the condition (d2) may be provided in the lens group G1 or G2. This is desirable for better performance. By introducing an aspherical surface into one of or both of the lens groups G1 and G2, mainly distortion aberration and image plane can be corrected effectively.

The provision of an aspherical surface having a region, as defined in condition (d3), in which, from central portion to a peripheral portion of the surface, the local curvature power thereof gradually increases in the positive direction, is desirable for further improvement of performance.

Use of an aspherical surface such as described above, is effective mainly for correction of the object-side telecentricity and higher order distortion aberration.

In the example described above, of the lens system having seven lens groups, the power of the three lens groups is enlarged to enable correction of astigmatism or curvature of image field which relates to the Petzval sum. However, it influences the balance of telecentricity on the object side because of higher order negative powers, and higher order "under" distortion aberration is produced.

In consideration of it, the object-side telecentricity is well accomplished again and, simultaneously, an "over" distortion aberration in an opposite direction is produced to cancel it. Thus, the correction can be done well.

As described above, with the provision of an aspherical surface which satisfies at lease one of the conditions (d1) and (d2), an optical system having a high resolution and being well aberration-corrected can be accomplished. Further, the provision of an aspherical surface satisfying the condition of (d3) is effective to provide an optical system of better performance.

Of course, plural aspherical surfaces may be introduced, in addition to the above-described aspherical surface, by which better aberration correction is attained through the whole lens system. When an aspherical surface having a region in which, from a central portion to a peripheral portion of the surface, the local curvature power thereof decreases in the same direction, is introduced into a lens group of positive refractive power wherein the height of the axial marginal light ray is high, that is, the lens group G5 or G7, successful correction of spherical aberration or coma aberration is attainable.

As regards an aspherical surface lens, the face thereof on the opposite side of its aspherical surface may not always be spherical. If that face comprises a plane surface, the production and assembling operation of such aspherical surface element becomes easier. This is particularly effective where an aspherical surface is to be formed on a lens having a large effective diameter. Some of all aspherical surface lenses used in a projection optical system may have a flat surface at the face on the opposite side of its aspherical surface. Further, all the aspherical surface lenses may have a flat surface at the face on the opposite side of the aspherical surface.

The face of an aspherical surface lens on the side opposite to its aspherical surface may be formed into an aspherical surface. Namely, a bi-aspherical surface lens may be used. On that occasion, all the aspherical surface lenses in a projection optical system may comprise bi-aspherical surface lenses, or only some of them may comprise bi-aspherical surface lenses.

Next, an example of an aspherical surface processing method applicable to a projection optical system of the present invention will be described.

As regards a process for forming an aspherical surface lens which can meet a large diameter lens to be used in lithography or the like, an example is reported in "Computer-controlled polishing of telescope mirror segments", Robert A. Jones, OPTICAL ENGINEERING, Mar/Apr Vol. 22, No. 2, 1983. In this example, a three-dimensionally computer-controlled grinding machine is used to produce an aspherical surface shape and, thereafter, a computer-controlled polishing machine (CCP) is used to finish the same. A shape precision of 0.025 λrms (λ=633 nm) is reported.

Figure 88:
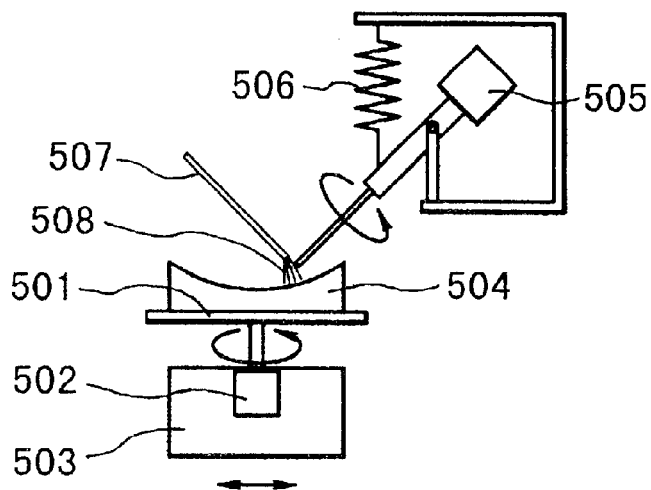
FIG. 88 is a schematic view of an aspherical surface processing system usable in the present invention.

FIG. 88 is a schematic view for explaining a procedure for making an aspherical surface by mechanical processings. Denoted in the drawing at 501 is a substrate, and denoted at 502 is a substrate rotating mechanism. Denoted at 503 is a stage, and denoted at 504 is a spherical surface pad. Denoted at 505 is a spherical surface pad rotating mechanism, and denoted at 506 is a load controlling mechanism. Denoted at 507 is a polishing liquid supplying nozzle, and denoted at 508 is a polishing liquid. The substrate 501 is rotatably mounted on the stage 503 which is movable, and the substrate can be rotated by the rotating mechanism 502.

The contact pressure to the surface of the substrate 501 being rotated is controlled by the load controlling mechanism 506. The spherical surface pad 405 being rotated by the pad rotating mechanism 505 contacts the surface of the substrate. The polishing liquid 508 is supplied to the contact surface by the liquid supplying mechanism 507, by which the contact surface is polished.

The position of the stage 503 and the contact pressure of the spherical pad 504 as applied by the load controlling mechanism 506 are controlled by a computer, not shown. With this procedure, an aspherical surface lens can be produced. However, the aspherical surface processing method is not limited to this, and any other method is usable.

Important features of lens projection structures in numerical examples of projection optical systems according to the present invention, will now be described.

EXAMPLE 1

FIG. 1 is a lens sectional view of a projection optical system according to Numerical Example 1 of the present invention. The projection optical system has a reference wavelength 193 nm, a numerical aperture NA=0.65, a projection magnification β=1:4, a lens conjugate distance L=1000 mm, and an exposure region of diameter ∅27.3 mm. This optical system is accomplished by lenses of a small number 17 (seventeen). It uses six aspherical surfaces.

Figure 2:
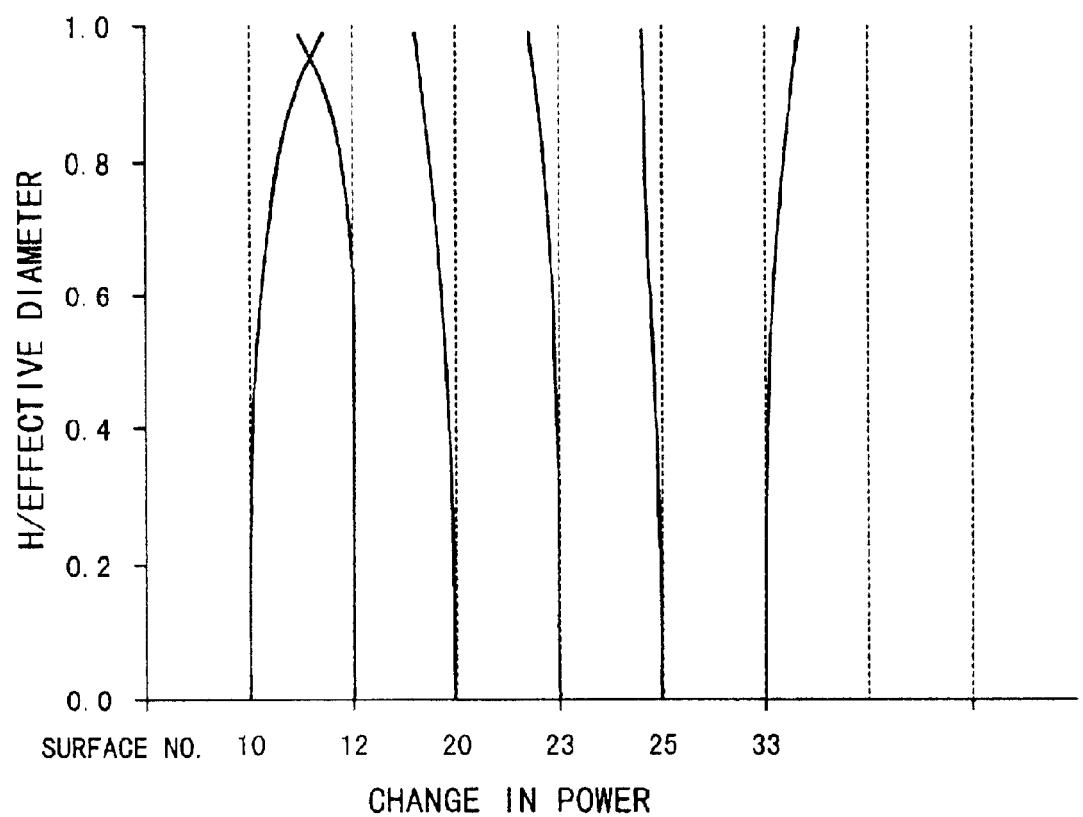
FIG. 2 is a graph for explaining changes in a local curvature power of an aspherical surface of a projection optical system according to Numerical Example 1.
Figure 3:
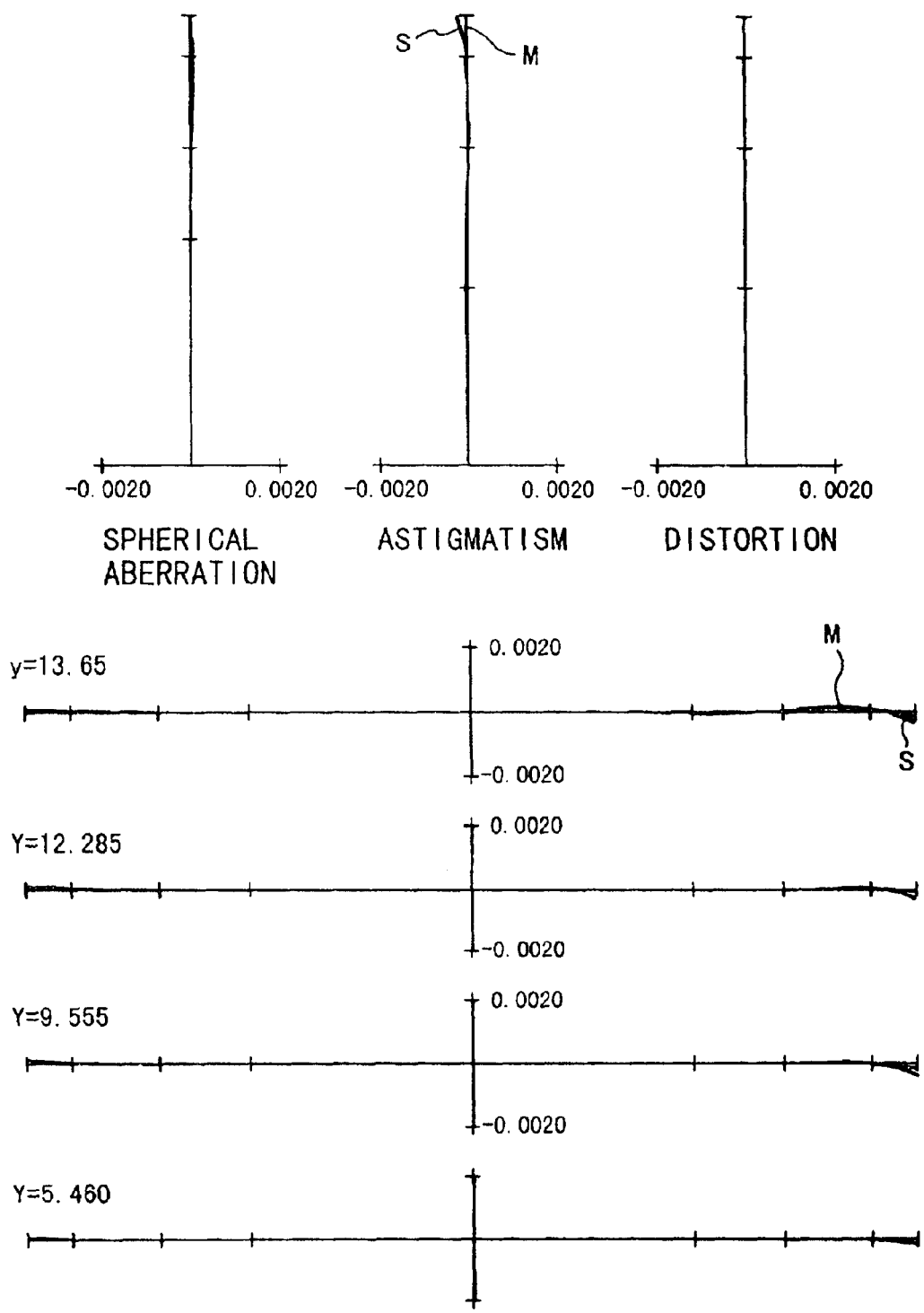
FIG. 3 illustrates aberrations of a projection optical system according to Numerical Example 1.

Table 1 shows specifications of this example, in regard to the conditions. FIG. 2 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward direction correspond to negative and positive directions of the change in local curvature power, respectively. FIG. 3 illustrates aberrations of this example.

In Numerical Example 1, surfaces r1–r8 belong to a positive first lens group G1, all of which are spherical surfaces. Surfaces r9–r16 belong to a negative second lens group G2, wherein r10 and r12 are aspherical surfaces. Surfaces r17–r34 belong to a positive third lens group G3, wherein r20, r23, r25 and r33 are aspherical surfaces.

In this example, as shown in Table 1, first the condition of equation (1) for correction of the Petzval sum is satisfied. Then, as aspherical surfaces satisfying the conditions of equations (2) and (3), two aspherical surfaces are placed in the second group. With this arrangement, the telecentricity, distortion aberration and curvature of field, for example, are corrected well.

The first lens group is provided by one negative lens and three positive lenses.

The second lens group is provided by four negative lenses. The aspherical surfaces at r10 and r12 include regions in which the local curvature powers change with mutually opposite signs so as to cancel each other, for correction of field curvature and distortion, for example. Thus, the functions as defined by conditions (a1) and (a2) described above are satisfied.

The third lens group is provided by eight positive lenses and one negative lens. Five of eight positive lenses are made of fluorite (n=1.5014), for correction of chromatic aberration. In the aspherical surfaces at r20, r23 and r25, the local curvature power changes in the negative direction so as mainly to correct the spherical aberration. The aspherical surface at r33 serves mainly to correct lower orders of the distortion aberration. The local curvature power thereof changes in the positive direction.

In the lens system, a pair of lenses, comprising a negative meniscus lens having its concave surface facing to the image plane side and a positive lens having a first concave surface facing to the image plane side, are disposed, to assist correction of field curvature, coma aberration and distortion aberration.

With this arrangement, aberrations are corrected satisfactorily, as illustrated in FIG. 3.

EXAMPLE 2

Figure 4:
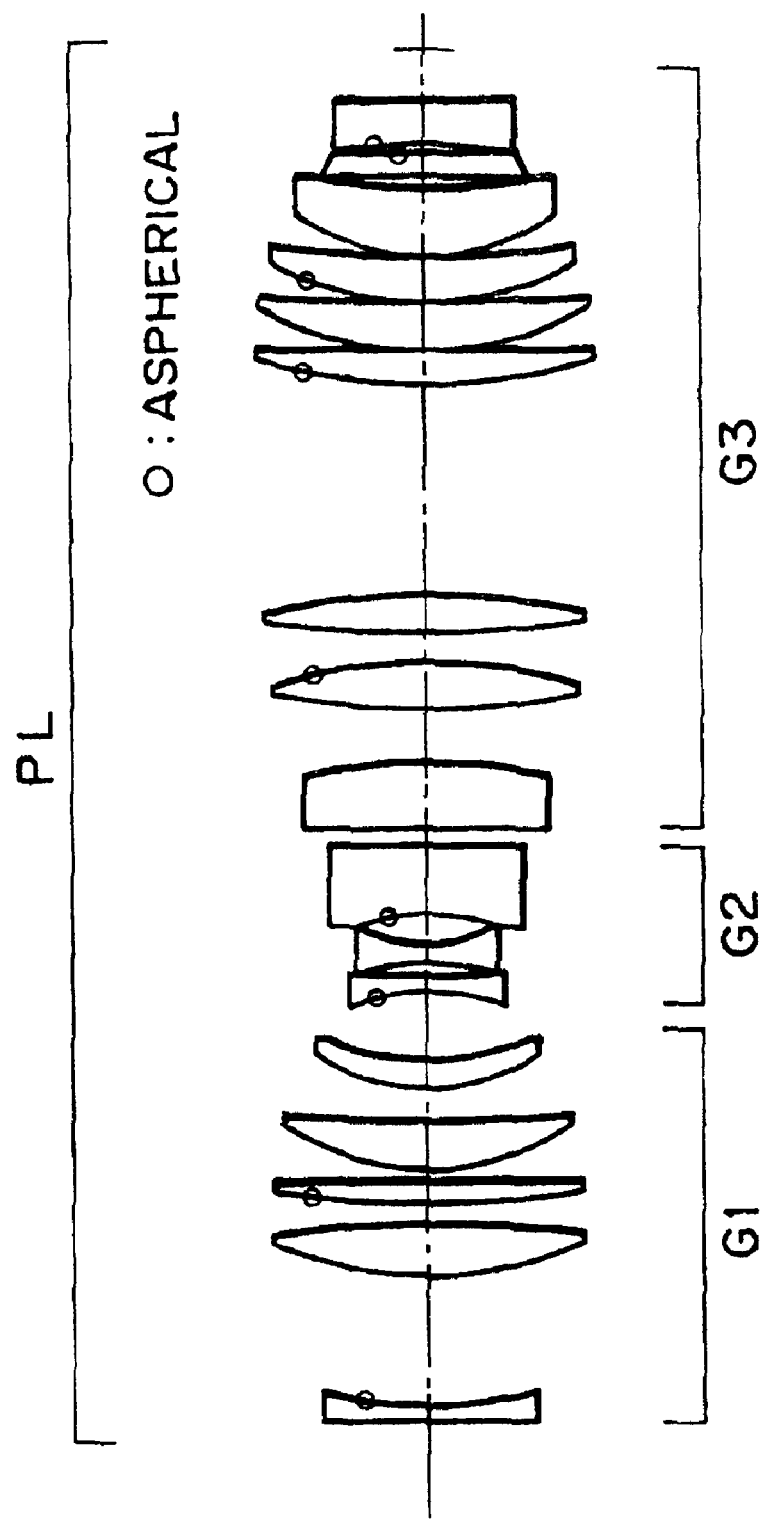
FIG. 4 is a lens sectional view of a projection optical system for use in a projection exposure apparatus, according to Numerical Example 2 of the present invention.

FIG. 4 is a lens sectional view of a projection optical system according to Numerical Example 2 of the present invention. The projection optical system has a reference wavelength 193 nm, a numerical aperture NA=0.65, a projection magnification, β=1:4, a lens conjugate distance L=1000 mm, and an exposure region of diameter ∅27.3 mm. This optical system is accomplished by lenses of a small number 17 (seventeen). It uses nine aspherical surfaces.

Figure 5:
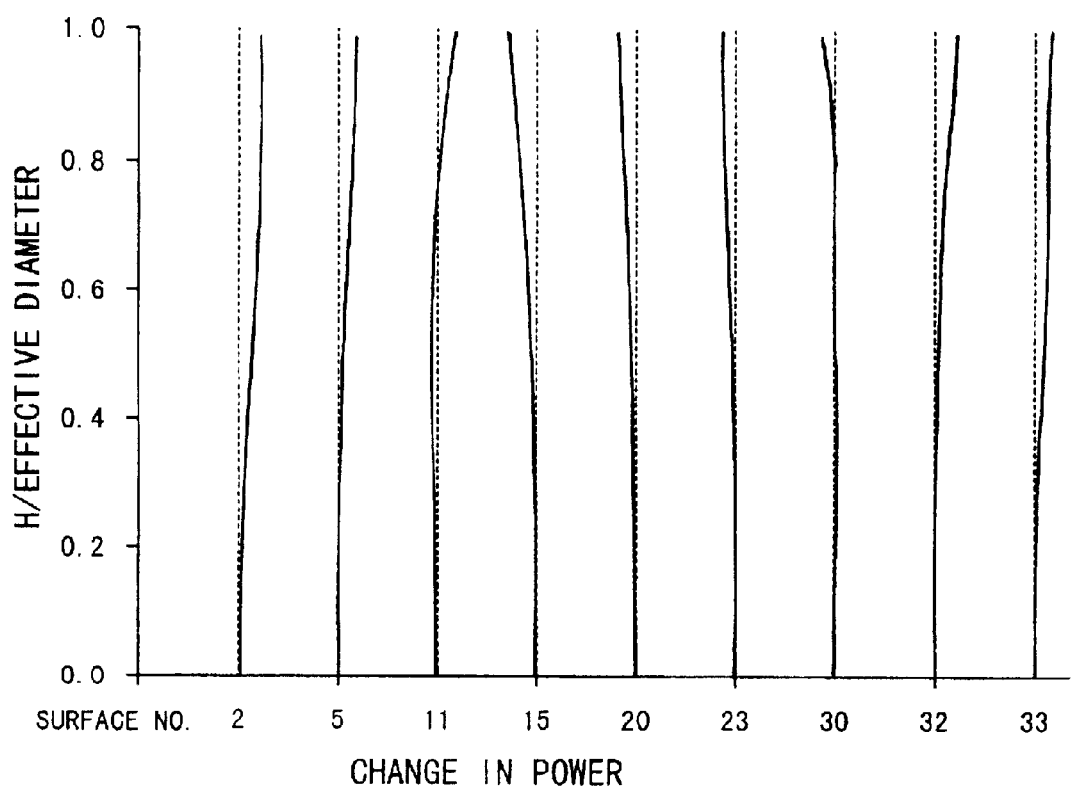
FIG. 5 is a graph for explaining changes in a local curvature power of an aspherical surface of a projection optical system according to Numerical Example 2.
Figure 6:
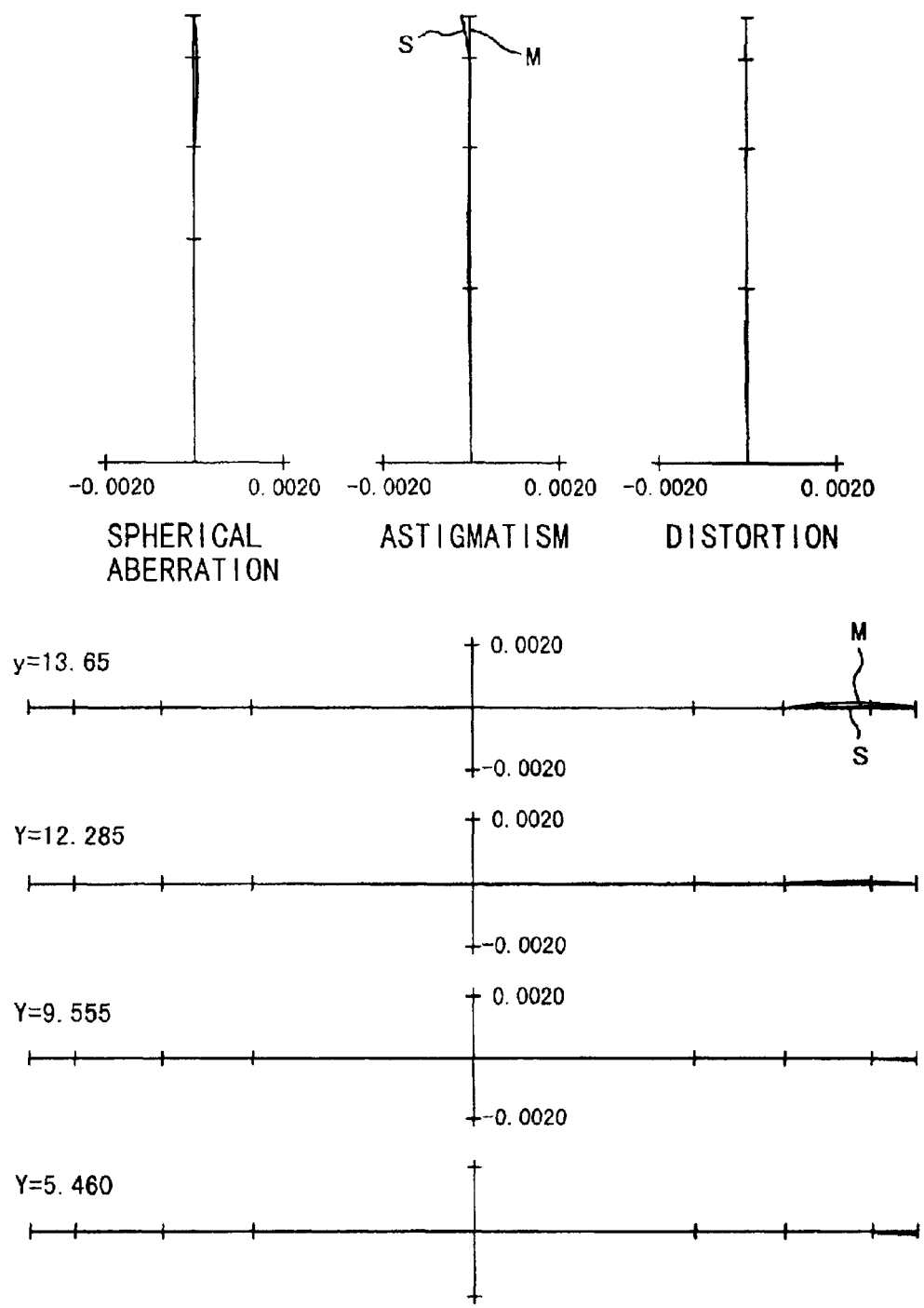
FIG. 6 illustrates aberrations of a projection optical system according to Numerical Example 2.

Table 2 shows specifications of this example, in regard to the conditions. FIG. 5 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 6 illustrates aberrations of this example.

In Numerical Example 2, surfaces r1–10 belong to a positive first lens group G1, wherein r2 and r5 are aspherical surfaces. Surfaces r11–r16 belong to a negative second lens group G2, wherein r11 and r15 are aspherical surfaces. Surfaces r17–r34 belong to a positive third lens group G3, wherein r20, r23, r27, r32 and r33 are aspherical surfaces.

In each of the lenses having aspherical surfaces r2, r5, r15, r23, r32 and r33, the face on the side opposite to its aspherical surface is a plane surface.

In this example, as shown in Table 2, first the condition of equation (1) for correction of the Petzval sum is satisfied.

Then, as aspherical surfaces satisfying the conditions of equations (2) and (3), four aspherical surface are used. Namely, two aspherical surfaces are placed in the first lens group, and two aspherical surfaces are placed in the second lens group. With this arrangement, the telecentricity, distortion aberration and curvature of field, for example, are corrected well.

The first lens group is provided by one negative lens and four positive lenses. The aspherical surfaces at r2 and r5 include regions in which their local curvature powers gradually change in the positive direction. Thus, the function as defined by condition (a3) described above is satisfied.

The second lens group is provided by three negative lenses. In the central portion of the surface at r11 and in the surface at r15, the local curvature power changes in the negative direction, and the function of condition (a2) is satisfied. The aspherical surfaces at r11 and r15 include regions, at peripheral portions, in which the local curvature powers change with mutually opposite signs so as to cancel each other, for correction of higher orders of field curvature and distortion, for example. Thus, the function as defined by condition (a1) described above is satisfied.

Additionally, at the central portion of the surface r11, at the surface r15, at the central portion of the surface r2 of the first lens group G1, and at the surface r5, there are regions in which the local curvature powers change with mutually opposite signs. Thus, also in this respect, the function of condition (a1) is satisfied. This is effective for correction of the telecentricity and distortion, for example.

The third lens group is provided by seven positive lenses and two negative lenses. Five of eight positive lenses are made of fluorite (n=1.5014), for correction of chromatic aberration. In the aspherical surfaces at r20, r23 and r27, the local curvature power changes in the negative direction so as mainly to correct the spherical aberration. The aspherical surfaces at r32 and r33 include regions in which the local curvature powers change in the positive direction, mainly for correction of distortion.

With this arrangement, aberrations are corrected satisfactorily, as illustrated in FIG. 6.

EXAMPLE 3

Figure 7:
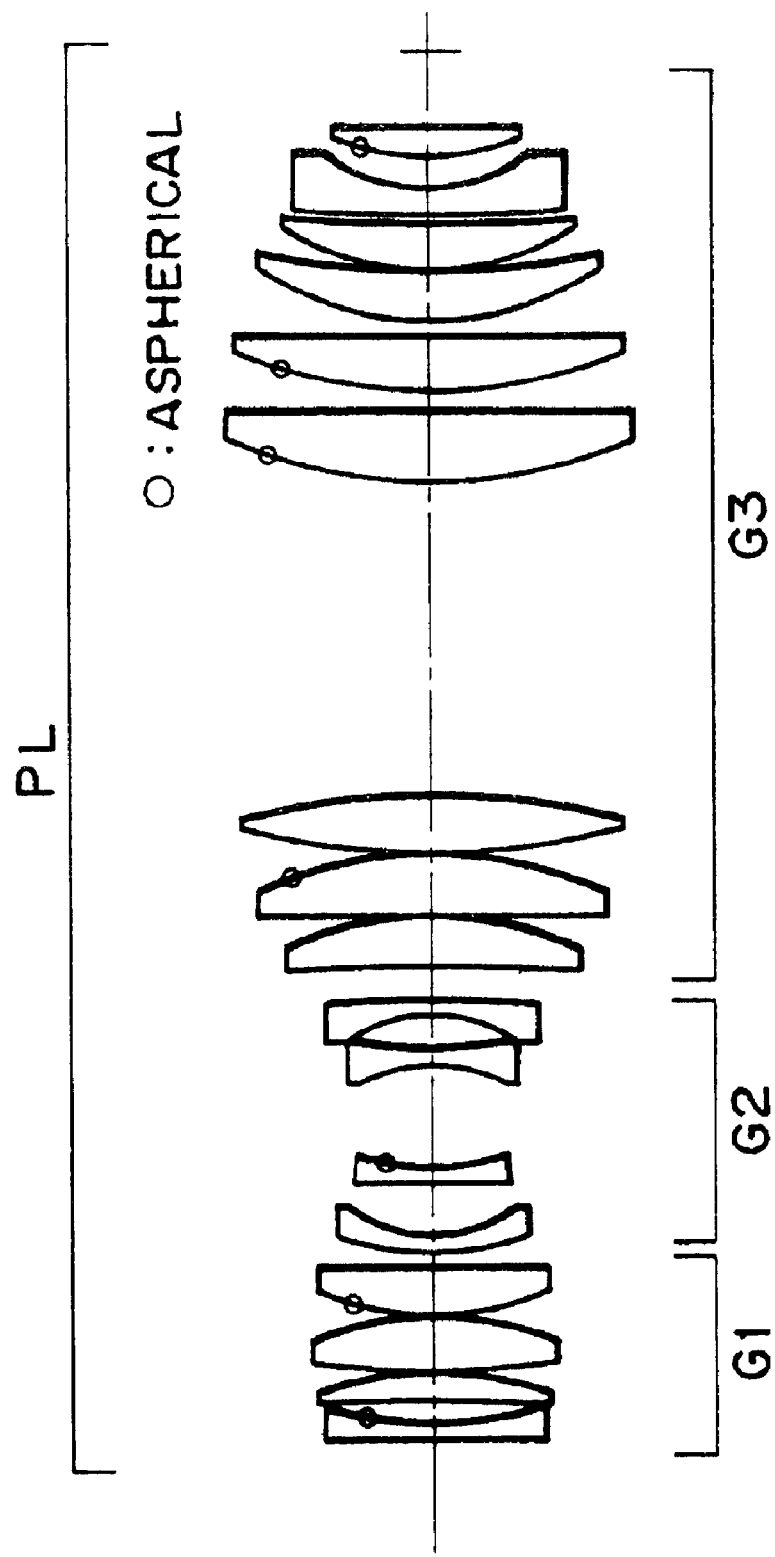
FIG. 7 is a lens sectional view of a projection optical system for use in a projection exposure apparatus, according to Numerical Example 3 of the present invention.
Figure 8:
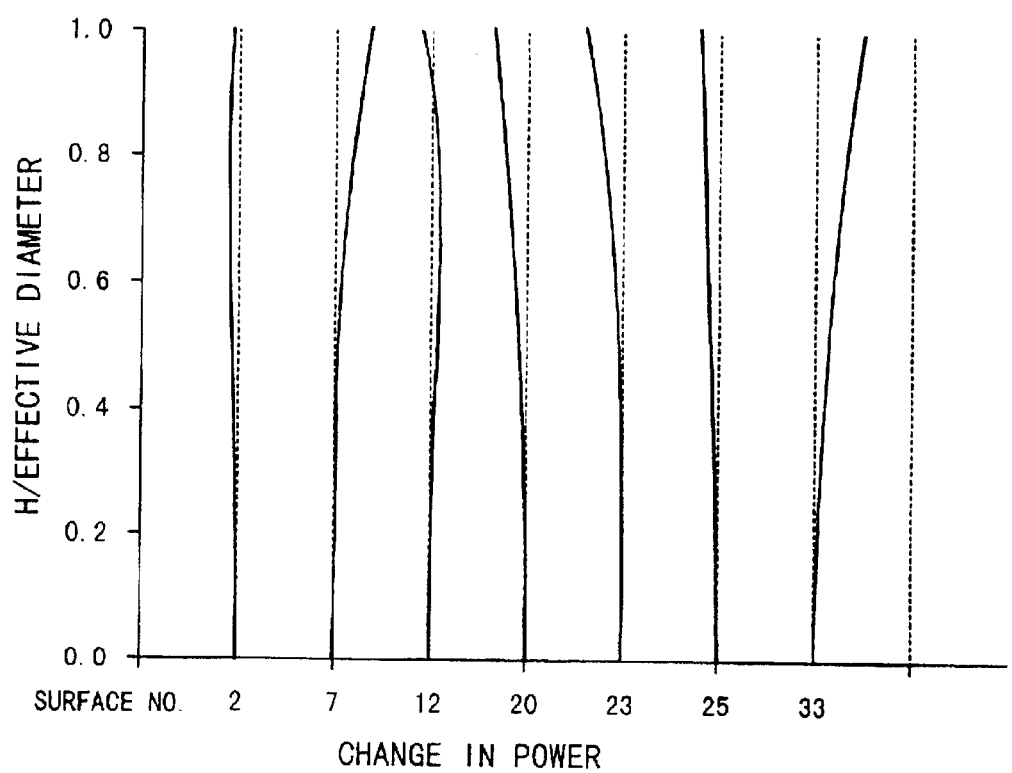
FIG. 8 is a graph for explaining changes in a local curvature power of an aspherical surface of a projection optical system according to Numerical Example 3.

FIG. 7 is a lens sectional view of a projection optical system according to Numerical Example 3 of the present invention. The projection optical system has a reference wavelength 193 nm, a numerical aperture NA=0.65, a projection magnification β=1:4, a lens conjugate distance L=1000 mm, and an exposure region of diameter Ø27.3 mm. This optical system is accomplished by lenses of a small number 17 (seventeen). It uses seven aspherical surfaces.

Figure 9:
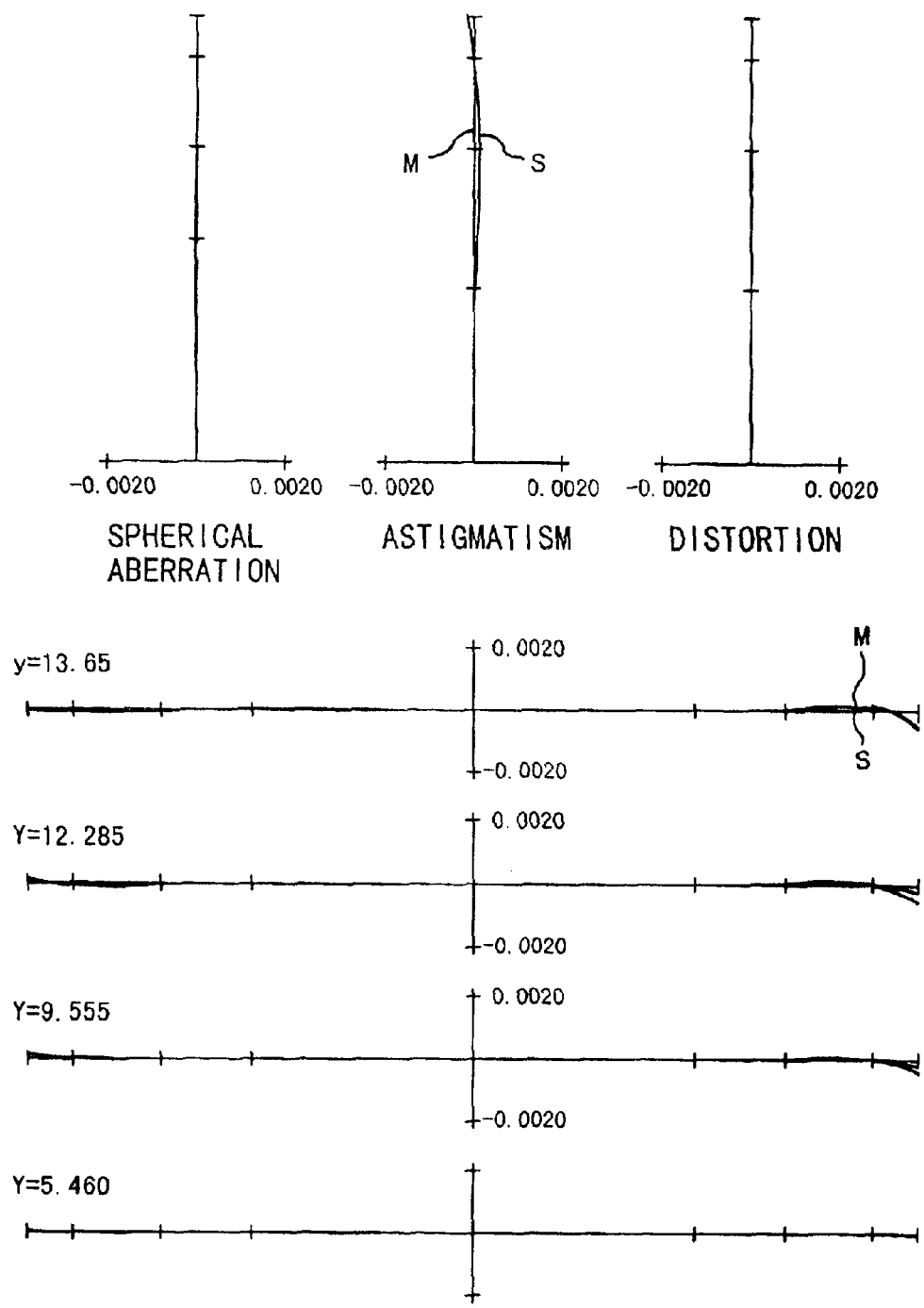
FIG. 9 illustrates aberrations of a projection optical system according to Numerical Example 3.

Table 3 shows specifications of this example, in regard to the conditions. FIG. 7 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 9 illustrates aberrations of this example.

In Numerical Example 3, surfaces r1–r8 belong to a positive first lens group G1, wherein r2 and r7 are aspherical surfaces. Surfaces r9–r16 belong to a negative second lens group G2, wherein r12 is an aspherical surface. Surfaces r17–r34 belong to a positive third lens group G3, wherein r20, r23, r25 and r33 are aspherical surfaces.

In each of the aspherical lenses having aspherical surfaces, the face on the side opposite to its aspherical surface is a plane surface.

In this example, as shown in Table 3, first the condition of equation (1) for correction of the Petzval sum is satisfied. Then, as an aspherical surface satisfying the conditions of equations (2) and (3), three aspherical surfaces are used. Namely, two aspherical surfaces are placed in the first lens group, and one aspherical surface is placed in the second lens group. With this arrangement, the telecentricity, distortion aberration and curvature of field, for example, are corrected well.

The first lens group is provided by one negative lens and three positive lenses. In the aspherical surface at r7, the local curvature power gradually changes in the positive direction, thus satisfying the function defined by condition (a3) described above. Simultaneously, in relation to the central portion of the aspherical surface at r2, their local curvature powers change with mutually opposite signs to cancel each other. Thus, the function as defined by condition (a1) described above is satisfied.

The second lens group is provided by four negative lenses. Two lenses at the image plane side have a large power for correction of the Petzval sum. In order to cancel it, in the central portion of the surface at r12, the local curvature power changes in the positive direction. At the peripheral portion, however, the local curvature power changes in the negative direction, for correction of higher order field curvature. Thus, the function of condition (a2) is satisfied.

Additionally, at this peripheral portion and the aspherical surface r7 of the first lens group G1, the local curvature powers change with mutually opposite signs to cancel with each other. Thus, also the function of condition (a1) is satisfied.

The third lens group is provided by eight positive lenses and one negative lens. In the aspherical surfaces at r20, r23 and r25, the local curvature power changes in the negative direction so as mainly to correct the spherical aberration. The aspherical surface at r33 serves mainly to correct distortion, and the local curvature power thereof changes in the positive direction, mainly for correction of distortion.

In the lens system, a pair of lenses, comprising a negative meniscus lens having its concave surface facing to the image plane side and a positive lens having a first concave surface facing to the image plane side, are disposed, to assist correction of field curvature, coma aberration and distortion aberration.

With this arrangement, aberrations are corrected satisfactorily, as illustrated in FIG. 9.

EXAMPLE 4

Figure 10:
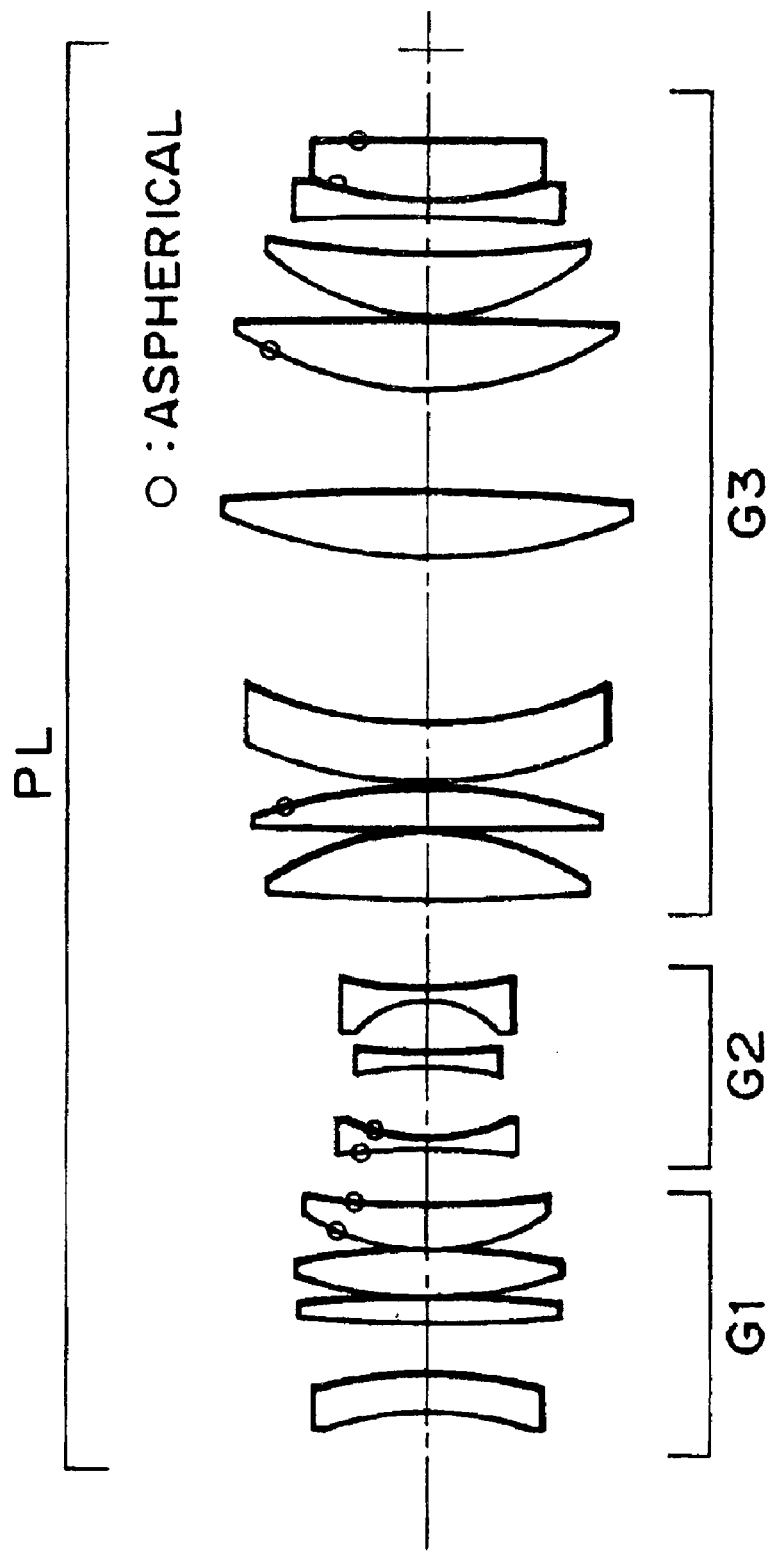
FIG. 10 is a lens sectional view of a projection optical system for use in a projection exposure apparatus, according to Numerical Example 4 of the present invention.

FIG. 10 is a lens sectional view of a projection optical system according to Numerical Example 4 of the present invention. The projection optical system has a reference wavelength 193 nm, a numerical aperture NA=0.65, a projection magnification β=1:4, a lens conjugate distance L=1000 mm, and an exposure region diameter of Ø27.3 mm. This optical system is accomplished by lenses of a small number 15 (fifteen). It uses eight aspherical surfaces.

Figure 11:
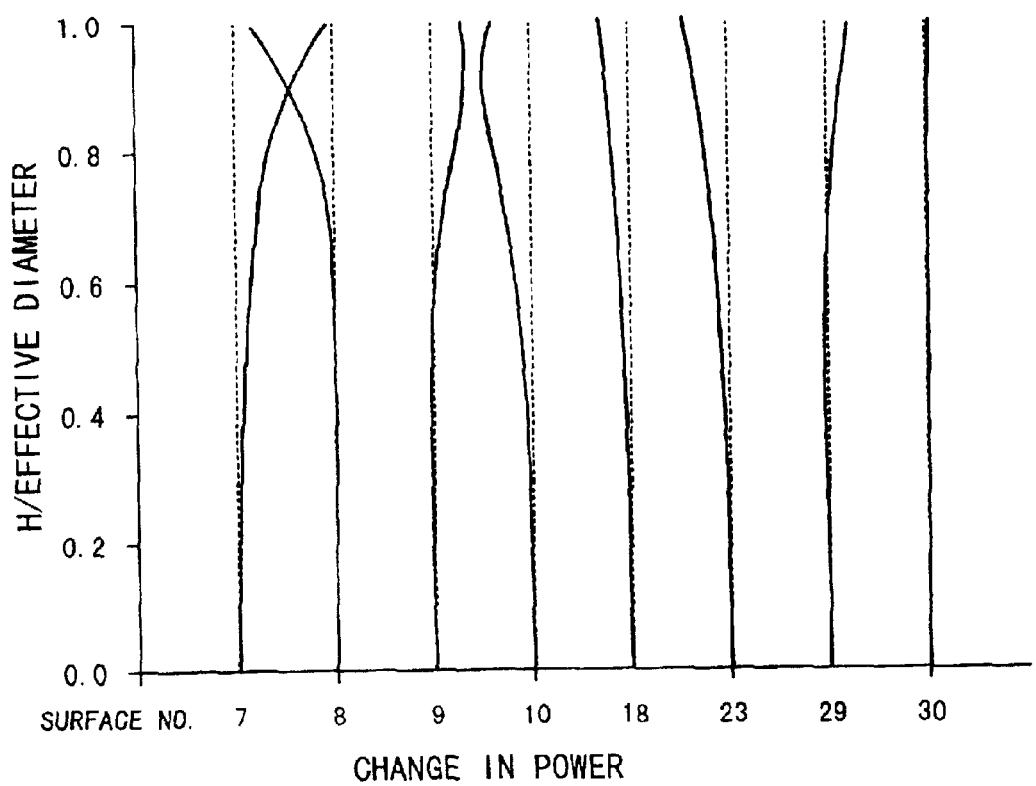
FIG. 11 is a graph for explaining changes in a local curvature power of an aspherical surface of a projection optical system according to Numerical Example 4.
Figure 12:
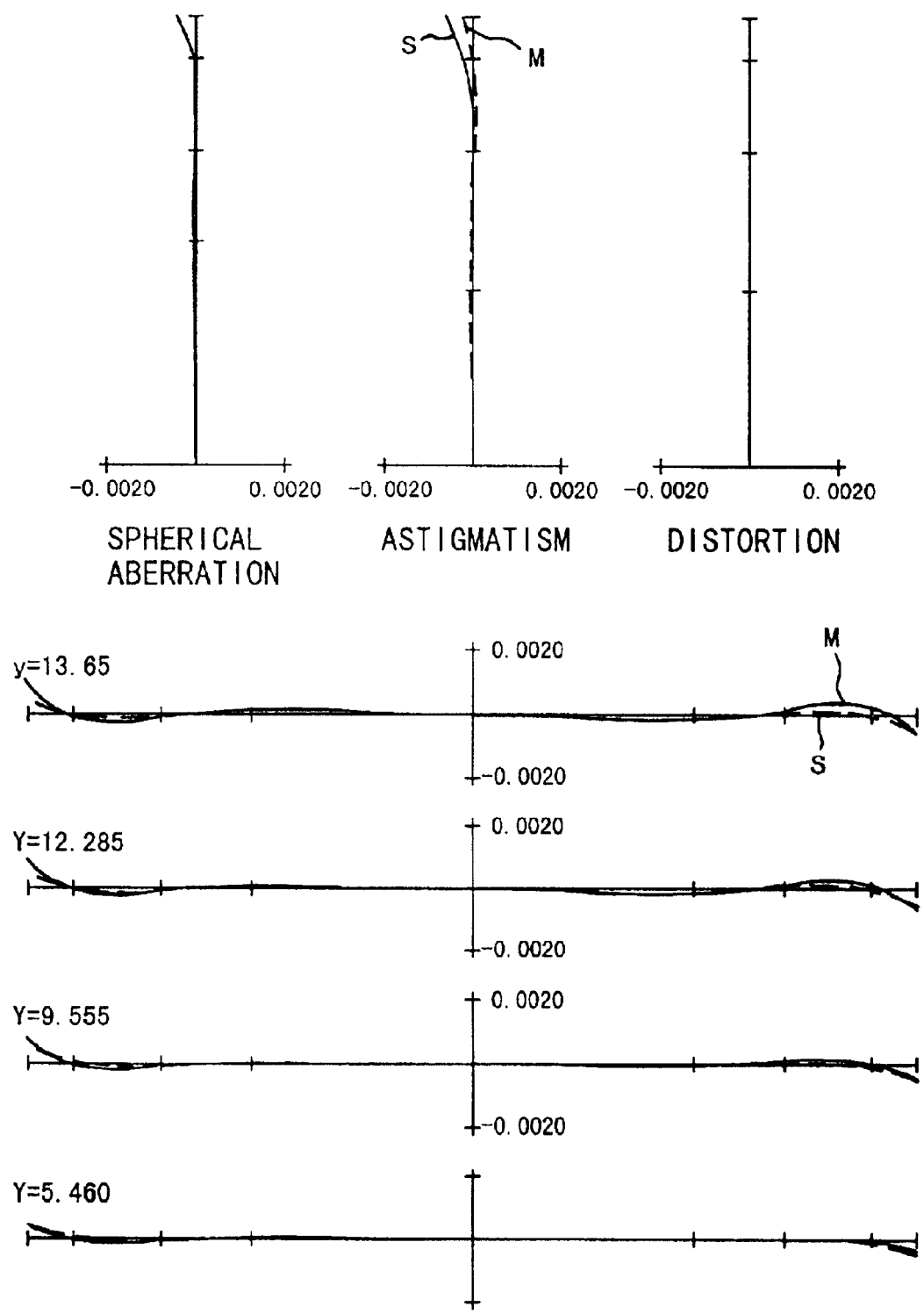
FIG. 12 illustrates aberrations of a projection optical system according to Numerical Example 4.

Table 4 shows specifications of this example, in regard to the conditions. FIG. 11 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 12 illustrates aberrations of this example.

In Numerical Example 4, surfaces r1–r8 belong to a positive first lens group G1, wherein r7 and r8 are aspherical surfaces. Surfaces r9–r14 belong to a negative second lens group G2, wherein r9 and r10 are aspherical surfaces. Surfaces r15–r30 belong to a positive third lens group G3, wherein r18, r23, r29 and r30 are aspherical surfaces.

Each of the lenses having surfaces r7 and r8; r9 and r10; and r29 and r30 is a bi-aspherical surface lens having aspherical surfaces on both sides thereof.

In this example, as shown in Table 4, first the condition of equation (1) for correction of the Petzval sum is satisfied. Then, as aspherical surfaces satisfying the conditions of equations (2) and (3), four aspherical surfaces are used. Namely, two aspherical surfaces are placed in the first lens group, and two aspherical surfaces are placed in the second lens group. With this arrangement, the telecentricity, distortion aberration and curvature of field, for example, are corrected well.

The first lens group is provided by one negative lens and three positive lenses. In the aspherical surfaces at r7 and r8 which are the surfaces of a bi-aspherical surface lens, their local curvature powers change with mutually opposite signs to cancel with each other, thus satisfying the function defined by condition (a1) described above and, simultaneously, the function of condition (a3) described above.

The second lens group is provided by three negative lenses. At the aspherical surfaces r9 and r10 which are the surfaces of a bi-aspherical surface lens, the local curvature powers change with mutually opposite signs to cancel with each other. Thus, the function of condition (a1) is satisfied and, simultaneously, the function of condition (a2) is satisfied.

Similarly, in the relation between the surfaces r8 and r9, and between the surfaces r7 and r10, the function defined by condition (a1) is satisfied. Thus, through mutual cancellation, the telecentricity, distortion and field curvature, for example, are well corrected.

The third lens group is provided by seven positive lenses and one negative lens. In the aspherical surfaces at r18 and r23, the local curvature power changes in the negative direction so as mainly to correct the spherical aberration. In the aspherical surface at r29, the local curvature power thereof at the peripheral portion changes in the positive direction, mainly for correction of distortion.

In the lens system, a pair of lenses, comprising a negative lens having a second concave surface facing to the image plane side and a positive meniscus lens having its first concave surface facing to the image plane side, are disposed, to assist correction of field curvature, coma aberration and distortion aberration.

With this arrangement, aberrations are corrected satisfactorily, as illustrated in FIG. 12.

EXAMPLE 5

Figure 13:
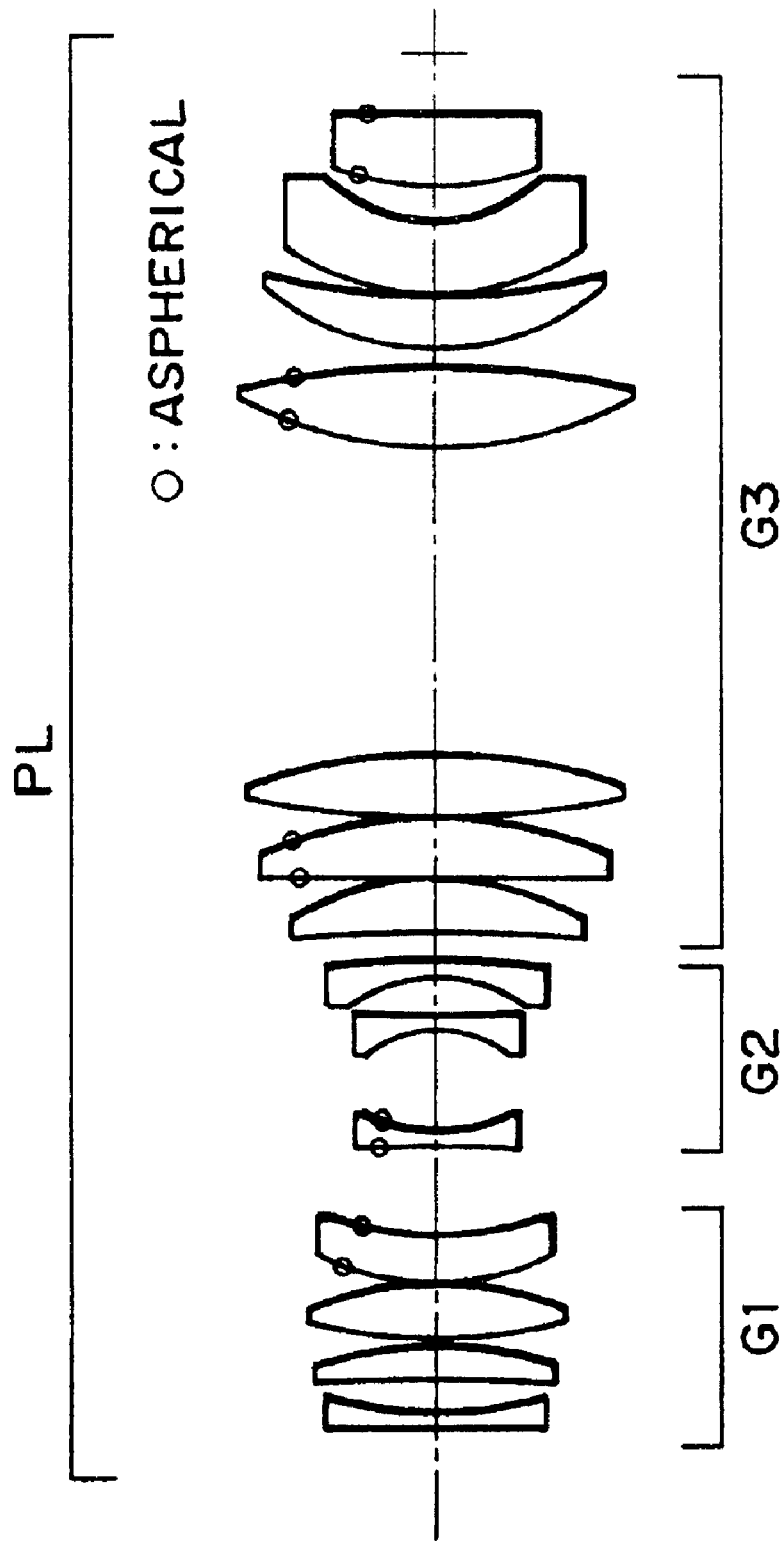
FIG. 13 is a lens sectional view of a projection optical system for use in a projection exposure apparatus, according to Numerical Example 5 of the present invention.

FIG. 13 is a lens sectional view of a projection optical system according to Numerical Example 5 of the present invention. The projection optical system has a reference wavelength 193 nm, a numerical aperture NA=0.65, a projection magnification β=1:4, a lens conjugate distance L=1000 mm, and an exposure region of diameter Ø27.3 mm. This optical system is accomplished by lenses of a very small number 14 (fourteen). It uses ten aspherical surfaces.

Figure 14:
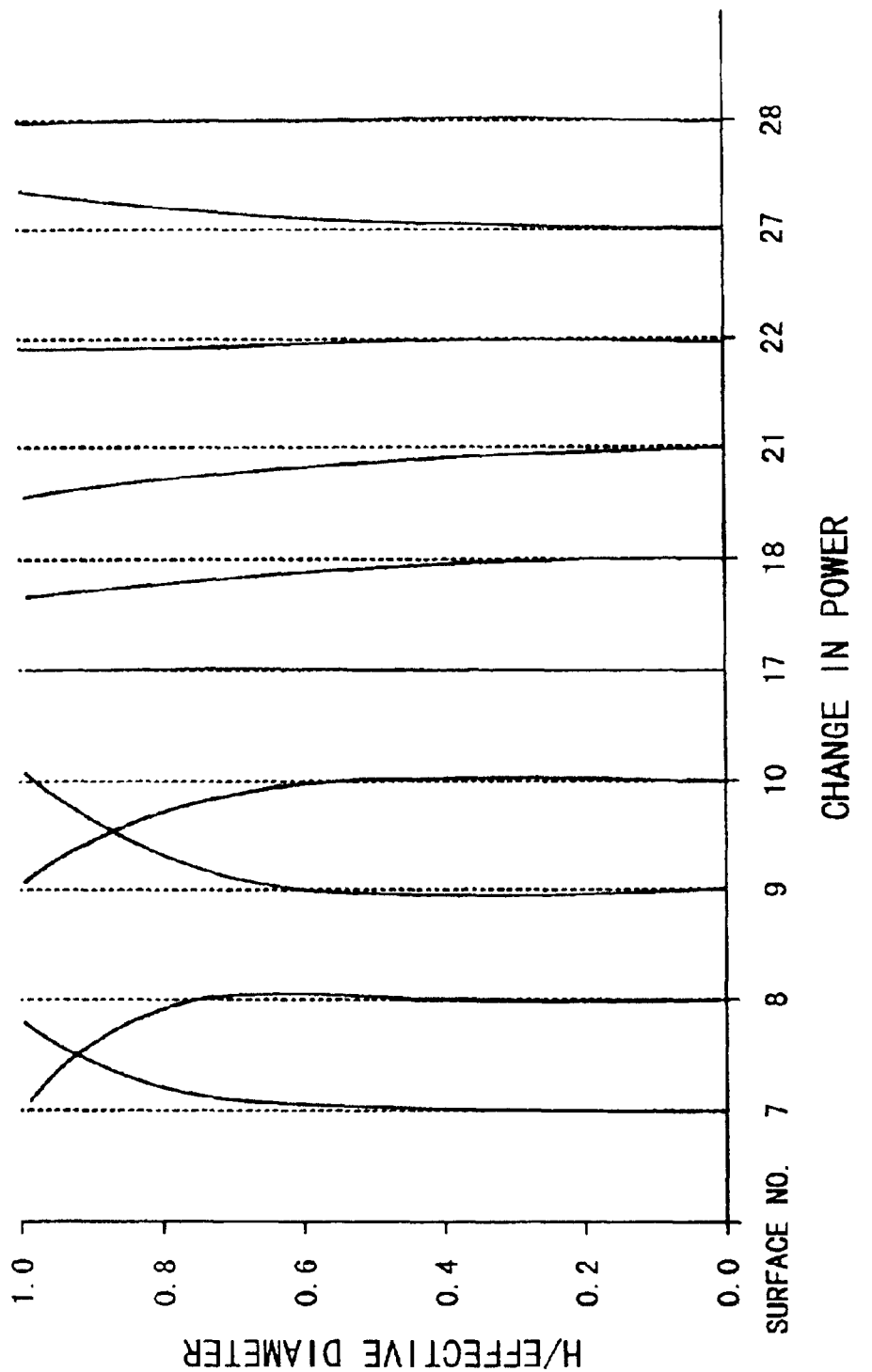
FIG. 14 is a graph for explaining changes in a local curvature power of an aspherical surface of a projection optical system according to Numerical Example 5.
Figure 15:
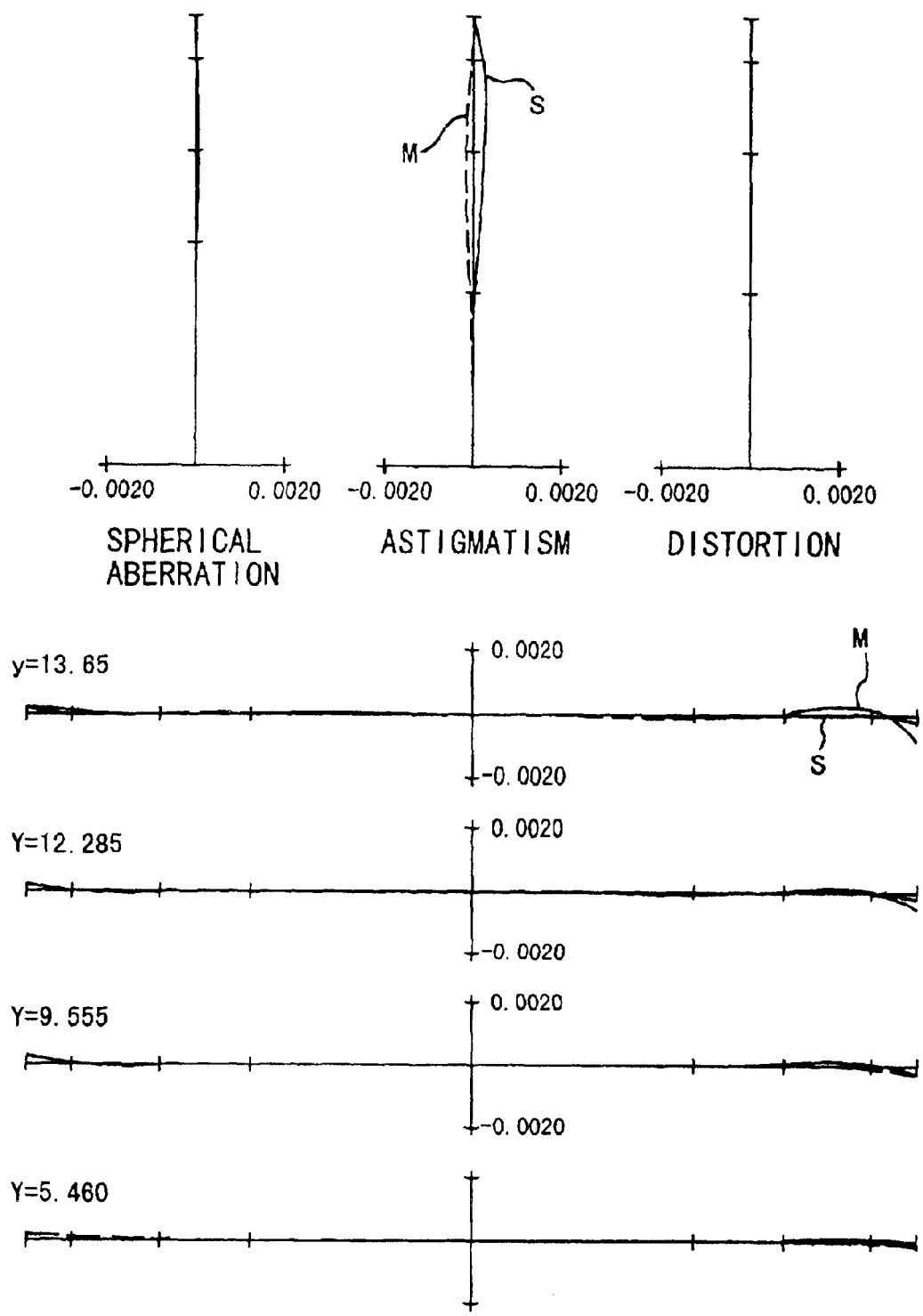
FIG. 15 illustrates aberrations of a projection optical system according to Numerical Example 5.

Table 5 shows specifications of this example, in regard to the conditions. FIG. 14 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 15 illustrates aberrations of this example.

In Numerical Example 5, surfaces r1–r8 belong to a positive first lens group G1, wherein r7 and r8 are aspherical surfaces. Surfaces r9–r14 belong to a negative second lens group G2, wherein r9 and r10 are aspherical surfaces. Surfaces r15–r28 belong to a positive third lens group G3, wherein r17, r18, r21, r22, r27 and r28 are aspherical surfaces.

Each of the aspherical lenses having aspherical surfaces is a bi-aspherical surface lens having aspherical surfaces on both sides thereof.

In this example, as shown in Table 5, first the condition of equation (1) for correction of the Petzval sum is satisfied. Then, as aspherical surfaces satisfying the conditions of equations (2) and (3), four aspherical surfaces are used. Namely, two aspherical surfaces are placed in the first lens group, and two aspherical surfaces placed in the second lens group. With this arrangement the telecentricity, distortion aberration and curvature of field, for example, are corrected well.

The first lens group is provided by one negative lens and three positive lenses. In the aspherical surfaces at r7 and r8 which are the surfaces of a bi-aspherical surface lens, their local curvature powers change with mutually opposite signs to cancel with each other, thus satisfying the function defined by condition (a1) described above and, simultaneously, the function of condition (a3) described above.

The second lens group is provided by three negative lenses. At the aspherical surfaces r9 and r10 which are the surfaces of a bi-aspherical surface lens, the local curvature powers change with mutually opposite signs to cancel with each other. Thus, the function of condition (a1) is satisfied and, simultaneously, the function of condition (a2) is satisfied.

Similarly, in the relation between the surfaces r8 and r9, and between the surfaces r7 and r10, the function defined by condition (a1) is satisfied. Thus, through mutual cancellation, the telecentricity, distortion and field curvature, for example, are well corrected.

The third lens group is provided by six positive lenses and one negative lens. In the aspherical surfaces at r18, r21 and r22, the local curvature power changes in the negative direction so as mainly to correct the spherical aberration. In the aspherical surface at r27, the local curvature power thereof at the peripheral portion changes in the positive direction, for correction of distortion, for example.

In the lens system, a pair of lenses, comprising a negative meniscus lens having a concave surface facing to the image plane side and a positive lens having its first concave surface facing to the image plane side, are disposed, to assist correction of field curvature, coma aberration and distortion aberration.

With this arrangement, aberrations are corrected satisfactorily, as illustrated in FIG. 15.

EXAMPLE 6

Figure 16:
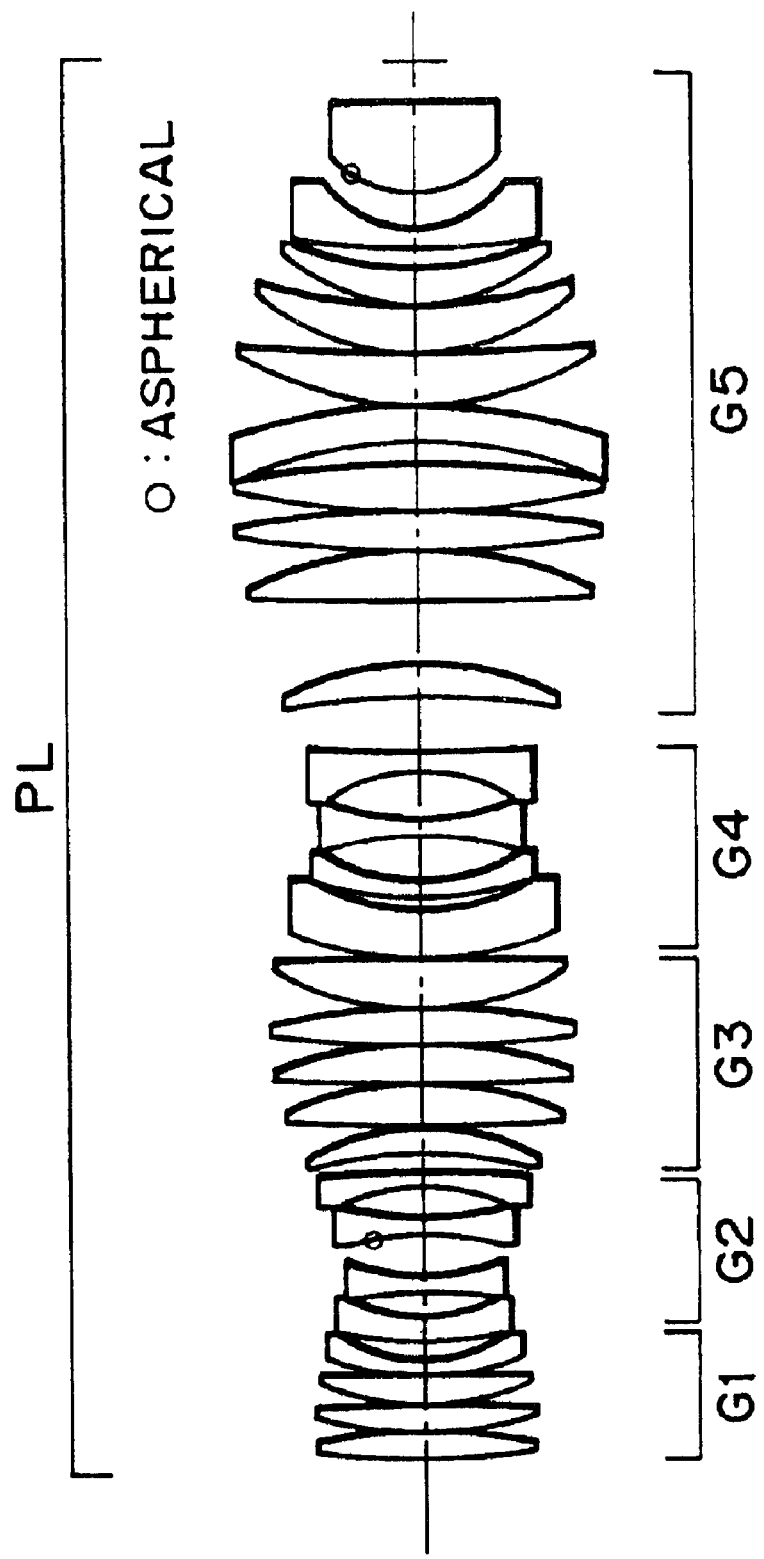
FIG. 16 is a lens sectional view of a projection optical system for use in a projection exposure apparatus, according to Numerical Example 6 of the present invention.

FIG. 16 is a lens sectional view of a projection optical system according to Numerical Example 6 of the present invention. The projection optical system has a reference wavelength 248 nm, a numerical aperture NA=0.65, a projection magnification β=1:4, a lens conjugate distance L=1050 mm, and an exposure region of diameter Ø27.3 mm. This optical system is accomplished by lenses of a number 27 (twenty-seven). It uses two aspherical surfaces.

Figure 17:
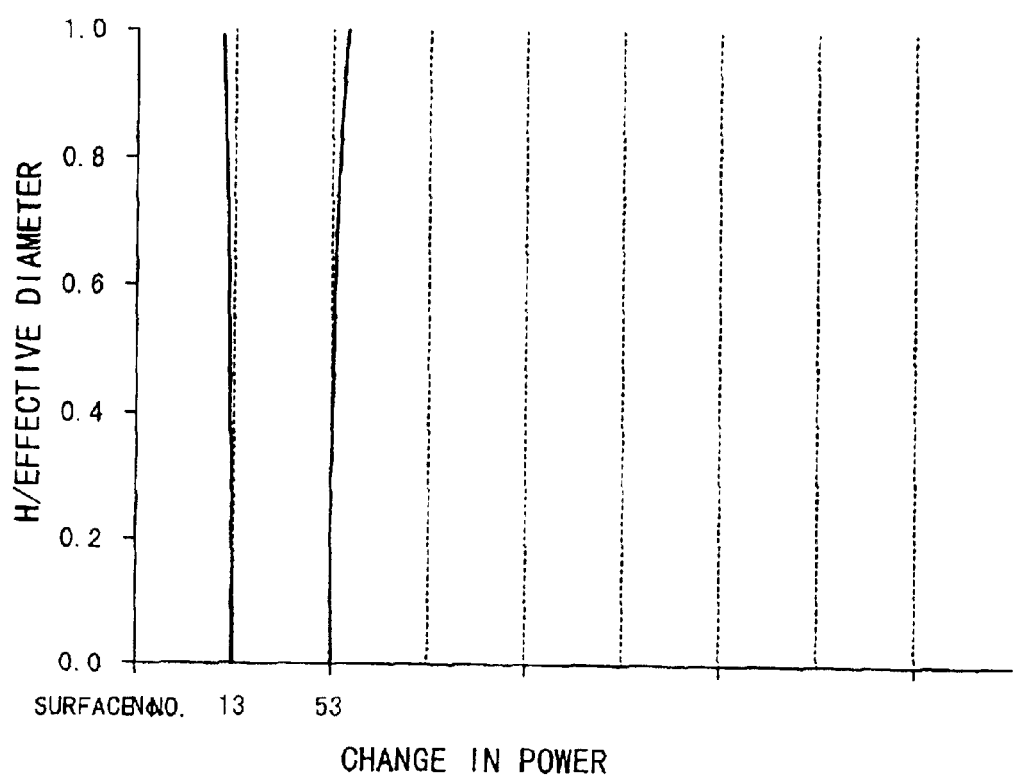
FIG. 17 is a graph for explaining changes in a local curvature power of an aspherical surface of a projection optical system according to Numerical Example 6.
Figure 18:
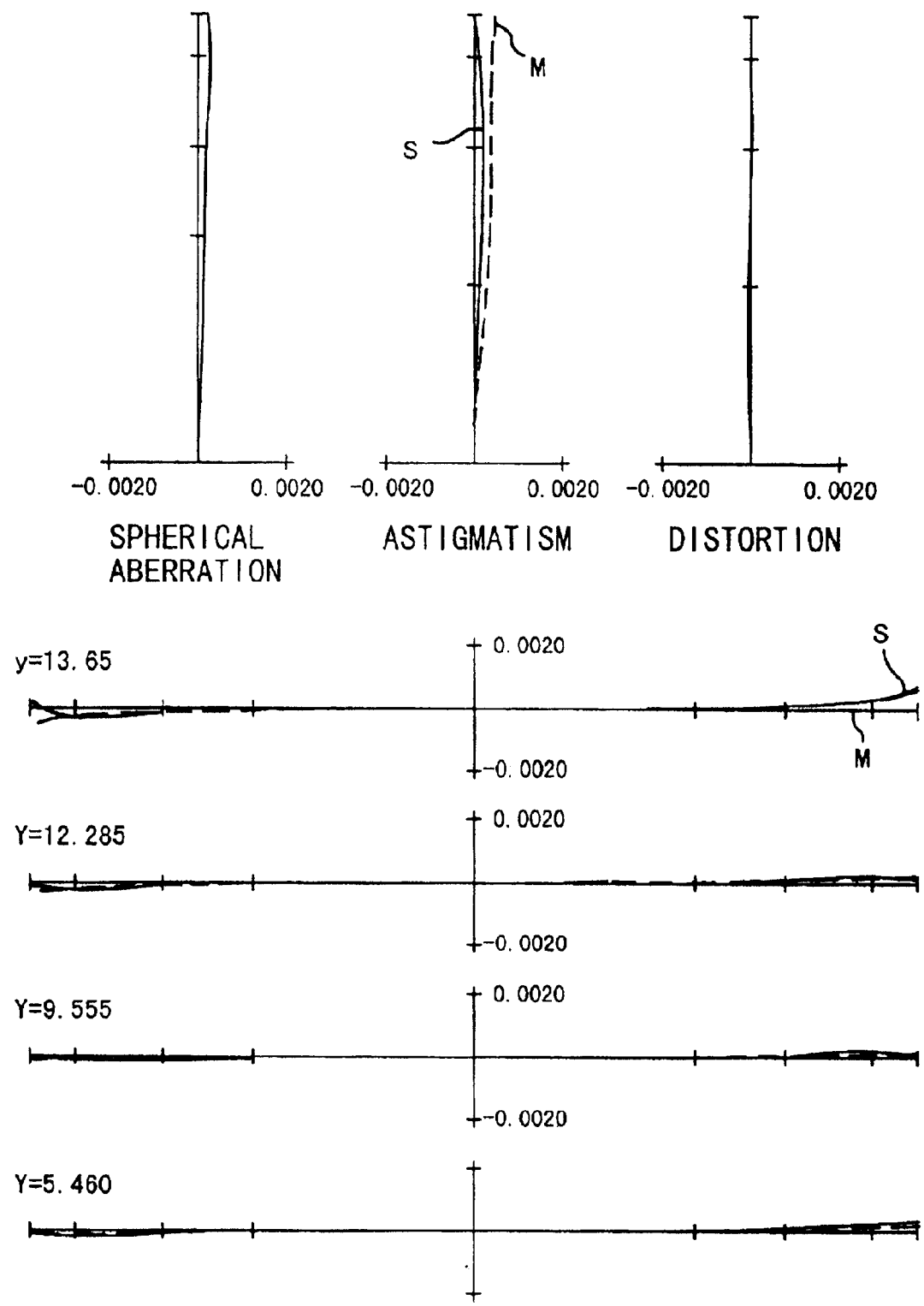
FIG. 18 illustrates aberrations of a projection optical system according to Numerical Example 6.

Table 6 shows specifications of this example, in regard to the conditions. FIG. 17 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 18 illustrates aberrations of this example.

In Numerical Example 6, surfaces r1–r6 belong to a positive first lens group G1, all of which are spherical surfaces. Surfaces r7–r16 belong to a negative second lens group G2, wherein r13 is an aspherical surface. Surfaces r17–r26 belong to a positive third lens group G3, all of which are spherical surfaces. Surfaces r27–r34 belong to a negative fourth lens group G4, all of which are spherical surfaces. Surfaces r35–r54 belong to a positive fifth lens group G5, wherein r53 is an aspherical surface.

In this example, as shown in Table 6, first the condition of equation (1) for correction of the Petzval sum is satisfied. Then, as aspherical surfaces satisfying the conditions of equations (2) and (3), one aspherical surface is placed in the first lens group. With this arrangement, the telecentricity, distortion aberration and curvature of field, for example, are corrected well.

The first lens group is provided by three positive lenses, mainly for correction of telecentricity and distortion.

The second lens group is provided by five negative lenses. At the aspherical surface r13, the local curvature power changes in the negative direction, thus satisfying the function defined by condition (a2). Also, distortion, for example, is corrected in the relationship with the first lens group.

The third lens group is provided by five positive lenses.

The fourth lens group is provided by four negative lenses, and they function mainly to correct the Petzval sum.

The fifth lens group is provided by eight positive lenses and two negative lenses.

With this arrangement, aberrations are corrected satisfactorily, as illustrated in FIG. 18.

EXAMPLE 7

Figure 19:
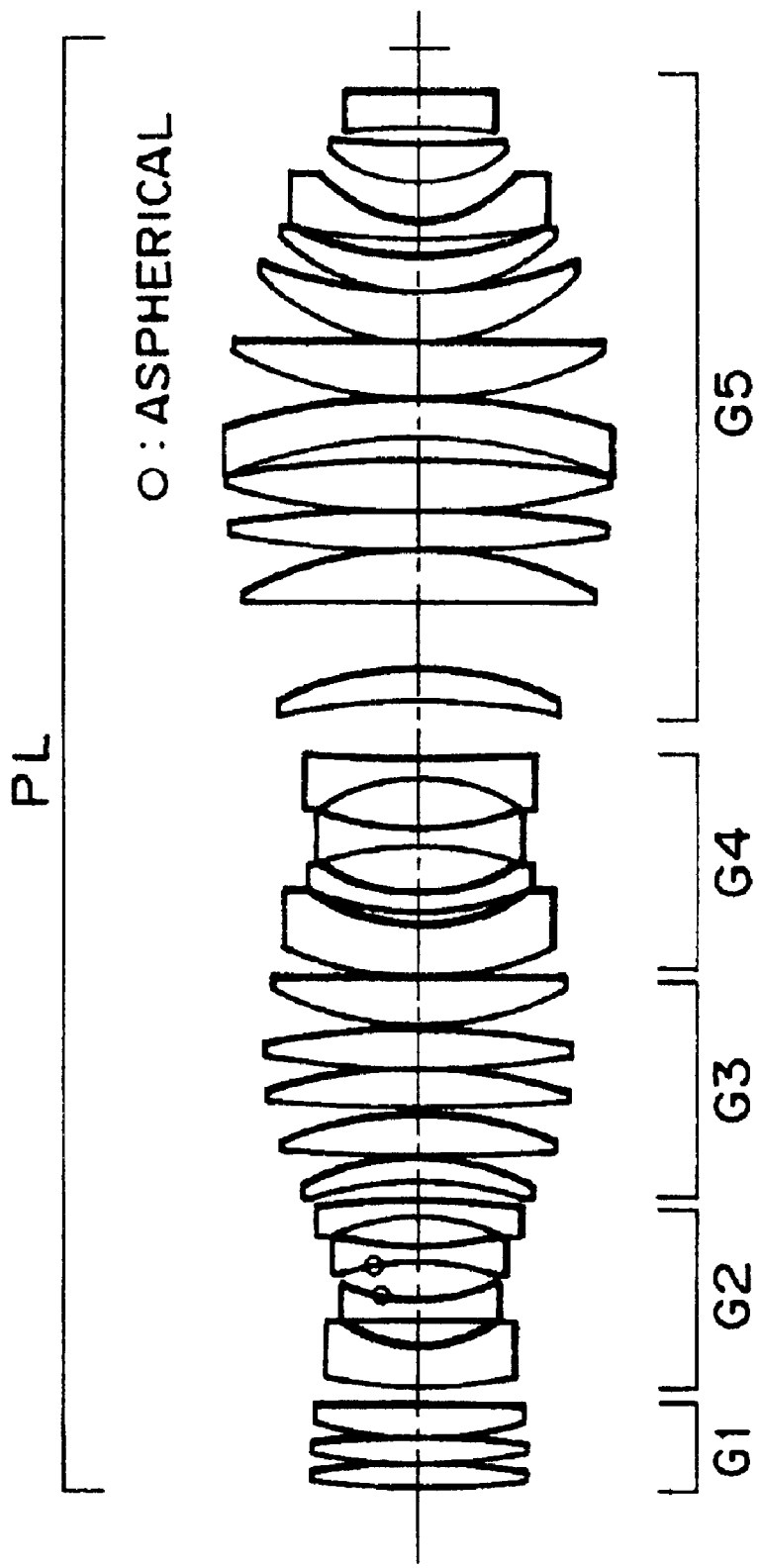
FIG. 19 is a lens sectional view of a projection optical system for use in a projection exposure apparatus, according to Numerical Example 7 of the present invention.

FIG. 19 is a lens sectional view of a projection optical system according to Numerical Example 7 of the present invention. The projection optical system has a reference wavelength 248 nm, a numerical aperture NA=0.65, a projection magnification β=1:4, a lens conjugate distance L=1050 mm, and an exposure region of diameter Ø27.3 mm. This optical system is accomplished by lenses of a number 27 (twenty-seven). It uses two aspherical surfaces.

Figure 20:
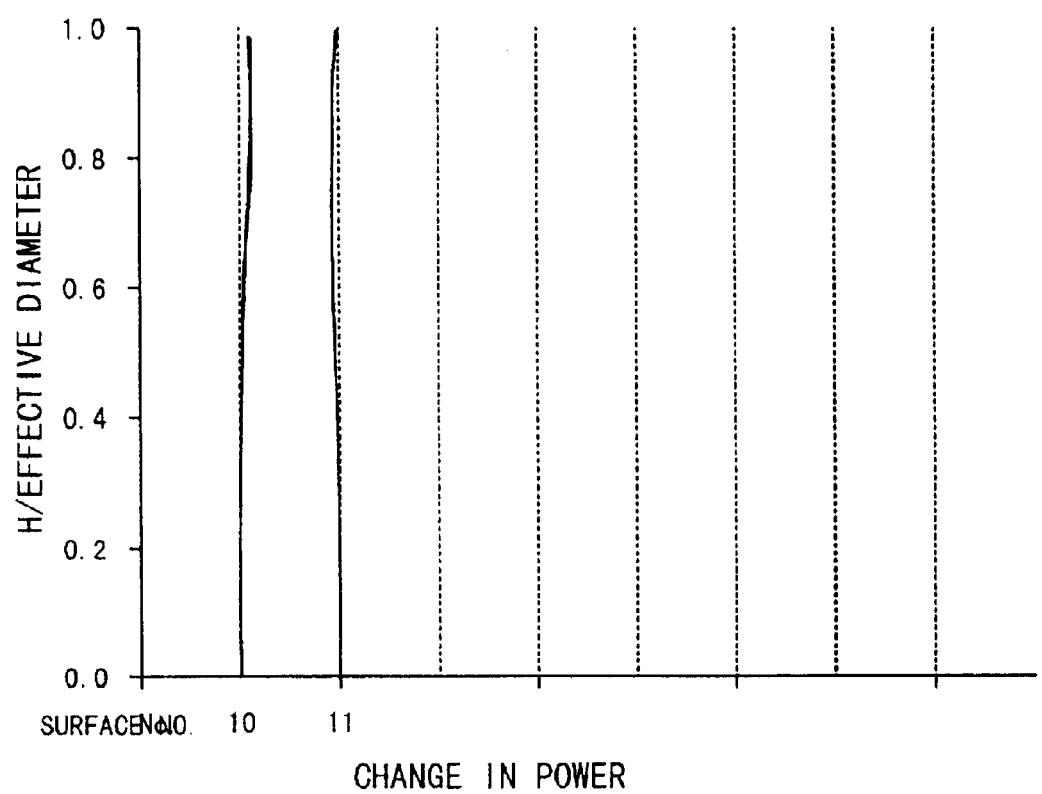
FIG. 20 is a graph for explaining changes in a local curvature power of an aspherical surface of a projection optical system according to Numerical Example 7.
Figure 21:
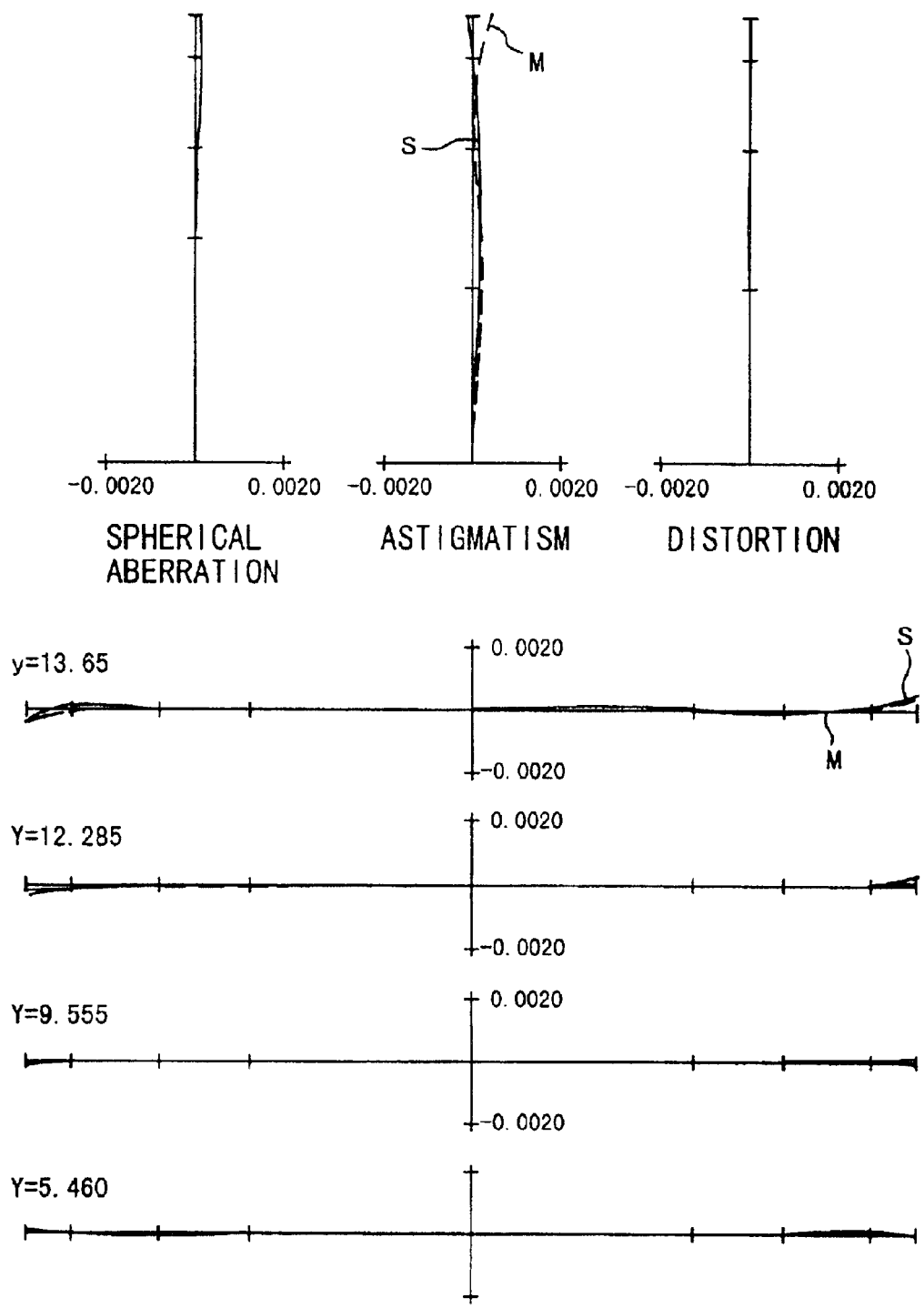
FIG. 21 illustrates aberrations of a projection optical system according to Numerical Example 7.

Table 7 shows specifications of this example, in regard to the conditions. FIG. 20 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 21 illustrates aberrations of this example.

In Numerical Example 7, surfaces r1–r6 belong to a positive first lens group G1, all of which are spherical surfaces. Surfaces r7–r14 belong to a negative second lens group G2, wherein r10 and r11 are aspherical surfaces. Surfaces r15–r24 belong to a positive third lens group G3, all of which are spherical surfaces. Surfaces r25–r32 belong to a negative fourth lens group G4, all of which are spherical surfaces. Surfaces r33–r54 belong to a positive fifth lens group G5, all of which are spherical surfaces.

In this example, as shown in Table 7, first the condition of equation (1) for correction of the Petzval sum is satisfied. Then, as aspherical surfaces satisfying the conditions of equations (2) and (3), two aspherical surfaces are placed in the second lens group. With this arrangement, the telecentricity, distortion aberration and curvature of field, for example, are corrected well.

The first lens group is provided by three positive lenses, mainly for correction of telecentricity and distortion.

The second lens group is provided by four negative lenses. The aspherical surfaces at r10 and r11 include regions in which their local curvature powers change with mutually opposite signs. Thus, the function defined by condition (a1) as well as the function of condition (a2) are satisfied.

The third lens group is provided by five positive lenses.

The fourth lens group is provided by four negative lenses, and they function mainly to correct the Petzval sum.

The fifth lens group is provided by nine positive lenses and two negative lenses.

With this arrangement, aberrations are corrected satisfactorily, as illustrated in FIG. 21.

EXAMPLE 8

Figure 22:
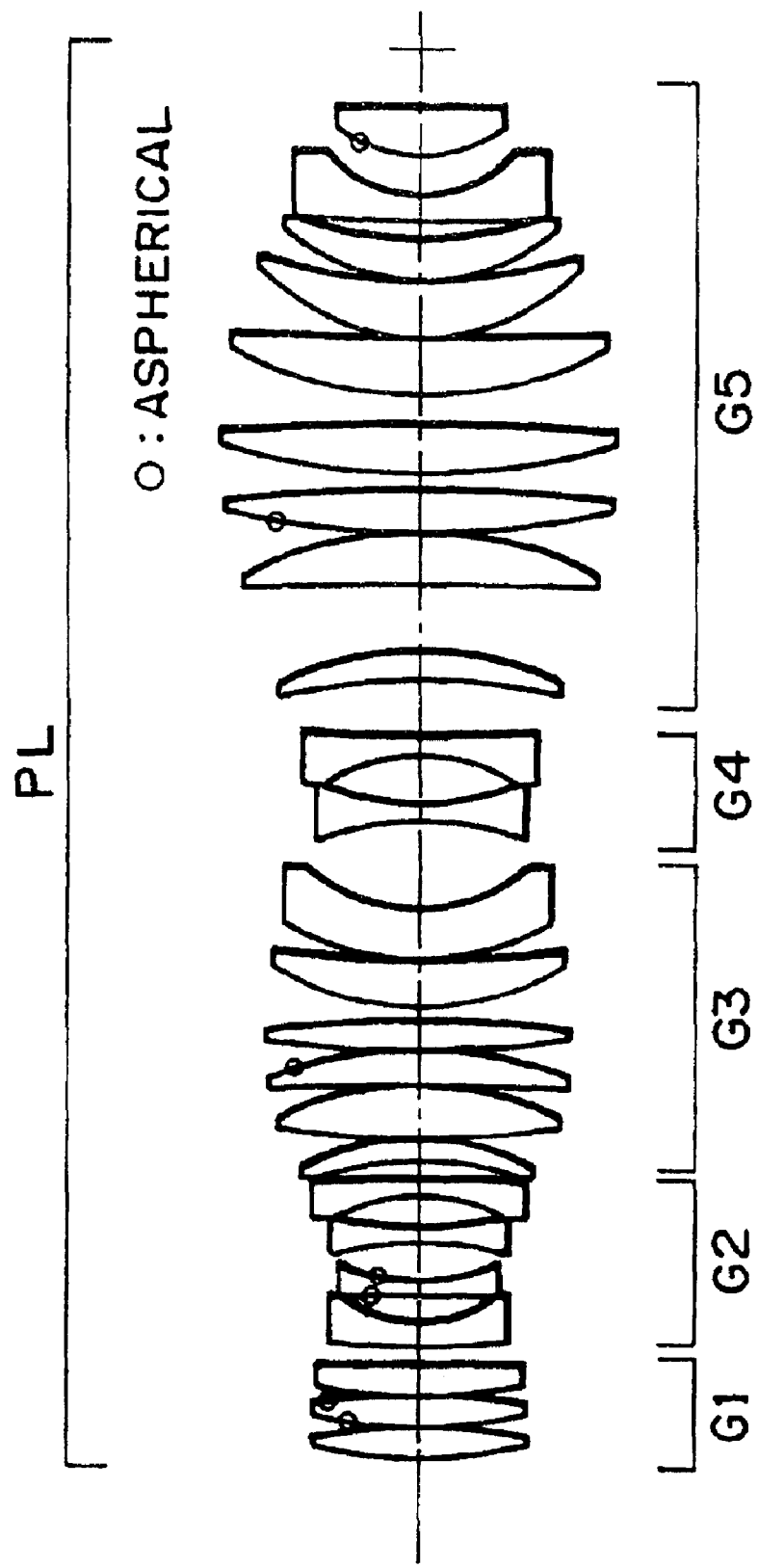
FIG. 22 is a lens sectional view of a projection optical system for use in a projection exposure apparatus, according to Numerical Example 8 of the present invention.

FIG. 22 is a lens sectional view of a projection optical system according to Numerical Example 8 of the present invention. The projection optical system has a reference wavelength 248 nm, a numerical aperture NA=0.65, a projection magnification β=1:4, a lens conjugate distance L=1050 mm, and an exposure region of diameter Ø27.3 mm. This optical system is accomplished by lenses of a number 24 (twenty-four) which is relatively small as a five-group type lens system. It uses seven aspherical surfaces, four of which are aspherical surfaces of two bi-aspherical lenses each having two aspherical surfaces on both sides thereof.

Figure 23:
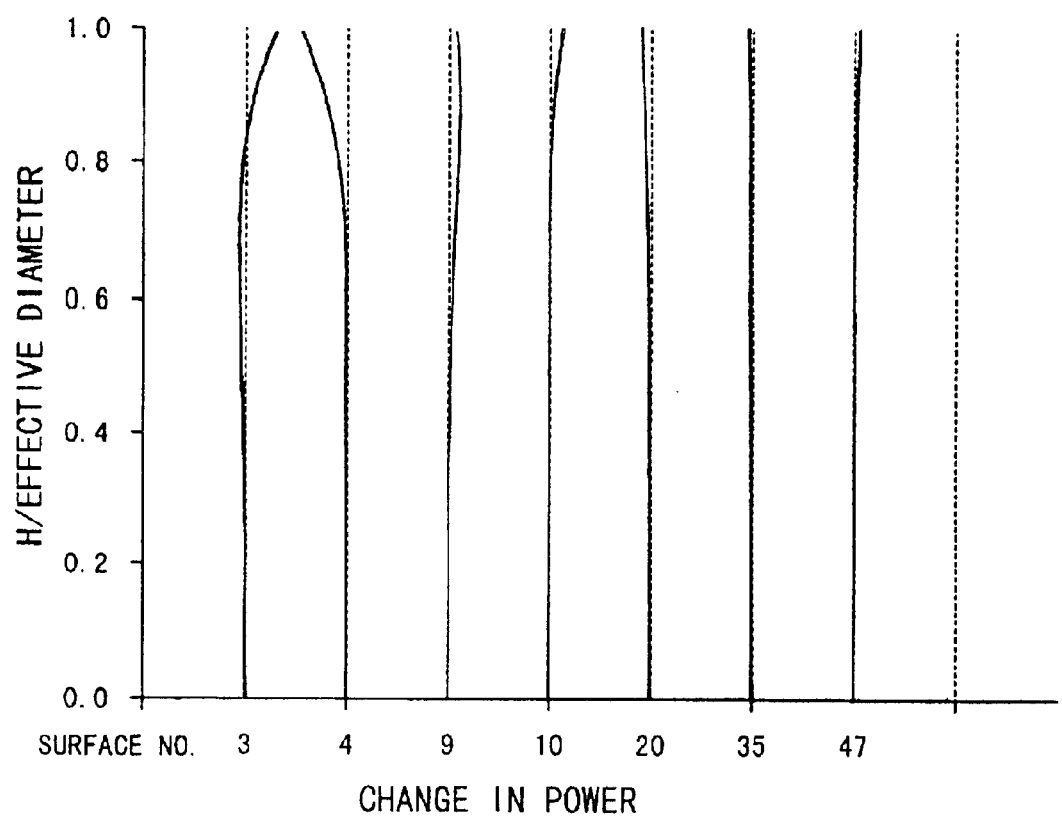
FIG. 23 is a graph for explaining changes in a local curvature power of an aspherical surface of a projection optical system according to Numerical Example 8.
Figure 24:
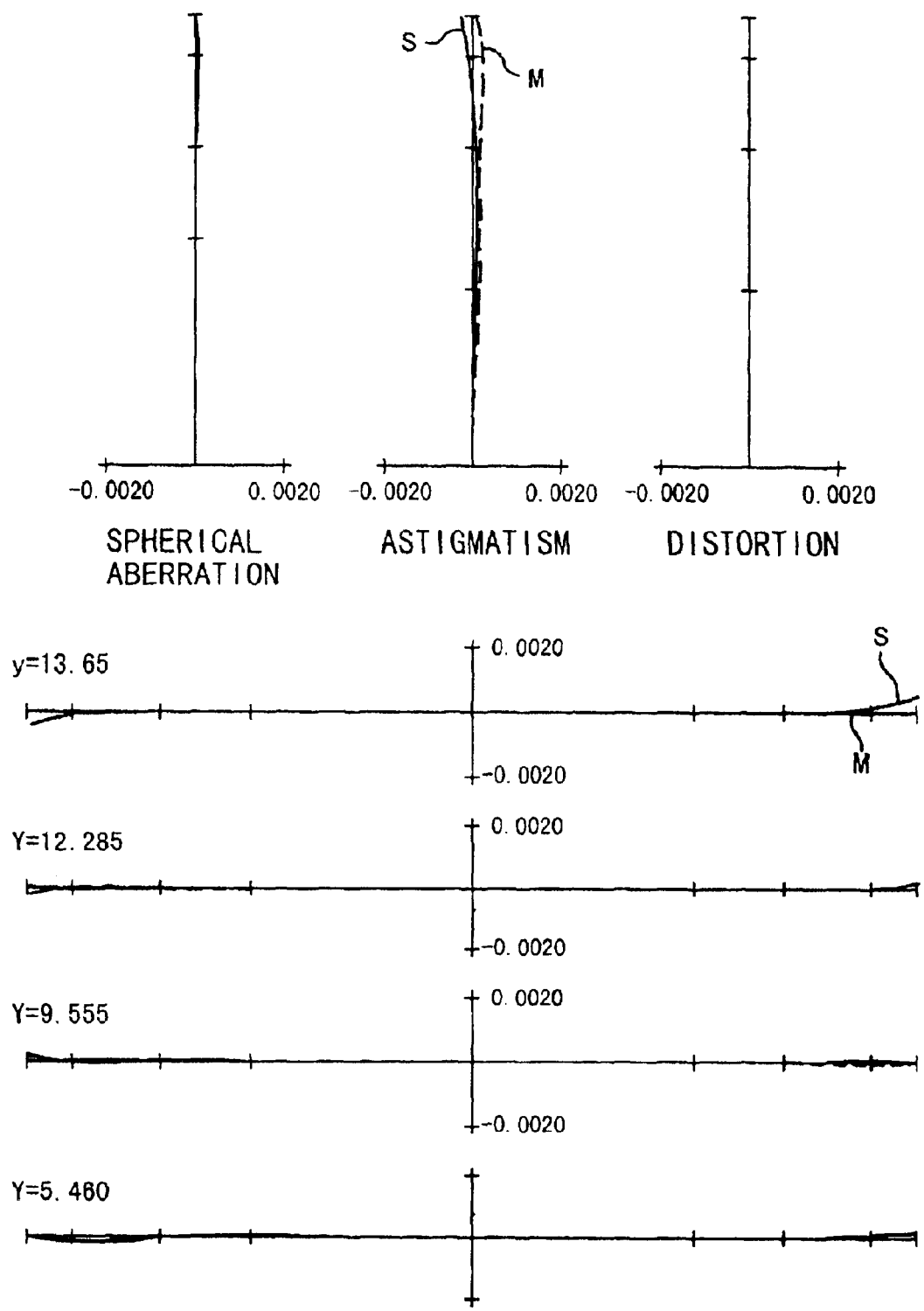
FIG. 24 illustrates aberrations of a projection optical system according to Numerical Example 8.

Table 8 shows specifications of this example, in regard to the conditions. FIG. 23 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 24 illustrates aberrations of this example.

In Numerical Example 8, surfaces r1–r6 belong to a positive first lens group G1, wherein r3 and r4 are aspherical surfaces (of a bi-aspherical surface lens). Surfaces r7–r15 belong to a negative second lens group G2, wherein r9 and r10 are aspherical surfaces (of a bi-aspherical surface lens). Surfaces r15–r26 belong to a positive third lens group G3, wherein r20 is an aspherical surface (of a mono-aspherical lens). Surfaces r27–r30 belong to a negative fourth lens group G4, all of which are spherical surfaces. Surfaces r31–r48 belong to a positive fifth lens group G5, wherein r35 and r47 are aspherical surfaces (of mono-aspherical surface lenses).

In this example, as shown in Table 8, first the condition of equation (1) for correction of the Petzval sum is satisfied. Then, as aspherical surfaces satisfying the conditions of equations (2) and (3), two aspherical surfaces (of a bi-aspherical surface lens) are placed in the first lens group, two aspherical surfaces (of a bi-aspherical surface lens) are placed in the second lens group, and one aspherical surface is placed in the third lens group. With this arrangement, the telecentricity, distortion aberration and curvature of field, for example, are corrected well.

The first lens group is provided by three positive lenses. The aspherical surfaces at r3 and r4 (of a bi-aspherical surface lens) include regions in which their local curvature powers change with mutually opposite signs to cancel with each other, thus satisfying the functions defined by conditions (a1) and (a3) described above.

The second lens group is provided by four negative lenses. The aspherical surfaces r9 and r10 (of a bi-aspherical surface lens) include regions in which the local curvature powers change with mutually opposite signs to cancel with each other. Thus, the functions of conditions (a1) and (a2) are satisfied.

The third lens group is provided by five positive lenses and one negative lens. In the aspherical surface at r20, the local curvature power changes in the negative direction so as to correct the spherical aberration, for example.

The fourth lens group is provided by two negative lenses, and they function mainly to correct the Petzval sum.

The fifth lens group is provided by eight positive lenses and one negative lens. In the aspherical surface at r35, the local curvature power thereof changes in the negative direction, for correction of spherical aberration. The aspherical surface at r47 includes a region in which the local curvature power changes in the positive direction, for correction of distortion aberration, for example.

With this arrangement, aberrations are corrected satisfactorily, as illustrated in FIG. 24.

EXAMPLE 9

Figure 25:
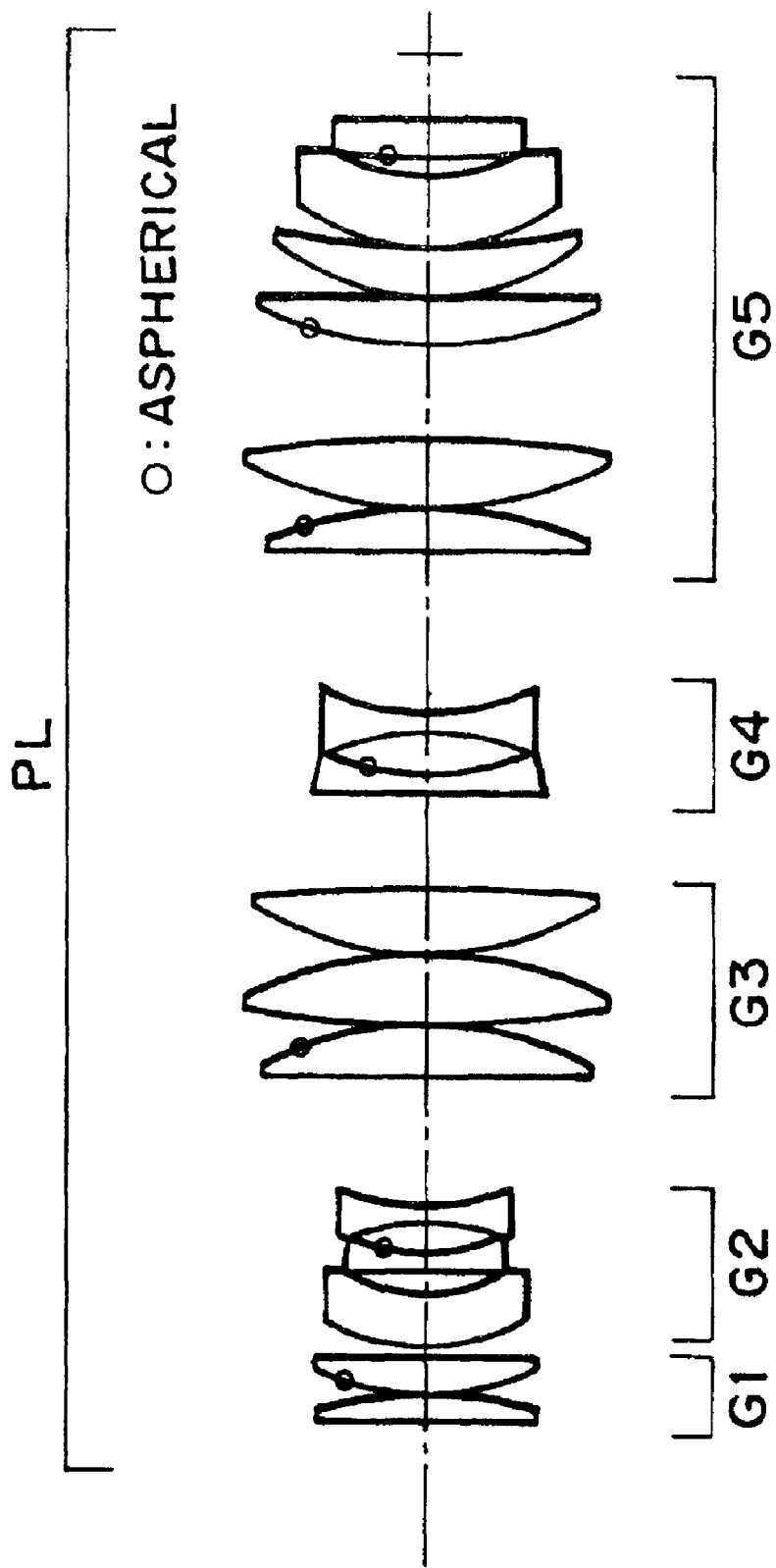
FIG. 25 is a lens sectional view of a projection optical system for use in a projection exposure apparatus, according to Numerical Example 9 of the present invention.

FIG. 25 is a lens sectional view of a projection optical system according to Numerical Example 9 of the present invention. The projection optical system has a reference wavelength 193 nm, a numerical aperture NA=0.65, a projection magnification β=1:4, a lens conjugate distance L=1000 mm, and an exposure region of diameter Ø27.3 mm. This optical system is accomplished by lenses of a number 16 (sixteen) which is very small as a five-group type lens system. It uses seven aspherical surfaces, all of which are aspherical surfaces formed on lenses each having a plane surface at one side.

Figure 26:
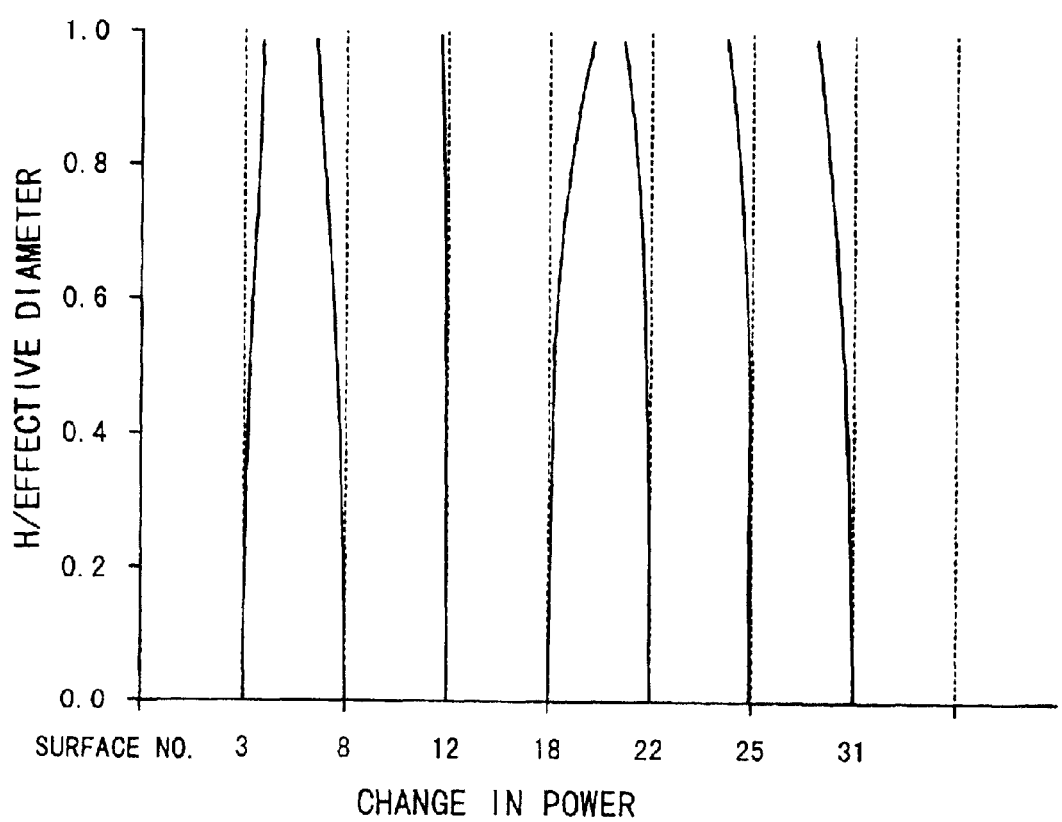
FIG. 26 is a graph for explaining changes in a local curvature power of an aspherical surface of a projection optical system according to Numerical Example 9.
Figure 27:
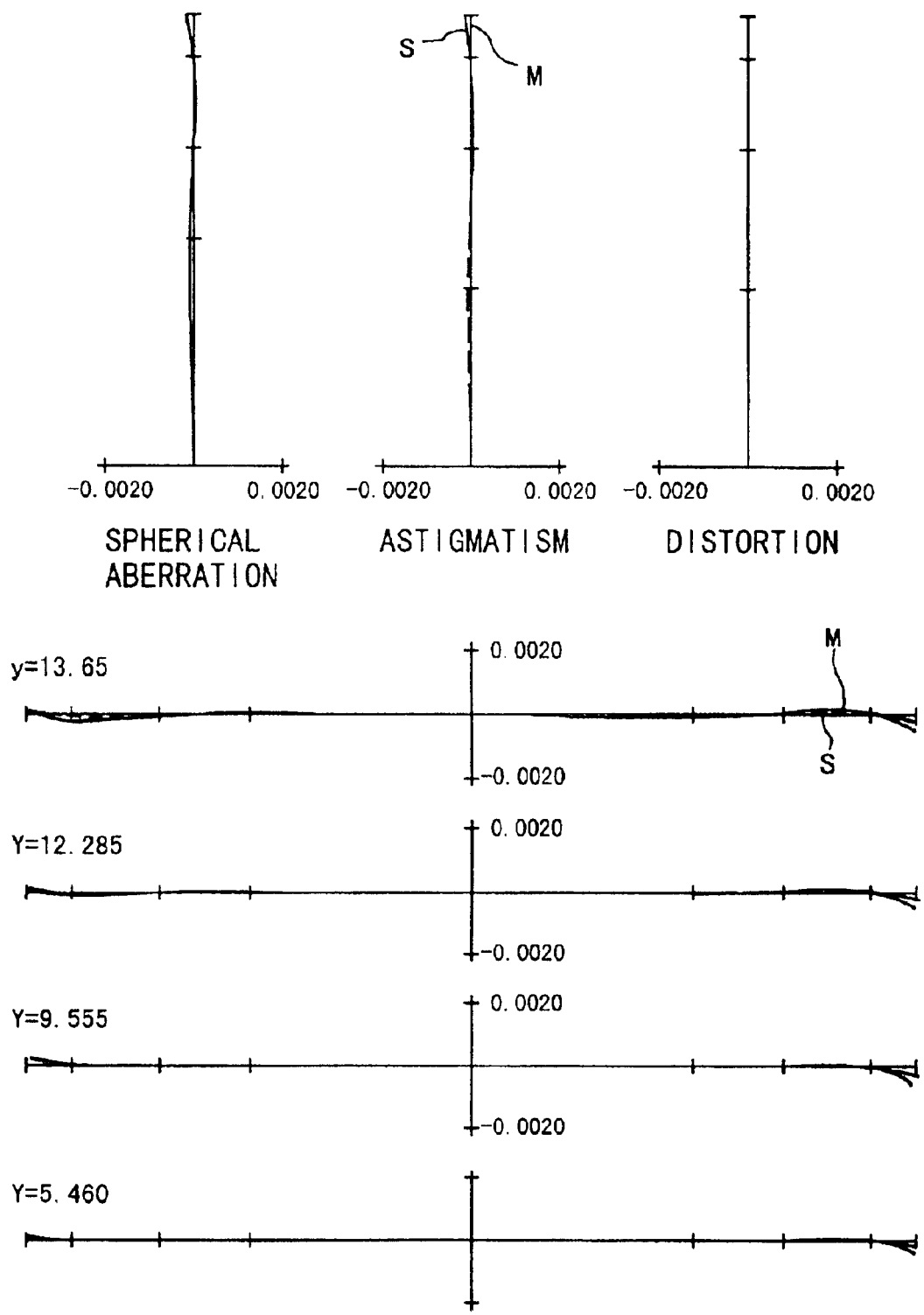
FIG. 27 illustrates aberrations of a projection optical system according to Numerical Example 9.

Table 9 shows specifications of this example, in regard to the conditions. FIG. 26 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 27 illustrates aberrations of this example.

In Numerical Example 9, surfaces r1–r4 belong to a positive first lens group G1, wherein r3 is an aspherical surface. Surfaces r5–r10 belong to a negative second lens group G2, wherein r8 is an aspherical surface. Surfaces r11–r16 belong to a positive third lens group G3, wherein r12 is an aspherical surface. Surfaces r17–r20 belong to a negative fourth lens group G4, wherein r18 is an aspherical surface. Surfaces r21–r32 belong to a positive fifth lens group G5, wherein r22, r25 and r31 are aspherical surfaces.

In this example, as shown in Table 9, first the condition of equation (1) for correction of the Petzval sum is satisfied. Then, as aspherical surfaces satisfying the conditions of equations (2) and (3), one aspherical surface is placed in the first lens group, and one aspherical surface is placed in the second lens group. With this arrangement, the telecentricity, distortion aberration and curvature of field, for example, are corrected well.

The first lens group is provided by two positive lenses. In the aspherical surface at r3, the local curvature power changes in the positive direction, thus satisfying the function defined by condition (a3) described above.

The second lens group is provided by three negative lenses. In the aspherical surface at r8, the local curvature power changes in the negative direction, thus satisfying the function of condition (a2). Simultaneously, the local curvature power changes in an opposite direction relative to that of the surface r3 of the first lens group, to cancel with each other. Thus, the function of condition (a1) described above is also satisfied.

The third lens group is provided by three positive lenses. In the aspherical surface at r12, the local curvature power changes in the negative direction so as to correct the spherical aberration, for example.

The fourth lens group is provided by two negative lenses. In the aspherical surface at r18, the local curvature power changes in the positive direction. This effectively cancels the diverging action which is produced by this lens group itself.

The fifth lens group is provided by six positive lenses. In the aspherical surfaces at r22, r25 and r31, the local curvature power thereof changes in the negative direction, for correction of spherical aberration. The aspherical surface at r31 also functions to correct distortion aberration.

In this example, each lens group is provided with an aspherical surface, such that aberrations are corrected satisfactorily, as illustrated in FIG. 27.

EXAMPLE 10

Figure 28:
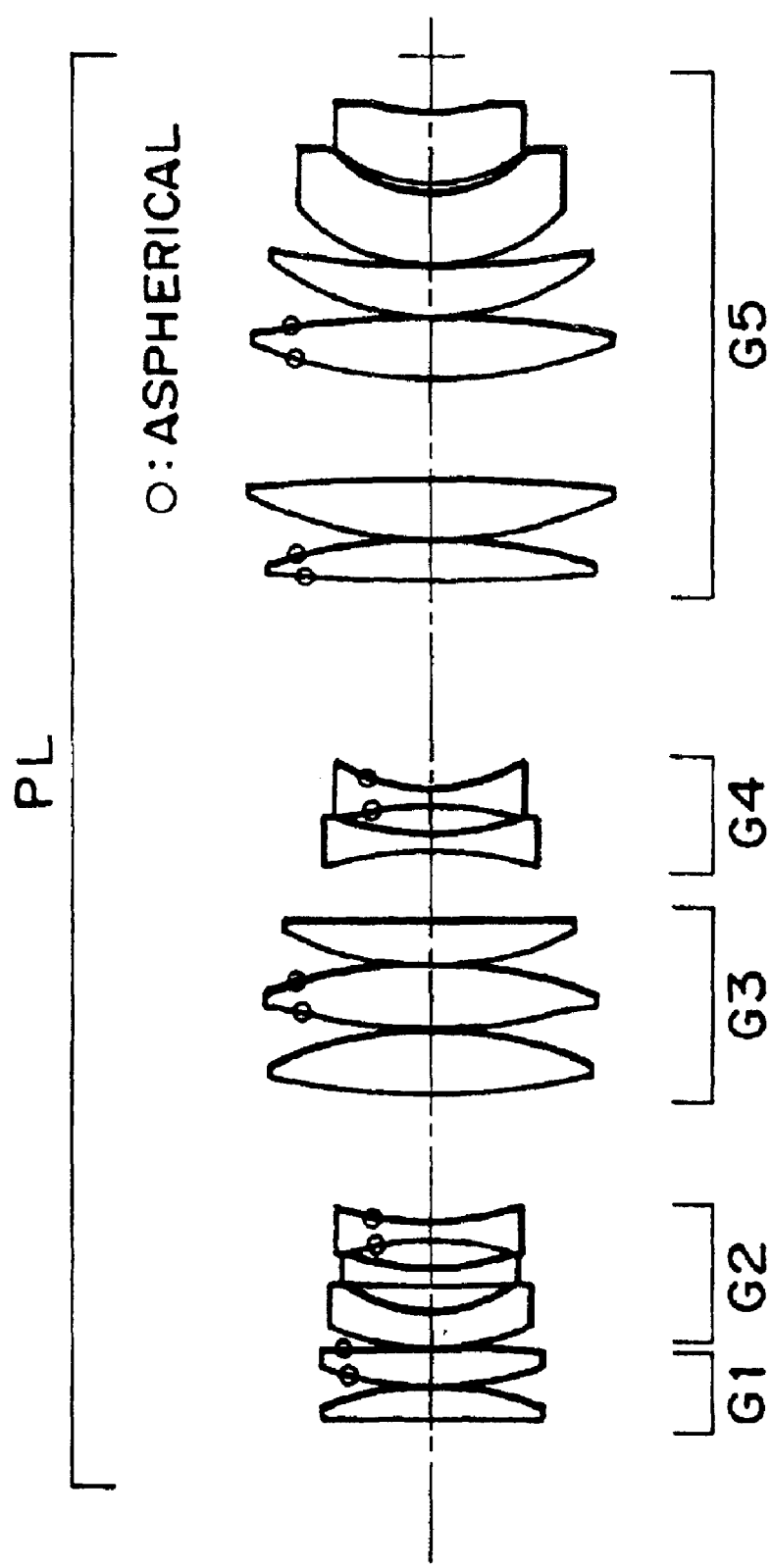
FIG. 28 is a lens sectional view of a projection optical system for use in a projection exposure apparatus, according to Numerical Example 10 of the present invention.

FIG. 28 is a lens sectional view of a projection optical system according to Numerical Example 10 of the present invention. The projection optical system has a reference wavelength 193 mm, a numerical aperture NA=0.65, a projection magnification β=1:4, a lens conjugate distance L=1000 mm, and an exposure region of diameter Ø27.3 mm. This optical system is accomplished by lenses of a number 16 (sixteen) which is very small as a five-group type lens system. It uses twelve aspherical surfaces, all of which are aspherical surfaces formed on bi-aspherical lenses each having two aspherical surfaces on both faces thereof.

Figure 29:
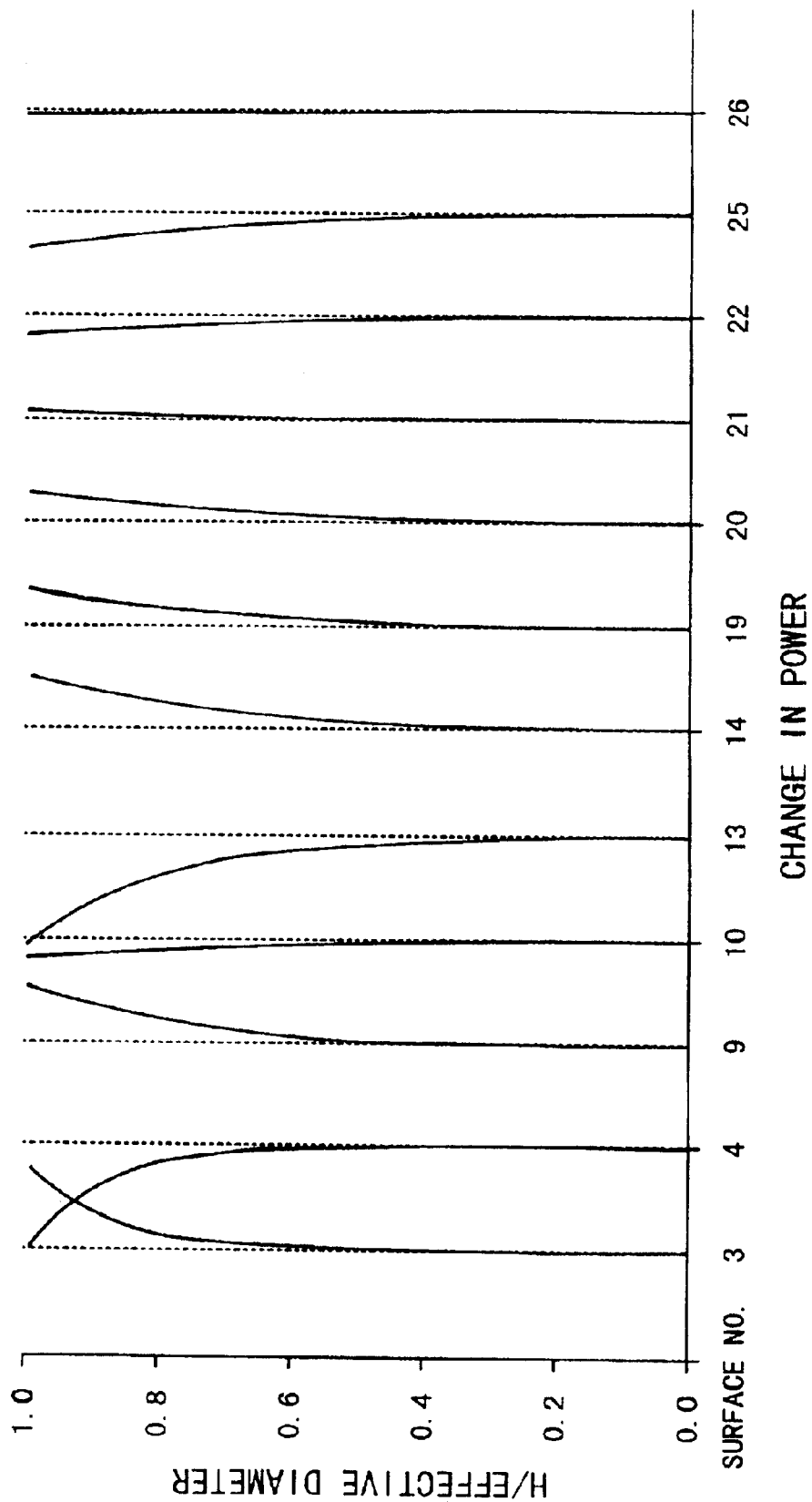
FIG. 29 is a graph for explaining changes in a local curvature power of an aspherical surface of a projection optical system according to Numerical Example 10.
Figure 30:
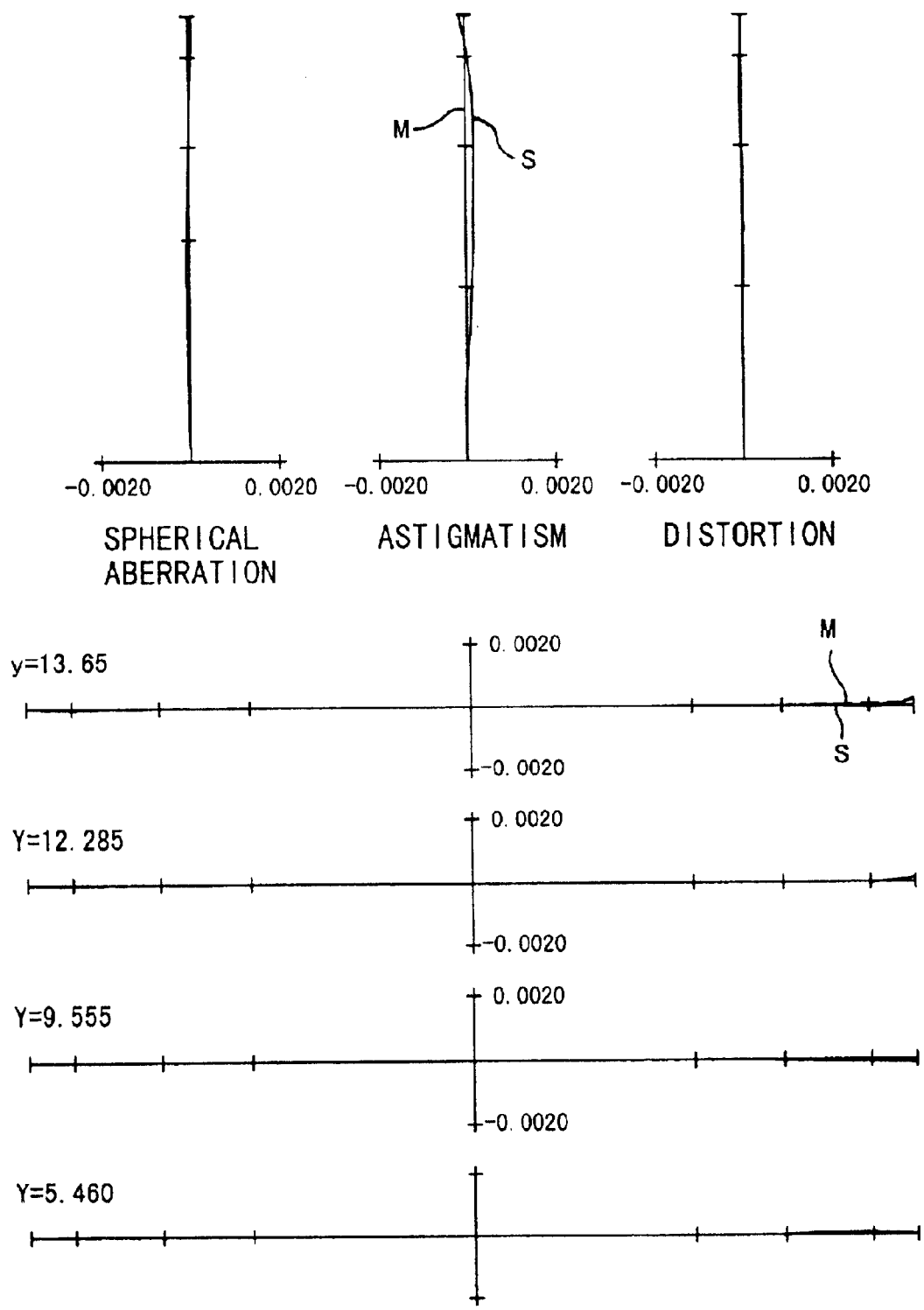
FIG. 30 illustrates aberrations of a projection optical system according to Numerical Example 10.

Table 10 shows specifications of this example, in regard to the conditions. FIG. 29 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 30 illustrates aberrations of this example.

In Numerical Example 10, surfaces r1–r4 belong to a positive first lens group G1, wherein r3 and r4 are aspherical surfaces (of a bi-aspherical surface lens). Surfaces r5–r10 belong to a negative second lens group G2, where r9 and r10 are aspherical surfaces (of a bi-aspherical surface lens). Surfaces r11–r16 belong to a positive third lens group G3, wherein r13 and r14 are aspherical surfaces (of a bi-aspherical surface lens). Surfaces r17–r20 belong to a negative fourth lens group G4, wherein r19 and r20 are aspherical surfaces (of a bi-aspherical surface lens). Surfaces r21–r32 belong to a positive fifth lens group G5, wherein r21 and r22 as well as r25 and r26 are aspherical surfaces (of bi-aspherical surface lenses).

In this example, as shown in Table 10, first the condition of equation (1) for correction of the Petzval sum is satisfied. Then, as aspherical surfaces satisfying the conditions of equations (2) and (3), two aspherical surfaces (of a bi-aspherical surface lens) are placed in the first lens group, two aspherical surfaces (of a bi-aspherical surface lens) are placed in the second lens group, and two aspherical surfaces (of a bi-aspherical surface lens) are placed in the second lens group, and two aspherical surfaces (of a bi-aspherical surface lens) are placed in the third lens group. With this arrangement, the telecentricity, distortion aberration and curvature of field, for example, are corrected well.

The first lens group is provided by two positive lenses. The aspherical surfaces at r3 and r4 include regions in which their local curvature powers change with mutually opposite signs to cancel with each other, thus satisfying the function defined by condition (a1) as well as the function of condition (a3) described above.

The second lens group is provided by three negative lenses. The aspherical surfaces at r9 and r10 (of a bi-aspherical surface lens) include regions in which their local curvature powers change with mutually opposite signs to cancel with each other, thus satisfying the function of condition (a1) as well as the function of condition (a2).

The third lens group is provided by three positive lenses. The aspherical surfaces at r13 and r14 include regions in which the local curvature powers change with mutually opposite signs to cancel with each other, thus satisfying the function as defined by condition (a1). In total, there remains the negative direction, for correction of aspherical aberration, for example.

The fourth lens group is provided by two negative lenses. In the aspherical surfaces at r19 and r20 (of a bi-aspherical surface lens), the local curvature power changes in the positive direction. This effectively cancels the diverging action which is produced by this lens group itself.

The fifth lens group is provided by five positive lenses and one negative lens. The aspherical surfaces at r21 and r22 include regions in which the local curvature powers thereof change with mutually opposite signs. In total, there remains the negative direction, for correction of apsherical aberration, for example.

In the aspherical surfaces at r25 and r26 (of a bi-aspherical surface lens), their local curvature powers change in the negative direction, and they function mainly to correct spherical aberration. Also, four of the five positive lenses are made of fluorite (n=1.50140), for correction of chromatic aberrations.

In this example, each lens group is provided with a bi-aspherical surface lens, such that aberrations are corrected satisfactorily, as illustrated in FIG. 30.

EXAMPLE 11

Figure 31:
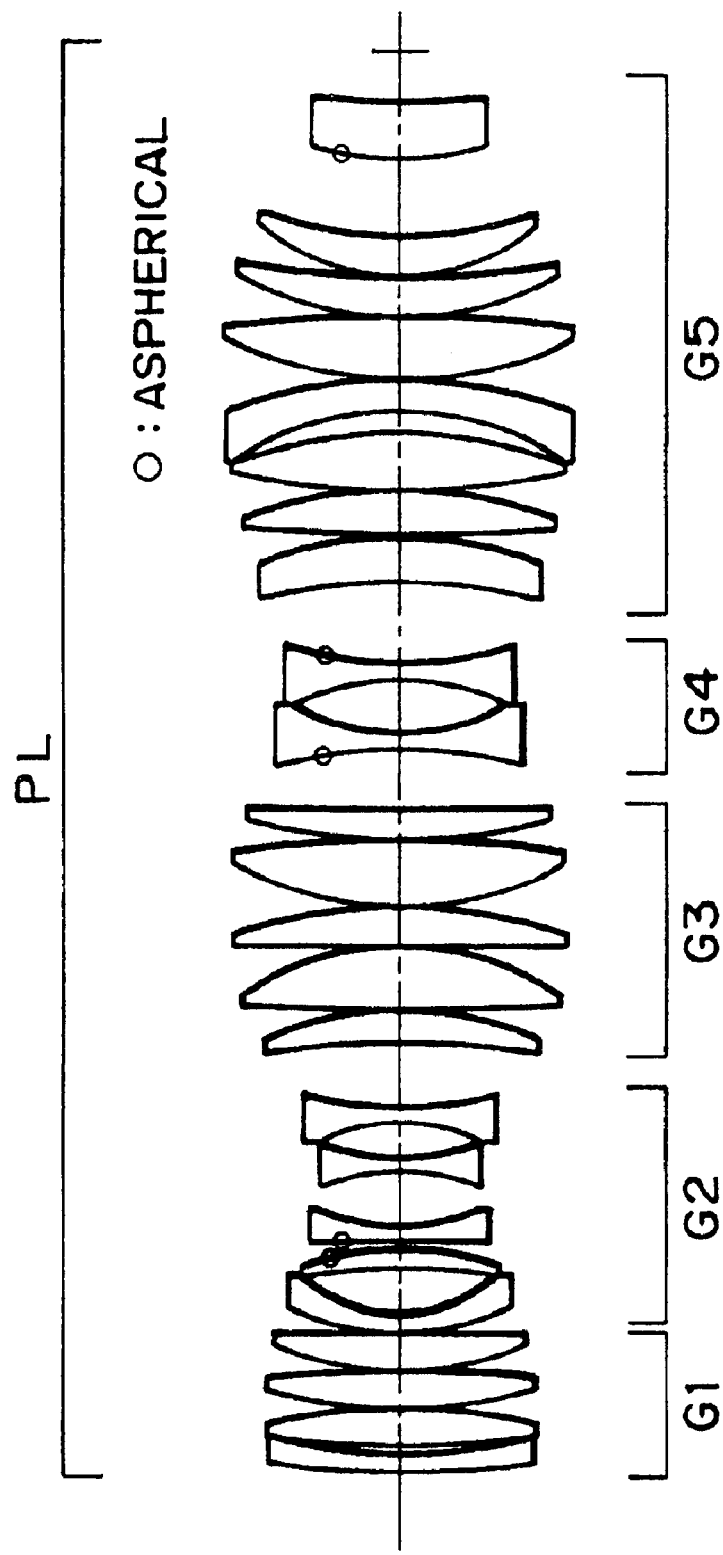
FIG. 31 is a lens sectional view of a projection optical system for use in a projection exposure apparatus, according to Numerical Example 11 of the present invention.

FIG. 31 is a lens sectional view of a projection optical system according to Numerical Example 11 of the present invention. The projection optical system has a reference wavelength 248 nm, a numerical aperture NA=0.65, a projection magnification β=1:5, a lens conjugate distance L=1000 mm, and an exposure region of diameter Ø31.3 mm. This optical system is accomplished by lenses of a number 24 (twenty-four) which is relatively small as a five-group type lens system. It uses twelve aspherical surfaces, all of which are aspherical surfaces formed on bi-aspherical surface lenses each having two aspherical surfaces on both faces thereof.

Figure 32:
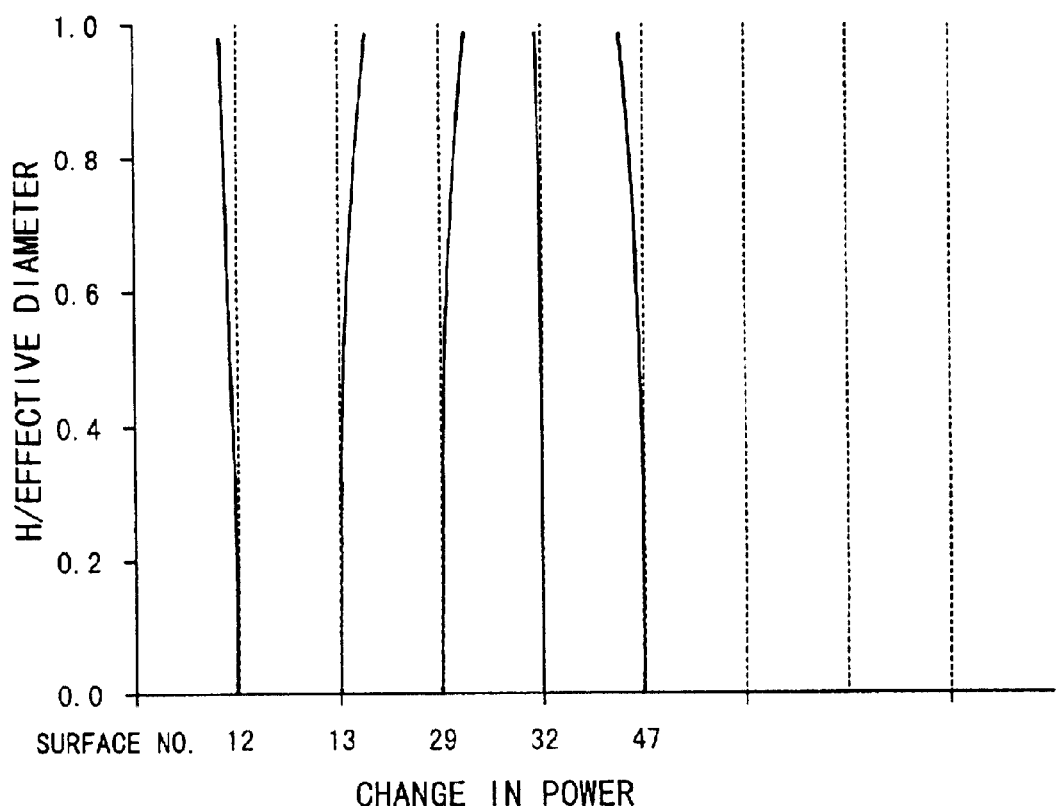
FIG. 32 is a graph for explaining changes in a local curvature power of an aspherical surface of a projection optical system according to Numerical Example 11.
Figure 33:
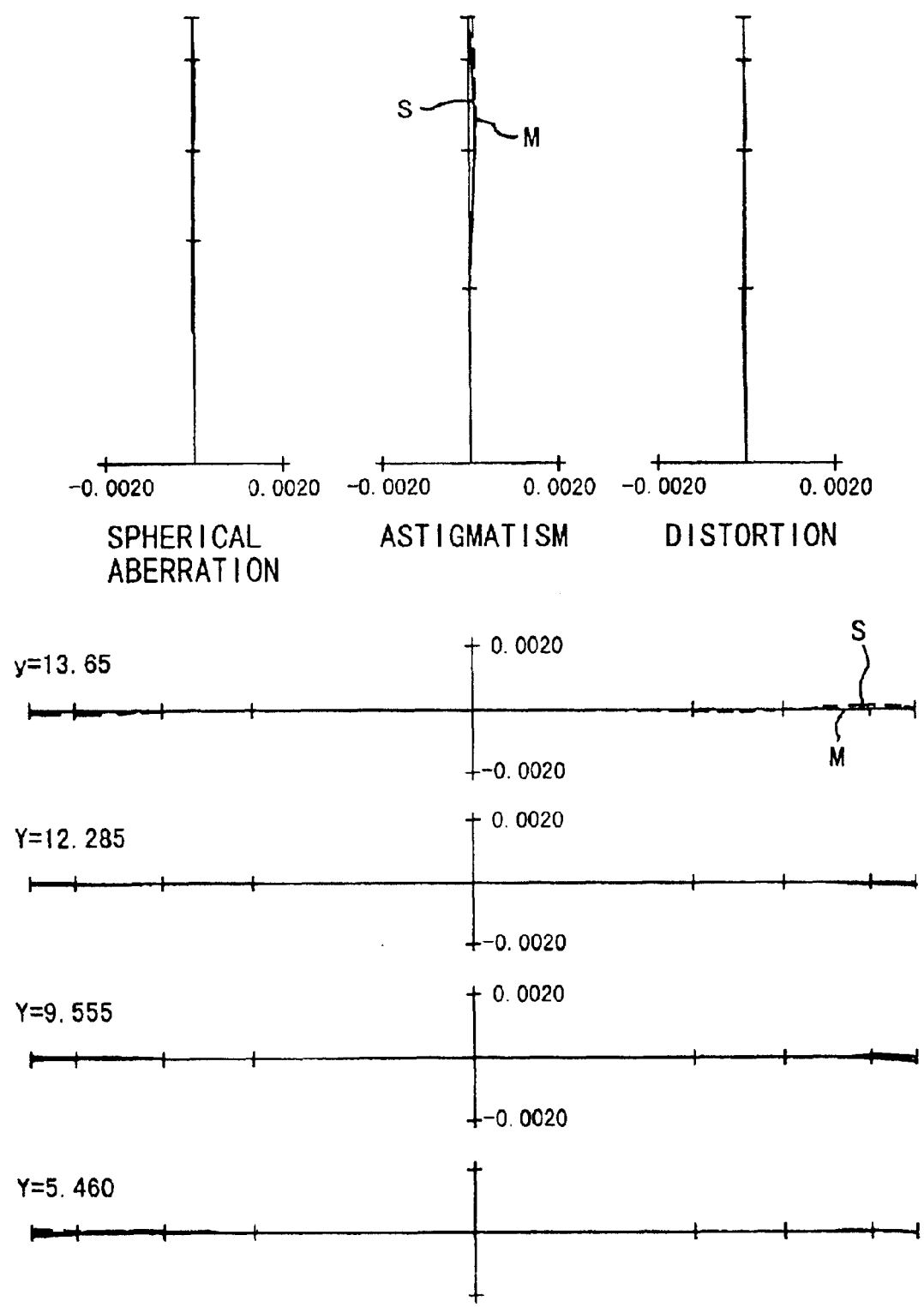
FIG. 33 illustrates aberrations of a projection optical system according to Numerical Example 11.

Table 11 shows specifications of this example, in regard to the conditions. FIG. 32 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward direction correspond to negative and positive directions of the change in local curvature power, respectively. FIG. 33 illustrates aberrations of this example.

In Numerical Example 11, surfaces r1–r8 belong to a positive first lens group G1, all of which are spherical surfaces. Surfaces r9–r18 belong to a negative second lens group G2, wherein r12 and r13 are aspherical surfaces. Surfaces r19–r28 belong to a positive third lens group G3, all of which are aspherical surfaces. Surfaces r29–r32 belong to a negative fourth lens group G4, wherein r29 and r32 are aspherical surfaces. Surfaces r33–r48 belong to a positive fifth lens group G5, wherein r47 is an aspherical surface.

In this example, as shown in Table 11, first the condition of equation (1) for correction of the Petzval sum is satisfied. Then, as aspherical surfaces satisfying the conditions of equations (2) and (3), two aspherical surfaces are placed in the first lens group. With this arrangement, the telecentricity, distortion aberration and curvature of field, for example, are corrected well.

The first lens group is provided by three positive lenses and one negative lens, and telecentricity and distortion aberration, for example, are well corrected.

The second lens group is provided by one positive lens and four negative lenses. In the aspherical surface at r12, the local curvature power changes in the negative direction, thus satisfying the function of condition (a2). Simultaneously, the local curvature power changes in the opposite direction relative to that in the surface r13 to cancel with each other, and the function of condition (a1) is satisfied as well.

The third lens group is provided by five positive lenses.

The fourth lens group is provided by two negative lenses. In the aspherical surfaces at r29 and r32, their local curvature powers change with mutually opposite signs. In total, there remains the positive direction, and it effectively cancels the diverging action, at higher order, produced by this lens group itself.

The fifth lens group is provided by seven positive lenses and one negative lens. In the aspherical surface at r47, the local curvature power thereof changes in the negative direction, and the spherical aberration, coma aberration, and distortion, for example, are corrected thereby.

With this arrangement, aberrations are corrected satisfactorily, as illustrated in FIG. 33.

EXAMPLE 12

Figure 34:
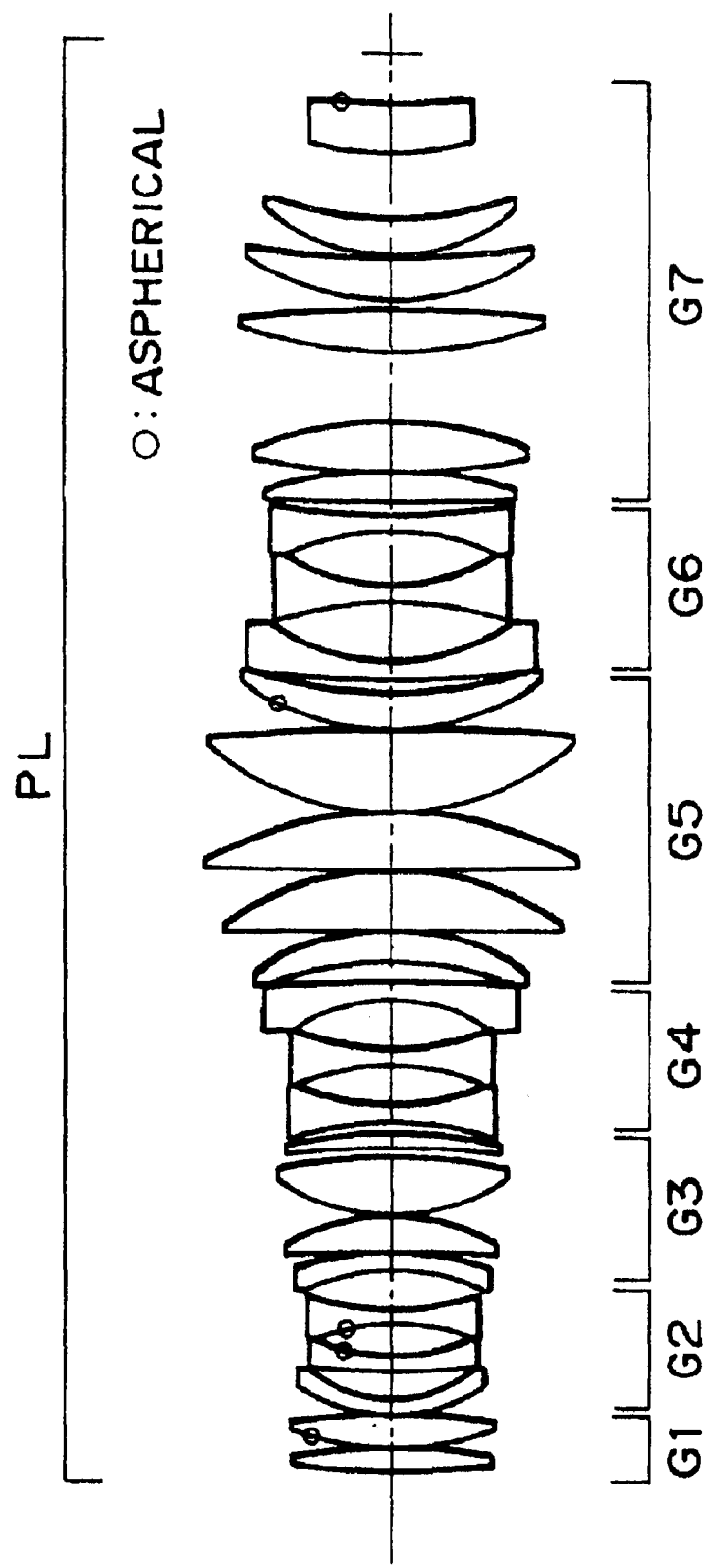
FIG. 34 is a lens sectional view of a projection optical system for use in a projection exposure apparatus, according to Numerical Example 12 of the present invention.

FIG. 34 is a lens sectional view of a projection optical system according to Numerical Example 12 of the present invention. The projection optical system has a reference wavelength 193 inn, a numerical aperture NA=0.65, a projection magnification β=1:4, a lens conjugate distance L=1130 mm, and an exposure region of diameter Ø27.3 mm. This optical system is accomplished by lenses of a number 26 (twenty-six). It uses five aspherical surfaces.

Figure 35:
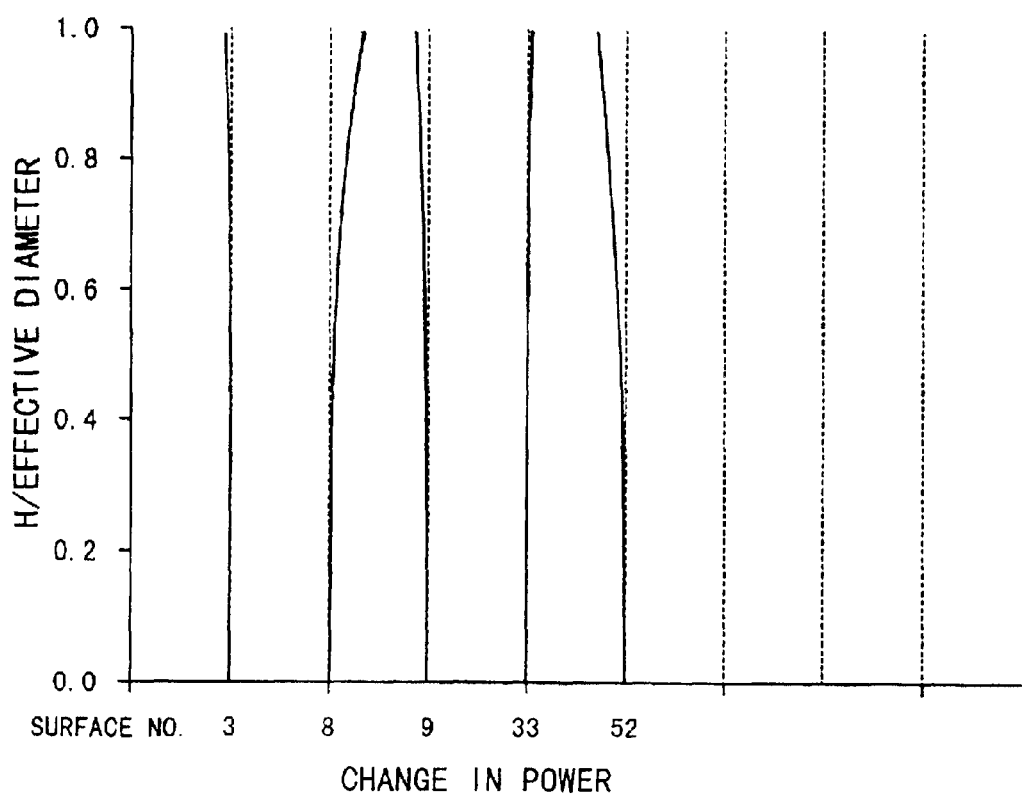
FIG. 35 is a graph for explaining changes in a local curvature power of an aspherical surface of a projection optical system according to Numerical Example 12.
Figure 36:
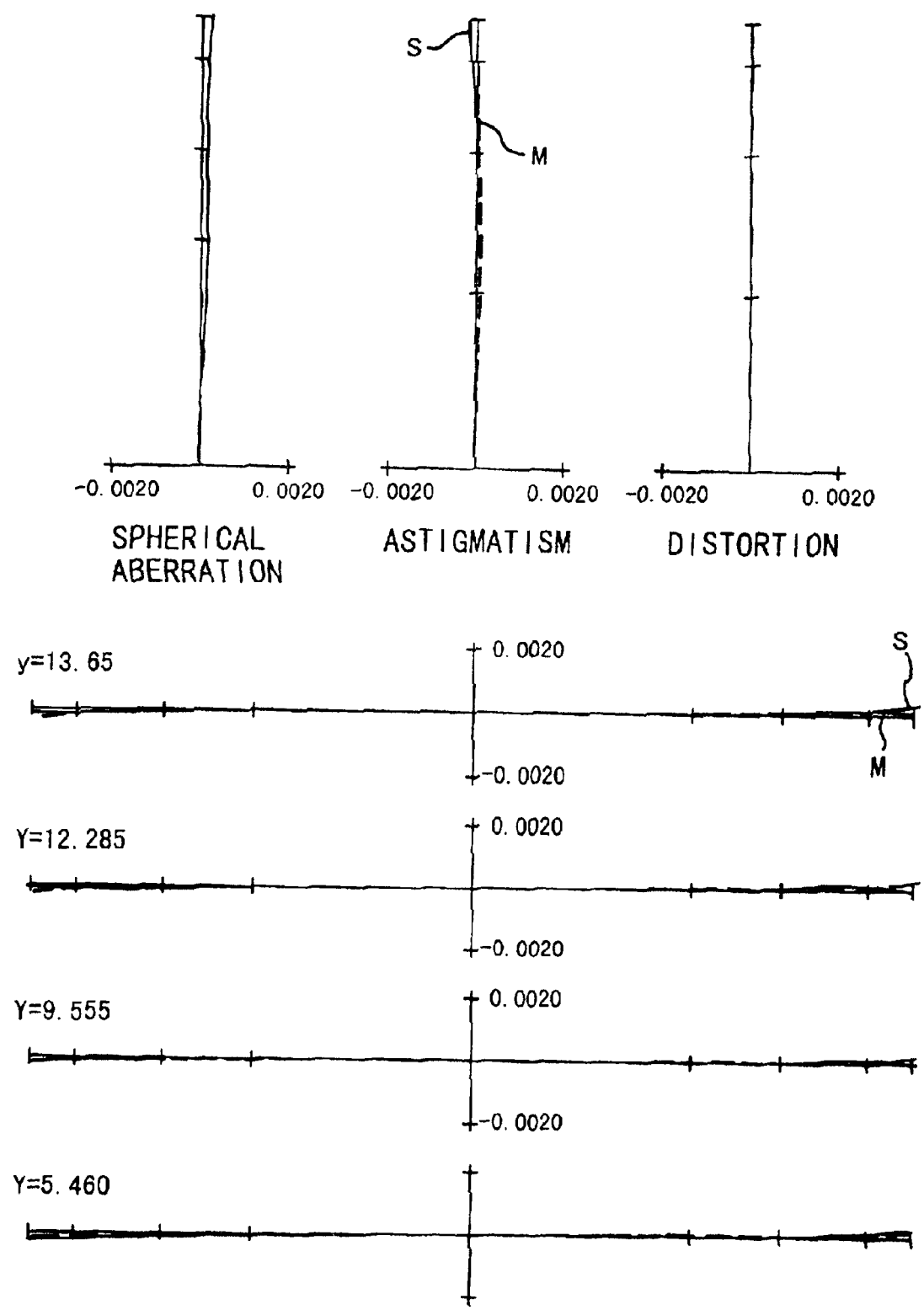
FIG. 36 illustrates aberrations of a projection optical system according to Numerical Example 12.

Table 12 shows specifications of this example, in regard to the conditions. FIG. 35 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 36 illustrates aberrations of this example.

In Numerical Example 12, surfaces r1–r4 belong to a positive first lens group G1, wherein r3 is an aspherical surface. Surfaces r5–r12 belong to a negative second lens group G2, wherein r8 and r9 are aspherical surfaces. Surfaces r13–r18 belong to a positive third lens group G3, all of which are spherical surfaces. Surfaces r19–r24 belong to a negative fourth lens group G4, all of which are apsherical surfaces. Surfaces r25–r34 belong to a positive fifth lens group G5, wherein r33 is an aspherical surface. Surfaces r35–r40 belong to a negative sixth lens group G6, all of which are spherical surfaces. Surfaces r41–r52 belong to a positive seventh lens group G7, wherein r52 is an aspherical surface.

In this example, as shown in Table 12, first the condition of equation (1) for correction of the Petzval sum is satisfied. Then, as aspherical surfaces satisfying the conditions of equations (2) and (3), one aspherical surface is placed in the first lens group, and two aspherical surfaces are placed in the second lens group. With this arrangement, the telecentricity, distortion aberration and curvature of field, for example, are corrected well.

The first lens group is provided by two positive lenses. In the aspherical surface at r3, the local curvature power changes in the negative direction.

The second lens group is provided by four negative lenses. In the aspherical surfaces at r8 and r9, the local curvature power changes in opposite directions, thus satisfying the function of condition (a1) and, simultaneously, the function of condition (a2). Also, through the relationship with the surfaces r3 and r8 of the first lens group, the function of condition (a1) is satisfied.

The third lens group is provided by three positive lenses.

The fourth lens group is provided by three negative lenses, and they serve mainly to correct the Petzval sum.

The fifth lens group is provided by five positive lenses. In the aspherical surface at r33, the local curvature power thereof at a peripheral portion changes slightly in the positive direction. This is effective to cancel, at higher orders, a strong diverging action of the subsequent sixth lens group.

The sixth lens group is provided by three negative lenses, and mainly they serve to correct the Petzval sum.

The seventh lens group is provided by six positive lenses. In the aspherical surface at r52, the local curvature power changes in the negative direction, to thereby correct distortion and coma, for example.

With this arrangement, aberrations are corrected satisfactorily, as illustrated in FIG. 36.

EXAMPLE 13

Figure 37:
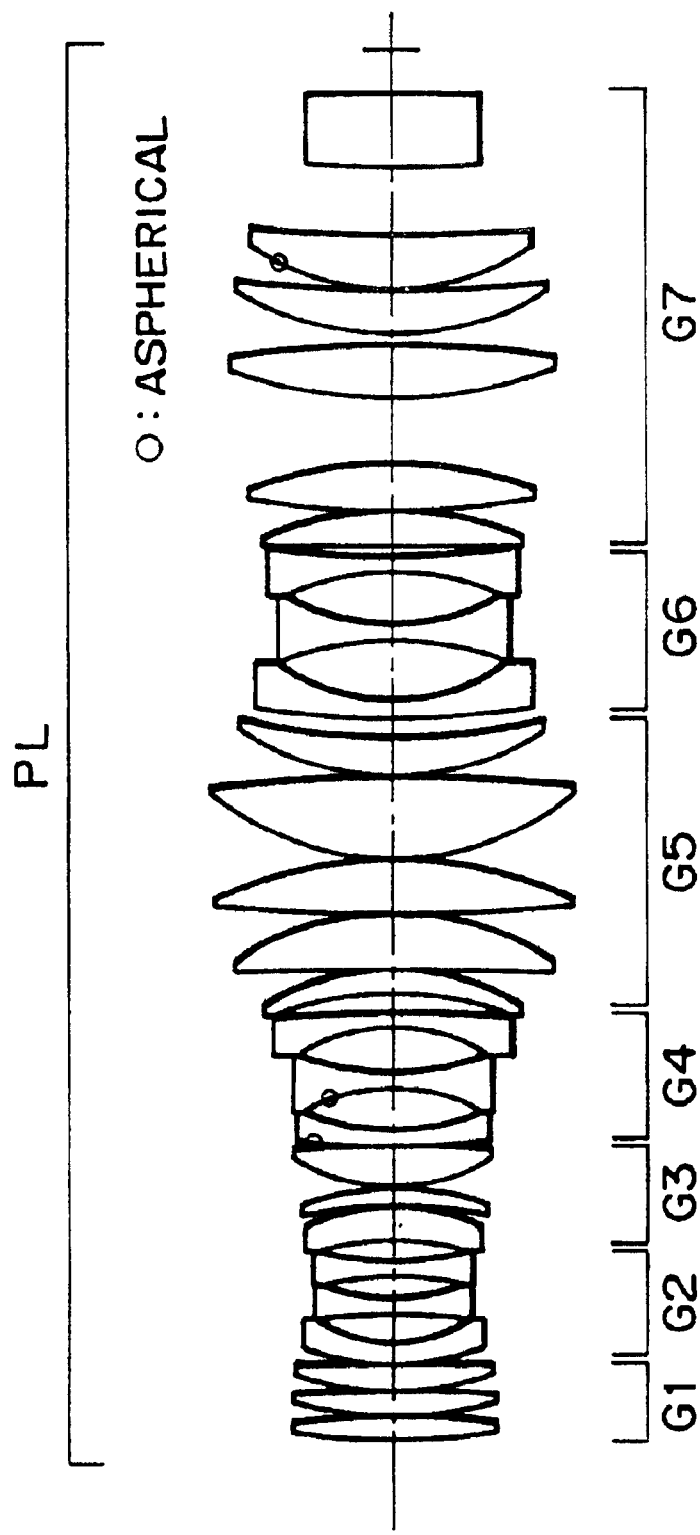
FIG. 37 is a lens sectional view of a projection optical system for use in a projection exposure apparatus, according to Numerical Example 13 of the present invention.

FIG. 37 is a lens sectional view of a projection optical system according to Numerical Example 13 of the present invention. The projection optical system has a reference wavelength 193 nm, a numerical aperture NA=0.65, a projection magnification β=1:4, a lens conjugate distance L=1130 mm, and an exposure region of diameter Ø27.3 mm. This optical system is accomplished by lenses of a number 26 (twenty-six). It uses three aspherical surfaces.

Figure 38:
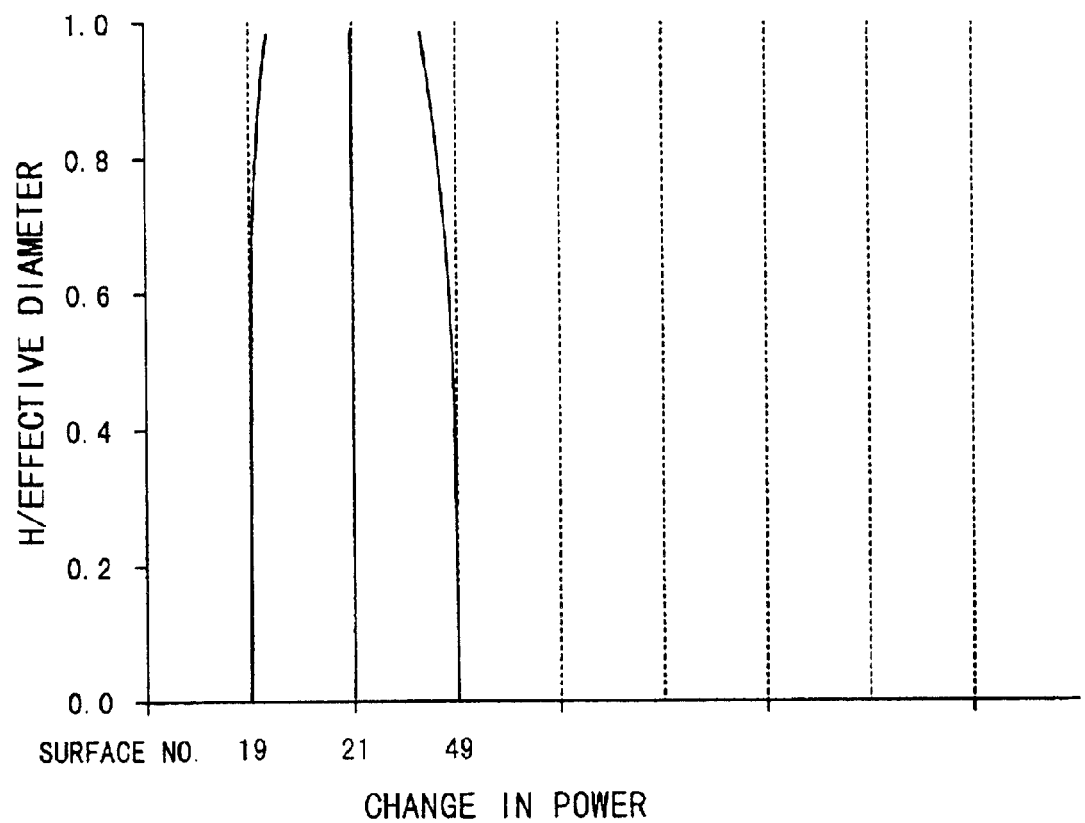
FIG. 38 is a graph for explaining changes in a local curvature power of an aspherical surface of a projection optical system according to Numerical Example 13.
Figure 39:
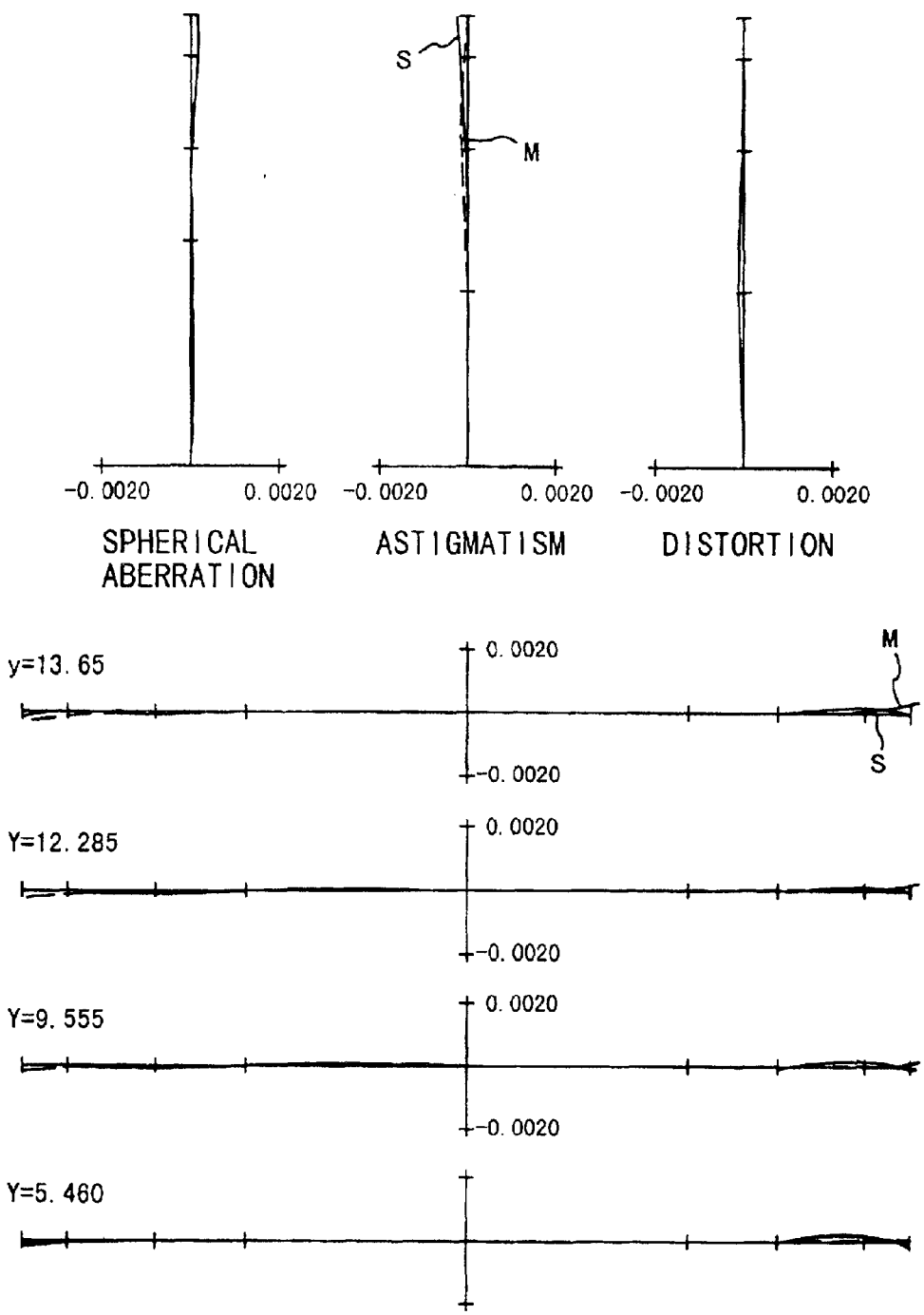
FIG. 39 illustrates aberrations of a projection optical system according to Numerical Example 13.

Table 13 shows specifications of this example, in regard to the conditions. FIG. 38 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to the negative and positive directions of the change in local curvature power, respectively. FIG. 39 illustrates aberrations of this example.

In Numerical Example 13, surfaces r1–r6 belong to a positive first lens group G1, all of which are spherical surfaces. Surfaces r7–r12 belong to a negative second lens group G2, all of which are spherical surfaces. Surfaces r13–r18 belong to a positive third lens group G3, all of which are spherical surfaces. Surfaces r19–r24 belong to a negative fourth lens group G4, wherein r19 and r20 are aspherical surfaces. Surfaces r25–r34 belong to a positive fifth lens group G5, all of which are spherical surface. Surfaces r35–r40 belong to a negative sixth lens group G6, all of which are spherical surfaces. Surfaces r41–r52 belong to a positive seventh lens group G7, wherein r49 is an aspherical surface.

In this example, as shown in Table 13, first the condition of equation (1) for correction of the Petzval sum is satisfied. Then, as aspherical surfaces satisfying the conditions of equations (2) and (3), two aspherical surfaces are placed in the fourth lens group, by which the telecentricity, distortion aberration and curvature of field, for example, are corrected well.

The first lens group is provided by three positive lenses.

The second lens group is provided by three negative lenses.

The third lens group is provided by three positive lenses.

The fourth lens group is provided by three negative lenses, and they serve mainly to correct the Petzval sum. In the surfaces r19 and r21, the local curvature powers slightly change in opposite directions, thus satisfying the function as defined by condition (a1) described above. In total, there remains the positive direction, which is effective to cancel, at higher orders, the diverging action of this lens group.

The fifth lens group is provided by five positive lenses.

The sixth lens group is provided by three negative lenses, and mainly they serve to correct the Petzval sum.

The seventh lens group is provided by six positive lenses. In the aspherical surface at r49, the local curvature power changes in the negative direction, to thereby correct distortion and coma, for example.

With this arrangement, aberrations are corrected satisfactorily, as illustrated in FIG. 39.

EXAMPLE 14

Figure 40:
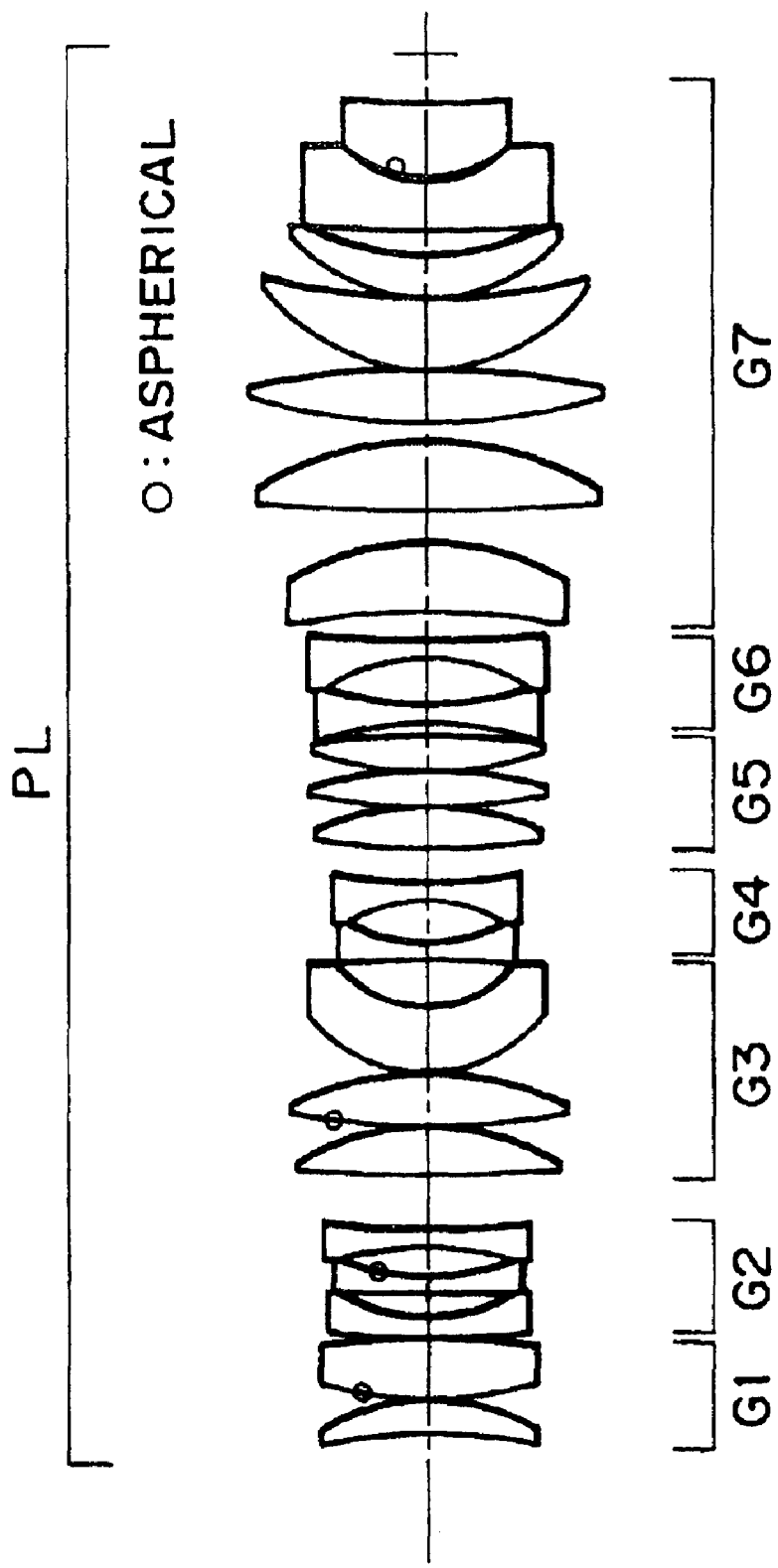
FIG. 40 is a lens sectional view of a projection optical system for use in a projection exposure apparatus, according to Numerical Example 14 of the present invention.

FIG. 40 is a lens sectional view of a projection optical system according to Numerical Example 14 of the present invention. The projection optical system has a reference wavelength 193 nm, a numerical aperture NA=0.65, a projection magnification β=1:4, a lens conjugate distance L=1000 mm, and an exposure region of diameter Ø27.3 mm. This optical system is accomplished by lenses of a number 22 (twenty-two) which is small as a seven-group type lens system. It uses four aspherical surfaces.

Figure 41:
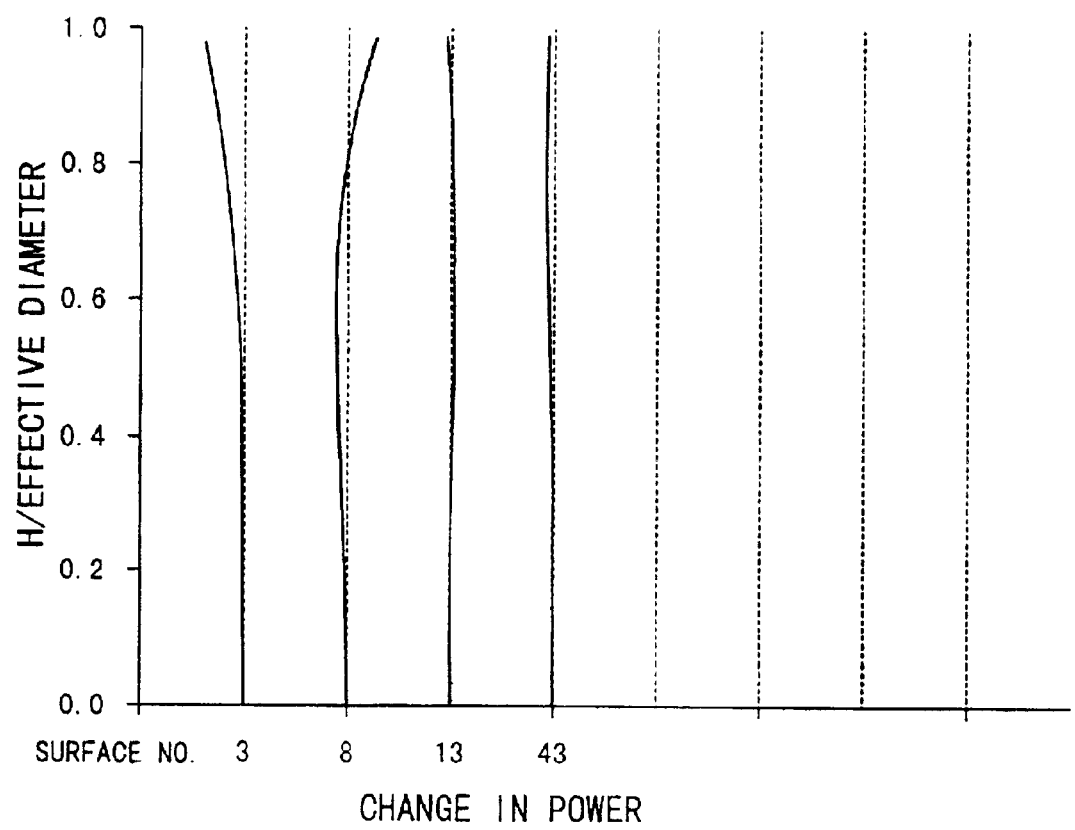
FIG. 41 is a graph for explaining changes in a local curvature power of an aspherical surface of a projection optical system according to Numerical Example 14.
Figure 42:
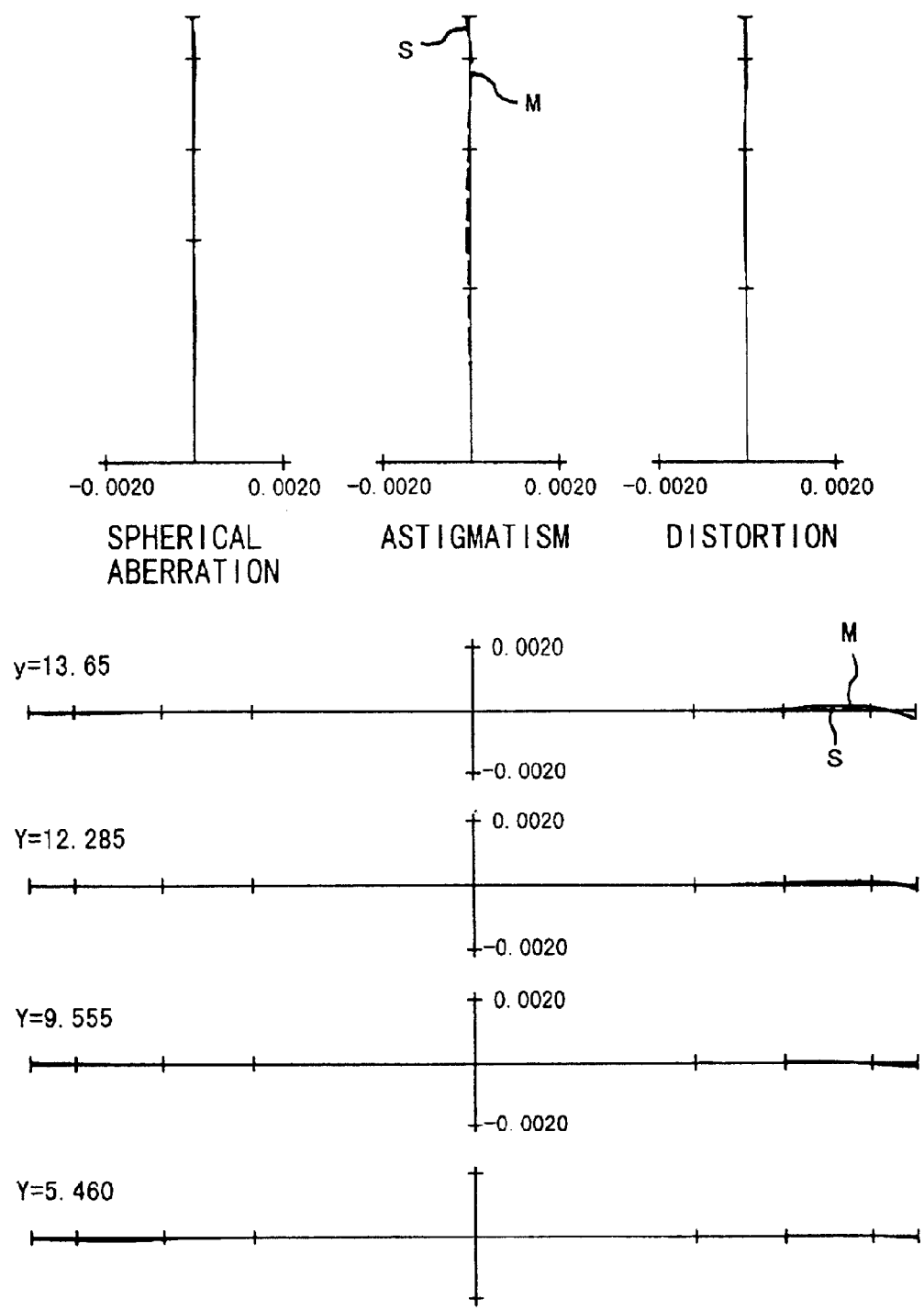
FIG. 42 illustrates aberrations of a projection optical system according to Numerical Example 14.

Table 14 shows specifications of this example, in regard to the conditions. FIG. 41 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 42 illustrates aberrations of this example.

In Numerical Example 14, surfaces r1–r4 belong to a positive first lens group G1, wherein r3 is an aspherical surface. Surfaces r5–r10 belong to a negative second lens group G2, wherein r8 is an apsherical surfaces. Surfaces r11–r16 belong to a positive third lens group G3, wherein r13 is an aspherical surface. Surfaces r17–r20 belong to a negative fourth lens group G4, all of which are spherical surfaces. Surfaces r21–r26 belong to a positive fifth lens group G5, all of which are spherical surfaces. Surfaces r27–r30 belong to a negative sixth lens group G6, all of which are spherical surfaces. Surfaces r31–r44 belong to a positive fifth lens group G7, wherein r43 is an aspherical surface.

In this example, as shown in Table 14, first the condition of equation (1) for correction of the Petzval sum is satisfied. Then, as aspherical surfaces satisfying the conditions of equations (2) and (3), one aspherical surface is placed in the first lens group, one aspherical surface is placed in the second lens group, and one aspherical surface is placed in the third lens group. With this arrangement, the telecentricity, distortion aberration, curvature of field, and sagittal transverse aberration, for example, are well corrected.

The first lens group is provided by two positive lenses. In the aspherical surface at r3, the local curvature power changes in the negative direction, this being effective to cancel, at higher orders, the converging action of this lens group itself.

The second lens group is provided by three negative lenses. In the aspherical surface at r8, the local curvature power changes, in the central portion, in the negative direction and thus the function of condition (a1) is satisfied. In the peripheral portion, the power changes in the positive direction to thereby cancel, at higher orders, the diverging action of this lens group itself. Further, in the peripheral portion, the change in the local curvature power is in the opposite direction in relation to the surface r3 of the first lens group, such that the function defined by condition (a1) is satisfied.

The third lens group is provided by three positive lenses. In the aspherical surface at r13, the local curvature power changes, in the central portion, in the positive direction and thus the function of condition (a1) is satisfied. In the peripheral portion, the power changes in the negative direction to thereby cancel, at higher orders, the converging action of this lens group itself. Further, in the peripheral portion, the change in the local curvature power is in the opposite direction in relation to the surface r8 of the second lens group, such that the function defined by condition (a1) is satisfied.

The fourth lens group is provided by two negative lenses, and they serve mainly to correct the Petzval sum.

The fifth lens group is provided by three positive lenses.

The sixth lens group is provided by two negative lenses, and mainly they serve to correct the Petzval sum.

The seventh lens group is provided by six positive lenses and one negative lens. The aspherical surface at r43 includes a region in which the local curvature power changes in the negative direction, to thereby correct spherical aberration, coma, and distortion, for example.

With this arrangement, aberrations are corrected satisfactorily, as illustrated in FIG. 42.

EXAMPLE 15

Figure 43:
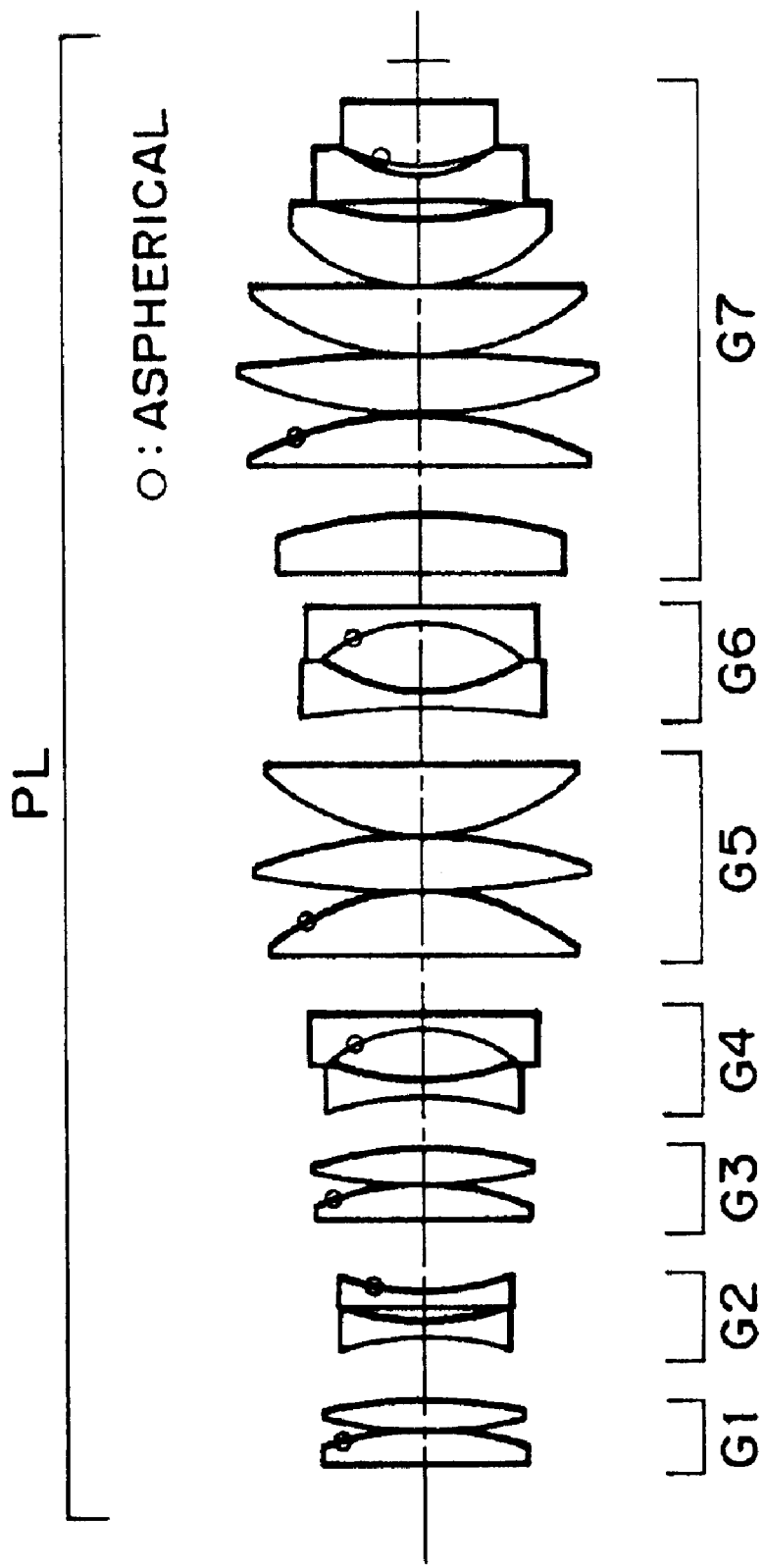
FIG. 43 is a lens sectional view of a projection optical system for use in a projection exposure apparatus, according to Numerical Example 15 of the present invention.

FIG. 43 is a lens sectional view of a projection optical system according to Numerical Example 15 of the present invention. The projection optical system has a reference wavelength 193 nm, a numerical aperture NA=0.65, a projection magnification β=1:4, a lens conjugate distance L=1000 mm, and an exposure region of diameter Ø27.3 mm. This optical system is accomplished by lenses of a number 20 (twenty) which is small as a seven-group type lens system. It uses eight aspherical surfaces.

Figure 44:
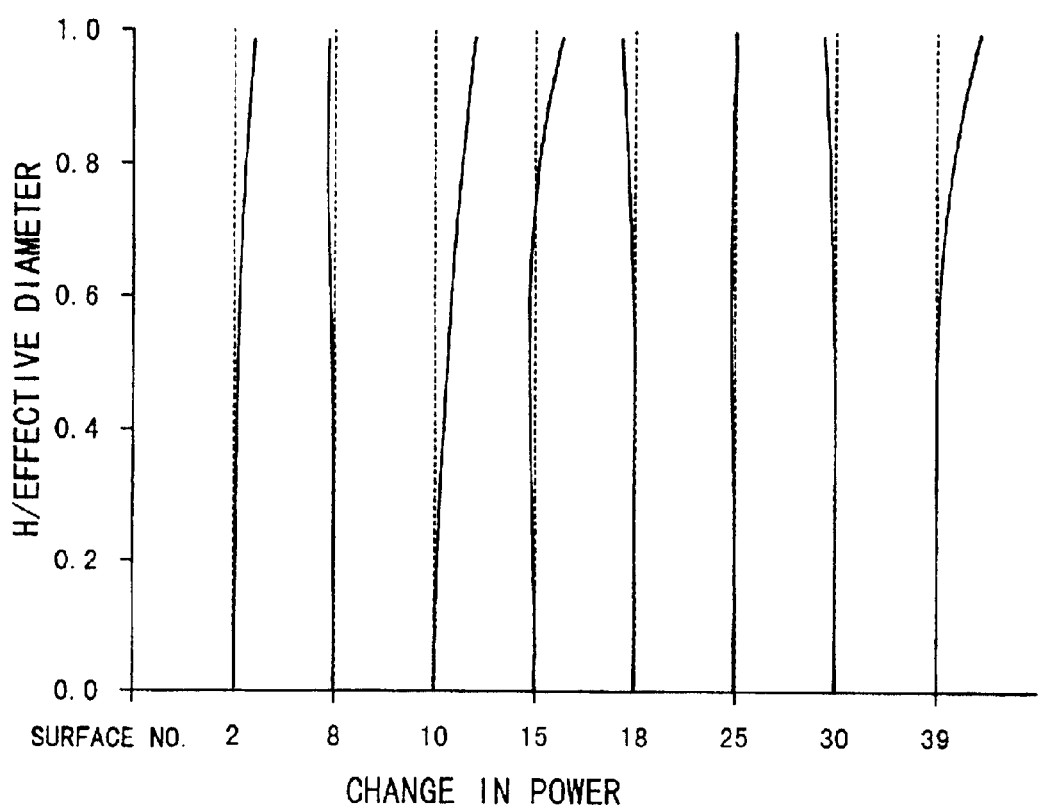
FIG. 44 is a graph for explaining changes in a local curvature power of an aspherical surface of a projection optical system according to Numerical Example 15.
Figure 45:
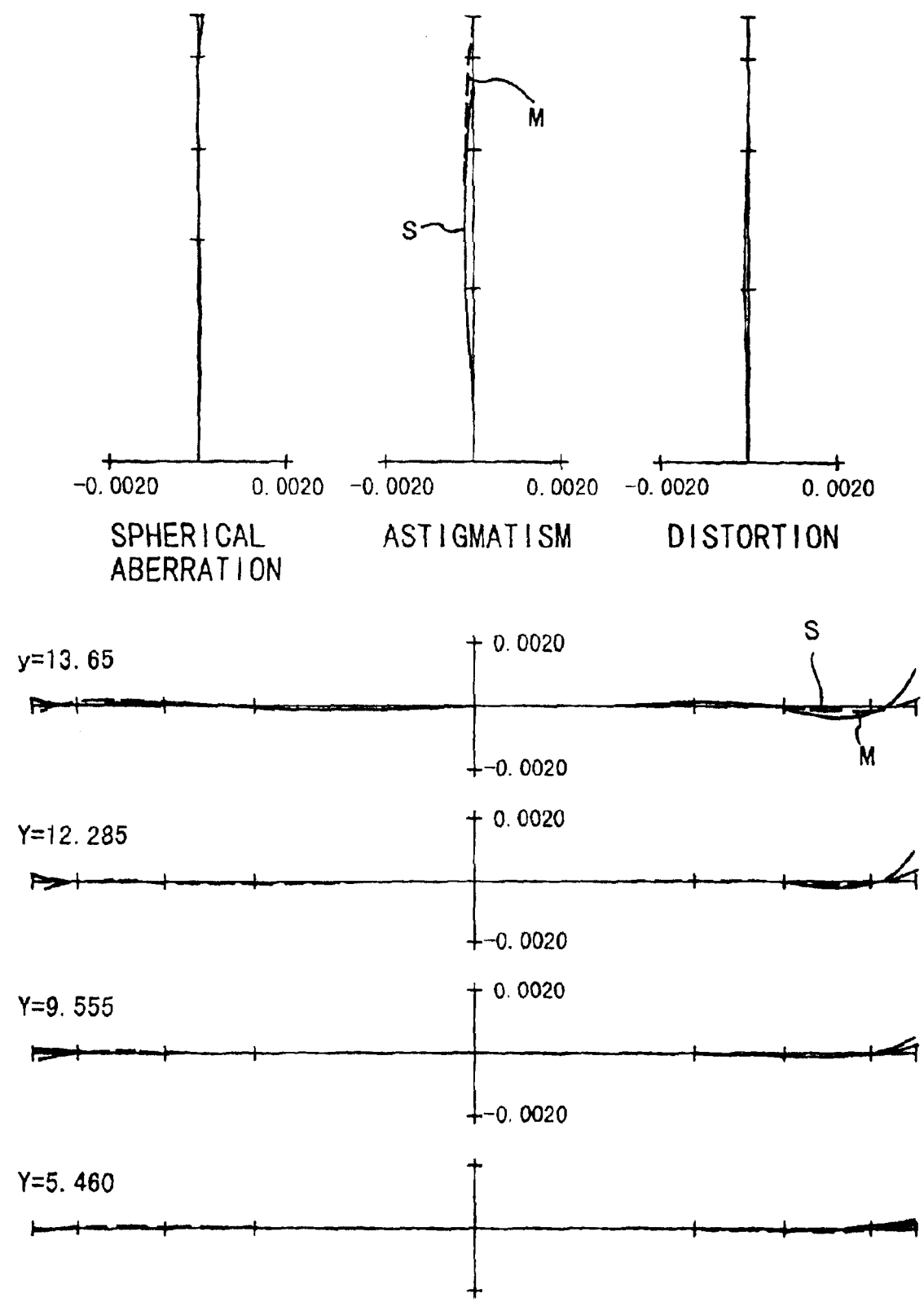
FIG. 45 illustrates aberrations of a projection optical system according to Numerical Example 15.

Table 15 shows specifications of this example, in regard to the conditions. FIG. 44 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 45 illustrates aberrations of this example.

In Numerical Example 15, surfaces r1–r4 belong to a positive first lens group G1, wherein r2 is an aspherical surface. Surfaces r5–r8 belong to a negative second lens group G2, wherein r8 is an aspherical surface. Surfaces r9–r12 belong to a positive third lens group G3, wherein r10 is an aspherical surface. Surfaces r13–r16 belong to a negative fourth lens group G4, wherein r15 is an aspherical surface. Surfaces r17–r22 belong to a positive fifth lens group, wherein r18 is an aspherical surface. Surfaces r23–r26 belong to a negative sixth lens group G6, wherein r25 is an aspherical surface. Surfaces r27–r40 belong to a positive seventh lens group G7, wherein r30 and r39 are aspherical surfaces.

In this example, as shown in Table 15, first the condition of equation (1) for correction of the Petzval sum is satisfied. Then, as aspherical surfaces satisfying the conditions of equations (2) and (3), one aspherical surface is introduced into each of the first, second, third, and fourth lens groups, by which the telecentricity, distortion aberration, curvature of field, and sagittal transverse aberration, for example, are well corrected.

The first lens group is provided by two positive lenses. In the aspherical surface at r2, the local curvature power changes in the positive direction, thus satisfying the function of condition (a3) described above.

The second lens group is provided by two negative lenses. In the aspherical surface at r8, the local curvature power changes in the negative direction, thus satisfying the function of condition (a2). Further, the changes in the local curvature power is in the opposite direction in relation to the surface r2 of the first lens group, such at also the function defined by condition (a1) is satisfied.

The third lens group is provided by two positive lenses. In the aspherical surface at r10, the local curvature power changes in the positive direction, thus satisfying the function of condition (a3). Further, the change in the local curvature power is in the opposite direction in relation to the surface r8 of the second lens group, such that also the function defined by condition (a1) is satisfied.

The fourth lens group is provided by two negative lenses, and they serve mainly to correct the Petzval sum. In the aspherical surface at r15, the local curvature power changes in the negative direction, in the central portion thereof, thus satisfying the function as defined by condition (a2) described above. In the peripheral portion, it changes in the positive direction, which is effective to cancel, at higher orders, the diverging action of this lens group itself.

The fifth lens group is provided by three positive lenses. The aspherical surface at r18 includes a region in which the local curvature power changes in the negative direction, thus correcting the spherical aberration, for example.

The sixth lens group is provided by two negative lenses, and mainly they serve to correct the Petzval sum. In the aspherical surface at r25, the local curvature power changes in the negative direction, in the central portion, whereas it changes in the positive direction, in the peripheral portion. This effectively cancels, at higher orders, the diverging action of this lens group itself.

The seventh lens group is provided by six positive lenses and one negative lens. The aspherical surface at r30 includes a region in which the local curvature power changes in the negative direction, to thereby mainly correct spherical aberration. In the spherical surface 39r, the change in local curvature power at the central portion is slightly in the negative direction, while at the peripheral portion it is in the positive direction, by which distortion and coma are corrected.

With this arrangement, aberrations are corrected satisfactorily, as illustrated in FIG. 45.

EXAMPLE 16

Figure 46:
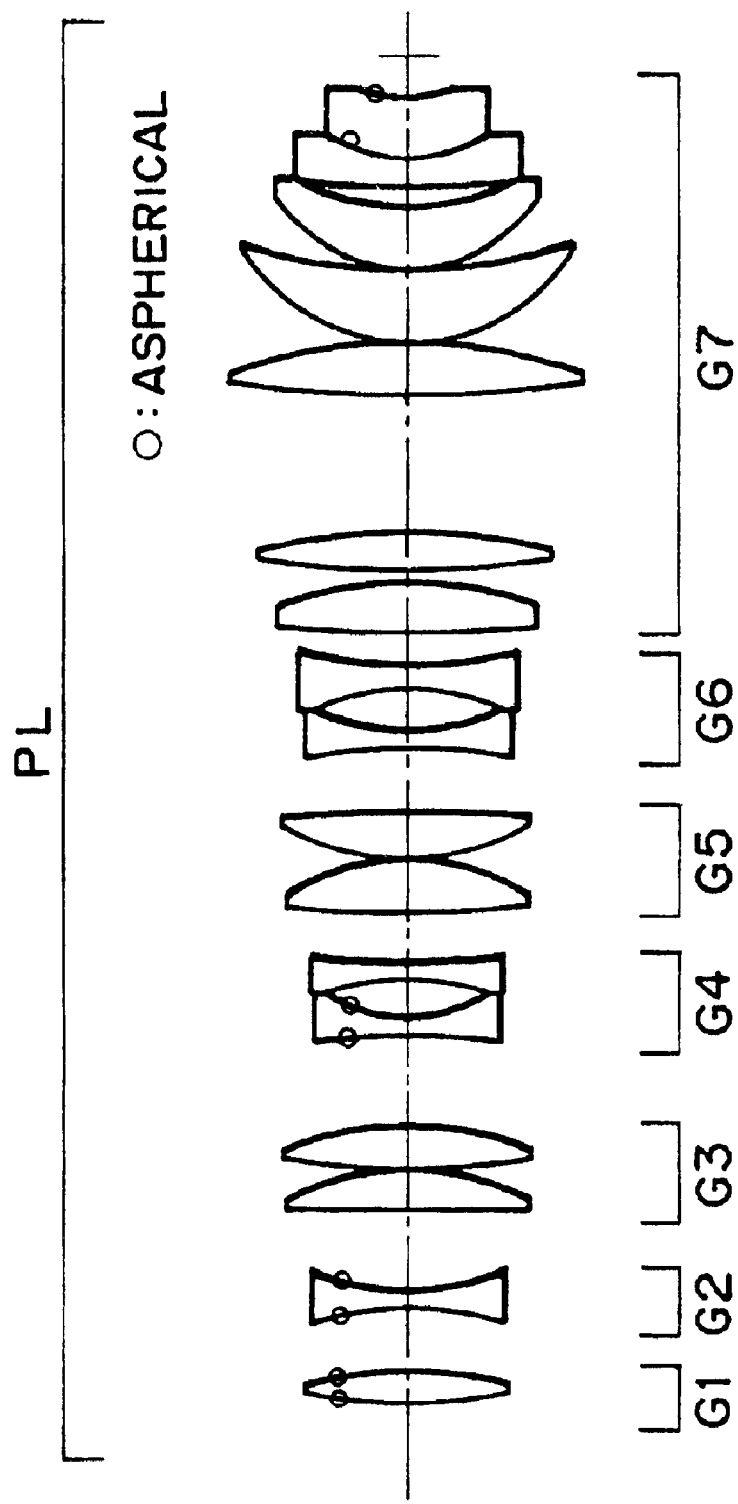
FIG. 46 is a lens sectional view of a projection optical system for use in a projection exposure apparatus, according to Numerical Example 16 of the present invention.

FIG. 46 is a lens sectional view of a projection optical system according to Numerical Example 16 of the present invention. The projection optical system has a reference wavelength 193 nm, a numerical aperture NA=0.65, a projection magnification β=1:4, a lens conjugate distance L=1000 mm, and an exposure region of diameter ⌀27.3 mm. This optical system is accomplished by lenses of a number 17 (seventeen) which is extraordinarily small as a seven-group type lens system. It uses eight aspherical surfaces, all being provided on a bi-aspherical surface lens.

Figure 47:
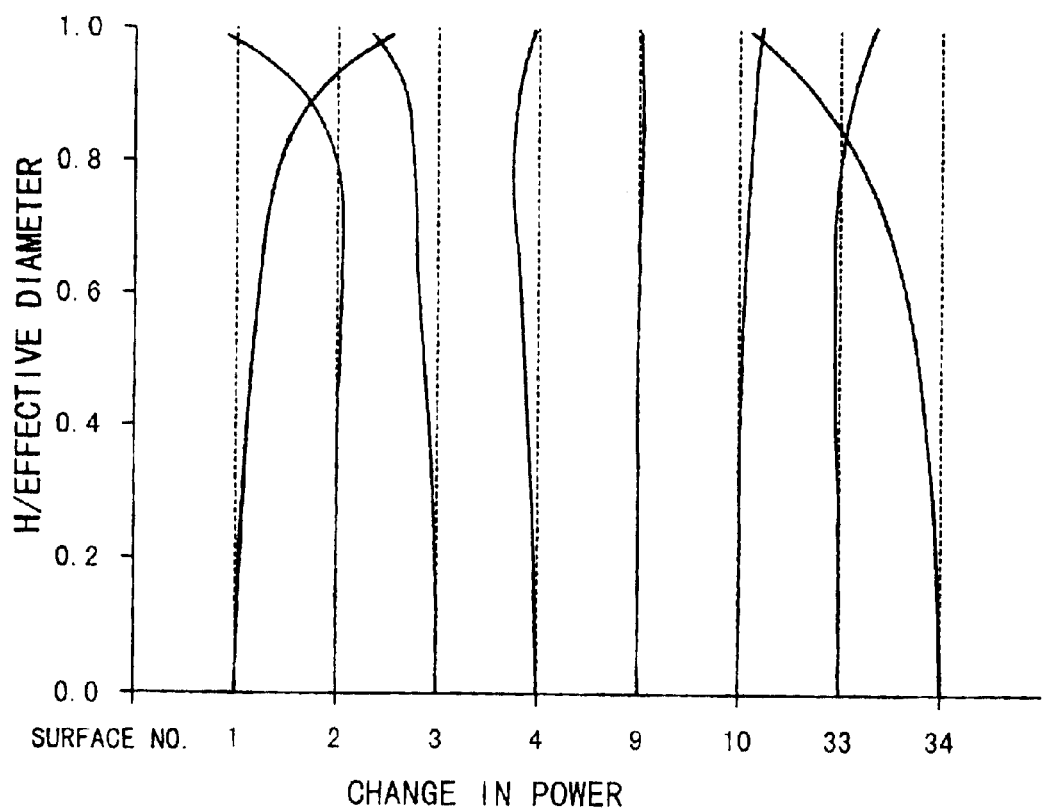
FIG. 47 is a graph for explaining changes in a local curvature power of an aspherical surface of a projection optical system according to Numerical Example 16.
Figure 48:
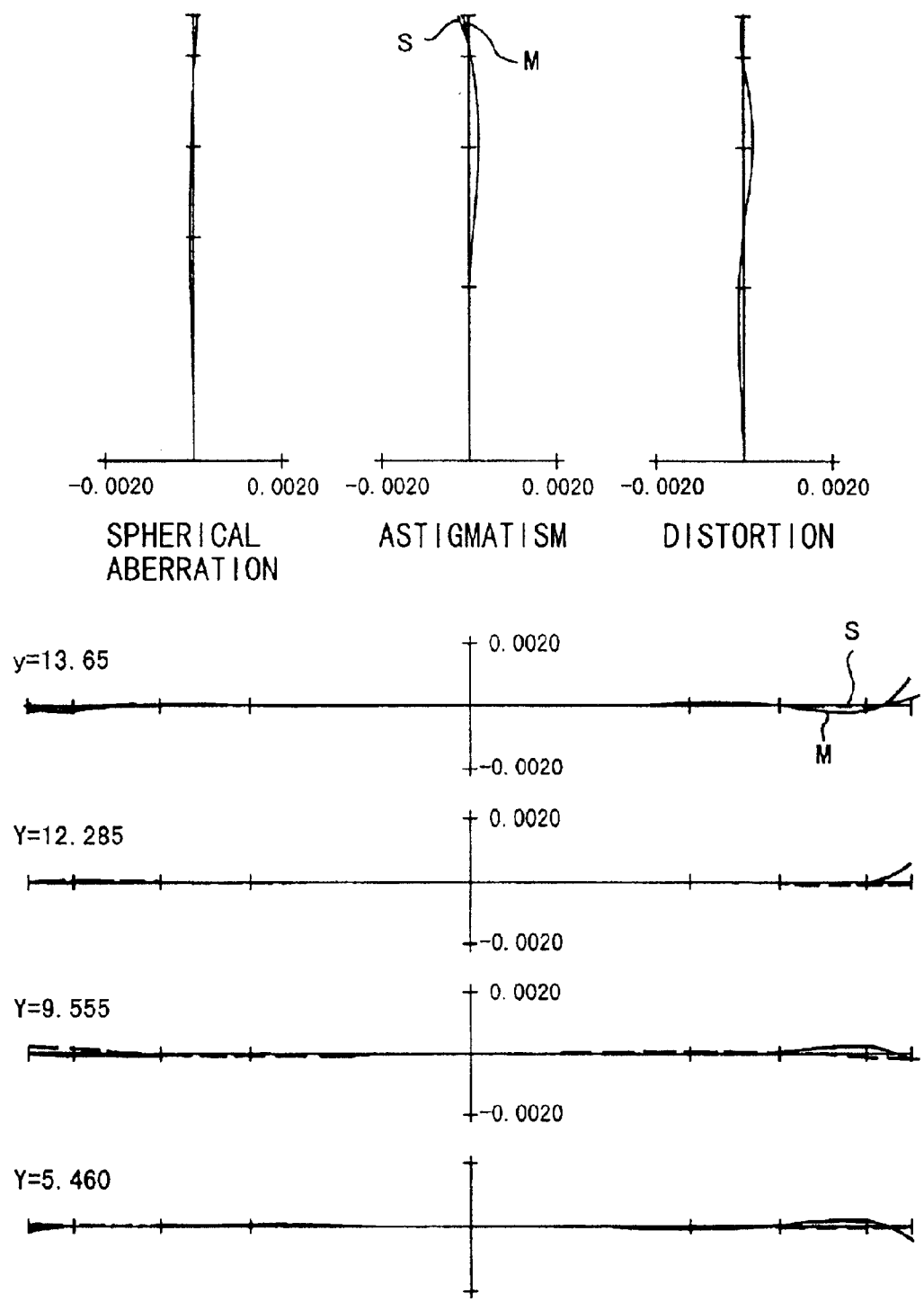
FIG. 48 illustrates aberrations of a projection optical system according to Numerical Example 16.

Table 16 shows specifications of this example, in regard to the conditions. FIG. 47 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 48 illustrates aberrations in this example.

In Numerical Example 16, surfaces r1–r2 belong to a positive first lens group G1, wherein r1 and r2 are aspherical surfaces (of a bi-aspherical surface lens). Surfaces r3–r4 belong to negative second lens group G2, wherein r3 and r4 are aspherical surfaces (of a bi-aspherical surface lens). Surfaces r5–r8 belong to a positive third lens group G3, all of which are spherical surfaces. Surfaces r9–r12 belong to a negative fourth lens group G4, wherein r9 and r10 are aspherical surfaces (of a bi-aspherical surface lens). Surfaces r13–r16 belong to a positive fifth lens group, all of which are spherical surfaces. Surfaces r17–r20 belong to a negative sixth lens group G6, all of which are spherical surfaces. Surfaces r21–r34 belong to a positive seventh lens group G7, wherein r33 and r34 are aspherical surfaces (of a bi-aspherical surface lens).

In this example, as shown in Table 16, first the condition of equation (1) for correction of the Petzval sum is satisfied. Then, as aspherical surfaces satisfying the conditions of equations (2) and (3), one aspherical surface is introduced into each of the first, second, fourth and seventh lens groups, by which the telecentricity, distortion aberration, and curvature of field, for example, are well corrected.

The first lens group is provided by one positive lens. The aspherical surfaces at r1 and r2 include regions in which their local curvature powers change with mutually opposite signs, thus satisfying the function of condition (a1) described above as well as the function of condition (a3). In total, there remains the power change in the positive direction.

The second lens group is provided by one negative lens. The aspherical surfaces at r3 and r4 includes regions in which the local curvature powers change with mutually opposite signs, thus satisfying the functions of conditions (a1) and (a2). In total, there remains a power change in the negative direction, and the group is in the canceling relation with the first group. Also, in this respect, the function defined by condition (a1) is satisfied.

The third lens group is provided by two positive lenses, and they are effective to correct meridional or sagittal transverse aberrations.

The fourth lens group is provided by two negative lenses. The aspherical surfaces at r9 and r10 are in a weak canceling relation with each other, at the outermost peripheral portion. In total, however, a power change in the positive direction remains. Thus, it functions to cancel the diverging action of this lens system itself.

The fifth lens group is provided by two positive lenses.

The sixth lens group is provided by two negative lenses, and mainly they serve to correct the Petzval sum.

The seventh lens group is provided by six positive lenses and one negative lens. In the aspherical surfaces at r33 and r34, their local curvature powers change with mutually opposite signs, in the peripheral portion, thus satisfying the function of condition (a1) described above. In total, a power change in the negative direction remains, which effectively corrects distortion, coma and spherical aberration, for example.

With this arrangement, aberrations are corrected satisfactorily, as illustrated in FIG. 48.

EXAMPLE 17

Figure 49:
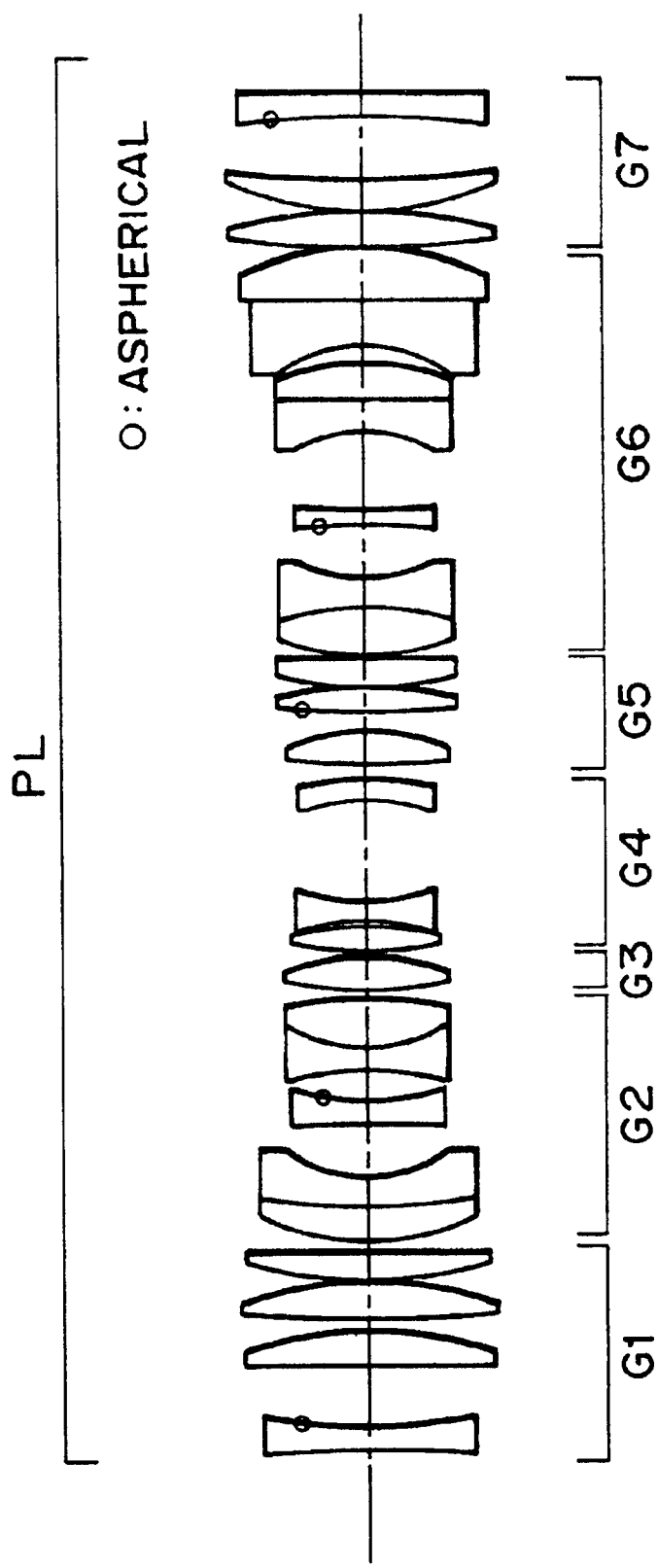
FIG. 49 is a lens sectional view of a projection optical system for use in a projection exposure apparatus, according to Numerical Example 17 of the present invention.

FIG. 49 is a lens sectional view of a projection optical system according to Numerical Example 17 of the present invention, which is particularly suitably used in an apparatus for producing a pattern for a liquid crystal device. The projection optical system has a reference wavelength 435.8 nm (g-line), a numerical aperture NA=0.10, a projection magnification β=1:1.25, a lens conjugate distance L=1250 mm, and an exposure region of diameter ⌀85.0 mm. This optical system is accomplished by lenses of a small number 26 (twenty-six). It uses five aspherical surfaces.

Figure 50:
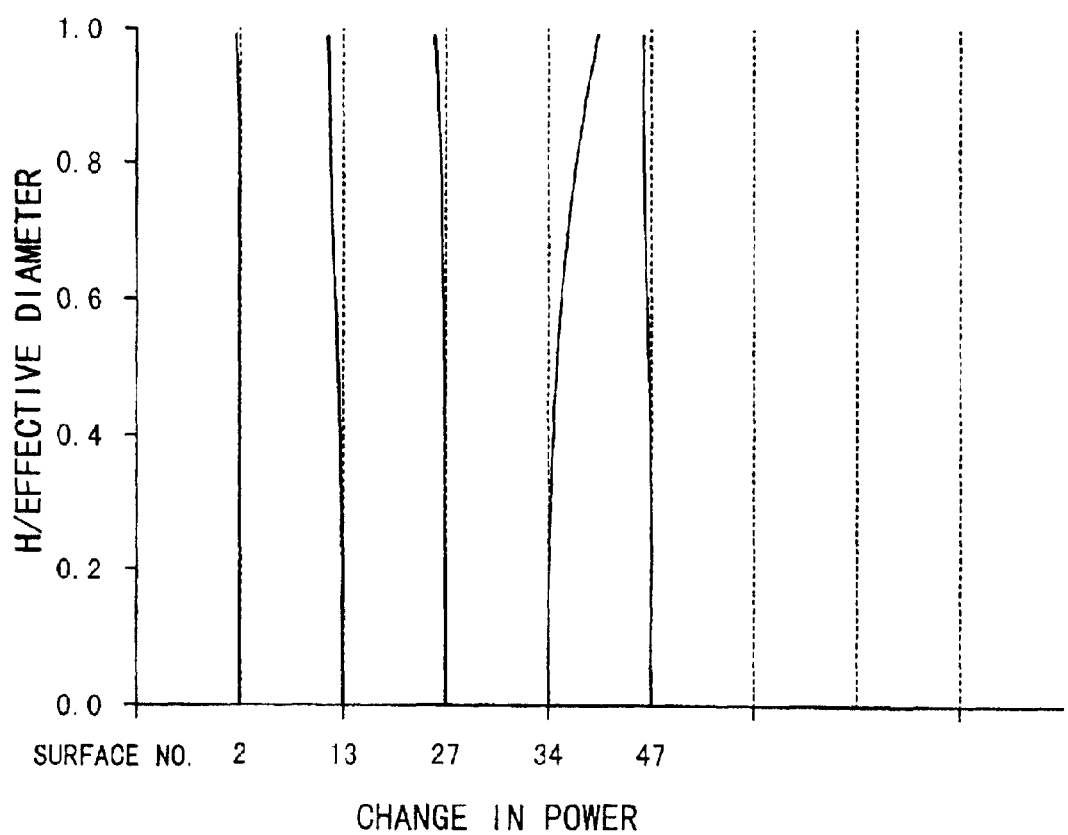
FIG. 50 is a graph for explaining changes in a local curvature power of an aspherical surface of a projection optical system according to Numerical Example 17.
Figure 51:
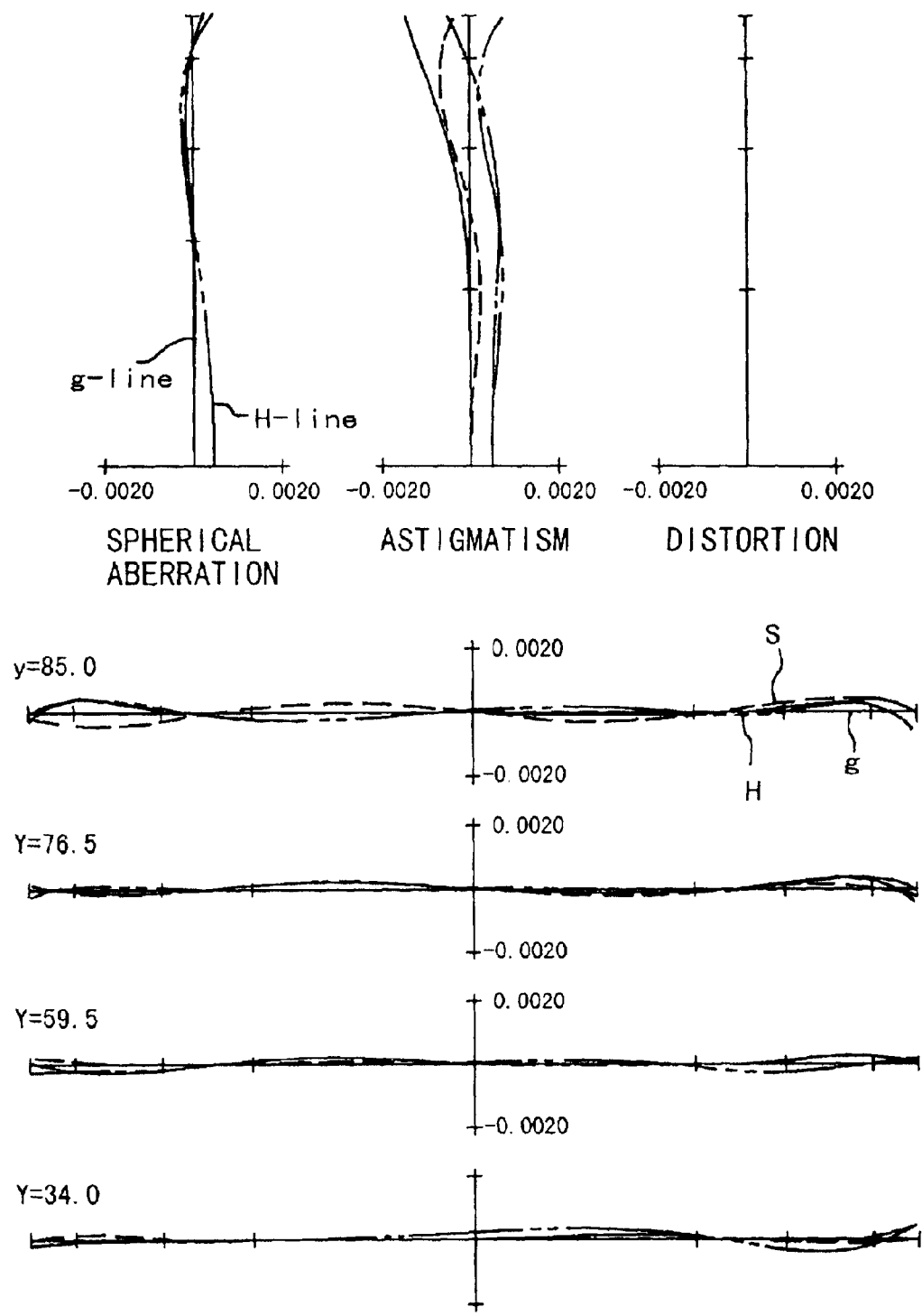
FIG. 51 illustrates aberrations of a projection optical system according to Numerical Example 17.

Table 17 shows specifications of this example, in regard to the conditions. FIG. 50 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 51 illustrates aberrations of this example.

Chromatic aberration is taken into consideration in this example. When glass materials have following the refractive indices (n) with respect to g-line:

| | |
|---|---|
| Refractive Index n | = 1.603377 |
| | = 1.594224 |
| | = 1.480884 | then, they have following the refractive indices with respect to h-line (404.7 nm):

| | |
|---|---|
| Refractive index n | = 1.607780 |
| | = 1.600939 |
| | = 1.483290 |

In Numerical Example 17, surfaces r1–r8 belong to a positive first lens group G1, wherein r2 is an aspherical surface. Surfaces r9–r16 belong to a negative second lens group G2, wherein r13 is an aspherical surface. Surfaces r17–r18 belong to a positive third lens group G3, all of which are spherical surfaces. Surfaces r19–r24 belong to a negative fourth lens group G4, all of which are spherical surfaces. Surfaces r25–30 belong to a positive fifth lens group G5, wherein r27 is an aspherical surface. Surfaces r31–r42 belong to a negative sixth lens group G6, wherein r34 is an aspherical surface. Surfaces r43–r48 belong to a positive seventh lens group G7, wherein r47 is an aspherical surface.

In this example, as shown in Table 17, first the condition of equation (1) for correction of the Petzval sum is satisfied. Then, as aspherical surfaces satisfying the conditions of equations (2) and (3), one aspherical surface is introduced into each of the first, second, sixth and seventh lens groups, by which the telecentricity, distortion aberration, and curvature of field, for example, are well corrected. This optical system has a magnification 1.25× which is greater than the unit magnification, and, even at the image plane side, a chief ray passes a high position. Therefore, introducing an aspherical surface also into the sixth and seventh lens groups is effective.

In the aspherical surface r13 of the second lens group, the function of condition (a2) described above is satisfied. Also, through the relation with the aspherical surface r34 of the sixth lens group and the aspherical surface r47 of the seventh lens group, the function defined by condition (a1) is satisfied.

In the aspherical surface r27 of the fifth lens group, the local curvature power changes in the negative direction, and, thus, mainly the spherical aberration is corrected.

With this arrangement, aberrations are corrected satisfactorily, as illustrated in FIG. 51.

EXAMPLE 18

Figure 55:
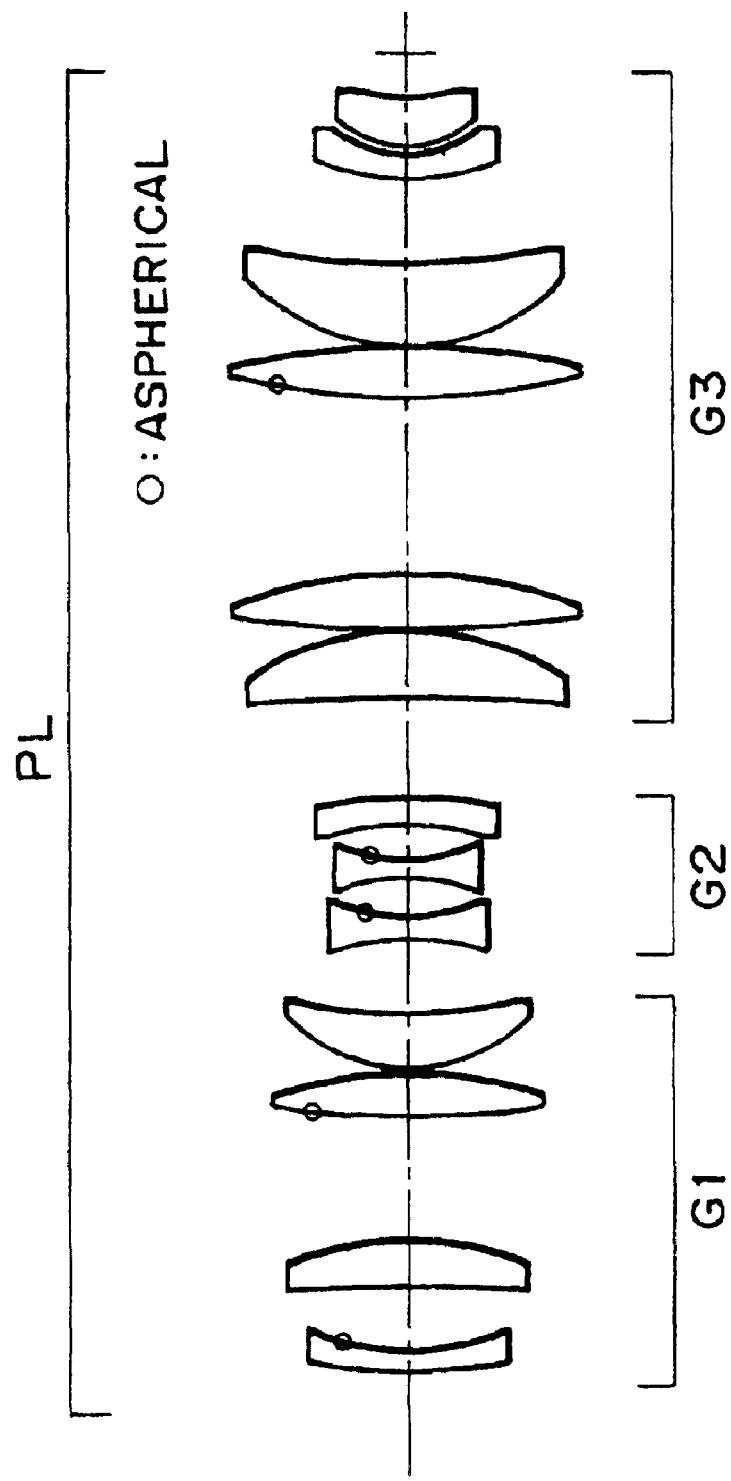
FIG. 55 is a lens sectional view of a projection optical system for use in a projection exposure apparatus, according to Numerical Example 18 of the present invention.

FIG. 55 is a lens sectional view of a projection optical system according to Numerical Example 18 of the present invention. The projection optical system has a reference wavelength 193 nm, a numerical aperture NA=0.65, a projection magnification $\beta$=1:4, a lens conjugate distance L=1000 mm, and an exposure region of diameter Ø27.3 mm. This optical system is accomplished by lenses of a small number 13 (thirteen). It uses five aspherical surfaces.

Figure 56:
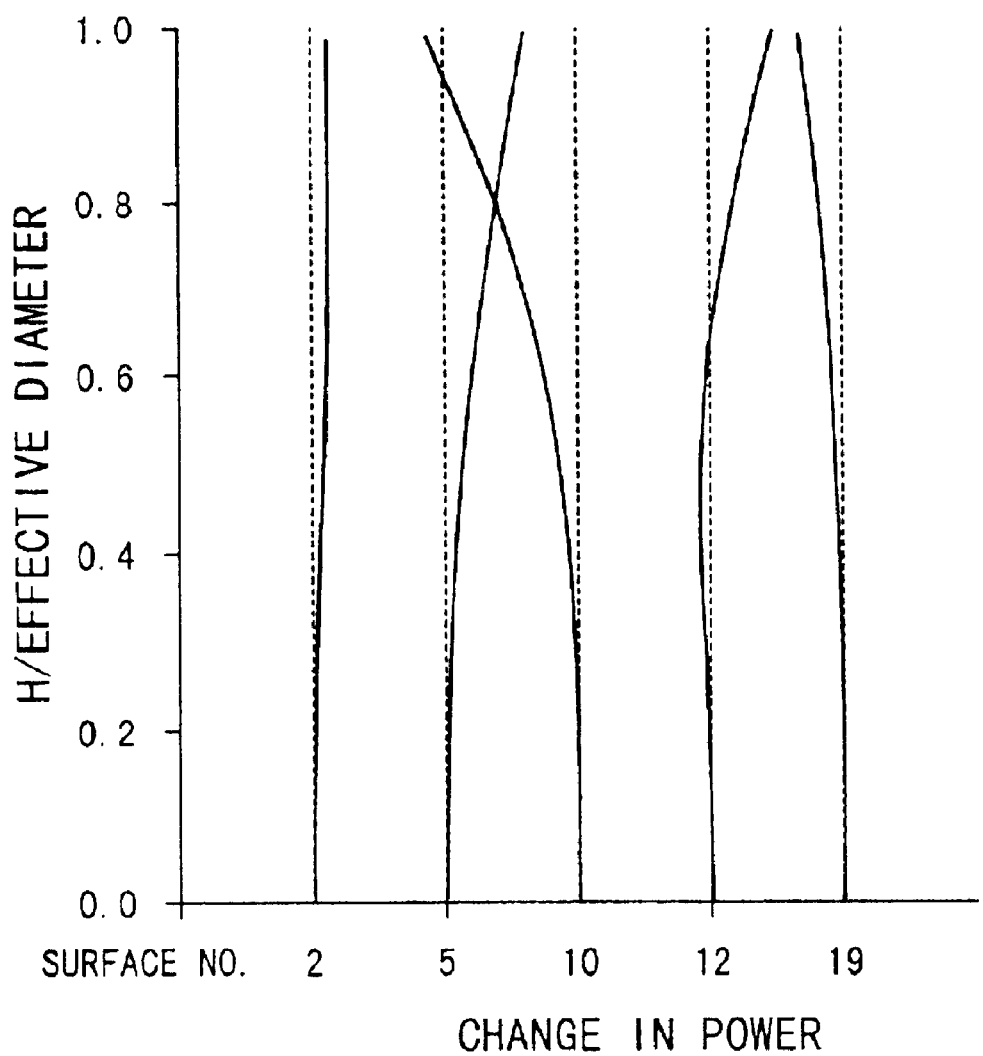
FIG. 56 is a graph for explaining changes in a local curvature power of an aspherical surface of a projection optical system according to Numerical Example 18.
Figure 57:
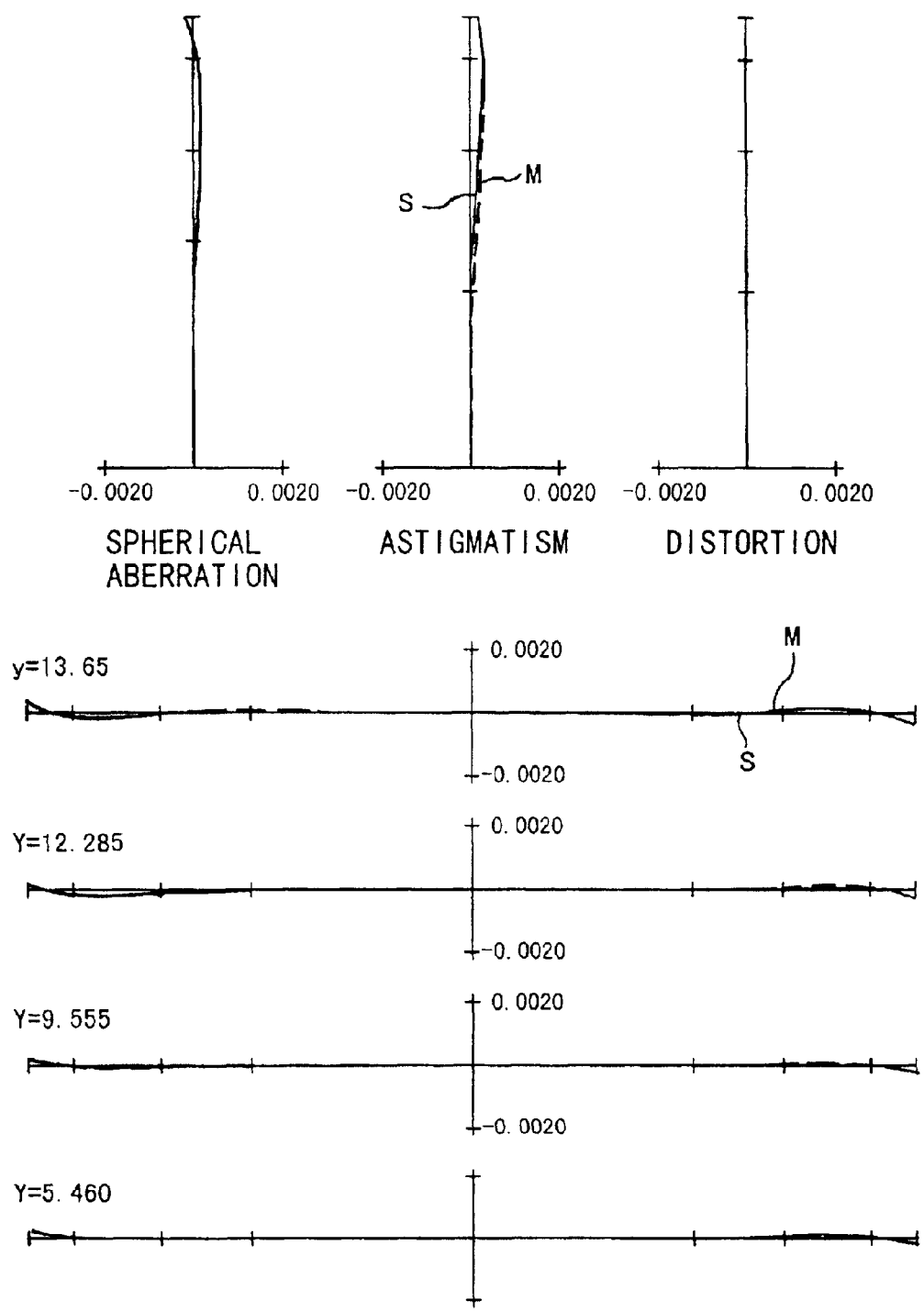
FIG. 57 illustrates aberrations of a projection optical system according to Numerical Example 18.

Table 18 shows specifications of this example, in regard to the conditions. FIG. 56 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 57 illustrates aberrations of this example.

In Numerical Example 18, surfaces r1–r8 belong to a positive first lens group G1, wherein r2 and r5 are aspherical surfaces. Surfaces r9–r14 belong to a negative second lens group G2, wherein r10 and r12 are aspherical surfaces. Surfaces r15–r26 belong to a positive third lens group G3, wherein r19 is an aspherical surface.

In this example, as shown in Table 18, first the condition of equation (1) for correction of the Petzval sum is satisfied. Then, as aspherical surfaces satisfying the conditions of equations (2) and (3), four aspherical surface are used. Namely, two aspherical surfaces are placed in the first lens group, and two aspherical surfaces are placed in the second lens group. With this arrangement, the telecentricity, distortion aberration and curvature of field, for example, are corrected well.

The first lens group is provided by one negative lens and three positive lenses. In the aspherical surfaces at r2 and r5, their local curvature powers gradually change in the positive direction. Thus, the function as defined by condition (b2) described above is satisfied.

The second lens group is provided by three negative lenses. The aspherical surfaces at r10 and r12 include regions in which their local curvature powers change with mutually opposite signs to cancel with each other, for correction of higher orders of field curvature and distortion, for example. Thus, the function as defined by condition (b1) described above is satisfied.

Additionally, in the relationship between the surface r10 and the surfaces r2 and r5 of the first lens group, there are regions in which the local curvature powers change with mutually opposite signs. Thus, also in this respect, the function of condition (b1) is satisfied. This is effective for correction of the telecentricity and distortion, for example.

The third lens group is provided by five positive lenses and one negative lens. Only the surface at r19 is an aspherical surface wherein the local curvature power changes in the negative direction mainly for correction of the spherical aberration. Thus, the functions of conditions (b3) and (b4) described above are satisfied.

In the lens system, a pair of lenses, comprising a negative meniscus lens having its concave surface facing to the image plane side and a positive meniscus lens having a first concave surface facing to the image plane side, are disposed, to assist correction of field curvature, coma aberration and distortion aberration.

With this arrangement, aberrations are corrected satisfactorily, as illustrated in FIG. 57.

EXAMPLE 19

Figure 58:
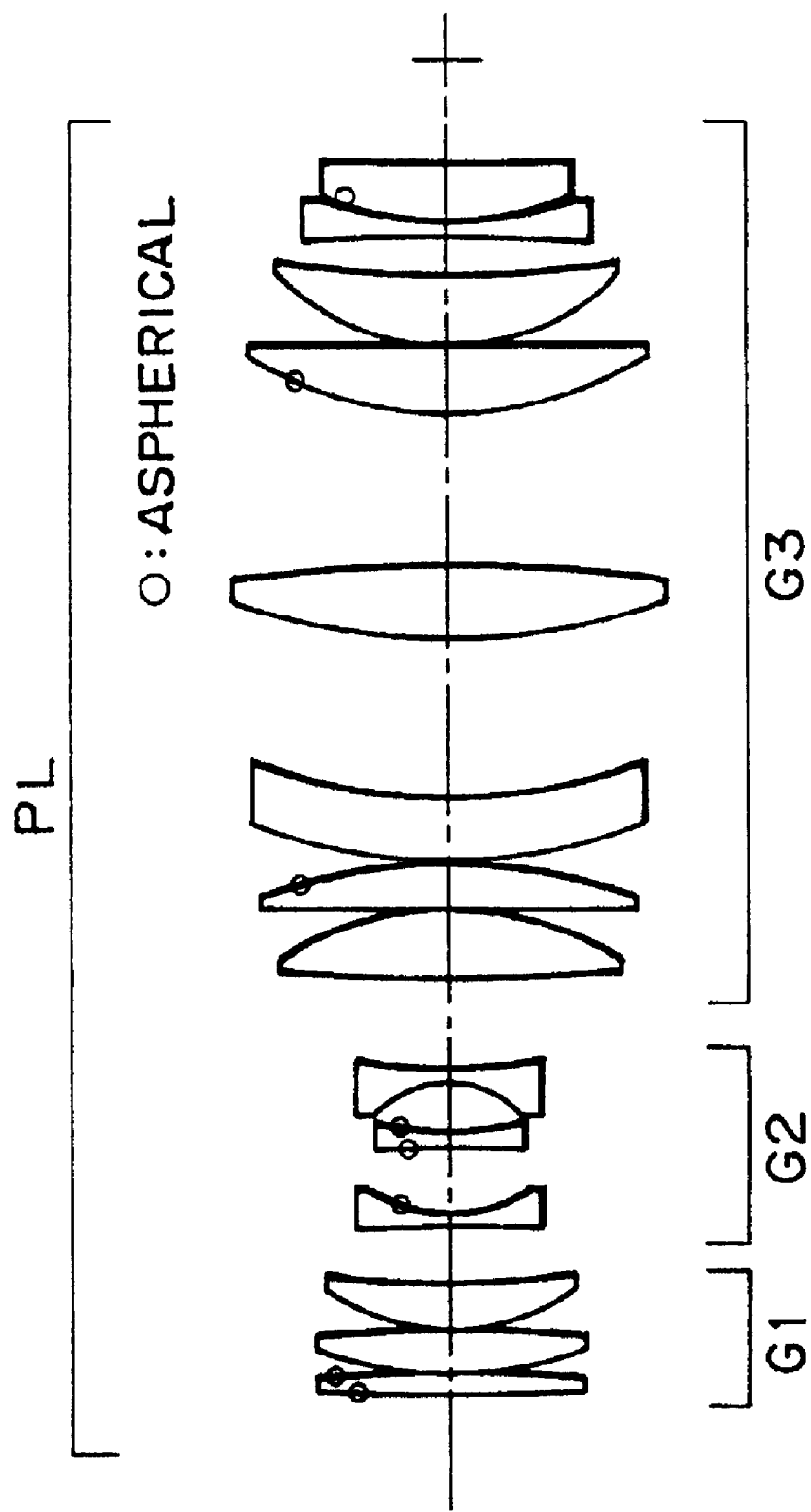
FIG. 58 is a lens sectional view of a projection optical system for use in a projection exposure apparatus, according to Numerical Example 19 of the present invention.

FIG. 58 is a lens sectional view of a projection optical system according to Numerical Example 19 of the present invention. The projection optical system has a reference wavelength 193 nm, a numerical aperture NA=0.65, a projection magnification $\beta$=1:4, a lens conjugate distance L=1000 mm, and an exposure region of diameter Ø27.3 mm. This optical system is accomplished by lenses of a small number 14 (fourteen). It uses eight aspherical surfaces.

Figure 59:
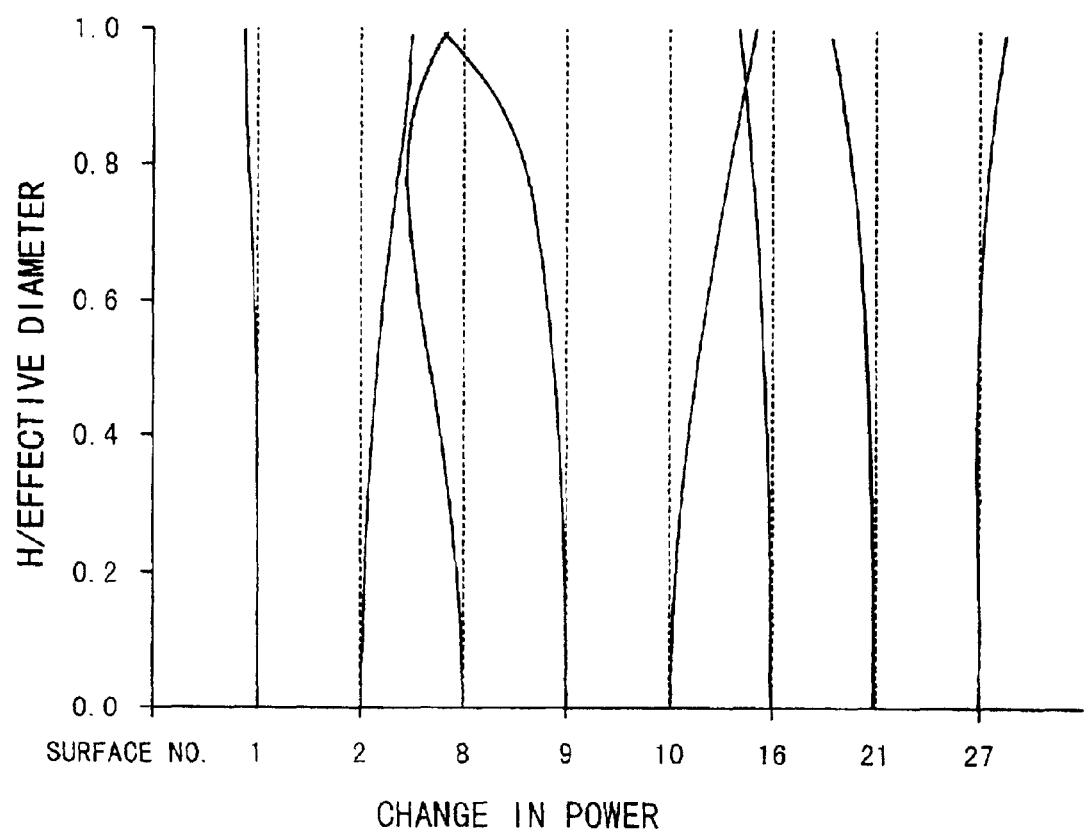
FIG. 59 is a graph for explaining changes in a local curvature power of an aspherical surface of a projection optical system according to Numerical Example 19.
Figure 60:
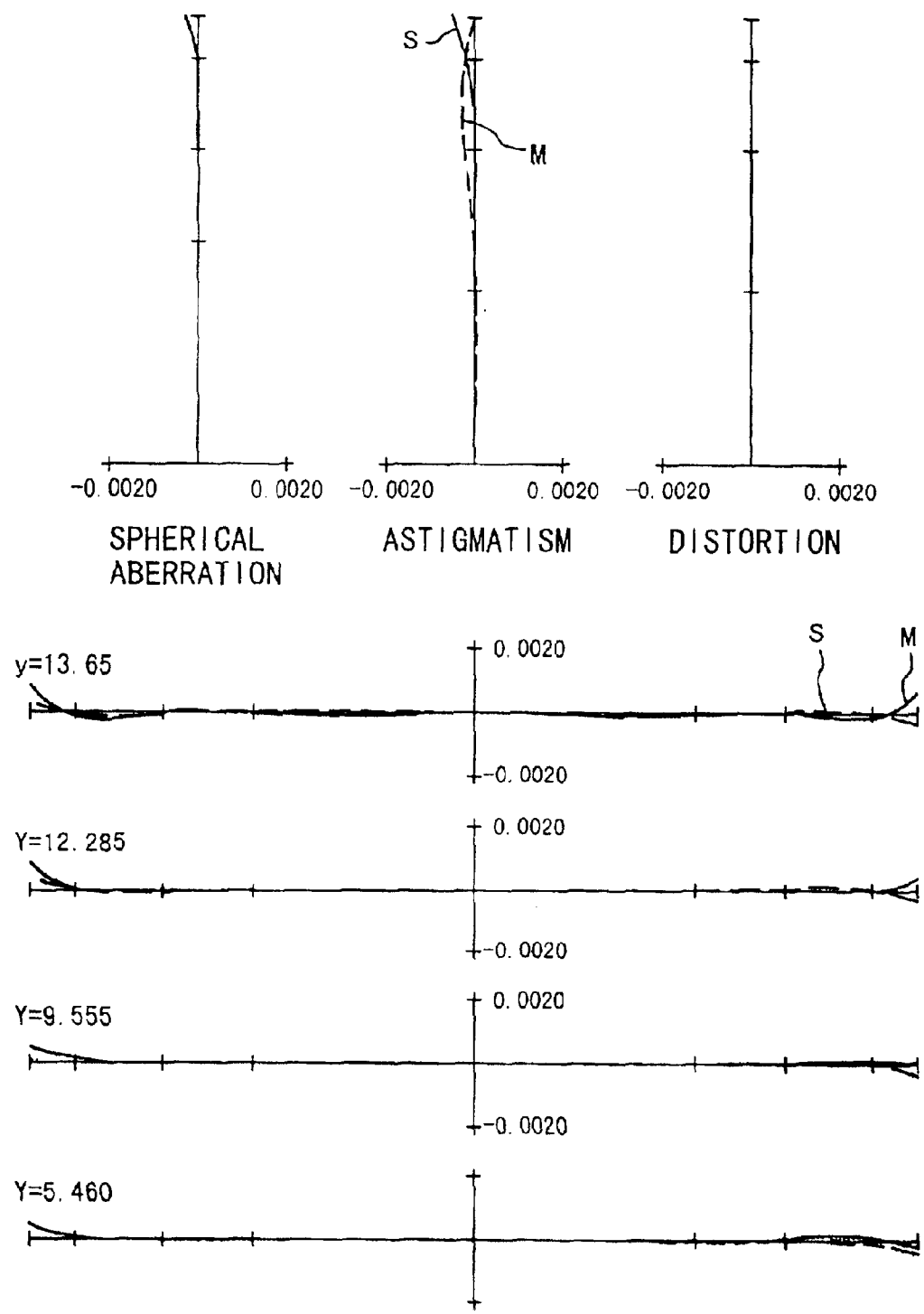
FIG. 60 illustrates aberrations of a projection optical system according to Numerical Example 19.

Table 19 shows specifications of this example, in regard to the conditions. FIG. 59 illustrates changes in power of aspherical surfaces, wherein the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively. FIG. 60 illustrates aberrations of this example.

In Numerical Example 19, surfaces r1–r6 belong to a positive first lens group G1, wherein r1 and r2 are aspherical surfaces. Surfaces r7–r12 belong to a negative second lens group G2, wherein r8, r9 and r10 are aspherical surfaces. Surfaces r13–r28 belong to a positive third lens group G3, wherein r16, r21 and r27 are aspherical surfaces.

Each of the lenses having surfaces r1 and r2; r8 and r9 is a bi-aspherical surface lens having aspherical surfaces on both sides thereof.

In this example, as shown in Table 19, first the condition of equation (1) for correction of the Petzval sum is satisfied. Then, as aspherical surfaces satisfying the conditions of equations (2) and (3), five aspherical surfaces are used. Namely, two aspherical surfaces are placed in the first lens group, and three aspherical surfaces are placed in the second lens group. With this arrangement, the telecentricity, distortion aberration and curvature of field, for example, are corrected well.

The first lens group is provided by three positive lenses. In the aspherical surfaces at r1 and r2 which are the surfaces of a bi-aspherical surface lens, their local curvature powers change with mutually opposite signs to cancel with each other, thus satisfying the function defined by condition (b1) described above and, simultaneously, the function of condition (b2) described above.

The second lens group is provided by three negative lenses. At the aspherical surfaces r9 and r10 which are the surfaces of a bi-aspherical surface lens, the local curvature powers change with mutually opposite signs to cancel with each other. Thus, the function of condition (b1) is satisfied.

Similarly, between the surfaces r8 and 10, between the surfaces r2 and r8, and between the surfaces r2 and r9, the function defined by condition (b1) is satisfied. Thus, through mutual cancellation, the telecentricity, distortion and field curvature, for example, are well corrected. Further, because a bi-aspherical surface lens is used to provide the function of condition (b1), the influence of any eccentricity due to the lens manufacture can be reduced.

The third lens group is provided by seven positive lenses and one negative lens. In the asperical surfaces at r16 and r21, the local curvature power changes in the negative direction so as mainly to correct the spherical aberration. Thus, the function of condition (b3) is satisfied. In the aspherical surface at r27, the local curvature power thereof at the peripheral portion changes in the positive direction, thus satisfying the function of condition (b4).

In the lens system, a pair of lenses, comprising a negative lens having a second concave surface facing to the image plane side and a positive meniscus lens having its first concave surface facing to the image plane side, are disposed, to assist correction of field curvature, coma aberration and distortion aberration., With this arrangement, aberrations are corrected satisfactorily, as illustrated in FIG. 60.

EXAMPLES 20–24

Next, important features of lens structures of projection optical systems according to Numerical Examples 20–24 of the present invention will be described. In these examples, the projection optical system is made substantially telecentric on the object side (reticle side) and on the image plane side (wafer side). It has a projection magnification β=1:4, a numerical aperture NA=0.65, and an object-to-image distance (from object plane to image plane) L=1000 mm. The reference wavelength is 193 nm. As regards the picture plane range, the diameter of an exposure area on a wafer is Ø27.3 mm.

In FIGS. 62, 65, 68, 71 and 74, the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively.

EXAMPLE 20

Figure 61:
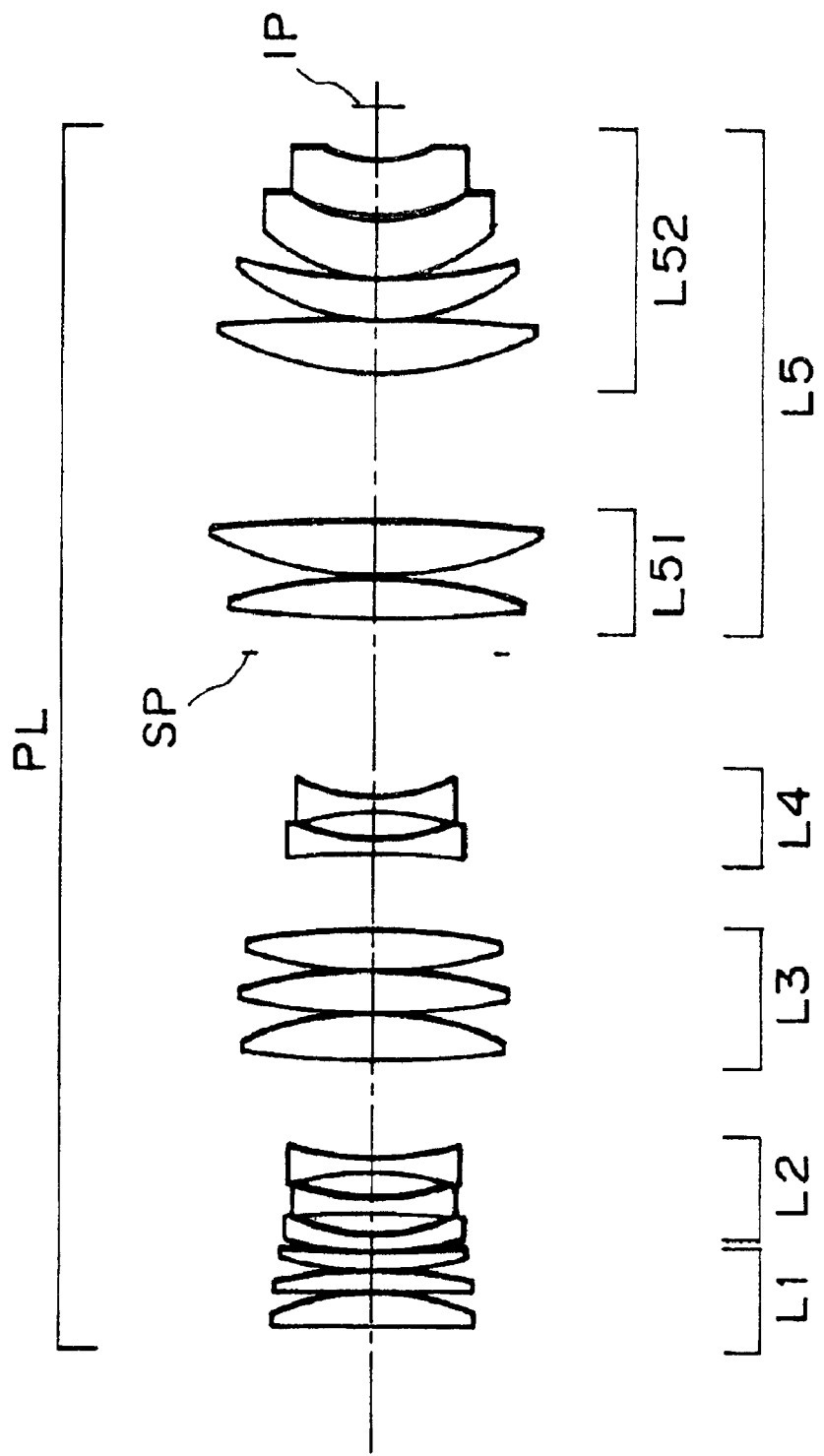
FIG. 61 is a lens sectional view of a projection optical system for use in a projection exposure apparatus, according to Numerical Example 20 of the present invention.

In Numerical Example 20 shown in FIG. 61, the lens system comprises, in an order from the object side, a first lens group L1 having a positive refractive power, a second lens group L2 having a negative refractive power, a third lens group L3 having a positive refractive power, a fourth lens group L4 having a negative refractive power, and a fifth lens group L5 having a positive refractive power and including a front unit L51 with a positive refractive power and a rear unit L52 having a positive refractive power.

Figure 62:
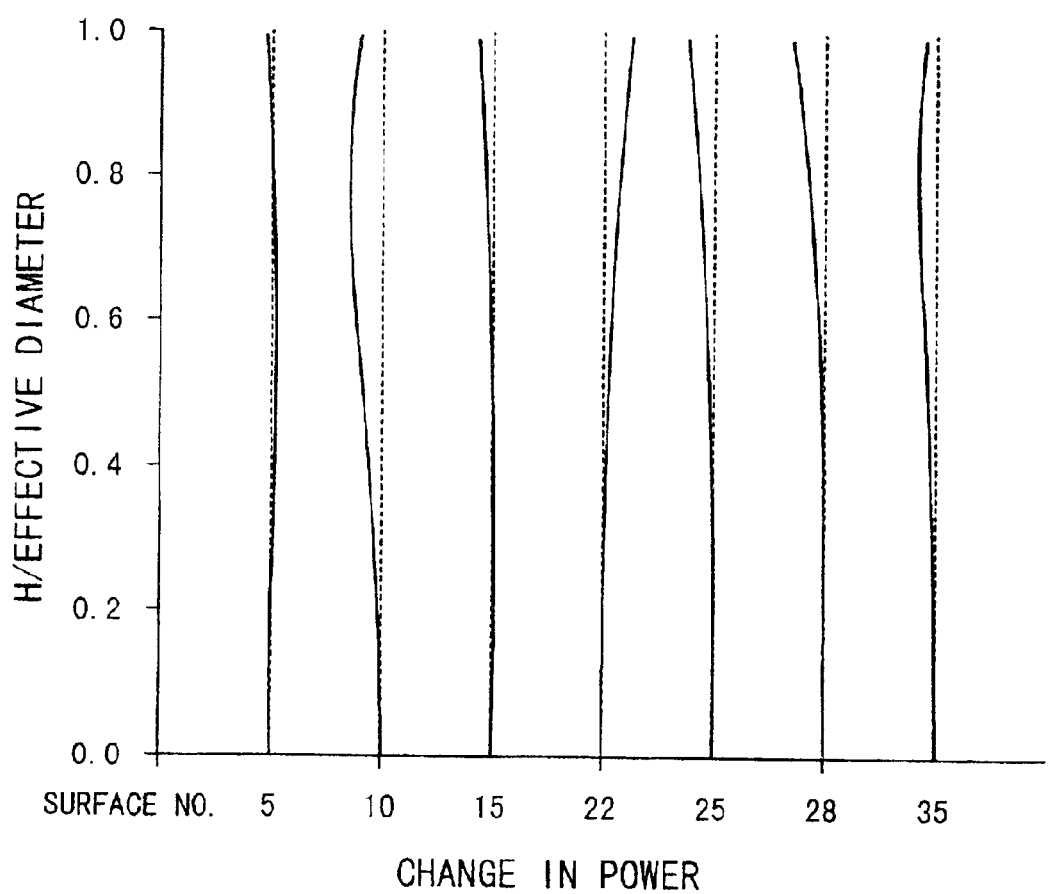
FIG. 62 is a graph for explaining changes in a local curvature power of an aspherical surface of a projection optical system according to Numerical Example 20.
Figure 63:
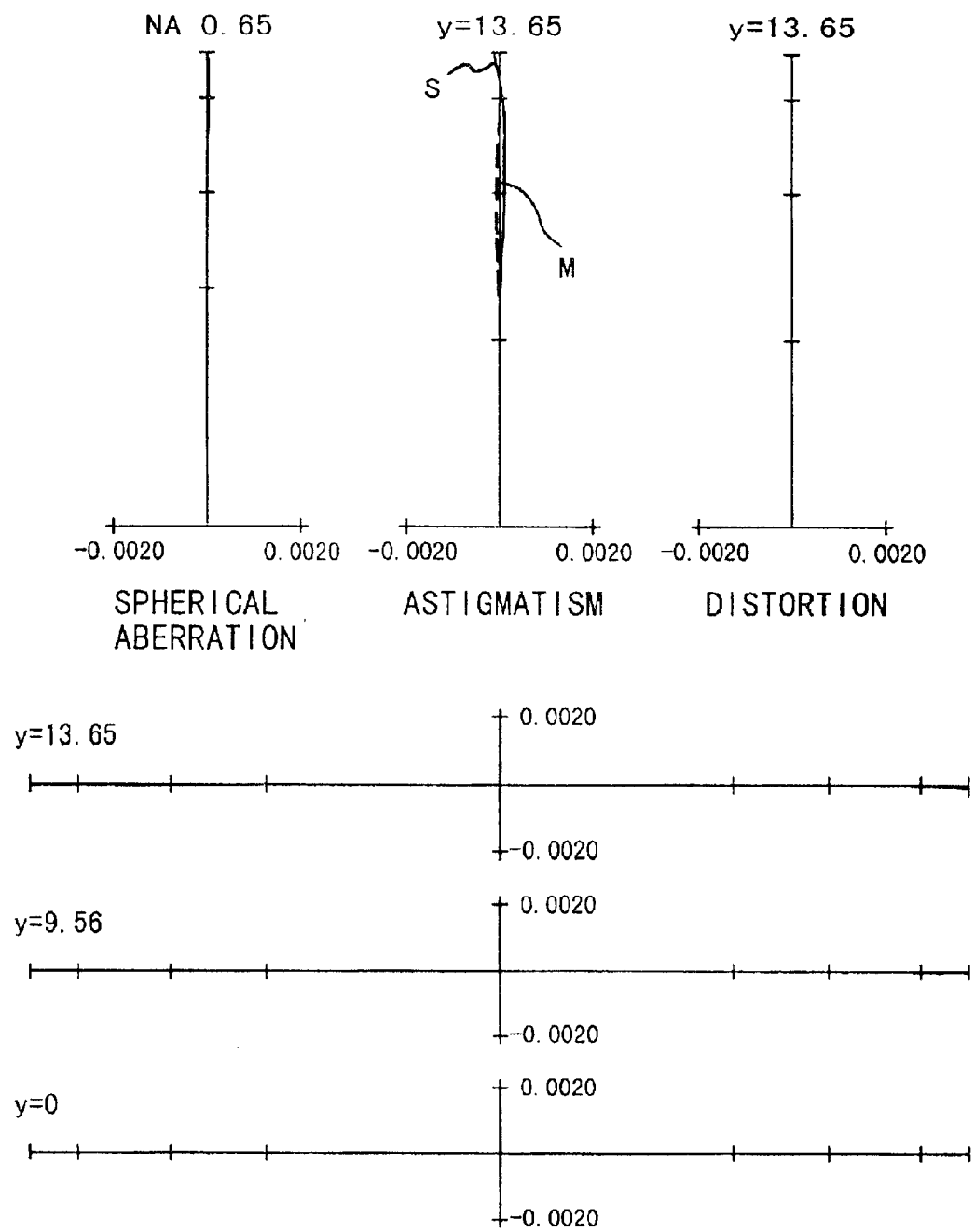
FIG. 63 illustrates aberrations of a projection optical system according to Numerical Example 20.

The lens optical system uses seven aspherical surfaces. Table 20 shows values corresponding to conditions of equations (2), (3) and (1). In Table 20, only those aspherical surfaces that satisfy condition (2) are shown. FIG. 63 shows aberrations and FIG. 62 shows changes in local curvature power of the aspherical surfaces.

Details of the lens structure will be described below.

The first lens group L1 comprises, in an order from the object side, a positive lens of a plane-convex shape having a convex surface facing to the image plane side, a positive lens of meniscus shape having a concave surface facing to the object side, and an aspherical surface lens of meniscus shape having a convex surface facing to the object side.

The aspherical surface at r5 includes a region in which the local curvature power changes in the positive direction, satisfying the function of (c3) described above. With this aspherical surface, mainly a positive distortion is produced to contribute correction of distortion aberration.

The second lens group L2 comprises, in an order from the object side, a negative lens of meniscus shape having a concave surface facing to the image side, an aspherical surface negative lens of bioconcave shape, and a negative lens of biconcave shape.

With the placement of plural negative lenses as in this example, the Petzval sum is well corrected while dispersing a strong refractive power. The aspherical surface at r10 includes a region in which the local curvature power changes in the negative direction, satisfying the function of condition (c2) described above. Also, in the relation with the surface r10 of the first lens group L1, there are regions in which the local curvature powers change in the opposite directions, thus satisfying the function of condition (c1).

The third lens group L3 has a positive refractive power so as to transform a divergent light from the second lens group L2 into a convergent light. In an order from the object side, it comprises a positive lens of biconvex shape, an aspherical surface positive lens of biconvex shape, and a positive lens of biconvex shape. Due to the strong positive refractive power of the third lens group L3, the incidence height on the fourth lens group L4 having a negative refractive power is made low and, by making the refractive power of the fourth lens group L4 strong, the Petzval sum is corrected satisfactorily. Further, with use of an aspherical surface, spherical aberration and coma aberration are well corrected.

The fourth lens group L4 comprises, in an order from the object side, a negative lens of biconcave shape, and an aspherical surface negative lens of biconcave shape. The fourth lens group L4 and the second lens group L2 bear a strong negative refractive power, by which the Petzval sum can be corrected successfully. Further, by use of an aspherical surface, mainly spherical aberration and coma aberration which are produced at a concave surface having a strong curvature can be corrected effectively.

The fifth lens group L5 has a positive refractive power, so that an optical system being telecentric on the image side is provided. In an order from the object side, it comprises an aspherical surface positive lens of biconvex shape, a positive lens of biconvex shape, an aspherical surface positive lens of biconvex shape, a positive lens of meniscus shape having a concave surface facing to the image side, a positive lens of meniscus shape having a concave surface facing to the image side, and an aspherical surface negative lens of meniscus shape having a concave surface and facing to the image side.

The aspherical surface used at a concave surface close to the image plane is contributable mainly to correction of coma and distortion.

In this example, by using seven aspherical surface lenses, an optical system of large numerical aperture (NA) is provided with a lens number of 17 (seventeen).

In this example, each of the first to fourth lens groups L1–L4 is provided with one aspherical surface while the fifth lens group L5 is provided with three aspherical surfaces. However, each of the first to fourth lens groups may have more than one aspherical surface. Also, there may be a lens group having no aspherical surface. This is also with the case of other examples to be described below.

EXAMPLE 21

Figure 64:
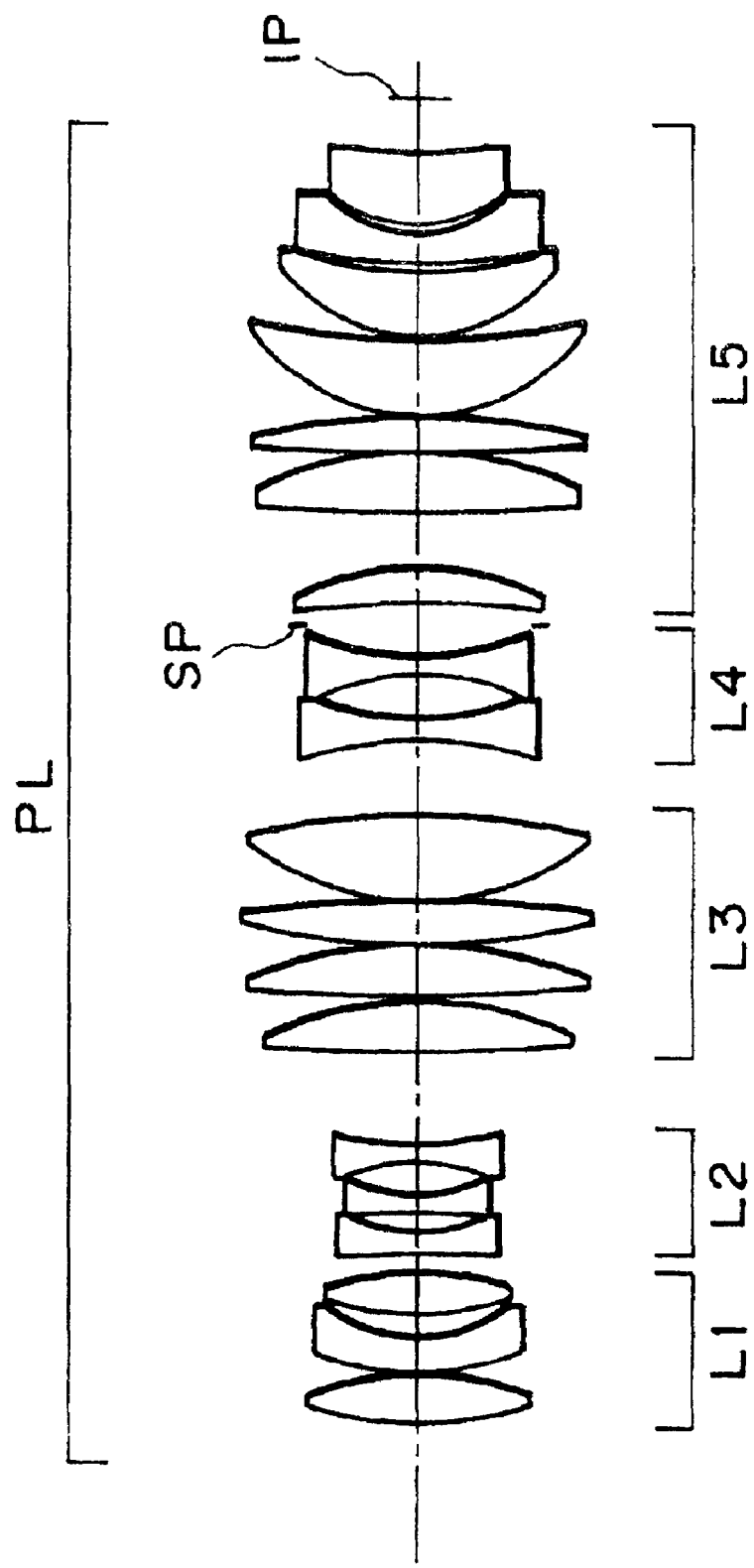
FIG. 64 is a lens sectional view of a projection optical system for use in a projection exposure apparatus, according to Numerical Example 21 of the present invention.

FIG. 64 shows Numerical Example 21 which differs from Numerical Example 20 of FIG. 61 in the point of the lens structure of the first and fifth lens groups L1 and L5 and the magnification and focal length of each lens group. The remaining portion has essentially the same structure.

Figure 65:
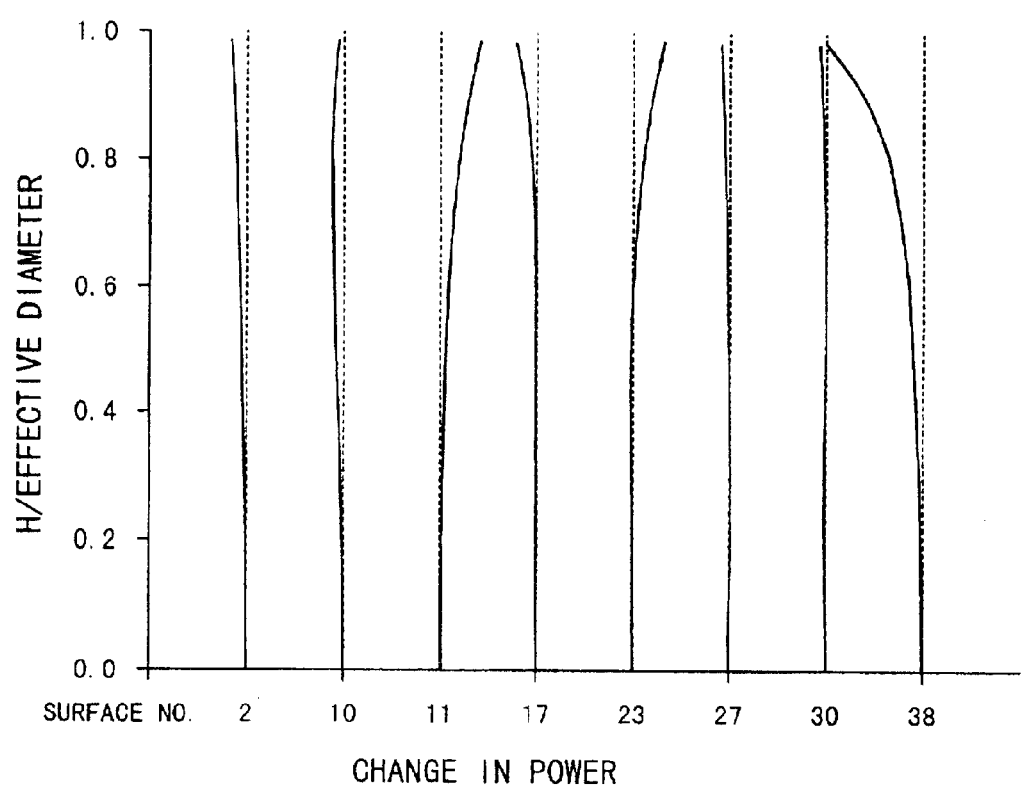
FIG. 65 is a graph for explaining changes in a local curvature power of an aspherical surface of a projection optical system according to Numerical Example 21.
Figure 66:
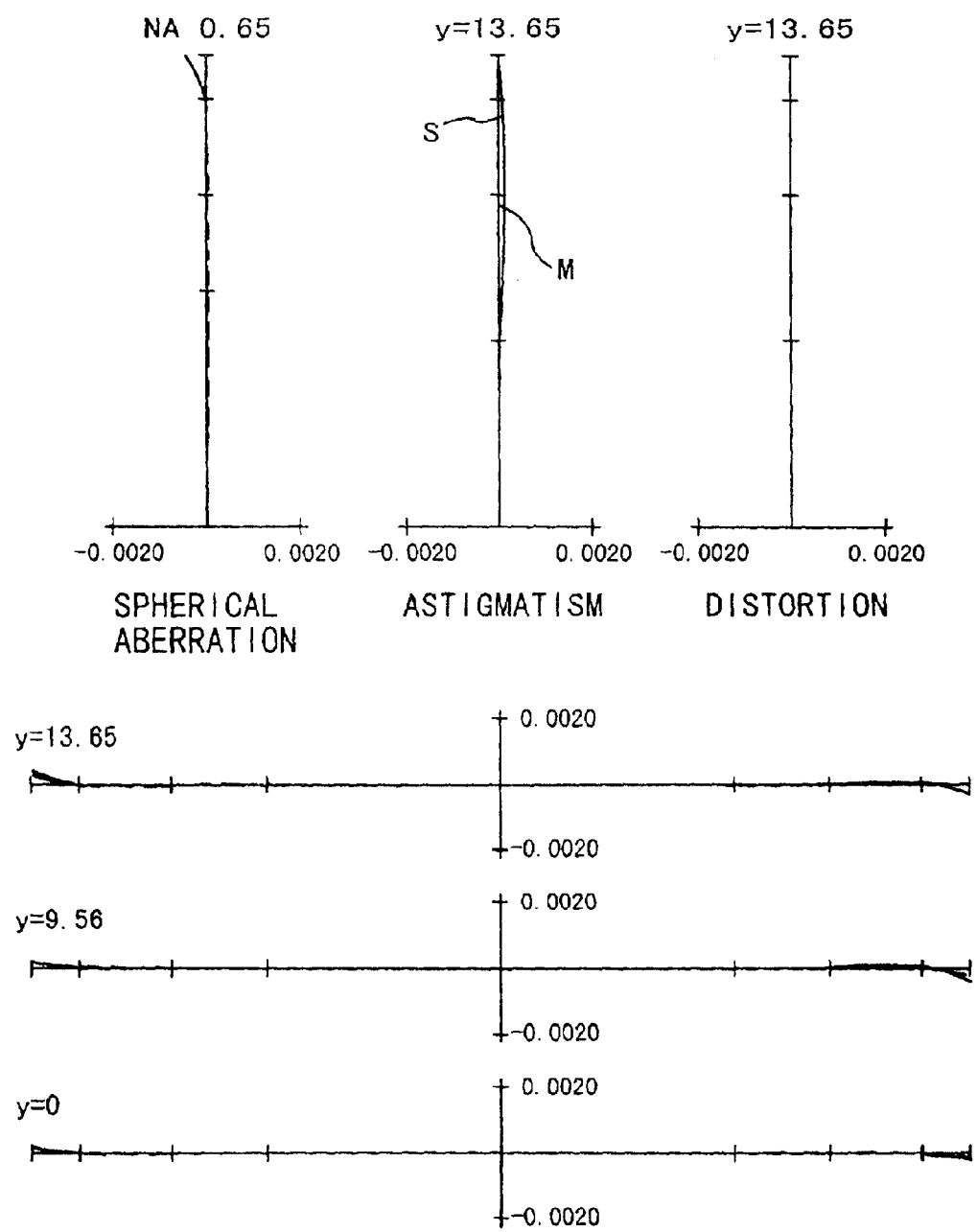
FIG. 66 illustrates aberrations of a projection optical system according to Numerical Example 21.

The lens optical system uses eight aspherical surfaces. Table 21 shows values corresponding to conditions of equations (2), (3) and (1). FIG. 66 shows aberrations, and FIG. 65 shows changes in local curvature power of the aspherical surface.

Details of the lens structure will be described below.

The first lens group L1 comprises, in an order from the object side, an aspherical surface positive lens of biconvex shape, a negative lens of meniscus shape having a concave surface facing to the image side, and a positive lens of biconvex shape. The aspherical surface on the second surface is effective to correct, with good balance, the distortion aberration produced at the first and second lens groups L1 and L2.

The second lens group L2 comprises, in an order from the object side, two negative lenses of approximately plane-concave shape having a concave surface facing to the image side, and an aspherical surface negative lens of biconcave shape.

The aspherical surface at r10 includes a region in which the local curvature power changes in the negative direction, thus satisfying the function of condition (c2) described above. Also, in the relation between the surfaces r10 and r11, there are regions in which the local curvature powers change in the opposite directions, thus satisfying the function of condition (c1). Further, the surface r2 of the first lens group L1 and the surface r11 of the second lens group L2 include regions in which their local curvature powers change in opposite directions, and the function of condition (c1) described above is satisfied.

The third lens group L3 comprises, in an order from the object side, a positive lens of meniscus shape having a convex surface facing to the image side, a positive lens of biconvex shape, and an aspherical surface positive lens of biconvex shape.

In this example, a fluorite lens is introduced into the third lens group L3, and a similar fluorite lens is used in the fifth lens group L5, for correction of chromatic aberration.

The fourth lens group L4 comprises, in an order from the object side, a negative lens of biconcave shape, and an aspherical surface negative lens of biconcave shape. By use of an aspherical surface, spherical aberration and coma aberration, for example, which are produced at a concave surface having a strong curvature can be corrected effectively.

The fifth lens group L5 comprises, in order from the object side, an aspherical surface positive lens of meniscus shape having a convex surface facing to the image side, a positive lens of biconvex shape, an aspherical surface positive lens of biconvex shape, two positive lenses of meniscus shape having a concave surface facing to the image side, a negative lens of meniscus shape having a concave surface facing to the image side, and an aspherical surface positive lens of meniscus shape having a concave surface facing to the image side.

In the fifth lens group L5, an aspherical surface is placed at a position where an axial light flux, which is a light flux emitted from an optical axis upon the object plane, is high, and this aspherical surface is used mainly for correction of negative spherical aberration to be produced in the fifth lens group L5 having a strong positive refractive power.

The aspherical surface used at a concave surface adjacent to the image plane is mainly contributable to correction of coma and distortion.

In this example, by using eight aspherical surface lenses, an optical system of large numerical aperture (NA) is provided with a lens number of 19 (nineteen).

EXAMPLE 22

Figure 67:
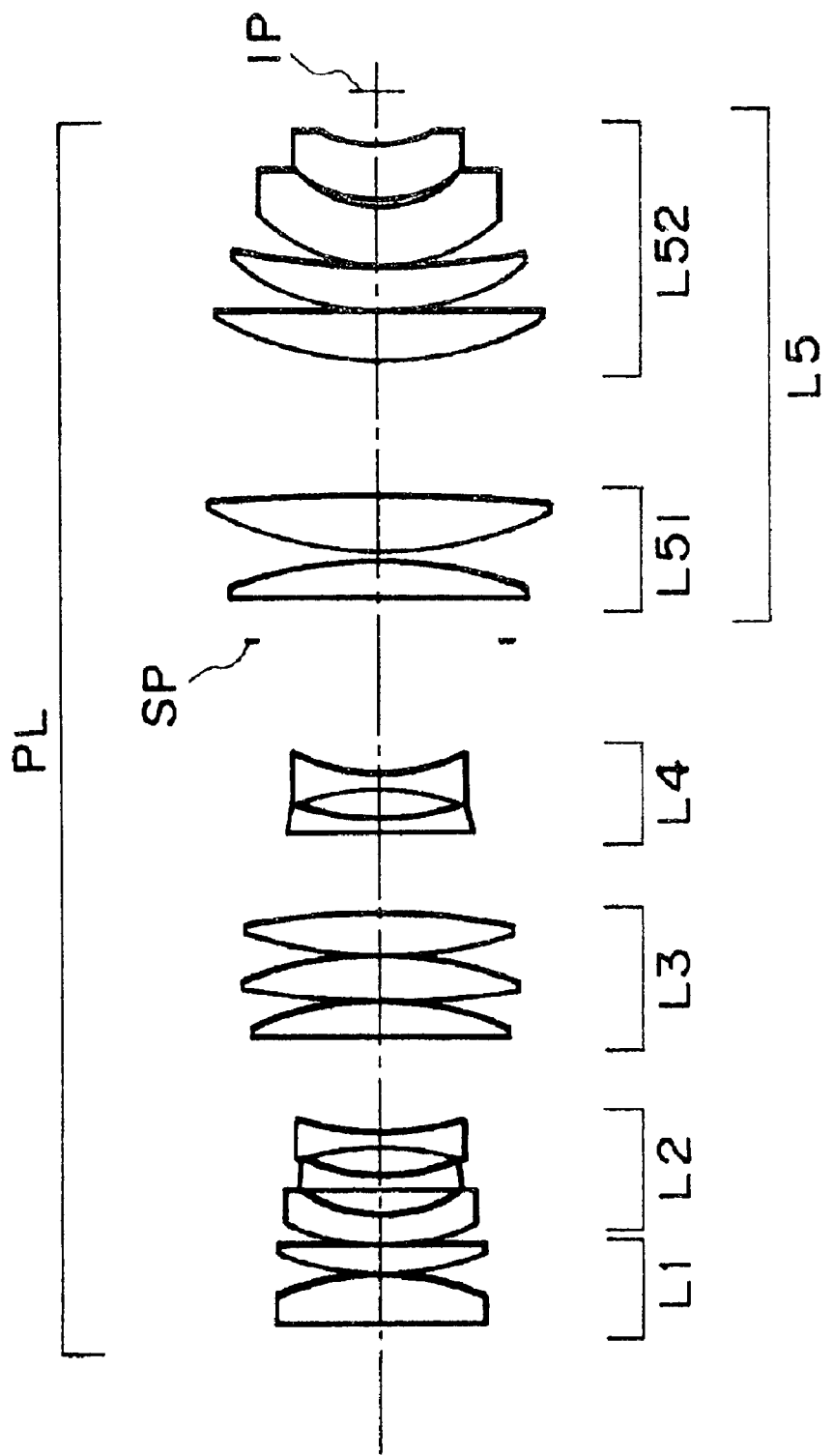
FIG. 67 is a lens sectional view of a projection optical system for use in a projection exposure apparatus, according to Numerical Example 22 of the present invention.
Figure 68:
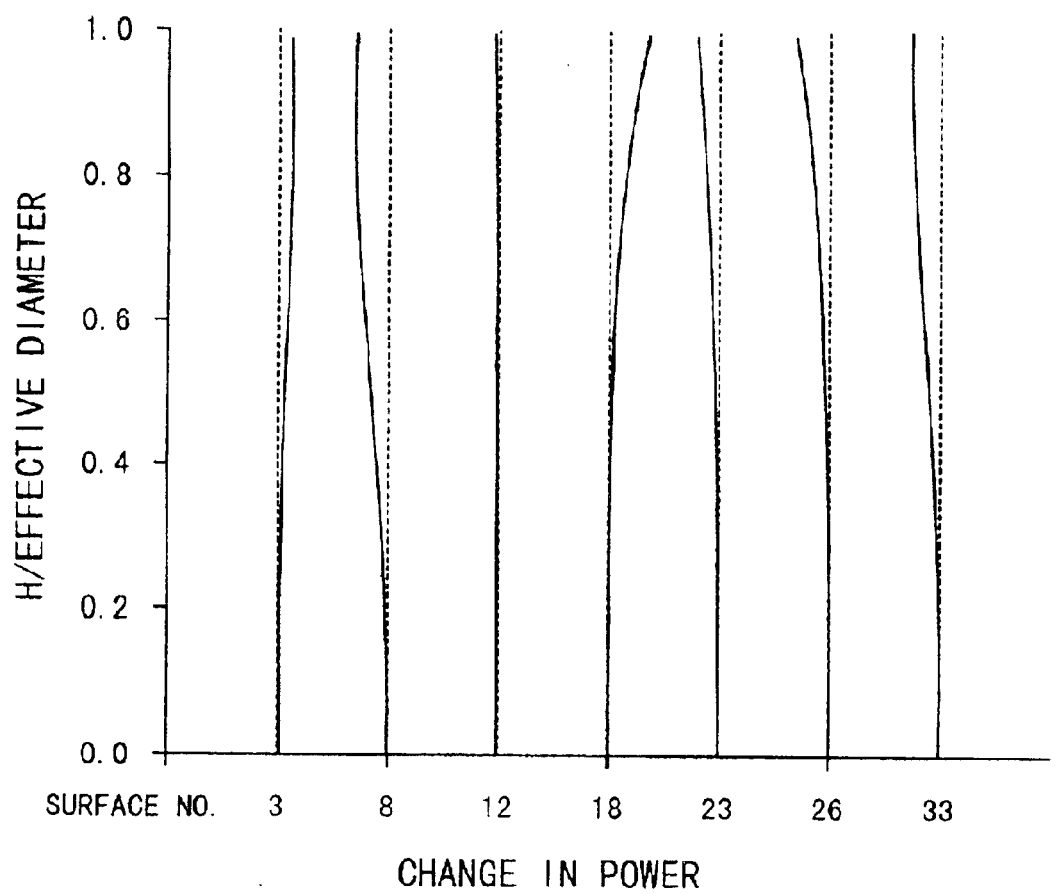
FIG. 68 is a graph for explaining changes in a local curvature power of an aspherical surface of a projection optical system according to Numerical Example 22.
Figure 69:
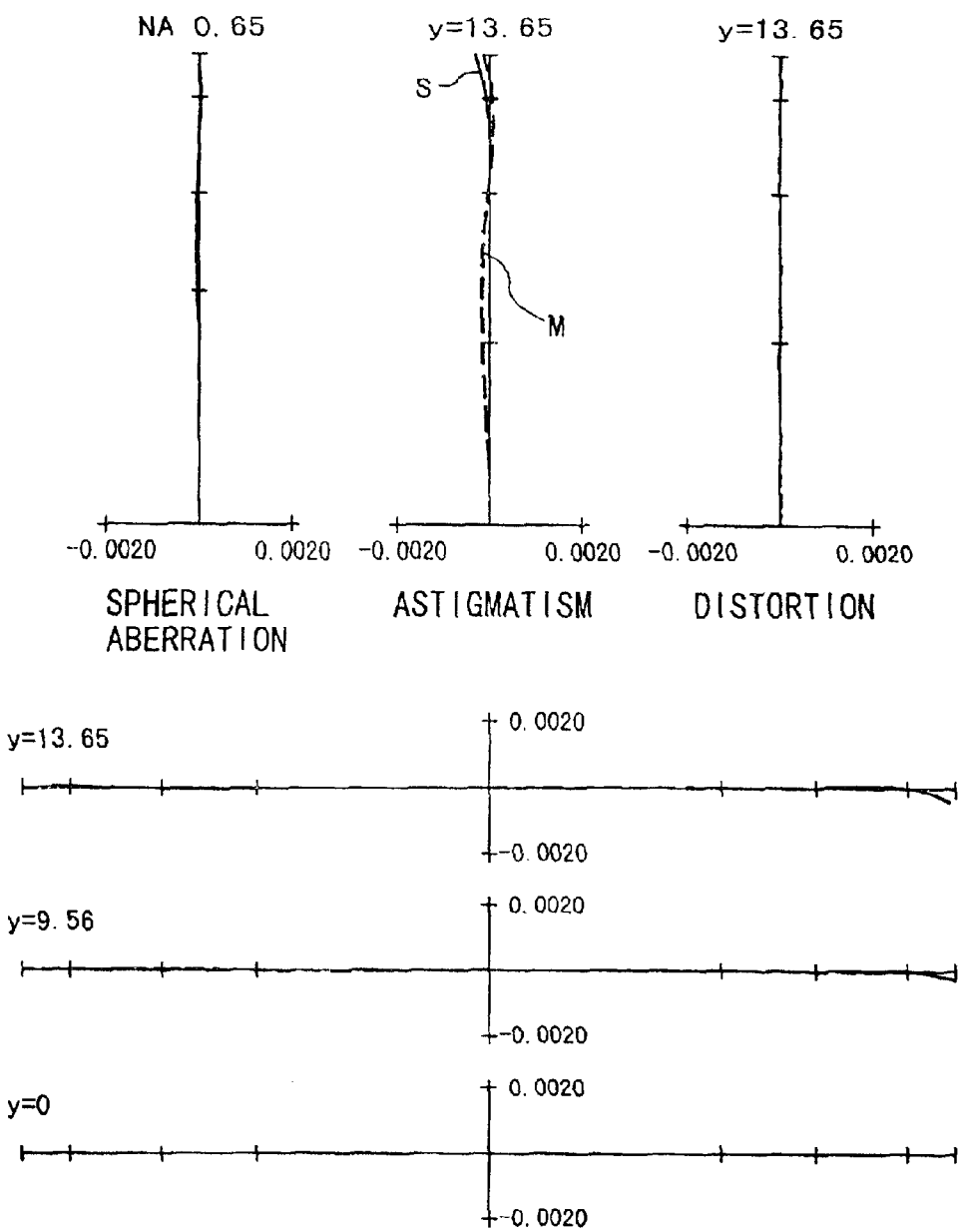
FIG. 69 illustrates aberrations of a projection optical system according to Numerical Example 22.

FIG. 67 shows Numerical Example 22 in which the lens optical system uses seven aspherical surfaces. Table 22 shows values corresponding to conditions of equations (2), (3) and (1). FIG. 69 shows aberrations, and FIG. 68 shows changes in local curvature power of the aspherical surface. A main difference of this example over Numerical Example 20 is that the aspherical surface lenses include at least one aspherical surface lens having a plane surface at a side opposite to the aspherical surface thereof. In this example, six of seven aspherical surface lenses have a plane surface formed at a side opposite to an aspherical surface thereof.

Details of the lens structure will be described below.

The first lens group L1 comprises, in an order from the object side, a positive lens of plane-convex shape having a convex surface facing to the image side, and an aspherical surface positive lens of plane-convex shape having a convex surface facing to the object side. The aspherical surface at r3 includes a region in which the local curvature power changes in the positive direction, thus satisfying the function defined by condition (c3) described above.

The second lens group L2 comprises, in an order from the object side, a negative lens of meniscus shape having a concave surface facing to the image side, an aspherical surface negative lens of plane-concave shape, and a negative lens of biconcave shape. With a strong negative refractive power, the Petzval sum is corrected satisfactorily. The aspherical surface at r8 includes a region in which the local curvature power changes in the negative direction, thus satisfying the function defined by condition (c2) described above. Also, in the relation with the surface r3 of their first lens group L1, there are regions in which their local curvature powers change in mutually opposite directions. Thus, also the function defined by condition (c1) described above is satisfied.

The third lens group L3 comprises, in an order from the object side, an aspherical surface positive lens having a convex surface facing to the image side, and two positive lenses of biconvex shape. Since the third lens group L3 should have a strong positive refractive power, it is provided by plural positive lenses.

The fourth lens group L4 comprises, in an order from the object side, an aspherical surface negative lens of plane-concave shape having a concave surface facing to the image plane, and a negative lens of biconcave shape. By use of an aspherical surface, higher order spherical aberration and coma aberration, for example, which are produced at a concave surface having a strong curvature can be corrected effectively.

The fifth lens group L5 comprises, in an order from the object side, an aspherical surface positive lens of plane-convex shape having a convex surface facing to the image side, a positive lens of biconvex shape, an aspherical surface positive lens of plane-convex shape having a convex surface facing to the object side, a positive lens of meniscus shape having a concave surface facing to the image side, a negative lens of meniscus shape having a concave surface facing to the image side, and an aspherical surface positive lens of meniscus shape having a concave surface facing to the image side.

In the fifth lens group L5, the aspherical surface is placed at a position where an axial light flux, which is a light flux emitted from an optical axis upon the object plane, is high, and this aspherical surface is used mainly for correction of negative spherical aberration to be produced in the fifth lens group L5 having a strong positive refractive power.

In this example, by using seven aspherical surface lenses, an optical system of large numerical aperture (NA) is provided with a lens number of 16 (sixteen).

EXAMPLE 23

Figure 70:
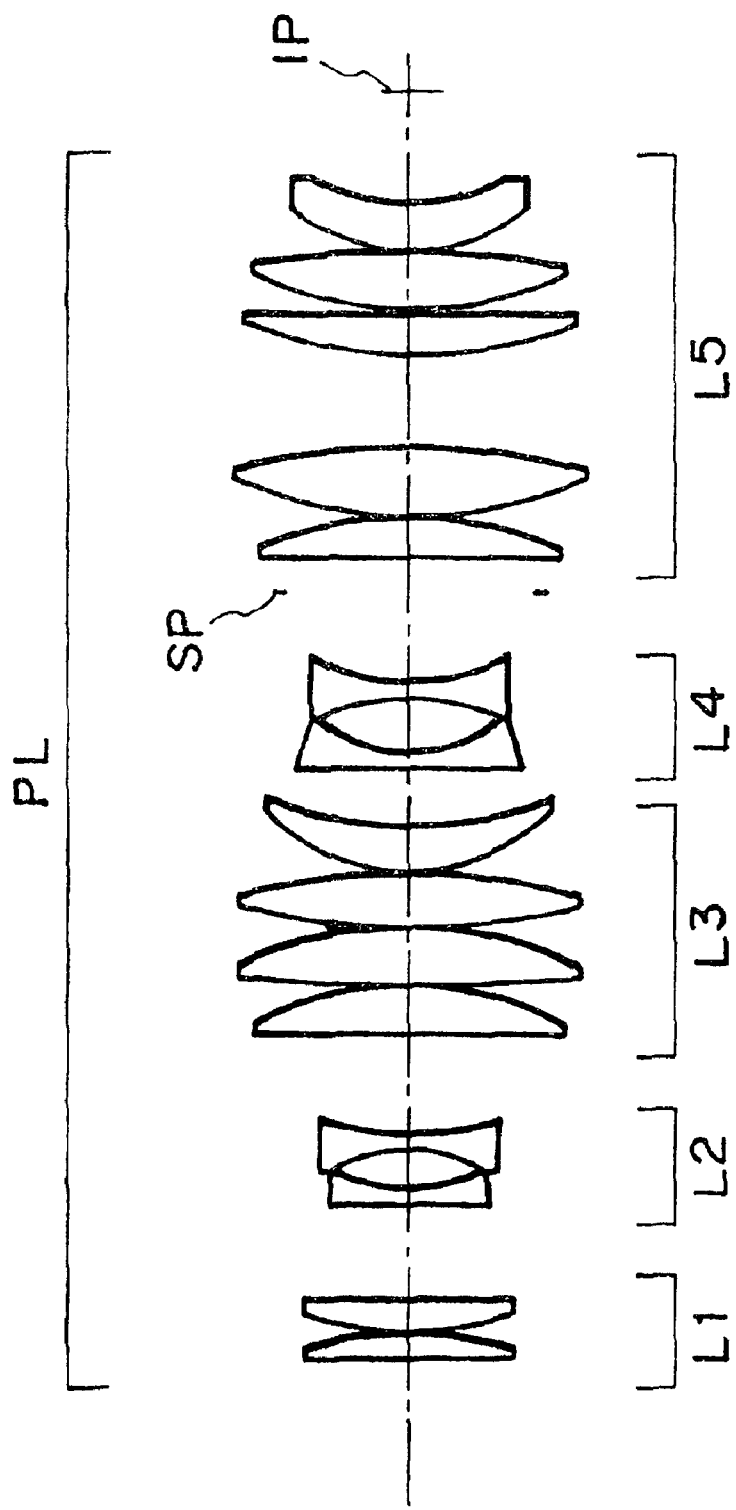
FIG. 70 is a lens sectional view of a projection optical system for use in a projection exposure apparatus, according to Numerical Example 23 of the present invention.

FIG. 70 shows Numerical Example 23 which differs from Numerical Example 22 of FIG. 67 mainly in the point of the lens structures of second, third and fifth lens groups L2, L3 and L5.

In this example, six of seven aspherical surface lenses have a plane surface formed at a side opposite to an aspherical surface thereof.

Figure 71:
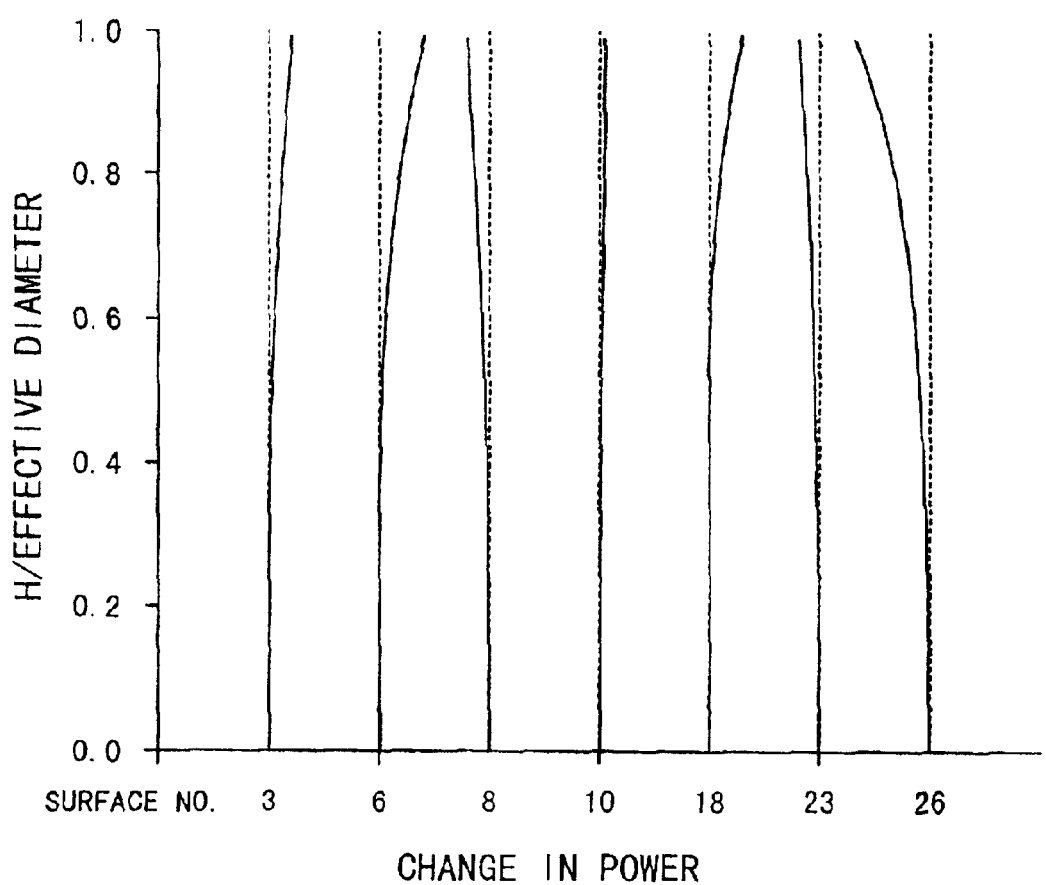
FIG. 71 is a graph for explaining changes in a local curvature power of an aspherical surface of a projection optical system according to Numerical Example 23.
Figure 72:
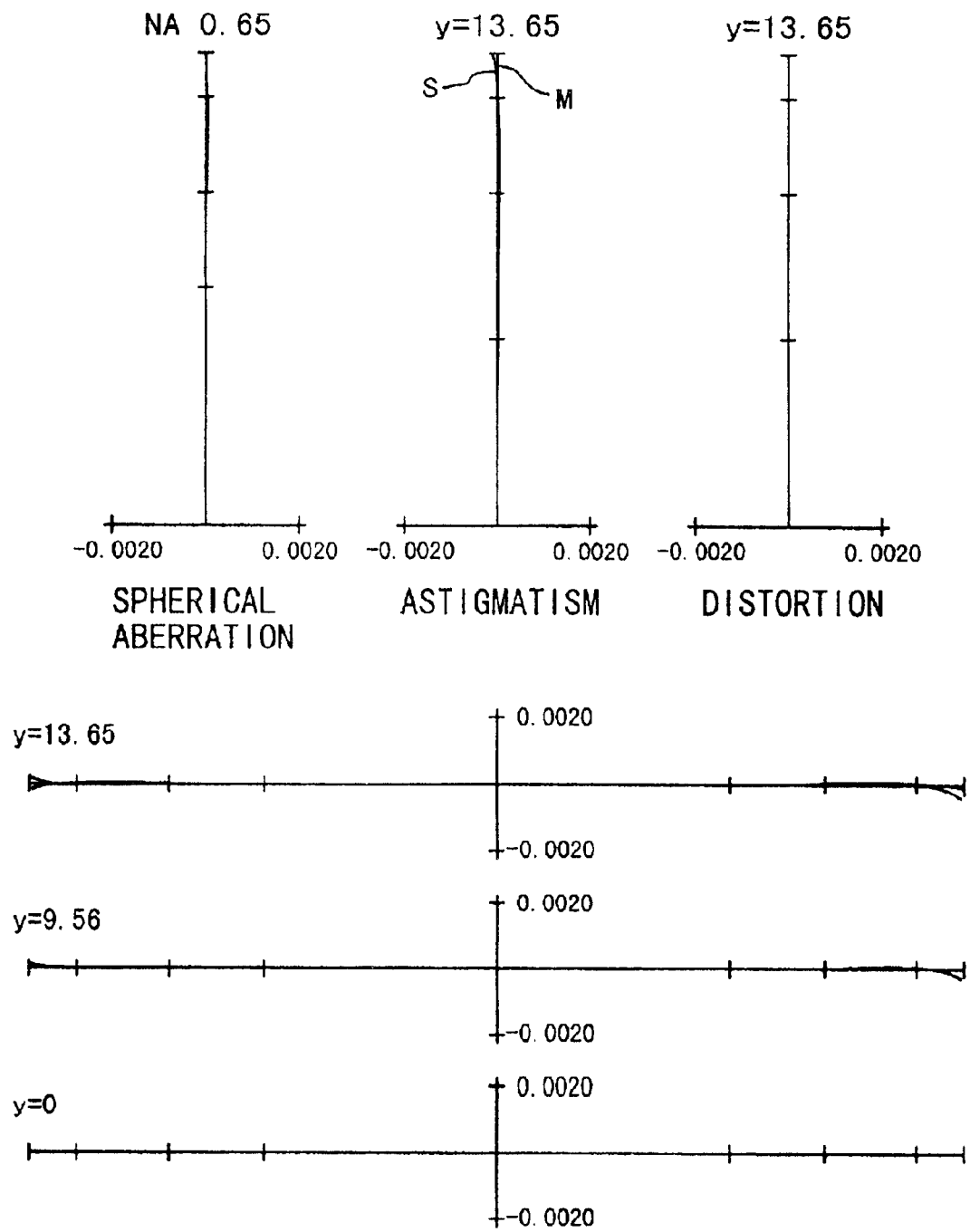
FIG. 72 illustrates aberrations of a projection optical system according to Numerical Example 23.

The lens optical system uses seven aspherical surfaces. Table 23 shows values corresponding to conditions of equations (2), (3) and (1). FIG. 72 shows aberrations, and FIG. 71 shows changes in local curvature power of the aspherical surface.

Details of the lens structure will be described below.

The first lens group L1 comprises, in an order from the object side, an aspherical surface positive lens of plane-convex shape having a convex surface facing to the image side, and an aspherical surface positive lens of plane-convex shape having a convex surface facing to the object side. The aspherical surface at r3 includes a region in which the local curvature power changes in the positive direction, thus satisfying the function defined by condition (c3) described above.

The second lens group L2 comprises, in an order from the object side, an aspherical surface negative lens of plane-concave shape having a concave surface facing to the image side, and a negative lens of biconcave shape. The aspherical surface at r8 includes a region in which the local curvature power changes in the negative direction, thus satisfying the function defined by condition (c2) described above. Also, in the relation with the surface r3 of the first lens group L1, there are regions in which their local curvature powers change in mutually opposite directions. Thus, also the function defined by condition (c1) described above is satisfied. Further, in the relation with the surface r6 of the second lens group L2, it is seen that there are regions in which their local curvature powers change in mutually opposite directions.

The third lens group L3 comprises, in an order from the object side, an aspherical surface positive lens of plane-convex shape having a convex surface facing to the image side, two positive lenses of biconvex shape, and a positive meniscus lens having a concave surface facing to the image side.

The fourth lens group L4 comprises, in an order from the object side, an aspherical surface negative lens of plane-concave shape having a concave surface facing to the image side, and a negative lens of biconcave shape.

The fifth lens group L5 comprises, in order from the object side, an aspherical surface positive lens of plane-convex shape having a convex surface facing to the image plane side, a positive lens of biconvex shape, an aspherical surface positive lens of plane-convex shape having a convex surface facing to the object side, a positive lens of biconvex shape, and a positive meniscus lens having a concave surface facing to the image side.

In this example, by using seven aspherical surface lenses, an optical system of large numerical aperture (NA) is provided with a lens number of 15 (fifteen).

As an alternative form, all the aspherical surface lenses may have a plane surface at a side opposite to the aspherical surface thereof.

EXAMPLE 23

Figure 73:
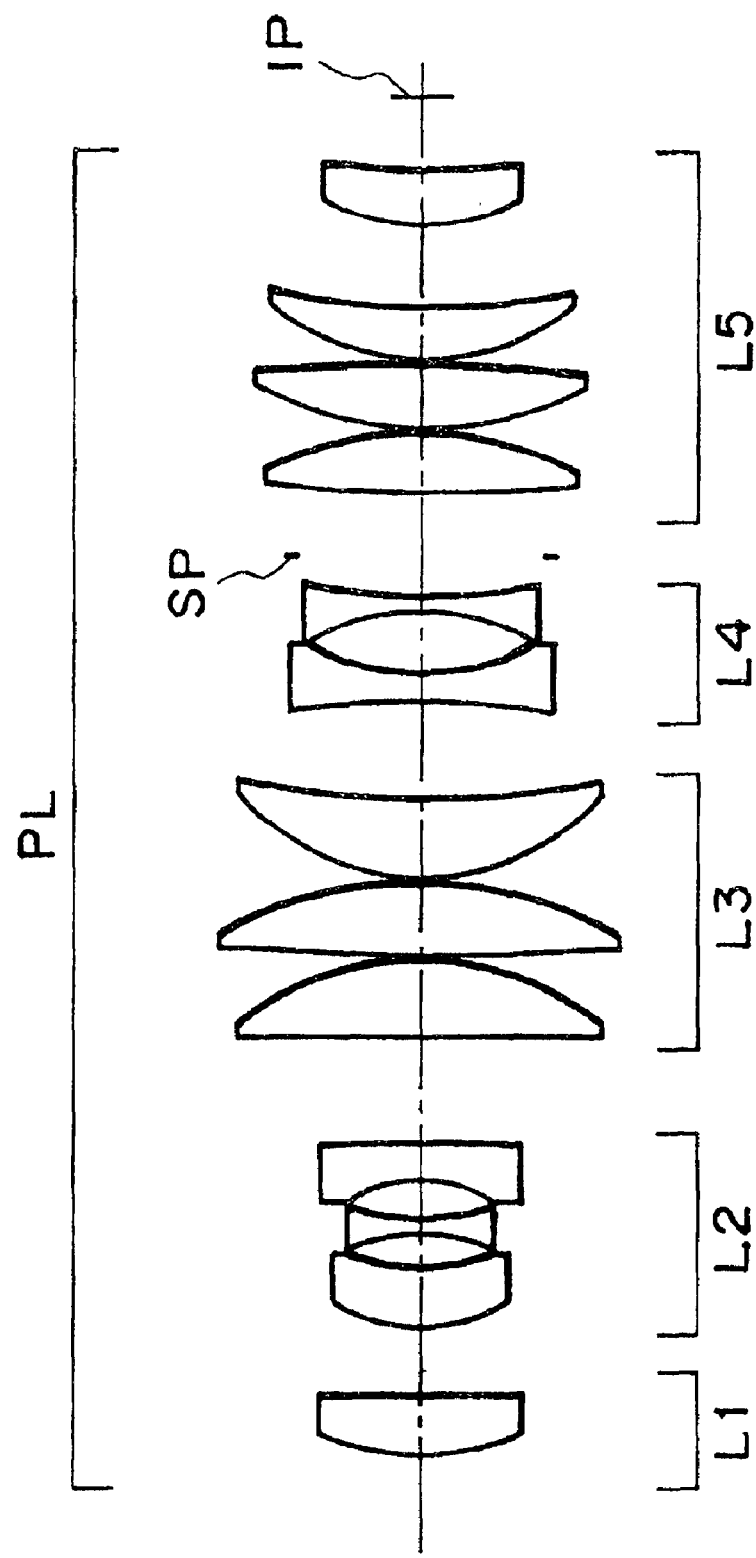
FIG. 73 is a lens sectional view of a projection optical system for use in a projection exposure apparatus, according to Numerical Example 24 of the present invention.

FIG. 73 shows Numerical Example 24 which differs from Numerical Examples 20–23 in that, among aspherical surface lenses, there is at least one lens (bi-aspherical surface lens) having aspherical surfaces on both faces thereof.

In this example, all six aspherical surface lenses used are bi-aspherical surface lenses.

Figure 74:
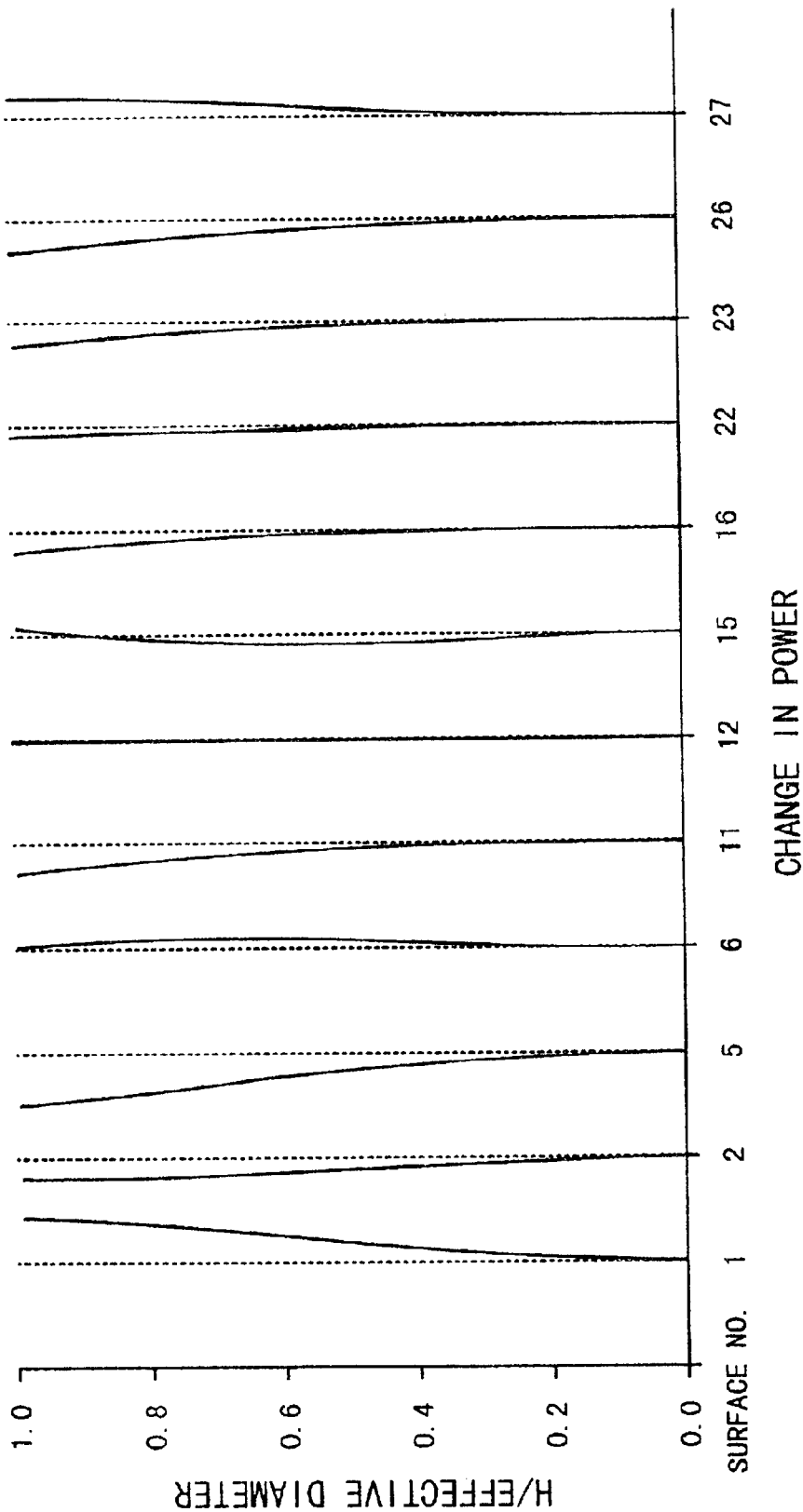
FIG. 74 is a graph for explaining changes in a local curvature power of an aspherical surface of a projection optical system according to Numerical Example 24.
Figure 75:
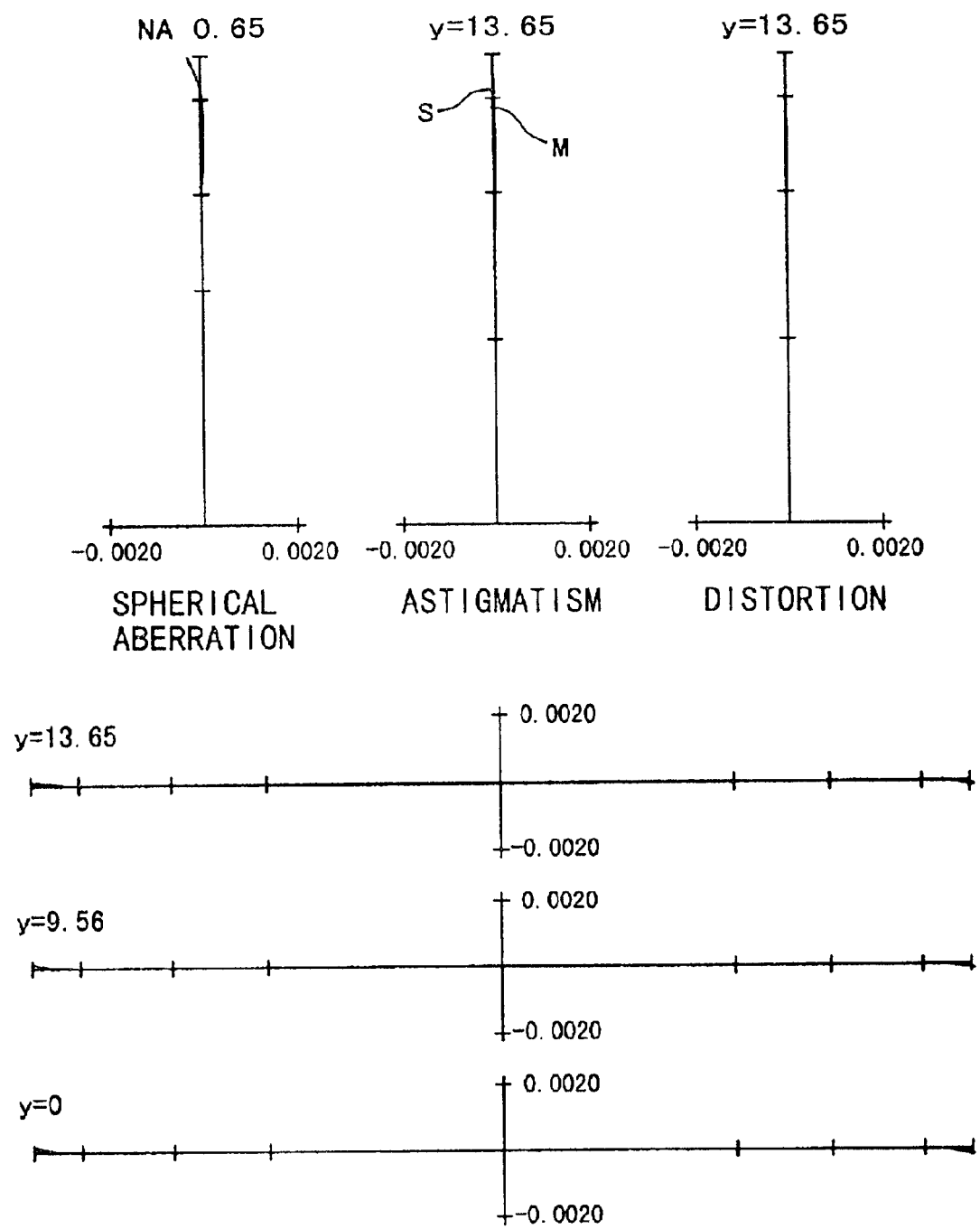
FIG. 75 illustrates aberrations of a projection optical system according to Numerical Example 24.

The lens optical system uses seven aspherical surfaces. Table 24 shows values corresponding to conditions of equations (2), (3) and (1). FIG. 75 shows aberrations, and FIG. 74 shows changes in local curvature power of the aspherical surface.

Details of the lens structure will be described below.

The first lens group L1 comprises, in an order from the object side, a bi-aspherical surface positive lens of approximately plane-convex shape having a convex surface facing to the object side. The aspherical surface at r1 includes a region in which the local curvature power changes in the positive direction, thus satisfying the function defined by condition (c3) described above. Also, in the relation with the surface r2, there are regions in which the local curvature powers change in mutually opposite directions, and the function of condition (c1) described above is satisfied.

The second lens group L2 comprises, in an order from the object side, a positive lens of meniscus shape having a concave surface facing to the image side, a bi-aspherical surface negative lens of biconcave shape, and a negative lens of approximately plane-concave shape having a concave surface facing to the object side.

The aspherical surface at r3 includes a region in which the local curvature power changes in the negative direction, thus satisfying the function defined by condition (c2) described above. Also, in the relation with the with the surface r4, there are regions in which their local curvature powers change in mutually opposite directions. Thus, also the function defined by condition (c1) described above is satisfied. Further, in the relation with the surface r6 of the second lens group L2, it is seen that there are regions in which their local curvature powers change in mutually opposite directions.

Further, in the apsherical surface r1 of the first lens group L1 and the aspherical surfaces r3 and r4 of the second lens group L2, at the peripheral portions the local curvature powers change in mutually opposite directions.

The third lens group L3 comprises, in an order from the object side, a bi-aspherical surface positive lens of approximately plane-convex shape having a convex surface facing to the image side, and positive lenses of meniscus shape having a concave surface facing to the image side.

The fourth lens group L4 comprises, in an order from the object side, a bi-aspherical surface negative lens of biconcave shape, and a negative lens of biconcave shape.

The fifth lens group L5 comprises, in order from the object side, a positive lens of biconvex shape, a bi-aspherical surface positive lens of biconvex shape, a positive lens of meniscus shape having a concave surface facing to the image side, and a bi-aspherical surface positive lens of meniscus shape having a concave surface facing to the image side.

In this example, by using six bi-aspherical surface lenses, an optical system of large numerical aperture (NA) is provided with a lens number of 13 (thirteen).

In this example, all the aspherical surface lenses in the lens optical system are bi-aspherical surface lenses each having aspherical surfaces on both faces thereof. However, this is not always necessary. An aspherical surface lens having a spherical surface on a side opposite to the aspherical surface thereof may be used.

Further, an aspherical surface lens having a plane surface on a side opposite to the aspherical surface thereof may be included, singly or in combination with an aspherical surface lens having a spherical surface on a side opposite to the aspherical surface thereof.

This example uses six bi-aspherical surface lenses. However, the number of lenses is not limited to this. The lens number may be changed in accordance with aberration correction in the optical system being designed.

The conical constant k regarding the aspherical surface shape is taken as zero, in some examples of the examples described above. However, the aspherical surface shape may be designed while taking the conical constant k as a variable.

Further, in these examples except Numerical Example 21, silica is used as a lens glass material. However, fluorite may be used. When both silica and fluorite are used, chromatic aberration can be corrected to be very small.

For better imaging performance, additional aspherical surfaces may be used. Particularly, adding an aspherical surface satisfying the conditions (2) and (3) between the object and the stop, is very effective to correct distortion and curvature of field, for example successfully.

In these examples, the exposure light source uses KrF wavelength of 248 nm or ArF wavelength of 193 nm. However, any other wavelength such as $F_2$ laser wavelength, for example, may be used. Also, the magnification of the projection optical system is not limited to 1:4 in these examples. Any other magnification may be used.

As described above, with use of aspherical surfaces, the number of lenses can be reduced considerably and, yet, a projection optical system having a large numerical aperture is accomplished.

When a face of an aspherical surface lens at a side opposite to the aspherical surface thereof is made a plane surface, a projection optical system being easy in manufacture and adjustment is provided. When the face at a side opposite to the aspherical surface is made a spherical surface, the degree of freedom can be expanded significantly, and better aberration correction is attainable.

EXAMPLES 25–28

Numerical Examples 25–28 to be described below concern a projection optical system having a seven-group structure. In these examples, the projection optical system comprises, in an order from the object side, a first lens group L1 having a positive refractive power, a second lens group L2 having a negative refractive power, a third lens group L3 having a positive refractive power, a fourth lens group L4 having a negative refractive power, a fifth lens group L5 having a positive refractive power, a sixth lens group L6 having a negative refractive power, and a seventh lens group L7 having a positive refractive power. Aspherical surfaces are formed on appropriate surfaces, whereby a good optical performance is obtained.

This projection optical system includes three lens groups having a negative refractive power. By distributing a strong negative refractive power in the lens optical system into these three lens groups, good correction of the Petzval sum is enabled. Also, an optical system of shorter total length can be accomplished.

Next, important features of lens structures of projection optical systems according to Numerical Examples 25–28 of the present invention will be described. In these examples, the projection optical system is made substantially telecentric on the object side (reticle side) and on the image plane side (wafer side). It has a projection magnification $\beta=1:4$, a numerical aperture NA=0.65, and an object-to-image distance (from object plane to image plane) L=1000 mm. The reference wavelength is 193 nm. As regards the picture plane range, the diameter of an exposure area on a wafer is Ø27.3 mm.

In FIGS. 77, 80, 83 and 86, the axis of ordinate represents the height of an aspherical surface from the optical axis, being standardized with respect to the effective diameter, and the axis of abscissa denotes the aspherical surface number. The leftward and rightward directions correspond to negative and positive directions of the change in local curvature power, respectively.

EXAMPLE 25

Figure 76:
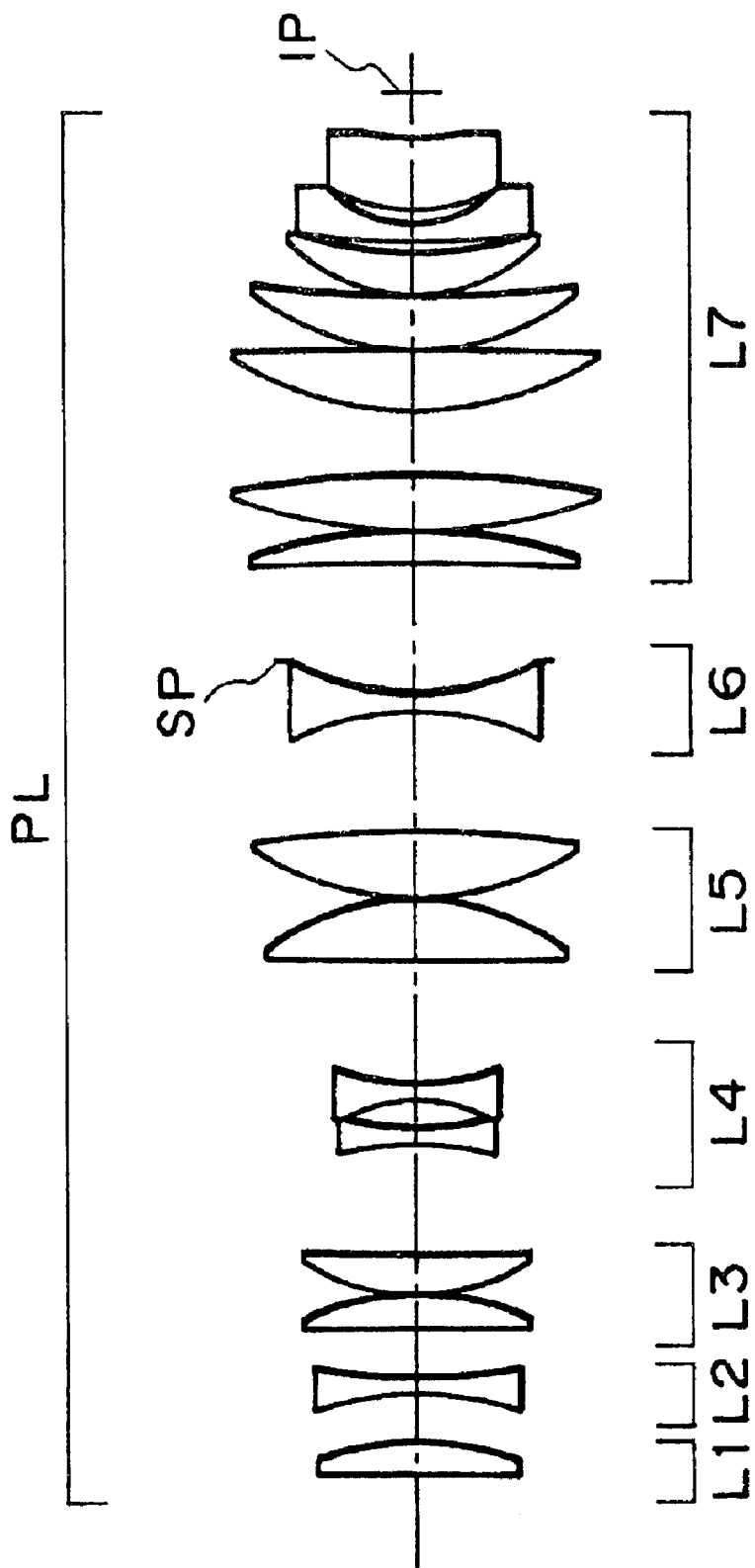
FIG. 76 is a lens sectional view of a projection optical system for use in a projection exposure apparatus, according to Numerical Example 25 of the present invention.

In Numerical Example 25 shown in FIG. 76, the lens system comprises, in an order from the object side, a first lens group L1 having a positive refractive power, a second lens group L2 having a negative refractive power, a third lens group L3 having a positive refractive power, a fourth lens group L4 having a negative refractive power, a fifth lens group L5 having a positive refractive power, a sixth lens group L6 having a negative refractive power, and a seventh lens group L7 having a positive refractive power.

Figure 77:
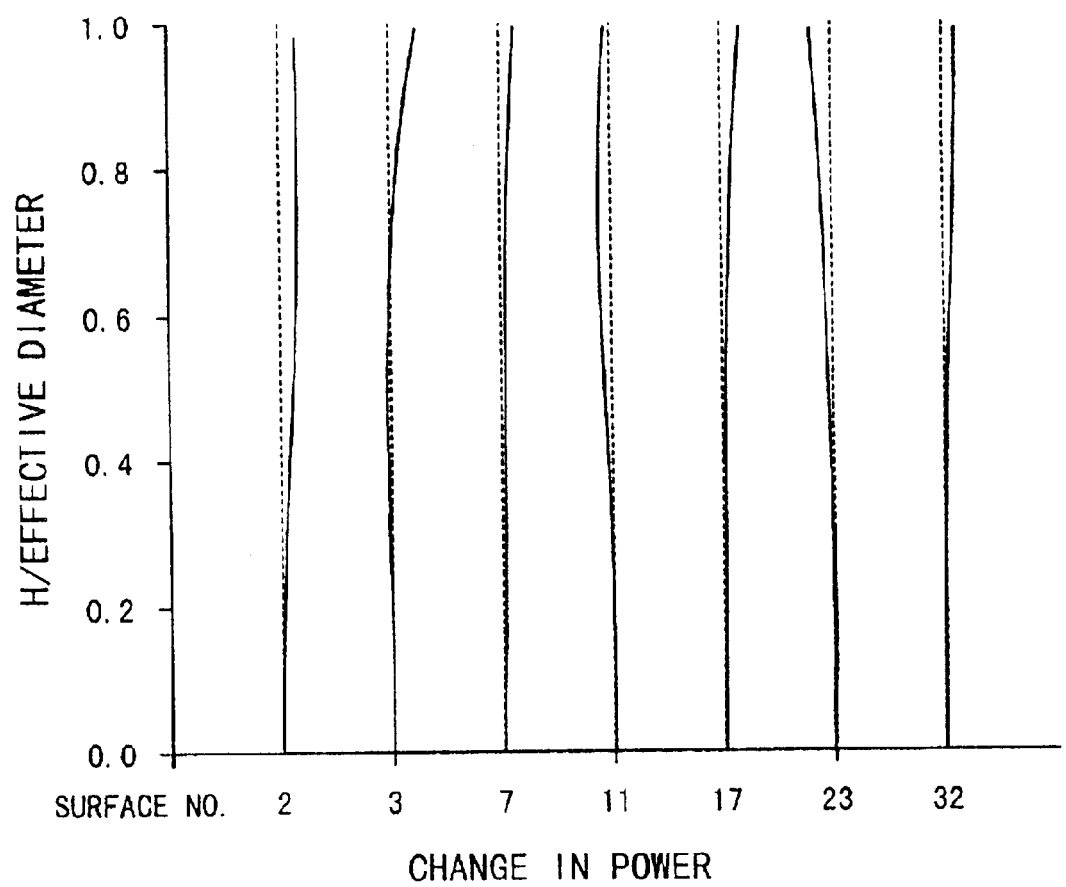
FIG. 77 is a graph for explaining changes in a local curvature power of an aspherical surface of a projection optical system according to numerical Example 25.
Figure 78:
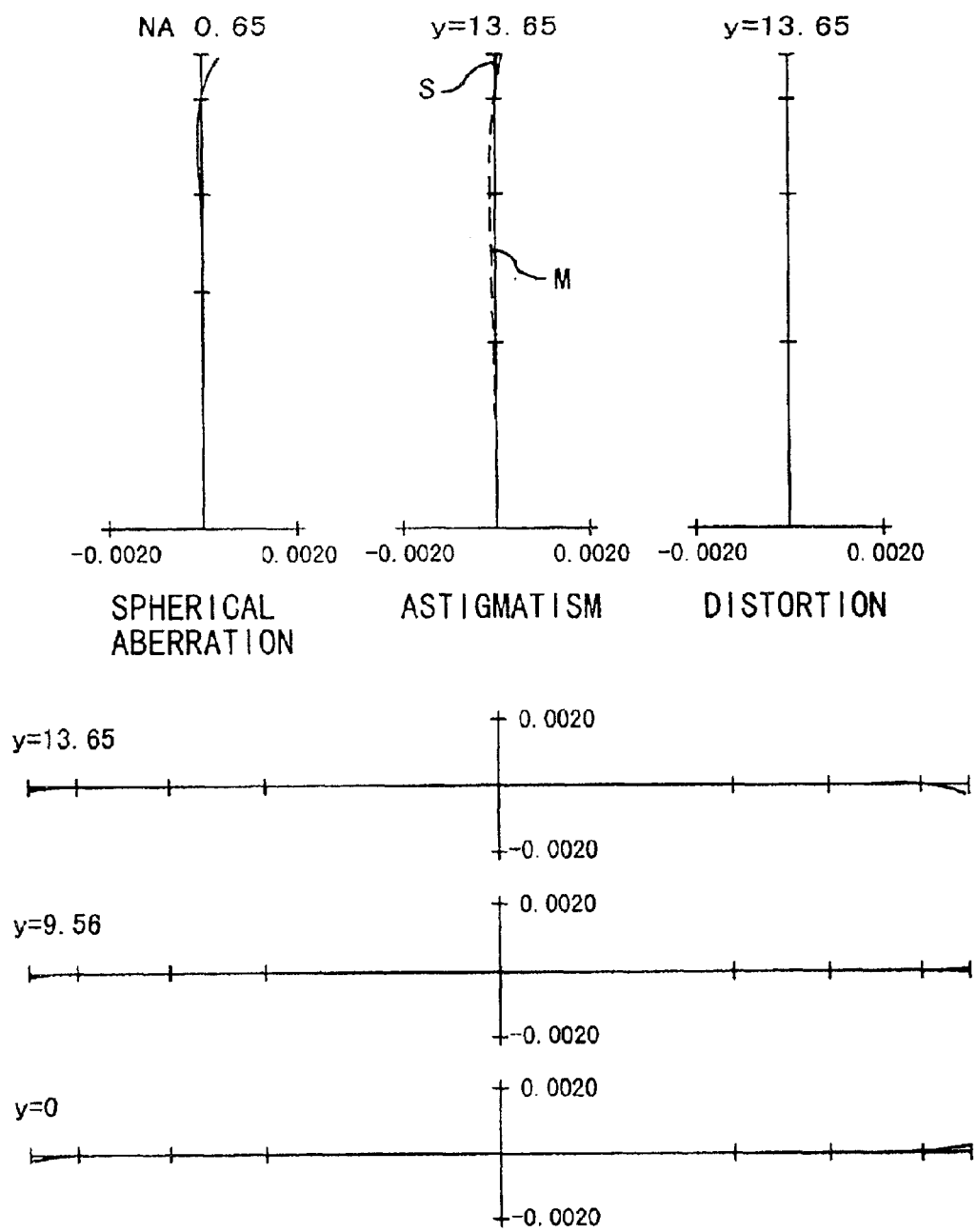
FIG. 78 illustrates aberrations of a projection optical system according to Numerical Example 25.

The lens optical system uses seven aspherical surfaces. Table 25 shows values corresponding to conditions of equations (1), (2) and (3). FIG. 78 shows aberrations, and FIG. 77 shows changes in local curvature power of the aspherical surface.

Details of the lens structure will be described below.

The first lens group L1 comprises an aspherical surface positive lens of plane-convex shape, singly, having a convex surface facing to the image plane side.

The aspherical surface at r2 includes a region in which the local curvature power changes in the positive direction, satisfying the function of (c3) described above. With this aspherical surface, mainly a positive distortion is produced to contribute to correction of distortion aberration.

The second lens group L2 comprises an ashperical surface negative lens of biconcave shape, singly.

The aspherical surface at r3 includes a region in which the local curvature power changes in the negative direction, satisfying the function of condition (c2) described above. Also, in the relation with the surface r2 of the first lens group L1, there are regions in which the local curvature powers change in mutually opposite directions, thus satisfying the function of condition (c1).

The third lens group L3 comprises, in an order from the object side, a positive lens of plane-convex shape having a convex surface facing to the image side, and an aspherical surface positive lens of approximately plane-convex shape having a convex surface facing to the object side.

The fourth lens group L4 comprises, in an order from the object side, a negative lens of biconcave shape, and an aspherical surface negative lens of biconcave shape. The aspherical surface at r11 includes a region in which the local curvature power changes in the negative direction, satisfying the function of condition (c2) described above. Also, in the relation with the surface r2 of the first lens group L1, there are regions in which the local curvature powers change in mutually opposite directions, thus satisfying the function of condition (c1). This aspherical surface is mainly contributable to good balance correction of image plane and coma aberration, for example.

The fifth lens group L5 comprises, in order from the object side, a positive lens of approximately plane-convex shape having a convex surface facing to the image side, and a positive lens of biconvex shape.

The sixth lens group L6 comprises an aspherical surface negative lens of biconcave shape, singly. This aspherical surface is contributable mainly to correction of spherical aberration and coma aberration to be produced by a strong negative refractive power.

The seventh lens group L7 comprises, in an order from the object side, a positive lens of meniscus shape having a convex surface facing to the image side, an aspherical surface positive lens of biconvex shape, a positive lens of approximately plane-convex shape having a convex surface facing to the object side, two positive lenses of meniscus shape having a convex surface facing to the object side, a negative lens of meniscus shape having a concave surface facing to the image side, and a positive lens of meniscus shape having a convex surface facing to the object side.

In the seventh lens group, an aspherical surface is placed at a position where an axial light flux, which is a light flux emitted from an optical axis upon the object plane, is high, and this aspherical surface is used mainly for correction of negative spherical aberration to be produced in the seventh lens group having a strong positive refractive power. The aspherical surface used at a convex surface adjacent to the image plane is mainly contributable to correction of coma and distortion.

By introducing at least one aspherical surface satisfying the condition (3) into the lens optical system, as described above, the effect of using an aspherical surface sufficiently functions in providing an optical system of large numerical aperture.

Particularly, placing five aspherical surfaces before the stop of the lens optical system is effective for good balance correction of distortion aberration, astigmatism and coma, for example. Further, an aspherical surface is formed on a surface which satisfies the condition (2), that is, a surface which is very influential to the abaxial chief rays. With this arrangement, mainly the aberration related to abaxial rays is corrected on one hand, and the load for correction of other aberration is reduced on the other hand, by which a good optical performance is accomplished.

In this example, the aspherical surfaces which satisfy the condition (2) are surfaces at r2, r3, r7 and r11. Further, when an aspherical surface satisfying at least one of the conditions (c1) and (c2) described above is introduced, the effect of aspherical surface is enhanced and better aberration correction is attainable.

This example uses seven aspherical surfaces, and an optical system of large numerical aperture (NA) is provided with a lens number of 16 (sixteen).

EXAMPLE 26

Figure 79:
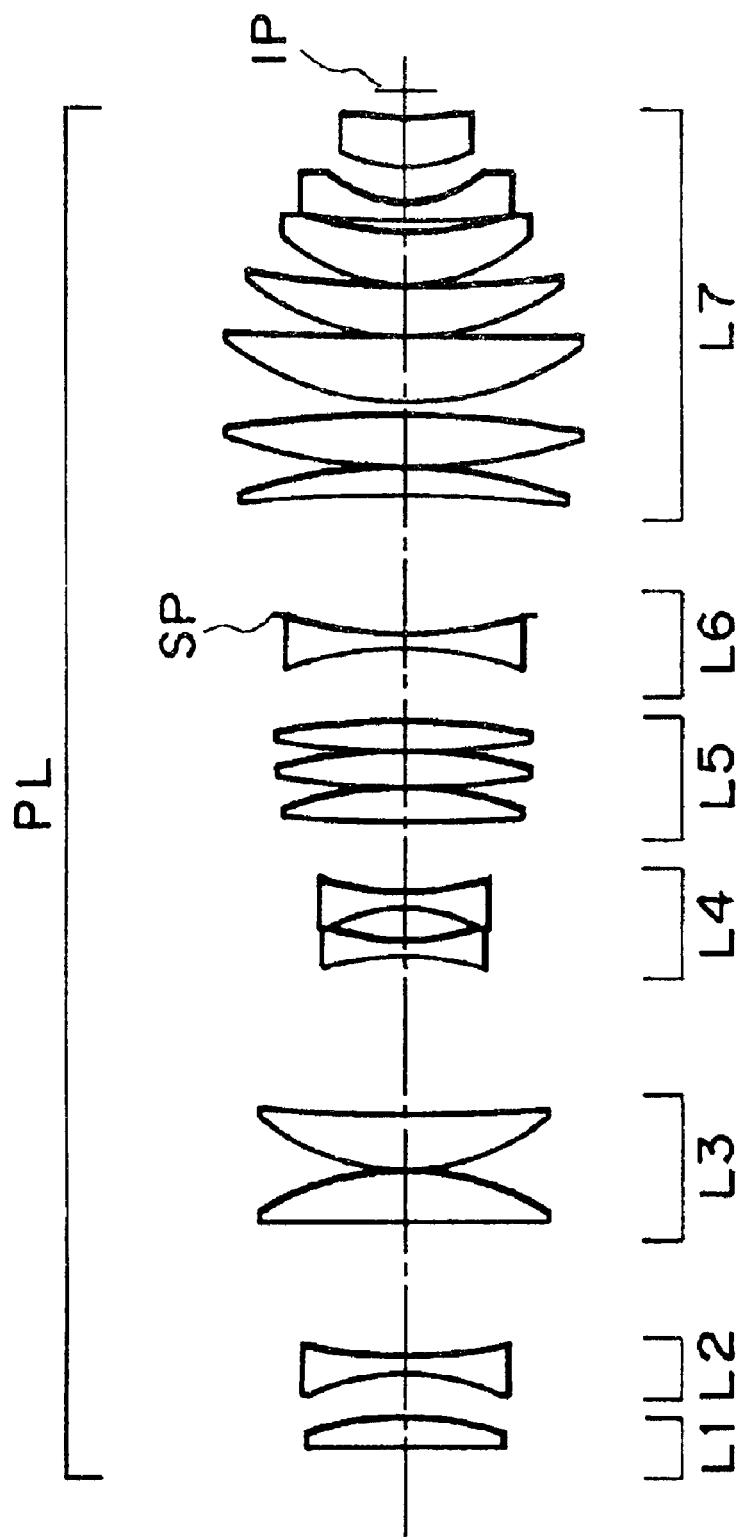
FIG. 79 is a lens sectional view of a projection optical system for use in a projection exposure apparatus, according to Numerical Example 26 of the present invention.
Figure 80:
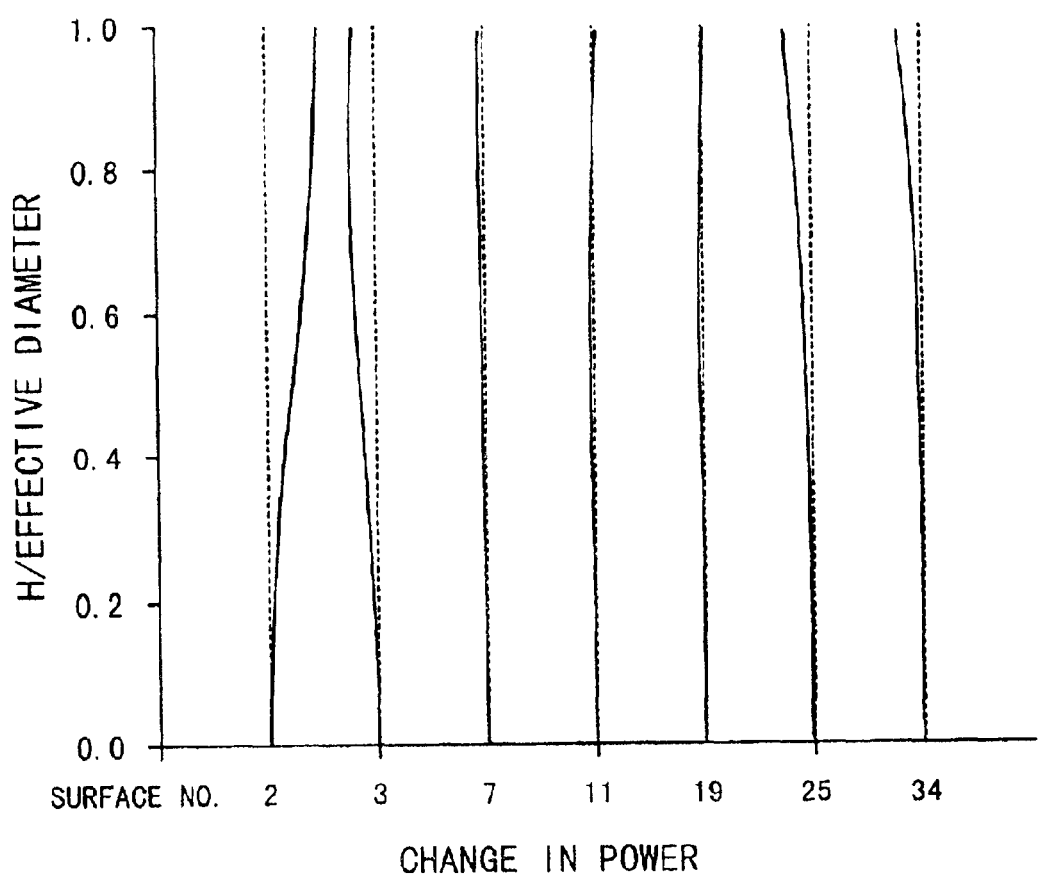
FIG. 80 is a graph for explaining changes in a local curvature power of an aspherical surface of a projection optical system according to Numerical Example 26.
Figure 81:
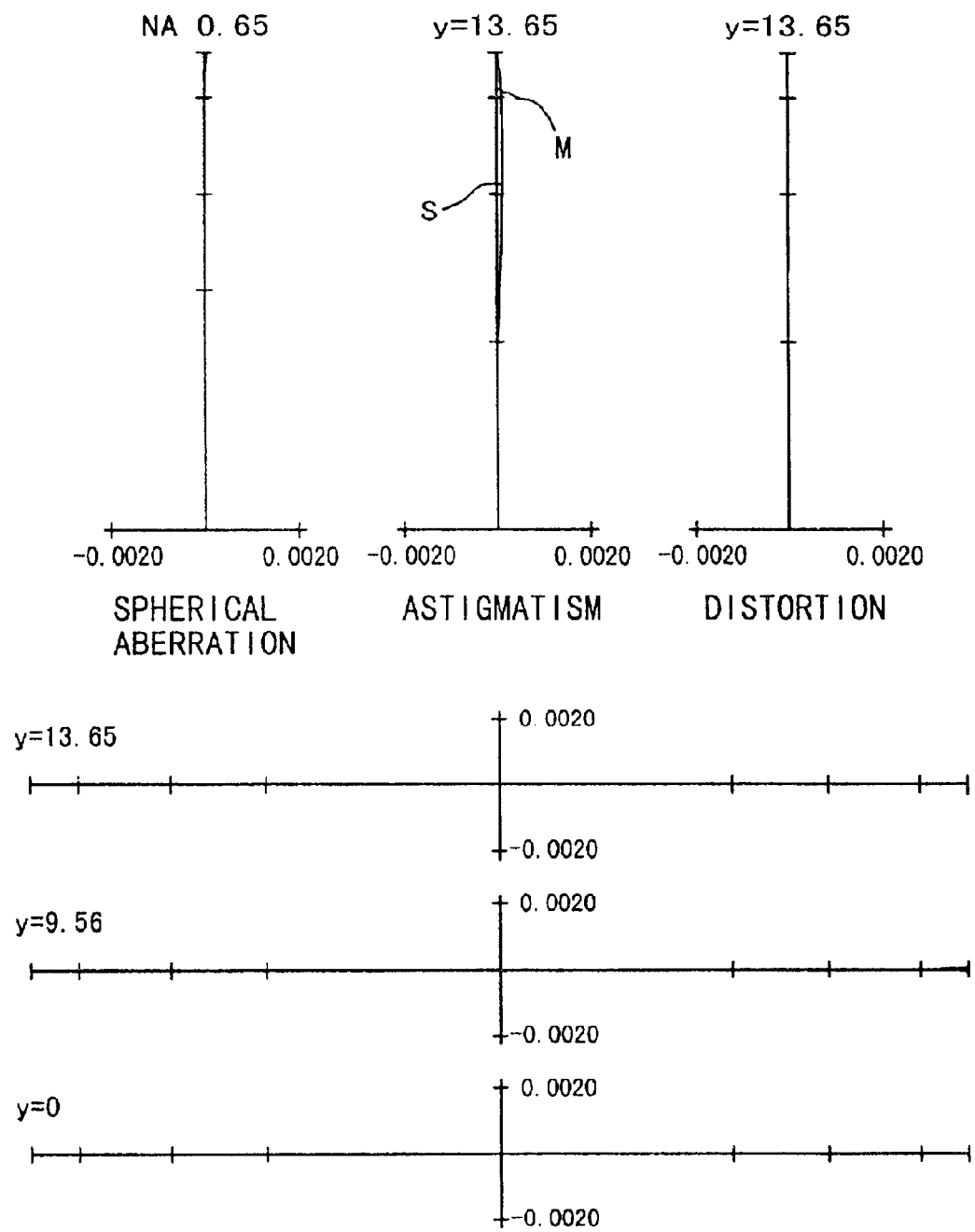
FIG. 81 illustrates aberrations of a projection optical system according to Numerical Example 26.

In Numerical Example 26 shown in FIG. 79, the lens optical system uses seven aspherical surfaces. Table 26 shows values corresponding to conditions of equations (1), (2) and (3). FIG. 81 shows aberrations, and FIG. 80 shows changes in local curvature power of the aspherical surface.

Details of the lens structure will be described below.

The first lens group L1 comprises an aspherical surface positive lens of plane-convex shape, singly, having a convex surface facing to the image plane side.

The aspherical surface at r2 includes a region in which the local curvature power changes in the positive direction, satisfying the function of (c3) described above.

The second lens group L2 comprises an aspherical surface negative lens of biconcave shape, singly.

The aspherical surface at r3 includes a region in which the local curvature power changes in the negative direction, satisfying the function of condition (c2) described above. Also, in the relation with the surface r2 of the first lens group L1, there are regions in which the local curvature powers change in mutually opposite directions, thus satisfying the plane-convex shape having a convex surface facing to the image side, and an aspherical surface positive lens of approximately plane-convex shape having a convex surface facing to the object side.

The fourth lens group L4 comprises, in an order from the object side, a negative lens of biconcave shape, and an aspherical surface negative lens of biconcave shape.

The fifth lens group L5 comprises three positive lenses of biconvex shape.

The sixth lens group L6 comprises an aspherical surface negative lens of biconcave shape, singly.

The seventh lens group L7 comprises, in an order from the object side, a positive lens of meniscus shape having a convex surface facing to the image side, an aspherical surface positive lens of biconvex shape, a positive lens of approximately plane-convex shape having a convex surface facing to the object side, two positive lenses of meniscus shape having a convex surface facing to the object side, a negative lens of meniscus shape having a concave surface facing to the image side, and an aspherical surface positive lens of meniscus shape having a convex surface facing to the object side.

This example uses seven aspherical surfaces and an optical system of large numerical aperture (NA) is provided with a lens number of 17 (seventeen).

EXAMPLE 27

Figure 82:
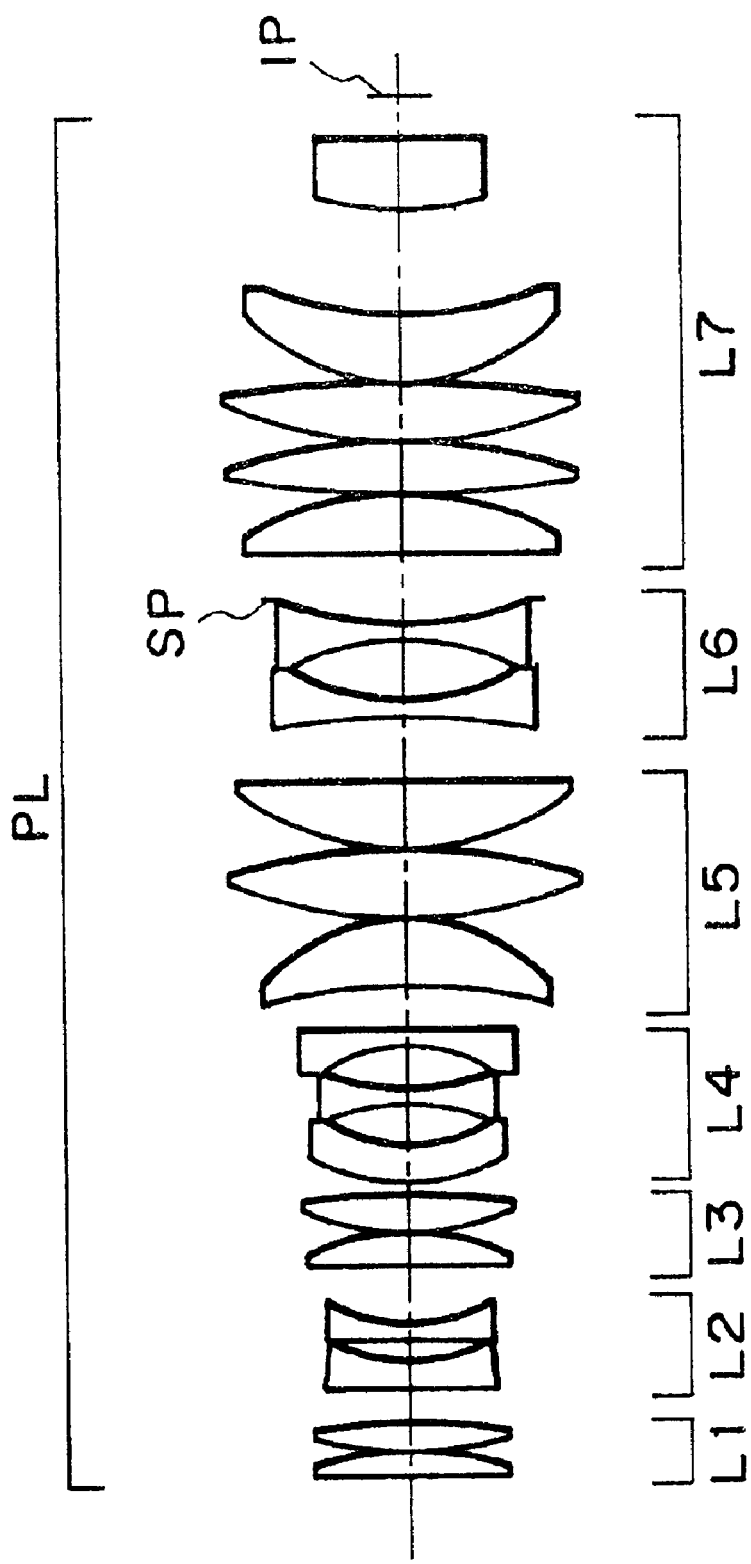
FIG. 82 is a lens sectional view of a projection optical system for use in a projection optical system for use in a projection exposure apparatus, according to Numerical Example 27 of the present invention.
Figure 83:
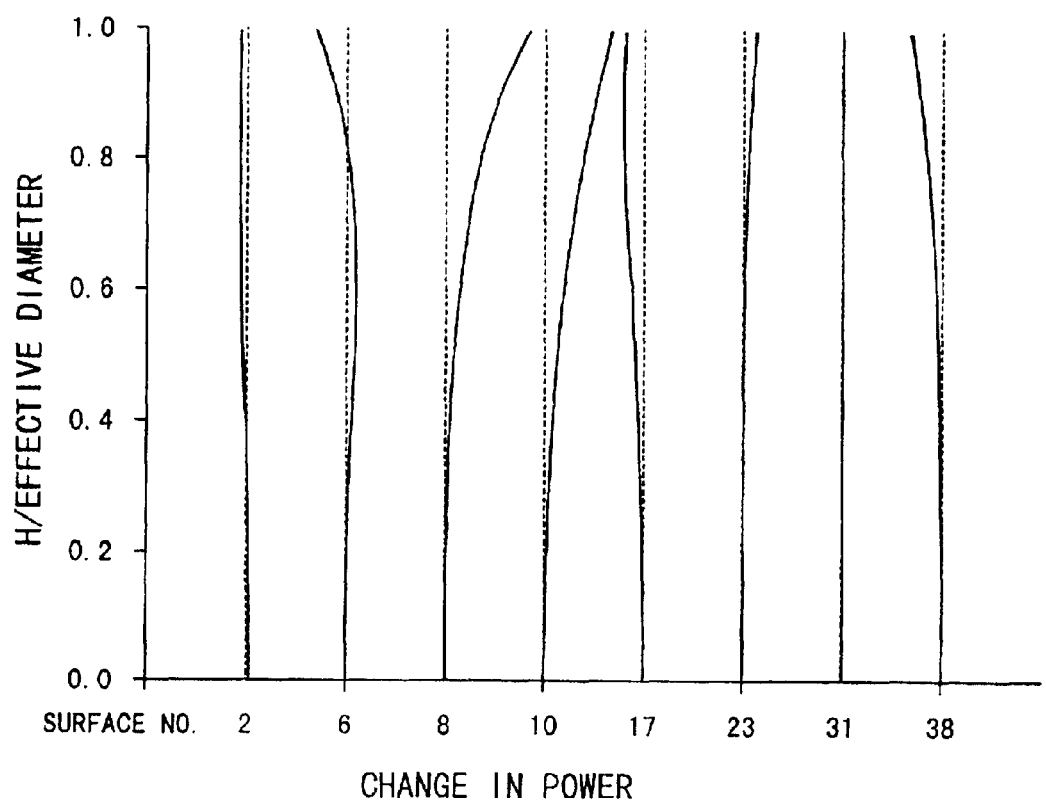
FIG. 83 is a graph for explaining changes in a local curvature power of an aspherical surface of a projection optical system according to Numerical Example 27.
Figure 84:
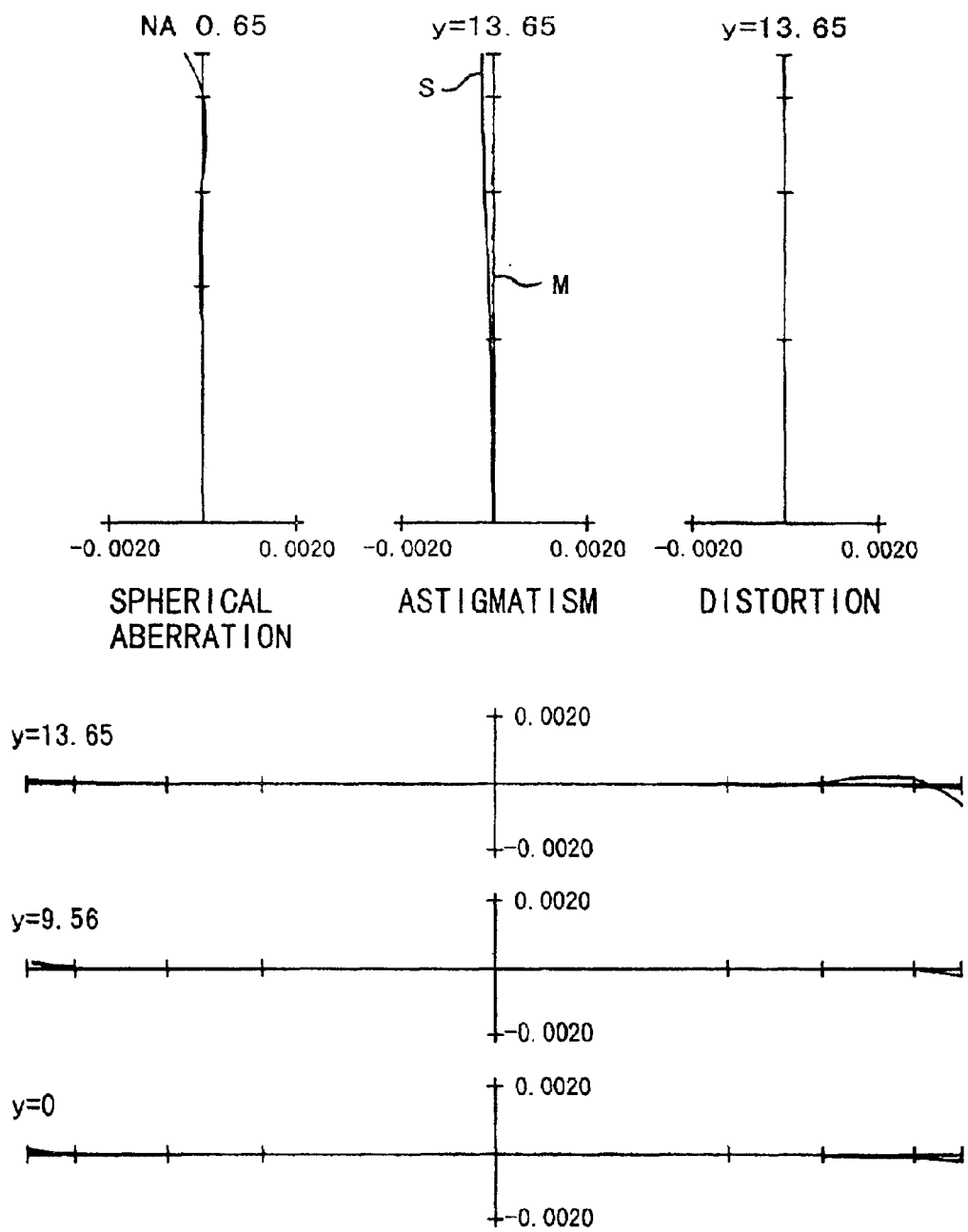
FIG. 84 illustrates aberrations of a projection optical system according to Numerical Example 27.

FIG. 82 shows a projection optical system according to Numerical Example 27 of the present invention. Table 27 shows values corresponding to conditions of equations (1), (2) and (3). FIG. 84 shows aberrations, and FIG. 83 shows changes in local curvature power of the aspherical surface. This lens system uses eight aspherical surfaces, and the values corresponding to equation (3) are shown in Table 27.

In this example, all the aspherical surface lenses have a plane surface on a side opposite to the aspherical surface thereof.

Details of the lens structure will be described below.

The first lens group L1 comprises, in an order from the object side, an aspherical surface positive lens of plane-convex shape having a convex surface facing to the image plane side, and a positive lens of biconvex shape.

The aspherical surface at r2 includes a region in which the local curvature power changes in the negative direction.

The second lens group L2 comprises, in an order from the object side, two aspherical surface negative lenses of plane-concave shape having a concave surface facing to the image side.

The aspherical surfaces at r4 and r6 include regions in which the local curvature powers change in the positive direction. Also, in the relation with the surface r2 of the first lens group L1, both of the surfaces r4 and r6 include regions in which the local curvature powers change in mutually opposite directions, thus satisfying the function of condition (c1).

The third lens group L3 comprises, in an order from the object side, an aspherical surface positive lens of plane-convex shape having a convex surface facing to the image side, and a positive lens of biconvex shape. The aspherical surface r10 includes a region in which the local curvature power changes in the negative direction, thus satisfying the function of condition (c3) described above.

The fourth lens group L4 comprises, in an order from the object side, a negative lens of meniscus shape having a concave surface facing to the image side, a negative lens of biconcave shape, and an aspherical surface negative lens of plane-concave shape having a concave surface facing to the object side. The aspherical surface at r17 includes a region in which the local curvature power changes in the negative direction, satisfying the function of condition (c2) described above. Also, in the relation with the surface r10 of the third lens group L3, there are regions in which the local curvature powers change in mutually opposite directions, thus satisfying the function of condition (c1).

The fifth lens group L5 comprises, in an order from the object side, a positive lens of meniscus shape having a concave surface facing to the object side, a positive lens of biconvex shape, and an aspherical surface positive lens of plane-convex shape having a convex surface facing to the object side.

The sixth lens group L6 comprises two negative lenses of biconcave shape.

The seventh lens group L7 comprises, in an order from the object side, an aspherical surface positive lens of plane-convex shape having a convex surface facing to the image side, two positive lenses of biconvex shape, a positive lens of meniscus shape having a concave surface facing to the image side, and an aspherical surface positive lens of plane-convex shape having a convex surface facing to the object side.

This example uses eight aspherical surfaces, and an optical system of large numerical aperture (NA) is provided with a lens number of 19 (nineteen).

EXAMPLE 28

Figure 85:
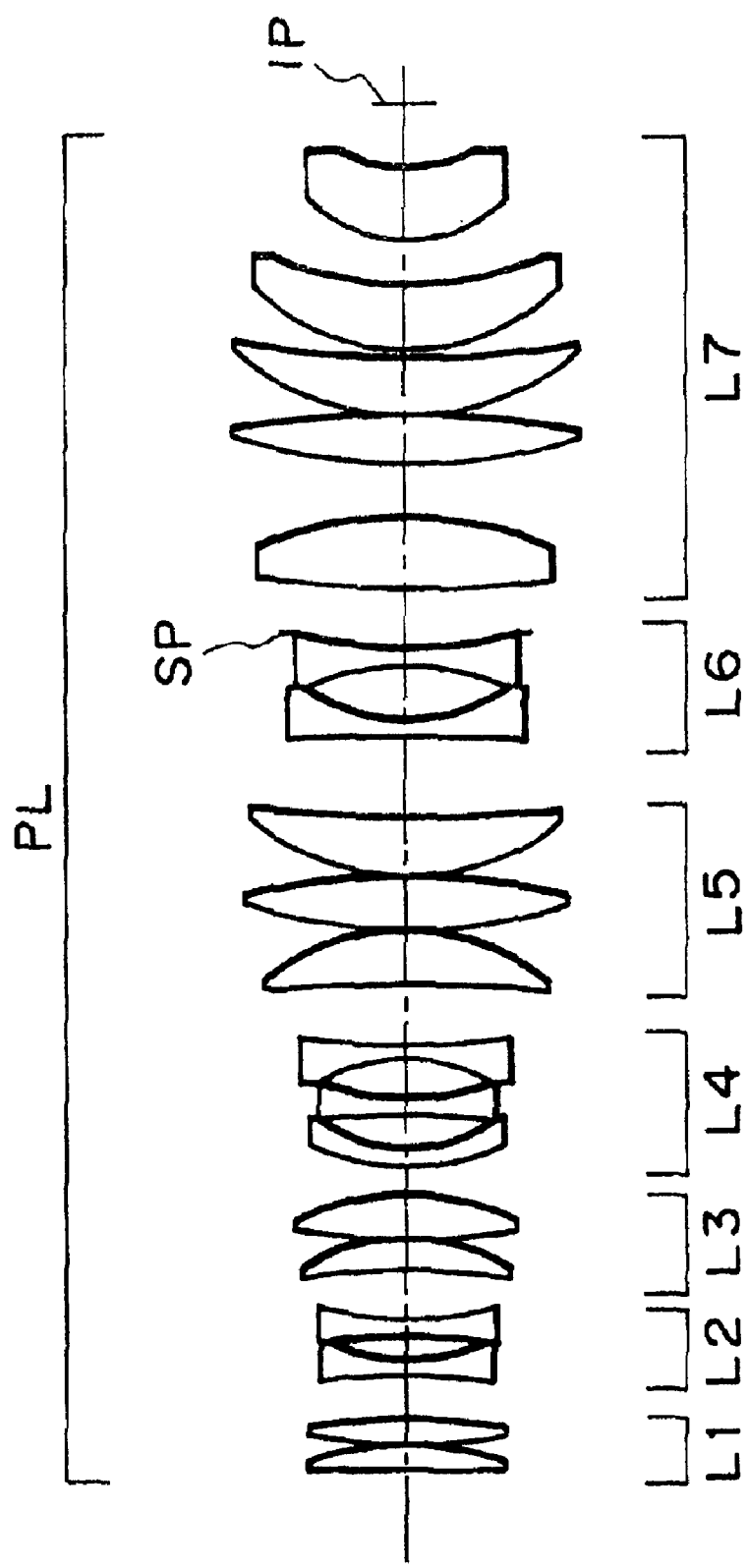
FIG. 85 is a lens sectional view of a projection optical system for use in a projection optical system for use in a projection exposure apparatus, according to Numerical Example 28 of the present invention.
Figure 86:
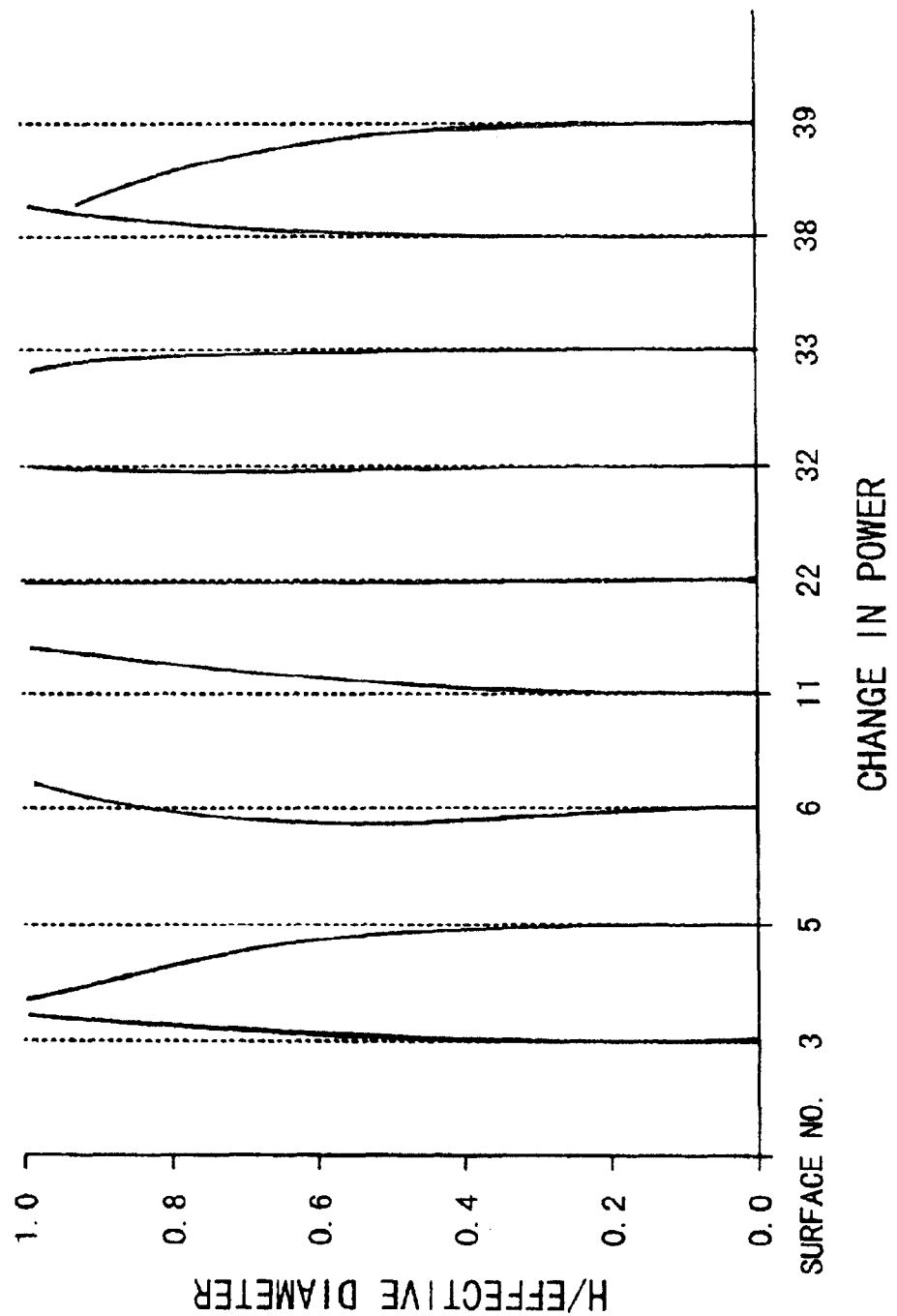
FIG. 86 is a graph for explaining changes in a local curvature power of an aspherical surface of a projection optical system according to a Numerical Example 28.
Figure 87:
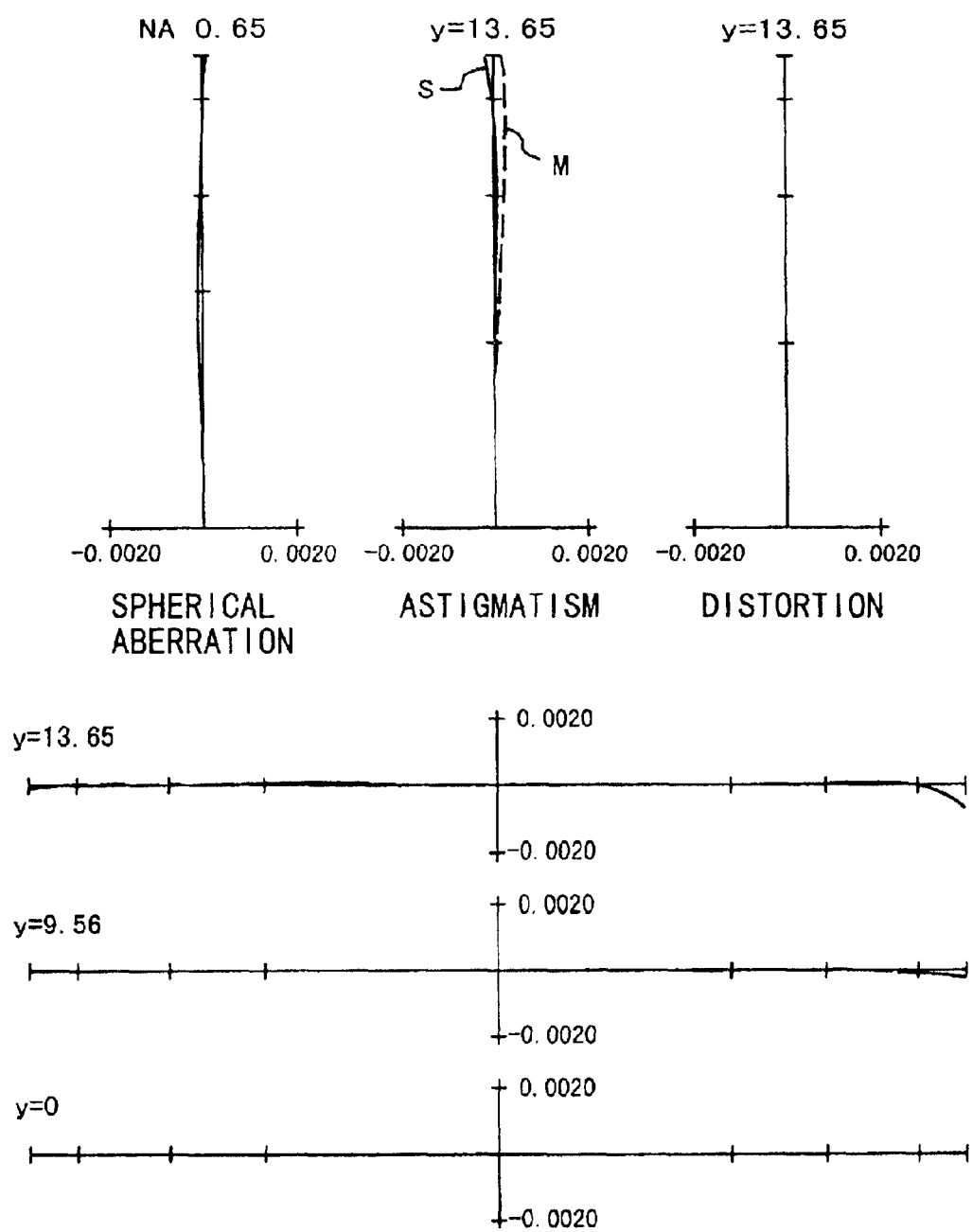
FIG. 87 illustrates aberrations of a projection optical system according to Numerical Example 28.

FIG. 85 shows a projection optical system according to Numerical Example 28 of the present invention. Table 28 shows values corresponding to conditions of equations (1), (2) and (3). FIG. 87 shows aberrations, and FIG. 86 shows changes in local curvature power of the aspherical surface.

This lens system uses nine aspherical surfaces. More specifically, three bi-aspherical surface lenses (each having two aspherical surfaces on both faces thereof) and three non-aspherical surface lenses each having a spherical surface on a side opposite to the aspherical surface thereof. Thus, six aspherical surface lenses with nine aspherical surfaces in total are used.

Details of the lens structure will be described below.

The first lens group L1 comprises, in an order from the object side, a positive lens of approximately plane-convex shape having a convex surface facing to the image plane side, and a positive lens of biconvex shape.

The aspherical surface at r3 includes a region in which the local curvature power changes in the positive direction, thus satisfying the function defined in condition (c3) described above.

The second lens group L2 comprises, in an order from the object side, an aspherical surface negative lens of biconcave shape, and a negative lens of biconcave shape.

The aspherical surfaces at r5 and r6 include regions in which the local curvature powers change in the negative direction, and the function of condition (c2) described above is satisfied. Also, there is a region in which, relative to the aspherical surface r3 of the first lens group L1, the local curvature powers change with mutually opposite signs to cancel with each other. Thus, the function of condition (c1) described above is satisfied. Further, between the surfaces r5 and r6, the local curvature powers of them, at the peripheral portion thereof, change with mutually opposite signs to cancel with each other.

The third lens group L3 comprises, in an order from the object side, a positive lens of meniscus shape having a concave surface facing to the object side, and an aspherical surface positive lens of biconvex shape. The aspherical surface r11 includes a region in which the local curvature power changes in the positive direction thus satisfying the function of condition (c3) described above.

The fourth lens group L4 comprises, in an order from the object side, a negative lens of meniscus shape having a concave surface facing to the image side, and two negative lenses of biconcave shape.

The fifth lens group L5 comprises, in an order from the object side, a positive lens of approximately plane-convex shape having a convex surface facing to the image side, an aspherical surface positive lens of biconvex shape, and a positive lens of approximately plane-convex shape having a convex surface facing to the object side.

The sixth lens group L6 comprises, in an order from the object side, a negative lens of approximately plane-convex shape having a concave surface facing to the image side, and a negative lenses of biconcave shape.

The seventh lens group L7 comprises, in an order from the object side, a positive lens of biconvex shape, a bi-aspherical surface positive lens of biconvex shape, two positive lenses of meniscus shape having a concave surface facing to the image side, and a bi-aspherical surface positive lens of meniscus shape having a concave surface facing to the image side.

This example uses three bi-aspherical surface lenses (each having two aspherical surfaces on both faces thereof) and three mono-aspherical surface lenses (each having a spherical surface on a side opposite to the aspherical surface thereof), and an optical system of large numerical aperture (NA) is provided with a lens number of 19 (nineteen).

For better imaging performance, additional aspherical surfaces may be used. Particularly, adding an aspherical surface satisfying the condition (3) between the object and the stop, is very effective to correct distortion and curvature of field, for example, successfully. When it is added in a lens group after the stop, further improvements in various aberrations such as spherical aberration and comma are attainable.

As described above, with use of aspherical surfaces, the number of lenses can be reduced considerably and, yet, a projection optical system having a large numerical aperture is accomplished.

When a face of an aspherical surface lens at a side opposite to the aspherical surface thereof is made a plane surface, a projection optical system being easy in manufacture and adjustment is provided. When the face at a side opposite to the aspherical surface is made a spherical surface, the degree of freedom can be expanded significantly, and better aberration correction is attainable.

The conical constant k regarding the aspherical surface shape is taken as zero, in some examples of Numerical Examples 1–28 described above. However, the aspherical surface shape may be designed while taking the conical constant k as a variable.

Further, in some examples described above, silica (n-1.5602) is used as a lens glass material. However, fluorite may be used. When both silica and fluorite are used, chromatic aberration can be corrected to be very small.

In many of these examples, the exposure light source uses an ArF wavelength laser of 193 nm (h-line in Example 17). However, any other wavelength shorter than 250 nm, such as a KrF excimer laser (wavelength 248 nm) or an $F_2$ laser (wavelength 157 nm), for example, may be used. Also, the magnification of the projection optical system is not limited to 1:4 in these examples. Any other magnification such as 1:5 for example, may be used.

Next, structural specifications of these numerical examples will be described. In the numerical example data to be described below "ri" refers to the curvature radius of the i-th lens surface, in an order from the object side, and "di" refers to the i-th lens thickness or air spacing, in an order from the object side. Further, "ni" refers to the refractive index of the glass material of the i-th lens lens, in an order from the object side.

The shape of an aspherical surface can be given by the following equation:

$$X = \frac{H^2/ri}{1 + \{1 - (1+k)\cdot(H/ri)^2\}^{1/2}} + A\cdot H^4 + B\cdot H^6 + C\cdot H^8 + D\cdot H^{10} + E\cdot H^{12} + F\cdot H^{14} + G\cdot H^{16} + \ldots$$

where X is the displacement amount in the optical axis direction from the lens vertex, H is the distance from the optical axis, ri is the curvature radius, k is the conical constant, and A, B, C, . . . , G are aspherical coefficients.

The refractive indices of fused silica and fluorite with respect to the exposure wavelength 193 nm are 1.5602 and 1.5014, respectively.

Further, the local curvature power of an aspherical surface referred to in the specification is given as a function X(H) of X and H in the above equation, by the following:

$$PH=(N'-N)/\rho$$

where $$\rho=(1+X'^2)^{3/2}/X''$$

wherein N and N' are refractive indices of mediums before and after the refraction surface.

The following are numerical data for Numerical Examples 1–28. Also, Tables 1–28 below show the relation between the conditions described above and these numerical examples.

Numerical Example 1

|  | i | ri | di | ni | Obj – distance = 70.000 |
|---|---|---|---|---|---|
|  | 1 | 7563.434 | 11.000 | 1.50140 |  |
|  | 2 | 251.917 | 17.200 |  |  |
|  | 3 | −2311.851 | 38.351 | 1.56020 |  |
|  | 4 | −271.421 | 7.945 |  |  |
|  | 5 | 334.300 | 33.453 | 1.56020 |  |
|  | 6 | −219.013 | 1.000 |  |  |
|  | 7 | 173.820 | 17.822 | 1.56020 |  |
|  | 8 | 472.228 | 1.000 |  |  |
|  | 9 | 166.425 | 20.537 | 1.50140 |  |
| ASP | 10 | 92.001 | 26.942 |  |  |
|  | 11 | −492.808 | 47.000 | 1.56020 |  |
| ASP | 12 | 539.947 | 53.772 |  |  |
|  | 13 | −87.519 | 11.000 | 1.56020 |  |
|  | 14 | 183.967 | 23.005 |  |  |
|  | 15 | −92.489 | 11.000 | 1.56020 |  |
|  | 16 | −1191.709 | 38.780 |  |  |
|  | 17 | 5589.217 | 33.160 | 1.56020 |  |
|  | 18 | −210.728 | 1.000 |  |  |
|  | 19 | 19670.824 | 26.317 | 1.50140 |  |
| ASP | 20 | −278.596 | 1.000 |  |  |
|  | 21 | 459.320 | 42.261 | 1.50140 |  |
|  | 22 | −419.941 | 199.293 |  |  |
| ASP | 23 | 262.924 | 28.089 | 1.50140 |  |
|  | 24 | 1496.662 | 37.244 |  |  |
| ASP | 25 | 202.338 | 31.685 | 1.50140 |  |
|  | 26 | 1192.437 | 1.000 |  |  |
|  | 27 | 194.380 | 27.820 | 1.50140 |  |
|  | 28 | 605.386 | 6.888 |  |  |
|  | 29 | 170.010 | 29.602 | 1.56020 |  |
|  | 30 | 243.002 | 8.981 |  |  |
|  | 31 | 196.503 | 18.733 | 1.56020 |  |

-continued

|     | i  | ri      | di     | ni      |
|-----|----|---------|--------|---------|
|     | 32 | 141.592 | 27.827 |         |
| ASP | 33 | 205.568 | 13.490 | 1.56020 |
|     | 34 | 405.138 |        |         | aspherical surfaces

| i  | K              | A              | B              | C              | D               |
|----|----------------|----------------|----------------|----------------|-----------------|
| 10 | −7.924169e−002 | −3.355354e−008 | −8.165025e−012 | −1.282327e−015 | −3.015911e−019  |
| 12 | 0.000000e+000  | −2.702105e−008 | 8.731564e−012  | 1.171736e−015  | 5.514590e−019   |
| 20 | −1.689089e−001 | 2.282695e−008  | 2.768267e−013  | 4.557746e−019  | −7.785683e−023  |
| 23 | 1.549976e−003  | −3.488190e−009 | −5.892913e−013 | 6.390236e−018  | −3.718856e−022  |
| 25 | −7.080562e−002 | −2.442717e−008 | 1.674842e−013  | −5.964801e−018 | 1.311802e−022   |
| 33 | −6.457308e−001 | 5.114130e−008  | 1.559426e−011  | 1.398483e−015  | 5.607100e−019   |

| i  | E              | F              | G             |
|----|----------------|----------------|---------------|
| 10 | 1.508201e−023  | −1.215145e−026 | 0.000000e=000 |
| 12 | −1.037663e−022 | 3.178927e−026  | 0.000000e=000 |
| 20 | 6.124503e−028  | 3.667262e−032  | 0.000000e=000 |
| 23 | 8.770095e−027  | −1.683943e−031 | 0.000000e=000 |
| 25 | −1.028257e−026 | 1.440202e−032  | 0.000000e=000 |
| 33 | −1.181280e−022 | 1.258543e−026  | 0.000000e=000 |

NA = 0.65
β = ¼
L = 1000

Numerical Example 2

|     | i  | ri       | di      | ni      | Obj − distance = 70.000 |
|-----|----|----------|---------|---------|-------------------------|
|     | 1  | ∞        | 11.000  | 1.56020 |                         |
| ASP | 2  | 241.459  | 89.729  |         |                         |
|     | 3  | 259.326  | 33.985  | 1.56020 |                         |
|     | 4  | −721.262 | 16.736  |         |                         |
| ASP | 5  | 839.101  | 13.458  | 1.56020 |                         |
|     | 6  | ∞        | 8.787   |         |                         |
|     | 7  | 160.242  | 33.590  | 1.56020 |                         |
|     | 8  | 1214.104 | 22.148  |         |                         |
|     | 9  | 129.280  | 19.364  | 1.56020 |                         |
|     | 10 | 174.248  | 47.364  |         |                         |
| ASP | 11 | −141.760 | 11.000  | 1.56020 |                         |
|     | 12 | 908.569  | 8.936   |         |                         |
|     | 13 | −164.780 | 11.000  | 1.56020 |                         |
|     | 14 | 93.667   | 21.167  |         |                         |
| ASP | 15 | 132.458  | 47.000  | 1.56020 |                         |
|     | 16 | ∞        | 11.171  |         |                         |
|     | 17 | 5830.851 | 43.946  | 1.56020 |                         |
|     | 18 | −344.619 | 37.984  |         |                         |
|     | 19 | 568.585  | 30.551  | 1.50140 |                         |
| ASP | 20 | −294.579 | 20.971  |         |                         |
|     | 21 | 899.021  | 24.198  | 1.50140 |                         |
|     | 22 | −473.709 | 140.955 |         |                         |
| ASP | 23 | 340.419  | 22.918  | 1.50140 |                         |
|     | 24 | ∞        | 1.000   |         |                         |
|     | 25 | 228.928  | 31.111  | 1.50140 |                         |
|     | 26 | 2033.762 | 1.000   |         |                         |
| ASP | 27 | 215.729  | 29.615  | 1.50140 |                         |
|     | 28 | 745.991  | 1.000   |         |                         |
|     | 29 | 146.642  | 47.000  | 1.56020 |                         |
|     | 30 | 521.804  | 5.774   |         |                         |
|     | 31 | ∞        | 16.697  | 1.56020 |                         |
| ASP | 32 | 1397.306 | 4.364   |         |                         |
| ASP | 33 | −595.584 | 30.479  | 1.56020 |                         |
|     | 34 | ∞        |         |         |                         |

-continued aspherical surface

| i  | K             | A              | B              | C              | D               |
|----|---------------|----------------|----------------|----------------|-----------------|
| 2  | 0.000000e=000 | −8.89977e−008  | 4.468913e−012  | −6.084916e−017 | −3.783704e−022  |
| 5  | 0.000000e=000 | 9.842755e−009  | 4.892032e−013  | −6.747952e−018 | −8.110711e−022  |
| 11 | 0.000000e=000 | −1.355522e−007 | 3.004930e−011  | 2.019333e−015  | −6.833401e−019  |
| 15 | 0.000000e=000 | −7.518484e−008 | −8.479227e−012 | −1.320534e−015 | 6.990086e−020   |
| 20 | 0.000000e=000 | 1.7596618e−008 | 1.555047e−013  | −4.699964e−019 | −5.339673e−023  |
| 23 | 0.000000e=000 | −1.206905e−008 | −2.262720e−013 | 9.284450e−018  | 1.832386e−022   |
| 27 | 0.000000e=000 | 6.500841e−009  | 1.034536e−013  | −1.828330e−0 017 | −1.247995e−021 |
| 32 | 0.000000e=000 | −1.844592e−0 008 | 1.601803e−012 | −8.642931e−016 | −2.787101e−019  |
| 33 | 0.000000e=000 | 4.100318e−008  | 7.653147e−012  | −2.748195e−015 | 1.526792e−019   |

| i  | E              | F             | G             |
|----|----------------|---------------|---------------|
| 2  | 7.421051e−0 025 | 0.000000e=000 | 0.000000e=000 |
| 5  | 9.181608−027   | 0.000000e=000 | 0.000000e=000 |
| 11 | 4.876491e−023  | 0.000000e=000 | 0.000000e=000 |
| 15 | −4.950373e−023 | 0.000000e=000 | 0.000000e=000 |
| 20 | −2.680910e−027 | 0.000000e=000 | 0.000000e=000 |
| 23 | −9.584813e−027 | 0.000000e=000 | 0.000000e=000 |
| 27 | −4.922083e−026 | 0.000000e=000 | 0.000000e=000 |
| 32 | 5.616870e−023  | 0.000000e=000 | 0.000000e=000 |
| 33 | 1.903936e−023  | 0.000000e=000 | 0.000000e=000 |

NA = 0.65
β = ¼
L = 1000

Numerical Example 3

|     | i  | ri        | di      | ni      | Obj − distance = 78.337 |
|-----|----|-----------|---------|---------|-------------------------|
|     | 1  | ∞         | 11.000  | 1.56020 |                         |
| ASP | 2  | 291.960   | 13.576  |         |                         |
|     | 3  | −2468.391 | 18.430  | 1.56020 |                         |
|     | 4  | −212.937  | 2.174   |         |                         |
|     | 5  | 632.276   | 36.661  | 1.56020 |                         |
|     | 6  | −195.510  | 1.716   |         |                         |
| ASP | 7  | 209.897   | 30.803  | 1.56020 |                         |
|     | 8  | ∞         | 10.964  |         |                         |
|     | 9  | 179.370   | 11.379  | 1.56020 |                         |
|     | 10 | 85.411    | 36.359  |         |                         |
|     | 11 | ∞         | 9.310   | 1.56020 |                         |
| ASP | 12 | 137.526   | 70.188  |         |                         |
|     | 13 | −94.815   | 9.310   | 1.56020 |                         |
|     | 14 | 354.874   | 22.479  |         |                         |
|     | 15 | −94.483   | 10.344  | 1.56020 |                         |
|     | 16 | −819.857  | 20.429  |         |                         |
|     | 17 | −1867.588 | 33.299  | 1.56020 |                         |
|     | 18 | −217.001  | 1.000   |         |                         |
|     | 19 | ∞         | 40.000  | 1.56020 |                         |
| ASP | 20 | −234.059  | 1.000   |         |                         |
|     | 21 | 477.242   | 37.938  | 1.56020 |                         |
|     | 22 | −515.192  | 207.111 |         |                         |
| ASP | 23 | 298.270   | 48.200  | 1.56020 |                         |
|     | 24 | ∞         | 11.574  |         |                         |
| ASP | 25 | 275.687   | 36.978  | 1.56020 |                         |
|     | 26 | ∞         | 10.799  |         |                         |
|     | 27 | 203.097   | 32.137  | 1.56020 |                         |
|     | 28 | 533.727   | 2.293   |         |                         |
|     | 29 | 186.253   | 28.417  | 1.56020 |                         |
|     | 30 | 1013.907  | 5.512   |         |                         |

-continued

|   | i | ri | di | ni |
|---|---|---|---|---|
|   | 31 | 1325.581 | 18.749 | 1.56020 |
|   | 32 | 107.474 | 22.379 |  |
| ASP | 33 | 180.126 | 18.257 | 1.56020 |
|   | 34 | ∞ |  |  | aspherical surfaces

| i | K | A | B | C | D |
|---|---|---|---|---|---|
| 2 | 0.000000 e + 000 | 3.736230 e − 008 | 1.03822 e − 012 | −3.965564 e − 016 | −5.505777e − 021 |
| 7 | 0.000000 e + 000 | 4.848022 e − 009 | 4.158133 e − 012 | 1.071518 e − 016 | −9.266750e − 021 |
| 12 | 0.000000 e + 000 | −1.028517 e − 007 | 1.142371 e − 011 | 1.548505 e − 015 | 3.030974e − 019 |
| 20 | 0.000000 e + 000 | 2.096099 e − 008 | 3.467669 e − 013 | 2.256954 e − 018 | −4.666722e − 023 |
| 23 | 0.000000 e + 000 | −3.621224 e − 009 | −5.579396 e − 013 | 7.419379 e − 018 | −3.142413e − 022 |
| 25 | 0.000000 e + 000 | −2.374654 e − 008 | 3.141420 e − 013 | −2.583907 e − 013 | 8.955907e − 023 e − 018 |
| 33 | 0.000000 e + 000 | 6.8128365 e − 008 | 5.847001 e − 012 | −1.362069 e − 017 | 8.105142e − 020 |

| i | E | F | G |
|---|---|---|---|
| 2 | 3.907528e − 024 | −2.229541e − 028 | 0.000000e + 000 |
| 7 | 1.709364e − 025 | −4.176085e − 029 | 0.000000e + 000 |
| 12 | −8.699782e − 024 | 1.590852e − 026 | 0.000000e + 000 |
| 20 | −1.190790e − 027 | 8.053527e − 032 | 0.000000e + 000 |
| 23 | 7.943315e − 027 | −9.396981e − 032 | 0.000000e + 000 |
| 25 | −8.404456e − 027 | 7.322317e − 032 | 0.000000e + 000 |
| 33 | −1.014027e − 023 | 8.198208e − 028 | 0.000000e + 000 |

NA = 0.65
β = ¼
L = 1000

Numerical Example 4

|   | i | ri | di | ni | Obj − distance = 94.777 |
|---|---|---|---|---|---|
|   | 1 | −211.935 | 25.002 | 1.56020 |  |
|   | 2 | −274.973 | 34.686 |  |  |
|   | 3 | 921.019 | 19.213 | 1.56020 |  |
|   | 4 | −878.587 | 1.375 |  |  |
|   | 5 | 310.870 | 29.825 | 1.56020 |  |
|   | 6 | −410.625 | 1.000 |  |  |
| ASP | 7 | 162.868 | 29.679 | 1.56020 |  |
| ASP | 8 | 719.157 | 37.255 |  |  |
| ASP | 9 | −694.335 | 8.000 | 1.56020 |  |
| ASP | 10 | 151.022 | 45.485 |  |  |
|   | 11 | −212.339 | 10.002 | 1.56020 |  |
|   | 12 | 510.246 | 34.725 |  |  |
|   | 13 | −64.375 | 8.000 | 1.56020 |  |
|   | 14 | 278.092 | 60.268 |  |  |
|   | 15 | 1463.988 | 43.610 | 1.56020 |  |
|   | 16 | −189.700 | 1.000 |  |  |
|   | 17 | 5371.657 | 28.376 | 1.56020 |  |
| ASP | 18 | −313.325 | 3.649 |  |  |
|   | 19 | 312.645 | 39.189 | 1.56020 |  |
|   | 20 | 306.130 | 112.761 |  |  |
|   | 21 | 386.134 | 42.570 | 1.56020 |  |
|   | 22 | −1353.684 | 65.759 |  |  |
| ASP | 23 | 210.713 | 45.920 | 1.56020 |  |
|   | 24 | −7100.101 | 3.172 |  |  |
|   | 25 | 161.697 | 40.777 | 1.56020 |  |
|   | 26 | 672.543 | 24.705 |  |  |
|   | 27 | −2434.070 | 10.000 | 1.56020 |  |
|   | 28 | 257.881 | 1.113 |  |  |
| ASP | 29 | 203.124 | 1.113 | 1.56020 |  |
| ASP | 30 | 2059.555 |  |  |  |

-continued aspherical surfaces

| i | K | A | B | C | D |
|---|---|---|---|---|---|
| 7 | 6.495603 e − 001 | 3.625859 e − 008 | 1.741255 e − 013 | −1.414452 e − 017 | 1.744975e − 020 |
| 8 | 0.000000 e + 000 | 6.098222 e − 009 | −2.569543 e − 012 | 2.225990 e − 016 | 8.493683e − 020 |
| 9 | 0.000000 e + 000 | −5.436344 e − 008 | 1.105804 e − 011 | 5.667300 e − 015 | −3.480729e − 019 |
| 10 | 8.962335 e − 001 | 3.597303 e − 008 | 1251516 e − 011 | 5.836732 e − 015 | 1.516663e − 020 |
| 18 | 2.384810 e − 001 | 1.556881 e − 008 | 1.578934 e − 013 | −7.371860 e − 019 | 1.581607e − 022 |
| 23 | 5.623844 e − 002 | −1.320180 e − 008 | −4.292778 e − 013 | −8.709804 e − 018 | −3.927143e − 023 |
| 29 | 0.000000 e + 000 | −5.318060 e − 008 | 5.315370 e − 012 | 4.059718 e − 016 | −3.209372e − 020 |
| 30 | 0.000000 e + 000 | −2.730145 e − 008 | 6.579062 e − 012 | 7.288556 e − 017 | −3.648637e − 019 |

| i | E | F | G |
|---|---|---|---|
| 7 | 4.363123e − 025 | 9.563679e − 028 | −1.965524e − 033 |
| 8 | 7.645759e − 024 | −5.447221e − 028 | −7.558589e − 032 |
| 9 | −1.501620e − 022 | 3.545450e − 028 | 1.529071e − 030 |
| 10 | −2.368293e − 022 | 1.602413e − 026 | −126581e − 029 |
| 18 | −1.625511e − 026 | 8.891181e − 031 | −1.806298e − 035 |
| 23 | −6.738671e − 027 | 2.324125e − 031 | −7.432070e − 036 |
| 29 | −6.309136e − 024 | 1.135376e − 027 | −5.838246e − 032 |
| 30 | 8.493168e − 023 | −9.227818e − 027 | 4.009184e − 031 |

NA = 0.65
β = ¼
L = 1000

Numerical Example 5

|   | i | ri | di | ni | Obj − distance = 76.729 |
|---|---|---|---|---|---|
|   | 1 | ∞ | 10.630 | 1.56020 |  |
|   | 2 | 262.778 | 21.348 |  |  |
|   | 3 | −2352.332 | 24.105 | 1.56020 |  |
|   | 4 | −235.727 | 3.497 |  |  |
|   | 5 | 335.785 | 34.929 | 1.56020 |  |
|   | 6 | −219.548 | 1.210 |  |  |
| ASP | 7 | 174.011 | 30.803 | 1.56020 |  |
| ASP | 8 | 223.533 | 58.374 |  |  |
| ASP | 9 | −721.643 | 9.310 | 1.56020 |  |
| ASP | 10 | 117.483 | 67.811 |  |  |
|   | 11 | −72.728 | 9.310 | 1.56020 |  |
|   | 12 | 2719.240 | 25.453 |  |  |
|   | 13 | −98.805 | 10.344 | 1.56020 |  |
|   | 14 | −727.917 | 19.799 |  |  |
|   | 15 | −988.788 | 34.866 | 1.56020 |  |
|   | 16 | −181.841 | 1.000 |  |  |
| ASP | 17 | −63212.427 | 38.888 | 1.56020 |  |
| ASP | 18 | −248.015 | 1.000 |  |  |
|   | 19 | 652.250 | 39.209 | 1.56020 |  |
|   | 20 | −381.746 | 204.164 |  |  |
| ASP | 21 | 237.211 | 51.746 | 1.56020 |  |
| ASP | 22 | −534.246 | 11.973 |  |  |
|   | 23 | 175.589 | 33.761 | 1.56020 |  |
|   | 24 | 457.536 | 2.163 |  |  |
|   | 25 | 173.823 | 45.901 | 1.56020 |  |
|   | 26 | 104.356 | 22.473 |  |  |
| ASP | 27 | 183.135 | 47.090 | 1.56020 |  |
| ASP | 28 | −18395.030 |  |  |  |

-continued aspherical surfaces

| i | K | A | B | C | D |
|---|---|---|---|---|---|
| 7 | 0.000000 e + 000 | 2.602087 e − 008 | −9.861657 e − 013 | 1.543773 e − 016 | 3.406696e − 020 |
| 8 | 0.000000 e + 000 | −996999 e − 009 | −7.964895 e − 012 | 3.960131 e − 016 | 2.894002e − 019 |
| 9 | 0.000000 e + 000 | −9.044863 e − 008 | 1.795894 e − 011 | 1.168555 e − 014 | −1.916381e − 019 |
| 10 | 0.000000 e + 000 | −9.122145 e − 008 | 2.638660 e − 011 | 1.484569 e − 014 | −1.164586e − 019 |
| 17 | 0.000000 e + 000 | −2.313834 e − 009 | 4.775923 e − 013 | −1.219135 e − 017 | −8.487163e − 022 |
| 18 | 0.000000 e + 000 | 1.619892 e − 008 | 6.583868 e − 013 | 5.134005 e − 018 | −1.010684e − 023 |
| 21 | 0.000000 e + 000 | −2.460447 e − 008 | −8.025827 e − 014 | 5.5851226 e − 019 | −6.974895e − 023 |
| 22 | 0.000000 e + 000 | 4.392679 e − 009 | 1.790428 e − 013 | −3.316430 e − 018 | −7.037122e − 019 |
| 27 | 0.000000 e + 000 | 6.116374 e − 009 | 1.014227 e − 011 | −1.144411 e − 016 | −1.547734e − 019 |
| 28 | 0.000000 e + 000 | −3.758336 e − 008 | 2.767725 e − 011 | −049151 e − 014 | 2.230695e − 018 |

| i | E | F | G |
|---|---|---|---|
| 7 | 8.828934e − 024 | 6.065203e − 029 | 0.000000e + 000 |
| 8 | 8.277960e − 024 | 0.000000e + 000 | 0.000000e + 000 |
| 9 | −1.939457e − 022 | 0.000000e + 000 | 0.000000e + 000 |
| 10 | 1.549810e − 022 | 1.589349e − 026 | 0.000000e + 000 |
| 17 | 2.904456e − 026 | 0.000000e + 000 | 0.000000e + 000 |
| 18 | −7.201050e − 026 | 2.156004e − 030 | 0.000000e + 000 |
| 21 | −8.625227e − 027 | 8.632202e − 032 | 0.000000e + 000 |
| 22 | −2.921158e − 028 | 0.000000e + 000 | 0.000000e + 000 |
| 27 | 2.856544e − 023 | −1.501637e − 027 | 0.000000e + 000 |
| 28 | −2.036432e − 022 | 0.000000e + 000 | 0.000000e + 000 |

NA = 0.65
β = ¼
L = 979

Numerical Example 6

| | i | ri | di | ni | Obj − distance = 105.380 |
|---|---|---|---|---|---|
| | 1 | 615.988 | 18.534 | 1.50850 | |
| | 2 | −383.644 | 0.100 | | |
| | 3 | 286.397 | 18.564 | 1.50850 | |
| | 4 | −1437.441 | 0.100 | | |
| | 5 | 190.097 | 19.857 | 1.50850 | |
| | 6 | 2853.160 | 0.100 | | |
| | 7 | 178.185 | 11.000 | 1.50850 | |
| | 8 | 107.105 | 13.672 | | |
| | 9 | 342.973 | 16.425 | 1.50850 | |
| | 10 | 118.870 | 16.187 | | |
| | 11 | −500.224 | 11.208 | 1.50850 | |
| | 12 | 167.322 | 28.182 | | |
| ASP | 13 | −214.604 | 11.000 | 1.50850 | |
| | 14 | 250.009 | 20.509 | | |
| | 15 | −159.879 | 11.031 | 1.50850 | |
| | 16 | −871.412 | 12.466 | | |
| | 17 | −281.698 | 15.983 | 1.50850 | |
| | 18 | −172.061 | 1.263 | | |
| | 19 | 1567.676 | 29.605 | 1.50850 | |
| | 20 | −230.841 | 0.100 | | |
| | 21 | 2957.023 | 25.135 | 1.50850 | |
| | 22 | −317.075 | 0.100 | | |
| | 23 | 743.070 | 25.712 | 1.50850 | |
| | 24 | −460.817 | 0.100 | | |
| | 25 | 208.157 | 32.503 | 1.50850 | |
| | 26 | −6943.879 | 0.421 | | |
| | 27 | 242.340 | 33.909 | 1.50850 | |

-continued

| | i | ri | di | ni |
|---|---|---|---|---|
| | 28 | 151.140 | 8.381 | |
| | 29 | 229.004 | 11.800 | 1.50850 |
| | 30 | 147.331 | 29.645 | |
| | 31 | −257.186 | 11.800 | 1.50850 |
| | 32 | 198.612 | 31.653 | |
| | 33 | −127.396 | 11.800 | 1.50850 |
| | 34 | 1158.506 | 39.131 | |
| | 35 | −561.270 | 19.932 | 1.50850 |
| | 36 | −228.783 | 43.324 | |
| | 37 | 4362.533 | 34.492 | 1.50850 |
| | 38 | −274.853 | 0.100 | |
| | 39 | 851.165 | 26.541 | 1.50850 |
| | 40 | −726.597 | 0.100 | |
| | 41 | 594.436 | 31.124 | 1.50850 |
| | 42 | −723.222 | 16.167 | |
| | 43 | −311.276 | 25.000 | 1.50850 |
| | 44 | −393.499 | 0.100 | |
| | 45 | 238.968 | 34.553 | 1.50850 |
| | 46 | 1417.673 | 0.100 | |
| | 47 | 162.808 | 31.997 | 1.50850 |
| | 48 | 371.018 | 0.100 | |
| | 49 | 136.027 | 24.985 | 1.50850 |
| | 50 | 230.317 | 13.522 | |
| | 51 | 563.294 | 11.001 | 1.50850 |
| | 52 | 76.679 | 26.332 | |
| ASP | 53 | 85.289 | 58.176 | 1.50850 |
| | 54 | 1259.907 | | | aspherical surfaces

| i | K | A | B | C | D |
|---|---|---|---|---|---|
| 13 | 1.374331 e + 000 | −1.584636 e − 008 | 1.915550 e − 012 | −5.383453 e − 016 | 2.263367e − 019 |
| 53 | 0.000000 e + 000 | 2.751100 e − 008 | 5.808228 e − 012 | −1.354164 e − 017 | 6.184812e − 019 |

| i | E | F | G |
|---|---|---|---|
| 13 | −6.393124e − 023 | 5.892191e − 027 | 0.000000e + 000 |
| 53 | −1.508737e − 022 | 2.672592e − 026 | 0.000000e + 000 |

NA = 0.65
β = ¼
L = 1050

Numerical Example 7

| | i | ri | di | ni | Obj − distance = 93.869 |
|---|---|---|---|---|---|
| | 1 | 685.809 | 16.517 | 1.50850 | |
| | 2 | −441.006 | 0.100 | | |
| | 3 | 397.311 | 18.226 | 1.50850 | |
| | 4 | −571.011 | 0.138 | | |
| | 5 | 266.971 | 21.856 | 1.50850 | |
| | 6 | −5608.095 | 11.732 | | |
| | 7 | 3055.587 | 27.236 | 1.50850 | |
| | 8 | 99.728 | 17.460 | | |
| | 9 | 114008.101 | 14.287 | 1.50850 | |
| ASP | 10 | 111.532 | 24.508 | | |
| ASP | 11 | −203.639 | 11.000 | 1.50850 | |
| | 12 | 262.585 | 19.913 | | |
| | 13 | −149.765 | 11.000 | 1.50850 | |
| | 14 | −603.441 | 12.966 | | |
| | 15 | −250.839 | 15.788 | 1.50850 | |
| | 16 | −170.460 | 2.110 | | |
| | 17 | 2105.855 | 28.463 | 1.50850 | |
| | 18 | −226.097 | 3.907 | | |
| | 19 | 1676.122 | 25.733 | 1.50850 | |
| | 20 | −328.306 | 0.100 | | |
| | 21 | 576.425 | 26.582 | 1.50850 | |
| | 22 | −512.315 | 3.154 | | |
| | 23 | 215.803 | 31.871 | 1.50850 | |

-continued

| i | ri | di | ni |
|---|---|---|---|
| 24 | -4089.312 | 0.294 | |
| 25 | 243.970 | 33.267 | 1.50850 |
| 26 | 143.075 | 8.148 | |
| 27 | 196.795 | 11.800 | 1.50850 |
| 28 | 139.205 | 30.930 | |
| 29 | -219.681 | 11.800 | 1.50850 |
| 30 | 211.178 | 32.392 | |
| 31 | -136.079 | 11.800 | 1.50850 |
| 32 | 1362.342 | 39.669 | |
| 33 | -486.992 | 20.686 | 1.50850 |
| 34 | -227.410 | 44.612 | |
| 35 | 13247.358 | 34.699 | 1.50850 |
| 36 | -270.597 | 0.100 | |
| 37 | 790.036 | 26.195 | 1.50850 |
| 38 | -869.446 | 0.100 | |
| 39 | 518.020 | 33.193 | 1.50850 |
| 40 | -790.408 | 16.284 | |
| 41 | -327.775 | 25.000 | 1.50850 |
| 42 | -444.896 | 0.100 | |
| 43 | 266.574 | 36.001 | 1.50850 |
| 44 | 5487.547 | 0.100 | |
| 45 | 147.257 | 35.230 | 1.50850 |
| 46 | 313.243 | 0.100 | |
| 47 | 140.928 | 22.653 | 1.50850 |
| 48 | 215.247 | 10.541 | |
| 49 | 430.568 | 11.000 | 1.50850 |
| 50 | 84.708 | 26.961 | |
| 51 | 93.991 | 25.870 | 1.50850 |
| 52 | 862.356 | 9.500 | |
| 53 | -991.884 | 24.290 | 1.50850 |
| 54 | -731.263 | | | aspherical surface:

| i | K | A | B | C | D |
|---|---|---|---|---|---|
| 10 | -2.717797e - 001 | -2.885201e - 008 | -6.026619e - 013 | -2.918385e - 015 | 1.725616e - 018 |
| 11 | 1.419563e + 000 | -1.167490e - 008 | 4.045580e - 012 | -3.781544e - 015 | 2.436852e - 018 |

| i | E | F | G |
|---|---|---|---|
| 10 | -5.375995e - 022 | 7.517989e - 026 | 0.000000e + 000 |
| 11 | -8.052113e - 022 | 1.108873e - 025 | 0.000000e + 000 |

NA = 0.65
β = ¼
L = 1050

Numerical Example 8

| | i | ri | di | ni | Obj - distance = 64.486 |
|---|---|---|---|---|---|
| | 1 | 337.003 | 22.211 | 1.50850 | |
| | 2 | -355.093 | 0.100 | | |
| ASP | 3 | 292.157 | 21.149 | 1.50850 | |
| ASP | 4 | -560.057 | 0.100 | | |
| | 5 | 521.242 | 20.968 | 1.50850 | |
| | 6 | 76436.568 | 14.385 | | |
| | 7 | 818.454 | 16.035 | 1.50850 | |
| | 8 | 97.900 | 17.606 | | |
| ASP | 9 | -1467.092 | 11.428 | 1.50850 | |
| ASP | 10 | 142.710 | 26.020 | | |
| | 11 | -212.403 | 11.196 | 1.50850 | |
| | 12 | 353.410 | 20.216 | | |
| | 13 | -134.210 | 11.240 | 1.50850 | |
| | 14 | -1002.862 | 12.039 | | |
| | 15 | -236.025 | 16.914 | 1.50850 | |
| | 16 | -156.795 | 0.204 | | |
| | 17 | 719.273 | 35.407 | 1.50850 | |
| | 18 | -209.072 | 0.100 | | |
| | 19 | -1786.188 | 23.880 | 1.50850 | |

-continued

| | i | ri | di | ni |
|---|---|---|---|---|
| ASP | 20 | -273.517 | 0.100 | |
| | 21 | 826.670 | 19.962 | 1.50850 |
| | 22 | -782.423 | 9.552 | |
| | 23 | 183.291 | 33.305 | 1.50850 |
| | 24 | 864.185 | 1.121 | |
| | 25 | 189.560 | 33.969 | 1.50850 |
| | 26 | 115.050 | 59.543 | |
| | 27 | -247.564 | 11.800 | 1.50850 |
| | 28 | 180.291 | 32.382 | |
| | 29 | -141.987 | 11.800 | 1.50850 |
| | 30 | 1634.805 | 38.291 | |
| | 31 | -432.625 | 19.180 | 1.50850 |
| | 32 | -225.889 | 43.366 | |
| | 33 | -5580.889 | 36.257 | 1.50850 |
| | 34 | -251.752 | 0.100 | |
| ASP | 35 | 656.210 | 28.234 | 1.50850 |
| | 36 | -1123.439 | 11.355 | |
| | 37 | 476.442 | 32.359 | 1.50850 |
| | 38 | -1813.445 | 21.067 | |
| | 39 | 285.017 | 37.448 | 1.50850 |
| | 40 | 3204.814 | 0.415 | |
| | 41 | 153.457 | 38.178 | 1.50850 |
| | 42 | 357.667 | 0.100 | |
| | 43 | 144.612 | 27.813 | 1.50850 |
| | 44 | 279.653 | 12.152 | |
| | 45 | 1408.031 | 15.899 | 1.50850 |
| | 46 | 83.926 | 28.089 | |
| ASP | 47 | 98.536 | 31.980 | 1.50850 |
| | 48 | -5814.320 | | | aspherical surface

| i | K | A | B | C | D |
|---|---|---|---|---|---|
| 3 | -467540e + 000 | -8.951376e - 009 | -2.285210e - 012 | 3.324945e - 016 | 2.628948e - 020 |
| 4 | 0.000000e + 000 | -5.978443e - 009 | -1.682938e - 012 | 7.478670e - 016 | -1.459628e - 020 |
| 9 | 0.000000e + 000 | -2.123929e - 008 | 1.529902e - 011 | 2.095313e - 015 | -9.109944e - 019 |
| 10 | -2.064869e - 001 | -1.153015e - 008 | 1.122575e - 011 | 1.126785e - 015 | -1.300266e - 018 |
| 20 | 0.000000e + 000 | 2.186523e - 009 | 9.742324e - 014 | 4.753496e - 018 | 6.448689e - 023 |
| 35 | 0.000000e + 000 | -7.203429e - 010 | 3.483951e - 015 | -3.090615e - 019 | -3.685641e - 024 |
| 47 | 0.000000e + 000 | 1.133753e - 009 | -6.956249e - 014 | 3.466240e - 016 | -9.834080e - 022 |

| i | E | F | G |
|---|---|---|---|
| 3 | 4.673713e - 024 | 0.000000e + 000 | 0.000000e + 000 |
| 4 | 4.074521e - 024 | 0.000000e + 000 | 0.000000e + 000 |
| 9 | 1.128762e - 023 | 0.000000e + 000 | 0.000000e + 000 |
| 10 | 1.052897e - 022 | 0.000000e + 000 | 0.000000e + 000 |
| 20 | 8.837182e - 027 | 0.000000e + 000 | 0.000000e + 000 |
| 35 | 1.334447e - 029 | 0.000000e + 000 | 0.000000e + 000 |
| 47 | 2.247095e - 023 | 0.000000e + 000 | 0.000000e + 000 |

NA = 0.65
β = ¼
L = 1050

Numerical Example 9

| | i | ri | di | ni | Obj - distance = 98.214 |
|---|---|---|---|---|---|
| | 1 | ∞ | 15.704 | 1.56020 | |
| | 2 | -299.434 | 1.000 | | |
| ASP | 3 | 175.000 | 23.792 | 1.56020 | |
| | 4 | ∞ | 9.571 | | |
| | 5 | 145.117 | 32.038 | 1.56020 | |
| | 6 | 100.000 | 17.662 | | |

-continued

| | i | ri | di | ni |
|---|---|---|---|---|
| | 7 | ∞ | 11.000 | 1.56020 |
| ASP | 8 | 123.021 | 20.788 | |
| | 9 | -161.438 | 11.000 | 1.56020 |
| | 10 | 154.557 | 86.015 | |
| | 11 | ∞ | 35.660 | 1.56020 |
| ASP | 12 | -212.876 | 1.000 | |
| | 13 | 766.932 | 44.175 | 1.56020 |
| | 14 | -268.029 | 1.000 | |
| | 15 | 226.018 | 41.814 | 1.56020 |
| | 16 | -1378.930 | 63.794 | |
| | 17 | ∞ | 11.000 | 1.56020 |
| ASP | 18 | 167.725 | 28.903 | |
| | 19 | -181.282 | 11.000 | 1.56020 |
| | 20 | 151.497 | 109.955 | |
| | 21 | ∞ | 26.211 | 1.56020 |
| ASP | 22 | -281.746 | 1.000 | |
| | 23 | 270.807 | 44.763 | 1.56020 |
| | 24 | -760.019 | 61.715 | |
| ASP | 25 | 272.524 | 29.142 | 1.56020 |
| | 26 | ∞ | 1.000 | |
| | 27 | 160.854 | 31.901 | 1.56020 |
| | 28 | 490.918 | 1.000 | |
| | 29 | 150.000 | 47.000 | 1.56020 |
| | 30 | 139.001 | 12.403 | |
| ASP | 31 | 464.315 | 23.386 | 1.56020 |
| | 32 | ∞ | | | aspherical surfaces

| i | K | A | B | C | D |
|---|---|---|---|---|---|
| 3 | 0.000000e+000 | 3.765611e-008 | 3.857832e-013 | 2.140099e-017 | -7.657000e-022 |
| 8 | 0.000000e+000 | 1.066079e-007 | 5.208923e-012 | 1.839063e-016 | 1.530801e-019 |
| 12 | 0.000000e+000 | 3.799718e-009 | 2.913747e-014 | -1.192573e-018 | 3.790180e-022 |
| 18 | 0.000000e+000 | -2.093220e-008 | -3.107989e-012 | -1.945659e-016 | -1.455401e-020 |
| 22 | 0.000000e+000 | 1.011214e-008 | 2.021265e-013 | 9.016095e-018 | 2.046099e-022 |
| 25 | 0.000000e+000 | -5.788514e-009 | -3.819654e-013 | 8.070465e-019 | -3.300433e-022 |
| 31 | 0.000000e+000 | -5.149679e-008 | -5.336959e-012 | 4.625129e-016 | -1.392531e-020 |

| i | E | F | G |
|---|---|---|---|
| 3 | 4.433241e-025 | -4.391693e-029 | 0.000000e+000 |
| 8 | 9.302962e-024 | -5.916181e-027 | 0.000000e+000 |
| 12 | -3.152611e-026 | 1.892071e-030 | 0.000000e+000 |
| 18 | 1.127026e-024 | -1.445302e-028 | 0.000000e+000 |
| 22 | 3.329047e-027 | 3.174893e-031 | 0.000000e+000 |
| 25 | 7.913976e-027 | -5.366459e-031 | 0.000000e+000 |
| 31 | 4.069475e-024 | -4.957972e-028 | 0.000000e+000 |

NA = 0.65
β = ¼
L = 1000

Numerical Example 10

| i | ri | di | ni | Obj – distance = 98.214 |
|---|---|---|---|---|
| 1 | 66506.430 | 20.534 | 1.56020 | |
| 2 | -200.815 | 1.000 | | |

-continued

| | i | ri | di | ni |
|---|---|---|---|---|
| ASP | 3 | 247.178 | 24.228 | 1.56020 |
| | 4 | -1273.958 | 1.799 | |
| ASP | 5 | 171.546 | 22.308 | 1.56020 |
| | 6 | 98.980 | 17.896 | |
| | 7 | 1182.942 | 11.000 | 1.56020 |
| | 8 | 159.619 | 19.222 | |
| ASP | 9 | -182.740 | 11.000 | 1.56020 |
| ASP | 10 | 207.068 | 86.213 | |
| | 11 | 500.819 | 43.015 | 1.56020 |
| | 12 | -240.019 | 1.000 | |
| ASP | 13 | 319.058 | 41.291 | 1.56020 |
| ASP | 14 | -365.817 | 1.000 | |
| | 15 | 229.840 | 28.376 | 1.56020 |
| | 16 | -8803.339 | 46.316 | |
| | 17 | -264.505 | 11.000 | 1.56020 |
| | 18 | 184.159 | 18.143 | |
| ASP | 19 | -269.210 | 11.000 | 1.56020 |
| ASP | 20 | 112.292 | 140.901 | |
| ASP | 21 | 15043.030 | 27.617 | 1.50140 |
| ASP | 22 | -325.399 | 1.000 | |
| | 23 | 287.965 | 37.520 | 1.50140 |
| | 24 | -1646.618 | 63.842 | |
| ASP | 25 | 291.973 | 40.105 | 1.50140 |
| ASP | 26 | -599.659 | 1.000 | |
| | 27 | 178.529 | 32.020 | 1.50140 |
| | 28 | 557.997 | 1.000 | |
| | 29 | 120.000 | 47.000 | 1.56020 |
| | 30 | 80.443 | 8.223 | |
| | 31 | 98.682 | 46.988 | 1.56020 |
| | 32 | 164.043 | | | aspherical surfaces

| i | K | A | B | C | D |
|---|---|---|---|---|---|
| 3 | -2.147054e+000 | 2.855743e-008 | -1.036774e-012 | 1.275547e-016 | 4.593414e-020 |
| 4 | 0.000000e+000 | 1.336794e-008 | -1.397714e-012 | 3.708289e-016 | 6.224425e-020 |
| 9 | -2.089679e+000 | 1.000595e-008 | 7.735659e-012 | 1.330938e-015 | 3.122334e-019 |
| 10 | 1.063518e+000 | 1.481255e-008 | 1.699184e-012 | 5.097592e-016 | 4.237075e-020 |
| 13 | -1.680764e+000 | -5.776339e-009 | -1.148440e-012 | -2.490235e-017 | -5.242050e-022 |
| 14 | 1.885960e+000 | -7.212811e-009 | -4.316706e-013 | -2.408691e-016 | 1.071687e-022 |
| 19 | -3.574249e+000 | 2.409944e-008 | 4.315636e-013 | -3.840839e-016 | 1.186363e-019 |
| 20 | 9.429294e-002 | -3.335778e-010 | -1.425263e-011 | -6.427809e-016 | 9.891739e-020 |
| 21 | 2.186406e+001 | 1.253508e-009 | 6.846267e-014 | 1.221954e-018 | 3.386655e-023 |
| 22 | -5.933867e-003 | 1.096609e-008 | 1.175524e-013 | 5.758625e-018 | 1.039016e-022 |
| 25 | -3.712593e-001 | -8.843257e-009 | -4.036554e-013 | 2.210059e-018 | -1.172535e-022 |
| 26 | -5.741502e+000 | 1.687149e-010 | 2.510453e-014 | -2.894874e-018 | 1.807084e-022 |

| i | E | F | G |
|---|---|---|---|
| 3 | -9.393944e-025 | 1.747211e-027 | 0.000000e+000 |
| 4 | 1.068921e-026 | 1.606181e-027 | 0.000000e+000 |
| 9 | -8.189520e-023 | 5.998644e-027 | 0.000000e+000 |
| 10 | -5.874433e-023 | 6.722456e-027 | 0.000000e+000 |
| 13 | -4.318772e-026 | 1.626810e-030 | 0.000000e+000 |
| 14 | 1.396749e-026 | -1.796726e-030 | 0.000000e+000 |
| 19 | 1.073154e-023 | -1.635891e-027 | 0.000000e+000 |
| 20 | 3.768240e-024 | -1.287764e-027 | 0.000000e+000 |
| 21 | -6.771036e-027 | 9.395056e-032 | 0.000000e+000 |
| 22 | -6.969503e-027 | -1.902148e-031 | 0.000000e+000 |
| 25 | 6.340859e-028 | -9453066e-032 | 0.000000e+000 |
| 26 | -6.855560e-027 | 5.347354e-032 | 0.000000e+000 |

NA = 0.65
β = ¼
L = 1000

Numerical Example 11

|     | i  | ri         | di     | ai      | Obj-distance = 100.000 |
|-----|----|------------|--------|---------|------------------------|
|     | 1  | 649.023    | 13.500 | 1.50850 |                        |
|     | 2  | 361.369    | 6.186  |         |                        |
|     | 3  | 546.492    | 26.671 | 1.50850 |                        |
|     | 4  | −431.310   | 1.000  |         |                        |
|     | 5  | 359.520    | 26.096 | 1.50850 |                        |
|     | 6  | −820.769   | 1.000  |         |                        |
|     | 7  | 225.399    | 26.802 | 1.50850 |                        |
|     | 8  | −8079.599  | 1.000  |         |                        |
|     | 9  | 182.351    | 11.501 | 1.50850 |                        |
|     | 10 | 106.062    | 34.137 |         |                        |
|     | 11 | −381.425   | 12.568 | 1.50850 |                        |
| ASP | 12 | −204.664   | 6.416  |         |                        |
| ASP | 13 | −865.043   | 9.000  | 1.50850 |                        |
|     | 14 | 160.025    | 38.823 |         |                        |
|     | 15 | −155.689   | 9.000  | 1.50850 |                        |
|     | 16 | 173.836    | 25.571 |         |                        |
|     | 17 | −132.366   | 10.000 | 1.50850 |                        |
|     | 18 | 285.824    | 45.894 |         |                        |
|     | 19 | −825.232   | 23.754 | 1.50850 |                        |
|     | 20 | −232.487   | 1.000  |         |                        |
|     | 21 | 2752.665   | 44.004 | 1.50850 |                        |
|     | 22 | −201.176   | 1.000  |         |                        |
|     | 23 | −17158.009 | 26.677 | 1.50850 |                        |
|     | 24 | −371.311   | 1.000  |         |                        |
|     | 25 | 236.005    | 45.827 | 1.50850 |                        |
|     | 26 | −936.533   | 1.000  |         |                        |
|     | 27 | 409.539    | 20.925 | 1.50850 |                        |
|     | 28 | 4743.410   | 43.481 |         |                        |
| ASP | 29 | −318.982   | 10.500 | 1.50850 |                        |
|     | 30 | 159.949    | 37.876 |         |                        |
|     | 31 | −188.248   | 10.500 | 1.50850 |                        |
| ASP | 32 | 275.952    | 58.220 |         |                        |
|     | 33 | −417.384   | 30.810 | 1.50850 |                        |
|     | 34 | −279.212   | 2.737  |         |                        |
|     | 35 | 1910.775   | 30.560 | 1.50850 |                        |
|     | 36 | −315.325   | 1.000  |         |                        |
|     | 37 | 599.552    | 38.938 | 1.50850 |                        |
|     | 38 | −356.838   | 14.606 |         |                        |
|     | 39 | −226.758   | 23.000 | 1.50850 |                        |
|     | 40 | −336.419   | 1.000  |         |                        |
|     | 41 | 296.645    | 40.976 | 1.50850 |                        |
|     | 42 | −1194.936  | 1.000  |         |                        |
|     | 43 | 231.667    | 27.972 | 1.50850 |                        |
|     | 44 | 654.096    | 1.000  |         |                        |
|     | 45 | 154.516    | 27.018 | 1.50850 |                        |
|     | 46 | 281.664    | 55.351 |         | NA = 0.65              |
| ASP | 47 | 228.126    | 38.104 | 1.50850 | β = 1/5                |
|     | 48 | 601.950    |        |         | L = 1100               |

| aspherical surfaces |
|---|

| i  | K             | A              | B              | C              |
|----|---------------|----------------|----------------|----------------|
| 12 | 0.000000e+000 | 2.721858e-008  | 4.440914e-012  | −8.681652e-016 |
| 13 | 0.000000e+000 | 2.261111e-008  | 5.977927e-012  | −5.548672e-016 |
| 29 | 0.000000e+000 | 5.769079e-009  | 2.101907e-012  | −7.945428e-017 |
| 32 | 0.000000e+000 | 3.262461e-009  | −9.342932e-014 | 5.248637e-018  |
| 41 | 0.000000e+000 | −1.593367e-008 | −4.300366e-012 | −1.646850e-016 |

| i  | D             | E              | F             | G             |
|----|---------------|----------------|---------------|---------------|
| 12 | 1.072700e-019 | −1.000243e-023 | 5.037820e-028 | 0.000000e+000 |
| 13 | 3.420032e-020 | −4.415014e-025 | 0.000000e+000 | 0.000000e+000 |
| 29 | 1.130602e-021 | 0.000000e+000  | 0.000000e+000 | 0.000000e+000 |
| 32 | 1.913566e-021 | 0.000000e+000  | 0.000000e+000 | 0.000000e+000 |
| 47 | 1.952807e-020 | −6.144185e-026 | 0.000000e+000 | 0.000000e+000 |

Numerical Example 12

|     | i  | ri         | di      | ai      | Obj-distance: 100.000 |
|-----|----|------------|---------|---------|-----------------------|
|     | 1  | 763.804    | 16.049  | 1.56020 |                       |
|     | 2  | −469.191   | 0.100   |         |                       |
| ASP | 3  | 203.770    | 24.476  | 1.56020 |                       |
|     | 4  | −641.970   | 0.100   |         |                       |
|     | 5  | 119.260    | 11.000  | 1.56020 |                       |
|     | 6  | 92.020     | 22.304  |         |                       |
|     | 7  | 502.773    | 11.000  | 156020  |                       |
| ASP | 8  | 129.649    | 23.277  |         |                       |
| ASP | 9  | −196.636   | 11.000  | 1.56020 |                       |
|     | 10 | 209.045    | 28.905  |         |                       |
|     | 11 | −167.151   | 13.779  | 1.56020 |                       |
|     | 12 | −219.660   | 0.100   |         |                       |
|     | 13 | −1321.329  | 26.454  | 1.56020 |                       |
|     | 14 | −146.820   | 0.100   |         |                       |
|     | 15 | 147.157    | 40.974  | 1.56020 |                       |
|     | 16 | −429.701   | 7.902   |         |                       |
|     | 17 | −773.858   | 12.082  | 1.56020 |                       |
|     | 18 | −329.557   | 6.785   |         |                       |
|     | 19 | −243.442   | 11.000  | 1.56020 |                       |
|     | 20 | 186.253    | 28.938  |         |                       |
|     | 21 | −194.264   | 11.000  | 1.56020 |                       |
|     | 22 | 196.773    | 37.307  |         |                       |
|     | 23 | −134.218   | 12.871  | 1.56020 |                       |
|     | 24 | −1172.511  | 13.767  |         |                       |
|     | 25 | −298.586   | 22.347  | 1.56020 |                       |
|     | 26 | −179.413   | 0.100   |         |                       |
|     | 27 | −10481.480 | 43.039  | 1.56020 |                       |
|     | 28 | −223.758   | 0.100   |         |                       |
|     | 29 | 3482.244   | 42.189  | 1.56020 |                       |
|     | 30 | −296.976   | 0.100   |         |                       |
|     | 31 | 204.855    | 60.135  | 1.56020 |                       |
|     | 32 | −2315.303  | 0.100   |         |                       |
| ASP | 33 | 182.054    | 27.702  | 1.56020 |                       |
|     | 34 | 359.872    | 10.166  |         |                       |
|     | 35 | 828.315    | 11.005  | 1.56020 |                       |
|     | 36 | 146.178    | 44.572  |         |                       |
|     | 37 | −317.652   | 11.000  | 1.56020 |                       |
|     | 38 | 142.088    | 40.682  |         |                       |
|     | 39 | −196.848   | 11.000  | 1.56020 |                       |
|     | 40 | 610.693    | 8.809   |         |                       |
|     | 41 | 2057.736   | 24.233  | 1.56020 |                       |
|     | 42 | −278.801   | 0.100   |         |                       |
|     | 43 | 606.192    | 33.247  | 1.56020 |                       |
|     | 44 | −282.084   | 50.656  |         |                       |
|     | 45 | 333.953    | 30.963  | 1.56020 |                       |
|     | 46 | −1154.203  | 7.373   |         |                       |
|     | 47 | 192.072    | 30.277  | 1.56020 |                       |
|     | 48 | 709.117    | 2.142   |         |                       |
|     | 49 | 140.357    | 25.979  | 1.56020 |                       |
|     | 50 | 271.887    | 49.191  |         | NA = 0.65             |
|     | 51 | 246.870    | 36.087  | 1.56020 | β = 1/4               |
| ASP | 52 | 843.329    |         |         | L = 1130              | aspherical surfaces

| i  | K             | A              | B              | C              |
|----|---------------|----------------|----------------|----------------|
| 3  | 0.000000e+000 | −4.160344e−010 | −8.173641e−013 | −1.847702e−017 |
| 8  | 0.0000000+000 | −2.925267e−008 | −4.791237e−012 | −1.125265e−016 |
| 9  | 0.000000e+000 | −2.893504e−008 | −2.541889e−013 | −6.294070e−016 |
| 33 | 0.000000e+000 | −1.243269e−009 | 9.266574e−015  | 1.750090e−018  |
| 52 | 0.000000e+000 | 7.000926e−008  | 1.194152e−011  | 6.581947e−017  |

| i  | D              | E              | F              | G             |
|----|----------------|----------------|----------------|---------------|
| 3  | 4.021619e−021  | −2.340365e−025 | 0.000000e+000  | 0.000000e+000 |
| 8  | 2.851327e−019  | −7.149298e−023 | 5.496942e−027  | 0.000000e+000 |
| 9  | 3.161482e−019  | −7.755999e−023 | 6.724380e−027  | 0.000000e+000 |
| 33 | 1.684224e−022  | −4.123949e−027 | 7.154662e−031  | 0.000000e+000 |
| 52 | −3.532015e−019 | 9.339549e−023  | 0.000000e+000  | 0.000000e+000 |

Numerical Example 13

|     | i  | ri        | di     | ai      | Obj-distance: 110.304 |
|-----|----|-----------|--------|---------|-----------------------|
|     | 1  | 566.117   | 17.071 | 1.56020 |                       |
|     | 2  | -537.616  | 0.100  |         |                       |
|     | 3  | 297.012   | 18.535 | 1.56020 |                       |
|     | 4  | -1396.028 | 0.100  |         |                       |
|     | 5  | 210.121   | 20.634 | 1.56020 |                       |
|     | 6  | -2473.292 | 0.100  |         |                       |
|     | 7  | 208.468   | 14.229 | 1.16020 |                       |
|     | 8  | 102.590   | 22.179 |         |                       |
|     | 9  | -464515   | 11.000 | 1.56020 |                       |
|     | 10 | 158.021   | 17.175 |         |                       |
|     | 11 | -243.314  | 11.000 | 1.56020 |                       |
|     | 12 | 266.770   | 15.357 |         |                       |
|     | 13 | -215.829  | 23.557 | 1.56020 |                       |
|     | 14 | -165.736  | 0.187  |         |                       |
|     | 15 | -405.435  | 14.470 | 1.56020 |                       |
|     | 16 | -184258   | 0.902  |         |                       |
|     | 17 | 138.856   | 29.436 | 1.56020 |                       |
|     | 18 | -1241.175 | 0.159  |         |                       |
| ASP | 19 | 814.292   | 12.155 | 1.56020 |                       |
|     | 20 | 171.534   | 30.877 |         |                       |
| ASP | 21 | -137.721  | 11.000 | 1.55020 |                       |
|     | 22 | 204.947   | 33.998 |         |                       |
|     | 23 | -139.849  | 11.000 | 1.56020 |                       |
|     | 24 | -1002.418 | 13.925 |         |                       |
|     | 25 | -260.840  | 19.096 | 1.56020 |                       |
|     | 26 | -173.471  | 0.100  |         |                       |
|     | 27 | -3848.952 | 39.207 | 1.58020 |                       |
|     | 28 | -218.919  | 0.100  |         |                       |
|     | 29 | 1602.820  | 40.346 | 1.66020 |                       |
|     | 30 | -320.667  | 0.100  |         |                       |
|     | 31 | 211.142   | 59.058 | 1.56020 |                       |
|     | 32 | -1777.340 | 1.773  |         |                       |
|     | 33 | 206.544   | 28.127 | 1.56020 |                       |
|     | 34 | 468.888   | 11.670 |         |                       |
|     | 35 | 759.016   | 11.000 | 1.56020 |                       |
|     | 36 | 144.572   | 46.208 |         |                       |
|     | 37 | -241.701  | 11.286 | 1.56020 |                       |
|     | 38 | 165.416   | 39.537 |         |                       |
|     | 39 | -196.712  | 11.000 | 1.56020 |                       |
|     | 40 | 745.364   | 7.842  |         |                       |
|     | 41 | -16420.189| 26.080 | 1.56020 |                       |
|     | 42 | -241.902  | 0.100  |         |                       |
|     | 43 | 652.031   | 33.185 | 1.56020 |                       |
|     | 44 | -318.590  | 47.429 |         |                       |
|     | 45 | 354.585   | 38.707 | 1.56020 |                       |
|     | 46 | -930.788  | 7.713  |         |                       |
|     | 47 | 222.294   | 32.201 | 1.56020 |                       |
|     | 48 | 1018.237  | 1.352  |         |                       |
| ASP | 49 | 178.026   | 38.963 | 1.56020 |                       |
|     | 50 | 1081.470  | 50.360 |         | NA = 0.65             |
|     | 51 | 1050.015  | 55.018 | 1.56020 | β = 1/4               |
|     | 52 | -734.877  |        |         | L = 1130              |

| aspherical surfaces | | | |
|---|---|---|---|

| i  | K            | A             | B              | C              |
|----|--------------|---------------|----------------|----------------|
| 19 | 0.000000e+000| 5.037018e-009 | 1.095799e-012  | -1.919844e-016 |
| 21 | 0.000000e+000| 5.898908e-010 | -3.300260e-013 | 3.428525e-016  |
| 49 | 0.000000e+000| -1.190613e-008| -6.346279e-013 | -2.514328e-017 |

| i  | D              | E              | F              | G             |
|----|----------------|----------------|----------------|---------------|
| 19 | 9.264552e-020  | -1.693773e-023 | 1.302335e-027  | 0.000000e+000 |
| 21 | -1.773740e-019 | 3.958228e-023  | -3.245096e-027 | 0.000000e+000 |
| 49 | -6.781741e-022 | -2.825622e-026 | 5.127567e-031  | 0.000000e+000 |

Numerical Example 14

|   | i | ri | di | ai | Obj-distance = 90.862 |
|---|---|---|---|---|---|
|   | 1 | −370.530 | 21.483 | 1.56020 | |
|   | 2 | −142.320 | 0.700 | | |
| ASP | 3 | 254.109 | 40.989 | 1.56020 | |
|   | 4 | −491.334 | 0.700 | | |
|   | 5 | 671.370 | 13.168 | 1.56020 | |
|   | 6 | 120.679 | 17.806 | | |
|   | 7 | −2878.732 | 11.000 | 1.55020 | |
| ASP | 8 | 207.692 | 19.442 | | |
|   | 9 | −226.107 | 11.000 | 1.56020 | |
|   | 10 | 598.193 | 36.591 | | |
|   | 11 | 1696.365 | 30.694 | 1.56020 | |
|   | 12 | −178.497 | 0.700 | | |
| ASP | 13 | 512.692 | 34.956 | 1.56020 | |
|   | 14 | −214.839 | 0.700 | | |
|   | 15 | 100.024 | 44.492 | 1.56020 | |
|   | 16 | 83.268 | 29.872 | | |
|   | 17 | −685.024 | 11.000 | 1.56020 | |
|   | 18 | 115.416 | 28.694 | | |
|   | 19 | −106.310 | 11.000 | 1.56020 | |
|   | 20 | 318.691 | 24.612 | | |
|   | 21 | 583.818 | 26.017 | 1.56020 | |
|   | 22 | −187.014 | 0.700 | | |
|   | 23 | 389.332 | 23.300 | 1.56020 | |
|   | 24 | −331.767 | 0.700 | | |
|   | 25 | 251.245 | 23.158 | 1.56020 | |
|   | 26 | −527.903 | 8.754 | | |
|   | 21 | −253.401 | 11.000 | 1.56020 | |
|   | 28 | 235.832 | 31.681 | | |
|   | 29 | −131.657 | 11.000 | 1.56020 | |
|   | 30 | 873.306 | 18.890 | | |
|   | 31 | −516.228 | 44.528 | 1.50140 | |
|   | 32 | −194.523 | 21.344 | | |
|   | 33 | 1486.546 | 45.310 | 1.50140 | |
|   | 34 | −226.607 | 11.999 | | |
|   | 35 | 441.694 | 35.011 | 1.50140 | |
|   | 36 | −629.429 | 0.700 | | |
|   | 37 | 135.240 | 46.482 | 1.50140 | |
|   | 38 | 450.927 | 0.700 | | |
|   | 39 | 120.725 | 28.158 | 1.56020 | |
|   | 40 | 189.713 | 16.567 | | |
|   | 41 | 1257.096 | 31.621 | 1.56020 | |
|   | 42 | 76.100 | 3.049 | | NA = 0.65 |
| ASP | 43 | 80.000 | 47.000 | 1.56020 | $\beta = 1/4$ |
|   | 44 | 820.473 | | | L = 1000 | aspherical surfaces

| i | K | A | B | C |
|---|---|---|---|---|
| 3 | −9.872706e+000 | 6.624928e−008 | −9.292370e−012 | 3.284321e−016 |
| 8 | 1.812763e+000 | 1.107500e−007 | −1.441387e−011 | −1.675187e−015 |
| 13 | −4.067550e+000 | 1.555436e−008 | −7.163034e−013 | −1.829797e−017 |
| 43 | 1.776067e−002 | −6.163923e−008 | −6.499724e−012 | −8.076654e−016 |

| i | D | E | F | G |
|---|---|---|---|---|
| 3 | −3.612644e−020 | 5.160574e−024 | −2.667799e−028 | 0.000000e+000 |
| 8 | −4.421521e−020 | 4.516444e−023 | −3.633179e−027 | 0.000000e+000 |
| 13 | 3.589327e−022 | −8.977418e−026 | −3.648511e−030 | 0 000000e+000 |
| 43 | 8.476241e−020 | −3.474625e−023 | 4.982009e−027 | 0.000000e+000 |

Numerical Example 15

|   | i | ri | di | ai | Obj-distance = 64.400 |
|---|---|---|---|---|---|
|   | 1 | ∞ | 21.483 | 1.56020 | |
| ASP | 2 | −223.520 | 0.700 | | |
|   | 3 | 324.053 | 19.299 | 1.56020 | |
|   | 4 | −353.700 | 42.878 | | |
|   | 5 | −194.376 | 11.000 | 1.56020 | |

-continued

|     | i  | ri        | di     | ni      |           |
|-----|----|-----------|--------|---------|-----------|
|     | 6  | 169.712   | 9.737  |         |           |
|     | 7  | ∞         | 11.000 | 1.56020 |           |
| ASP | 8  | 176.122   | 49.836 |         |           |
|     | 9  | ∞         | 22.771 | 1.56020 |           |
| ASP | 10 | −185.168  | 0.700  |         |           |
|     | 11 | 423.634   | 23.637 | 1.56020 |           |
|     | 12 | −244.092  | 34.286 |         |           |
|     | 13 | −219.694  | 11.000 | 1.56020 |           |
|     | 14 | 180.011   | 35.532 |         |           |
| ASP | 15 | −101.095  | 11.000 | 1.56020 |           |
|     | 16 | ∞         | 36.544 |         |           |
|     | 17 | ∞         | 41.224 | 1.56020 |           |
| ASP | 18 | −165.000  | 0.700  |         |           |
|     | 19 | 613.013   | 37.099 | 1.56020 |           |
|     | 20 | −314.522  | 0.700  |         |           |
|     | 21 | 155.889   | 46.421 | 1.56020 |           |
|     | 22 | −16193.780| 37.763 |         |           |
|     | 23 | −545.453  | 11.000 | 1.56020 |           |
|     | 24 | 123.496   | 47.345 |         |           |
| ASP | 25 | −107.334  | 11.000 | 1.56020 |           |
|     | 26 | ∞         | 22.957 |         |           |
|     | 27 | ∞         | 39.601 | 1.56020 |           |
|     | 28 | −369.755  | 32.400 |         |           |
|     | 29 | ∞         | 31.385 | 1.56020 |           |
| ASP | 30 | −260.069  | 3.099  |         |           |
|     | 31 | 320.054   | 35.813 | 1.56020 |           |
|     | 32 | −1109.205 | 0.700  |         |           |
|     | 33 | 180.000   | 44.852 | 1.56020 |           |
|     | 34 | ∞         | 0.700  |         |           |
|     | 35 | 118.000   | 45.269 | 1.56020 |           |
|     | 36 | 243.132   | 13.160 |         |           |
|     | 37 | −1170.643 | 16.269 | 1.56020 |           |
|     | 38 | 83.151    | 5.965  |         | NA = 0.65 |
| ASP | 39 | 113.618   | 41.305 | 1.56020 | β = 1/4   |
|     | 40 | ∞         |        |         | L = 1000  | aspherical surfaces

| i  | K            | A             | B             | C             |
|----|--------------|---------------|---------------|---------------|
| 2  | 0.000000e+000| −2.461170e−008| −1.254678e−012| 1.741418e−017 |
| 8  | 0.000000e+000| 1.330433e−008 | 3.996524e−012 | −6.425340e−015|
| 10 | 0.000000e+000| −7.314349e−008| −3.668407e−013| −6.551240e−017|
| 15 | 0.000000e+000| −8.288231e−008| 4.470040e−012 | 7.953928e−016 |
| 18 | 0.000000e+000| −3.010817e−009| 7.230562e−013 | 1.976312e−017 |
| 25 | 0.000000e+000| −2.381635e−008| 5.863091e−013 | 1.887350e−017 |
| 30 | 0.000000e+000| 1.189738e−009 | 2.579270e−013 | −9.540845e−019|
| 39 | 0.000000e+000| −5.338672e−008| 2.479306e−011 | 2.425502e−015 |

| i  | D             | E             | F             | G             |
|----|---------------|---------------|---------------|---------------|
| 2  | −3.942618e−021| 2.970299e−027 | 0.000000e+000 | 0.000000e+000 |
| 8  | 8.539215e−020 | −1.018743e−023| 0.000000e+000 | 0.000000e+000 |
| 10 | −5.632962e−021| −1.001277e−024| 0.000000e+000 | 0.000000e+000 |
| 15 | 1.175441e−019 | 4.548658e−025 | 0.000000e+000 | 0.000000e+000 |
| 18 | 3.752192e−022 | −2.789718e−026| 0.000000e+000 | 0.000000e+000 |
| 25 | −6.092378e−021| 2.398328e−024 | 0.000000e+000 | 0.000000e+000 |
| 30 | 1.898098e−022 | −4.477469e−027| 0.000000e+000 | 0.000000e+000 |
| 39 | −1.556929e−019| 7.470691e−023 | 0.000000e+000 | 0.000000e+000 |

Numerical Example 16

|     | i  | ri       | di     | ni      | Obj-distance = 70.000 |
|-----|----|----------|--------|---------|-----------------------|
| ASP | 1  | 426.303  | 22.143 | 1.56020 |                       |
| ASP | 2  | −293.270 | 44.991 |         |                       |
| ASP | 3  | −239.063 | 12.287 | 1.56020 |                       |
| ASP | 4  | 193.554  | 56.615 |         |                       |
|     | 5  | 8175.282 | 27.396 | 1.56020 |                       |
|     | 6  | −172.317 | 0.700  |         |                       |
|     | 7  | 485.638  | 29.517 | 1.56020 |                       |
|     | 8  | −226.633 | 62.198 |         |                       |
| ASP | 9  | −543.539 | 11.000 | 1.56020 |                       |
| ASP | 10 | 98.865   | 29.468 |         |                       |

-continued

|     | i  | ri       | di     | ni      |         |
|-----|----|----------|--------|---------|---------|
|     | 11 | −166.560 | 11.000 | 1.56020 |         |
|     | 12 | 579.649  | 35.061 |         |         |
|     | 13 | 804.055  | 34.406 | 1.56020 |         |
|     | 14 | −152.871 | 0.700  |         |         |
|     | 15 | 163.018  | 31.782 | 1.56020 |         |
|     | 16 | −1638.880| 46.140 |         |         |
|     | 17 | −383.725 | 11.000 | 1.56020 |         |
|     | 18 | 151.783  | 30.642 |         |         |
|     | 19 | −147.895 | 15.264 | 1.56020 |         |
|     | 20 | 335.023  | 21.043 |         |         |
|     | 21 | 1046.740 | 35.362 | 1.56020 |         |
|     | 22 | −250.766 | 9.458  |         |         |
|     | 23 | 720.726  | 25.727 | 1.56020 |         |
|     | 24 | −397.727 | 94.567 |         |         |
|     | 25 | 980.555  | 34.089 | 1.56020 |         |
|     | 26 | −357.145 | 0.700  |         |         |
|     | 27 | 133.000  | 50.773 | 1.56020 |         |
|     | 28 | 386.552  | 0.918  |         |         |
|     | 29 | 107.997  | 41.164 | 1.56020 |         |
|     | 30 | 169.965  | 13.455 |         |         |
|     | 31 | 539.514  | 19.429 | 1.56020 |         |
|     | 32 | 106.461  | 0.700  |         | NA = 0.65 |
| ASP | 33 | 92.023   | 41.003 | 1.56020 | β = 1/4 |
| ASP | 34 | 110.938  |        |         | L = 1000 | aspherical surfaces

| i  | K             | A              | B              | C              |
|----|---------------|----------------|----------------|----------------|
| 1  | 0.000000e+000 | 1.179390e-007  | −2.481342e-012 | −8.514994e-016 |
| 2  | 0.000000e+000 | 1.984808e-009  | −2.379609e-012 | −1.777691e-015 |
| 3  | 0.000000e+000 | −6.127062e-005 | −2.439639e-011 | 4.940348e-015  |
| 4  | 0.000000e+000 | 1.351928e-007  | −2.155565e-011 | 4.979933e-015  |
| 9  | 0.000000e+000 | −1.029855e-008 | 4.222175e-013  | 9.252409e-016  |
| 10 | 0.000000e+000 | −1.647436e-008 | −6.863313e-012 | 2.498019e-016  |
| 33 | 0.000000e+000 | −7.872670e-008 | 3.170754e-012  | 7.552635e-016  |
| 34 | 0.000000e+000 | 5.393494e-007  | 1.483362e-010  | 4.549512e-014  |

| i  | D              | E              | F              | G             |
|----|----------------|----------------|----------------|---------------|
| 1  | −5.507741e-021 | 4.244235e-023  | 1.894592e-027  | 0.000000e+000 |
| 2  | 2.269844e-019  | 2.746013e-023  | 6.870022e-028  | 0.000000e+000 |
| 3  | 1.783844e-019  | −3.758891e-023 | −1.387715e-026 | 0.000000e+000 |
| 4  | −2.254154e-020 | − 1.550011e-022| 1.237198e-026  | 0.000000e+000 |
| 9  | −3.320195e-020 | − 2.287173e-023| 1.356755e-027  | 0.000000e+000 |
| 10 | 3.078894e-021  | −4.351537e-023 | 6.281604e-028  | 0.000000e+000 |
| 33 | 1.265430e-018  | −3.541330e-022 | 7.175403e-026  | 0.000000e+000 |
| 34 | 5.826949e-017  | −4.706812e-020 | 3.185353e-023  | 0.000000e+000 |

Numerical Example 17

|     | i  | ri         | di     | ni       | Obj-distance = 90.538 |
|-----|----|------------|--------|----------|------------------------|
|     | 1  | −2173.919  | 17.000 | 1.603377 |                        |
| ASP | 2  | 415.839    | 49.200 |          |                        |
|     | 3  | −10081.321 | 26.766 | 1.594224 |                        |
|     | 4  | −328.287   | 10.248 |          |                        |
|     | 5  | 1129.412   | 28.656 | 1.594224 |                        |
|     | 6  | −308.478   | 2.981  |          |                        |
|     | 7  | 347.593    | 20.835 | 1.594224 |                        |
|     | 8  | 30560.909  | 9.470  |          |                        |
|     | 9  | 192.586    | 28.028 | 1.594224 |                        |
|     | 10 | 600.221    | 21.523 | 1.603377 |                        |
|     | 11 | 113.162    | 42.174 |          |                        |
|     | 12 | −1287.217  | 17.646 | 1.603377 |                        |
| ASP | 13 | 201.828    | 24.439 |          |                        |
|     | 14 | −230.109   | 18.460 | 1.594224 |                        |
|     | 15 | 129.305    | 38.186 | 1.603377 |                        |
|     | 16 | −310.734   | 7.182  |          |                        |
|     | 17 | 302.807    | 25.115 | 1.480884 |                        |
|     | 18 | −190.854   | 4.421  |          |                        |
|     | 19 | 340.589    | 19.913 | 1.480884 |                        |
|     | 20 | −219.421   | 3.874  |          |                        |

-continued

|     | i  | ri        | di     | ni       |            |
|-----|----|-----------|--------|----------|------------|
|     | 21 | −181.985  | 15.000 | 1.603377 |            |
|     | 22 | 160.986   | 81.067 |          |            |
|     | 23 | −141.832  | 15.077 | 1.603377 |            |
|     | 24 | −271.520  | 12.534 |          |            |
|     | 25 | 892.494   | 23.757 | 1.480884 |            |
|     | 26 | −165.761  | 16.728 |          |            |
| ASP | 27 | 641.696   | 18.838 | 1.480884 |            |
|     | 28 | −315.023  | 0.152  |          |            |
|     | 29 | 287.866   | 21.464 | 1.480884 |            |
|     | 30 | 4039.331  | 3.404  |          |            |
|     | 31 | 191.617   | 37.590 | 1.603377 |            |
|     | 32 | −258.209  | 22.761 | 1.594224 |            |
|     | 33 | 130.065   | 41.379 |          |            |
| ASP | 34 | −429.130  | 12.144 | 1.603377 |            |
|     | 35 | 941.156   | 61.542 |          |            |
|     | 36 | −105.300  | 24.184 | 1.603377 |            |
|     | 37 | −3332.376 | 27.927 | 1.594224 |            |
|     | 38 | −183.797  | 14.302 |          |            |
|     | 39 | −113.095  | 33.829 | 1.603377 |            |
|     | 40 | −6034.000 | 0.100  |          |            |
|     | 41 | 4882.455  | 41.773 | 1.594224 |            |
|     | 42 | −231.974  | 0.100  |          |            |
|     | 43 | 784.515   | 28.037 | 1.594224 |            |
|     | 44 | −400.816  | 0.100  |          |            |
|     | 45 | 259.744   | 24.506 | 1.594224 |            |
|     | 46 | 1013.135  | 48.052 |          | NA = 0.1   |
| ASP | 47 | −991.262  | 20.000 | 1.603377 | β = 1.25   |
|     | 48 | −5753.507 |        |          | L = 1250   | aspherical surfaces

| i  | K             | A              | B              | C              |
|----|---------------|----------------|----------------|----------------|
| 2  | 0.000000e+000 | 1.732651e−010  | 8.978816e−014  | 6.676870e−019  |
| 13 | 0.000000e+000 | 3.987781e−008  | 6.882497e−013  | −3.270833e−017 |
| 27 | 0 000000e+000 | −1.383683e−008 | −4.200987e−013 | −4.907919e−018 |
| 34 | 0.000000e+000 | 6.892230e−008  | 5.467352e−012  | 1.616376e−016  |
| 47 | 0.000000e+000 | −7.437008e−009 | 7.059486e−014  | 1.729433e−018  |

| i  | D              | E             | F             | G             |
|----|----------------|---------------|---------------|---------------|
| 2  | 2.108700e−023  | 0.000000e+000 | 0.000000e+000 | 0.000000e+000 |
| 13 | −1.827952e−020 | 0.000000e+000 | 0.000000e+000 | 0.000000e+000 |
| 27 | −1.233173e−023 | 0.000000e+000 | 0.000000e+000 | 0.000000e+000 |
| 34 | 2.002978e−020  | 0.000000e+000 | 0.000000e+000 | 0.000000e+000 |
| 47 | −6.315660e−023 | 0.000000e+000 | 0.000000e+000 | 0.000000e+000 |

Numerical Example 18

|     | i  | ri        | di      | ni      | Obj-distance = 74.305 |
|-----|----|-----------|---------|---------|-----------------------|
|     | 1  | 373.120   | 12.974  | 1.56020 |                       |
| ASP | 2  | 164.628   | 47.146  |         |                       |
|     | 3  | −3359.229 | 37.768  | 1.56020 |                       |
|     | 4  | −218.105  | 86.869  |         |                       |
| ASP | 5  | 2738.452  | 28.445  | 1.56020 |                       |
|     | 6  | −304.496  | 3.530   |         |                       |
|     | 7  | 118.714   | 38.686  | 1.56020 |                       |
|     | 8  | 395.116   | 54.147  |         |                       |
|     | 9  | −185.784  | 14.201  | 1.56020 |                       |
| ASP | 10 | 155.206   | 27.288  |         |                       |
|     | 11 | −141.565  | 12.480  | 1.56020 |                       |
| ASP | 12 | 114.106   | 26.423  |         |                       |
|     | 13 | −204.014  | 18.463  | 1.56020 |                       |
|     | 14 | −353.327  | 71.915  |         |                       |
|     | 15 | −2046.298 | 46.133  | 1.56020 |                       |
|     | 16 | −200.916  | 1.000   |         |                       |
|     | 17 | 890.257   | 38.648  | 1.56020 |                       |
|     | 18 | −337.058  | 124.746 |         |                       |
| ASP | 19 | 444.270   | 35.791  | 1.56020 |                       |
|     | 20 | −539.937  | 1.293   |         |                       |
|     | 21 | 156.861   | 56.316  | 1.56020 |                       |
|     | 22 | 493.741   | 60.723  |         |                       |

-continued

|    |         |        |         |
|----|---------|--------|---------|
| 23 | 162.767 | 17.902 | 1.56020 |
| 24 | 87.061  | 4.114  |         |
| 25 | 74.355  | 33.695 | 1.56020 |
| 26 | 171.271 |        |         | aspherical surfaces

| i  | K             | A              | B              | C              |
|----|---------------|----------------|----------------|----------------|
| 2  | 0.000000e+000 | −6.151422e-008 | 2.635679e-012  | −4.629311e-017 |
| 5  | 4.022539e+002 | 3.238513e-008  | 1.444575e-012  | −1.299191e-017 |
| 10 | 0.000000e+000 | 9.060021e-008  | 6.368879e-011  | 1.867166e-015  |
| 12 | 0.000000e+000 | 2.327945e-007  | −8.622504e-011 | 7.848182e-017  |
| 19 | 0.000000e+000 | −1.195187e-008 | −1.416116e-013 | −6.278820e-019 |

| i  | D              | E              | F              | G             |
|----|----------------|----------------|----------------|---------------|
| 2  | 1.256802e-022  | −5.255483e-025 | 8.024017e-029  | 0.000000e+000 |
| 5  | −2.782533e-021 | 1.258182e-026  | 1.215906e-030  | 0.000000e+000 |
| 10 | 9.142776e-020  | 8.772362e-023  | −1.631989e-026 | 0.000000e+000 |
| 12 | 1.872815e-018  | −2.573162.-022 | 9.539079e-027  | 0.000000e+000 |
| 19 | −4.370204e-024 | −8.269803e-028 | −1.146333e-032 | 0.000000e+000 |

NA = 0.65
β = 1/4
L = 1000

Numerical Example 19

|     | i  | ri         | di     | ai      | Obj-distance = 159.910 |
|-----|----|------------|--------|---------|------------------------|
| ASP | 1  | 1426.235   | 13.395 | 1.56020 |                        |
| ASP | 2  | −18646.845 | 1.000  |         |                        |
|     | 3  | 234.396    | 26.952 | 1.56020 |                        |
|     | 4  | −1043.490  | 1.000  |         |                        |
|     | 5  | 132.015    | 29.134 | 1.56020 |                        |
|     | 6  | 695.945    | 36.199 |         |                        |
|     | 7  | −2151.684  | 8.000  | 1.56020 |                        |
| ASP | 8  | 119.308    | 40.946 |         |                        |
| ASP | 9  | 0.000      | 10.001 | 1.56020 |                        |
| ASP | 10 | 139.306    | 32.296 |         |                        |
|     | 11 | −64.778    | 7.500  | 1.56020 |                        |
|     | 12 | 358.861    | 59.331 |         |                        |
|     | 13 | 1808.193   | 43.533 | 1.56020 |                        |
|     | 14 | −190.795   | 1.000  |         |                        |
|     | 15 | −12637.113 | 27.113 | 1.56020 |                        |
| ASP | 16 | −309.272   | 2.989  |         |                        |
|     | 17 | 329.502    | 39.999 | 1.56020 |                        |
|     | 18 | 361.110    | 99.711 |         |                        |
|     | 19 | 422.259    | 45.890 | 1.56020 |                        |
|     | 20 | −1020.802  | 95.132 |         |                        |
| ASP | 21 | 213.405    | 42.491 | 1.56020 |                        |
|     | 22 | 22708.670  | 1.000  |         |                        |
|     | 23 | 152.762    | 43.718 | 1.56020 |                        |
|     | 24 | 713.753    | 23.810 |         |                        |
|     | 25 | −1740.329  | 10.000 | 1.56020 |                        |
|     | 26 | 272.427    | 1.000  |         |                        |
| ASP | 27 | 214.892    | 33.772 | 1.56020 |                        |
|     | 28 | 1651.406   |        |         |                        | aspherical surfaces

| i  | K              | A              | B              | C              |
|----|----------------|----------------|----------------|----------------|
| 1  | 0.000000e+000  | 5.655433e-009  | −9.761116e-013 | −5.760406e-017 |
| 2  | 0.0000000+000  | −6.971343e-008 | 1.596973e-012  | −1.156489e-016 |
| 8  | 2.062997e+000  | 3.046348e-007  | −2.473855e-011 | −1.369273e-015 |
| 9  | 0.000000e+000  | −1.273407e-007 | −5.392020e-011 | 2.383841e-014  |
| 10 | −5.185475e+000 | −1.153426e-007 | −6.068909e-011 | 2.958140e-014  |
| 16 | 1.483773e-001  | 1.529142e-008  | 2.653064e-013  | −1.610087e-018 |
| 21 | 5.505534e-002  | −1.395115e-008 | −3.478119e-013 | −9.176869e-018 |
| 27 | 0.000000e+000  | −2.915211e-008 | 4.096900e-012  | 1.642705e-016  |

-continued

| i | D | E | F | G |
|---|---|---|---|---|
| 1 | −8.900881e-021 | 6.018890e-025 | 1.226600e-028 | −4.790467e-033 |
| 2 | −6.146567e-021 | 3.857142e-025 | 1.130926e-128 | −3.918967e-033 |
| 8 | −2.096578e-018 | 5.848018e-022 | −2.847819e-025 | −6.295862e-031 |
| 9 | −4.688497e-018 | −3.461126e-022 | −1.331753e-025 | 9.443424e-030 |
| 10 | −4.936248e-018 | −1.811705e-022 | −9.260870e-026 | 5.901073e-029 |
| 16 | 1.839705e-022 | −2.145983e-026 | 1.090597e-030 | −2.080577e-035 |
| 21 | 7.786648e-023 | −1.742447e-026 | 6.151744e-031 | −1.381606e-035 |
| 27 | −1.898429e-020 | −9.051554e-026 | 1.144600e-028 | −1.0468521-032 |

NA = 0.65
β = 1/4
L = 1000

Numerical Example 20

| | Object to First Surface Distance: 98.214 mm | | |
|---|---|---|---|
| i | ri | di | ni |
| 1 | 0.000 | 26.026 | 1.56020 |
| 2 | −182.658 | 1.000 | |
| 3 | −2698.945 | 14.661 | 1.56020 |
| 4 | −306.331 | 1.000 | |
| 5 | 274.751 | 13.789 | 1.56020 |
| 6 | 949.145 | 1.000 | |
| 7 | 273.833 | 11.000 | 1.56020 |
| 8 | 140.490 | 17.638 | |
| 9 | −582.890 | 11.000 | 1.56020 |
| 10 | 207.947 | 18.628 | |
| 11 | −226.022 | 11.000 | 1.56020 |
| 12 | 235.468 | 73.861 | |
| 13 | 826.269 | 32.989 | 1.56020 |
| 14 | −232.749 | 1.000 | |
| 15 | 480.682 | 30.232 | 1.56020 |
| 16 | −377.116 | 1.000 | |
| 17 | 350.466 | 27.974 | 1.56020 |
| 18 | −547.948 | 58.535 | |
| 19 | −577.129 | 11.000 | 1.56020 |
| 20 | 159.547 | 20.289 | |
| 21 | −210.322 | 11.000 | 1.56020 |
| 22 | 127.412 | 106.550 | |
| 23 | 0.0(stop) | 28.400 | |
| 24 | 1512.402 | 26.036 | 1.56020 |
| 25 | −336.438 | 4.111 | |
| 26 | 291.888 | 38.182 | 1.56020 |
| 27 | −1333.617 | 109.565 | |
| 28 | 243.299 | 38.039 | 1.56020 |
| 29 | −1496.216 | 1.000 | |
| 30 | 160.404 | 31.231 | 1.56020 |
| 31 | 423.056 | 1.000 | |
| 32 | 120.000 | 40.969 | 1.56020 |
| 33 | 122.677 | 3.894 | |
| 34 | 137.160 | 39.075 | 1.56020 |
| 35 | 94.932 | | |

| aspherical surfaces | | | |
|---|---|---|---|
| i | K | A | B | C |
|---|---|---|---|---|
| 5 | 0.000000e+000 | 3.967358e-008 | −3.864245e-012 | 3.966438e-017 |
| 10 | 0.000000e+000 | 1.997893e-007 | −1.002364e-011 | −7.614655e-016 |
| 15 | 0.000000e+000 | 3.455575e-009 | −7.722473e-013 | 1.315998e-017 |
| 22 | 0.000000e+000 | −1.853322e-008 | −9.221953e-012 | 1.109905e-016 |
| 25 | 0.000000e+000 | 1.081702e-008 | 2.252523e-013 | 4.022520e-018 |
| 28 | 0.000000e+000 | −6.543627e-009 | −4.416705e-013 | −4.129965e-018 |
| 35 | 0.000000e+000 | 2.039958e-007 | 1.023185e-012 | −2.445114e-015 |

| i | D | E | F | G |
|---|---|---|---|---|
| 5 | −3.558419e-020 | 7.378869e-024 | −5.305032e-028 | 0.000000e+000 |
| 10 | −1.609150e-019 | 5.840329e-023 | −5.965041e-027 | 0.000000e+000 |
| 15 | −2.730036e-022 | 1.226431e-026 | −5.374728e-031 | 0.000000e+000 |

-continued

| | | | |
|---|---|---|---|
| 22 | 3.582375e-020 | -5.440508e-024 | 1.859686e-028 | 0.000000e+000 |
| 25 | 3.297878e-023 | -4.516028e-028 | 1.861970e-032 | 0.000000e+000 |
| 28 | -1.173134e-022 | 2.636446e-027 | -2.053727e-031 | 0.000000e+000 |
| 35 | -2.255754e-018 | 3.096130e-022 | -1.399174e-025 | 0.000000e+000 |

Numerical Example 21

Object to First Surface Distance: 98.335 mm

| i | ri | di | ni |
|---|---|---|---|
| 1 | 287.464 | 31.801 | 1.56020 |
| 2 | -221.023 | 1.981 | |
| 3 | 178.289 | 23.482 | 1.56020 |
| 4 | 100.774 | 16.799 | |
| 5 | 185.474 | 28.268 | 1.56020 |
| 6 | -248.716 | 12.641 | |
| 7 | -1830.438 | 15.601 | 1.56020 |
| 8 | 118.144 | 13.340 | |
| 9 | -672.129 | 12.203 | 1.56020 |
| 10 | 128.731 | 22.260 | |
| 11 | -128.312 | 12.613 | 1.56020 |
| 12 | 260.849 | 63.688 | |
| 13 | 1090.602 | 36.650 | 1.50140 |
| 14 | -263.371 | 3.385 | |
| 15 | 1451.653 | 34.659 | 1.50140 |
| 16 | -321.128 | 1.422 | |
| 17 | 500.707 | 28.672 | 1.50140 |
| 18 | -961.818 | 1.000 | |
| 19 | 199.015 | 57.083 | 1.50140 |
| 20 | -507.319 | 51.127 | |
| 21 | -267.052 | 14.311 | 1.56020 |
| 22 | 232.559 | 30.137 | |
| 23 | -158.226 | 11.000 | 1.56020 |
| 24 | 221.812 | 17.262 | |
| 25 | 0.0(stop) | 19.227 | |
| 26 | -714.808 | 23.000 | 1.50140 |
| 27 | -191.620 | 38.957 | |
| 28 | 2124.929 | 40.223 | 1.50140 |
| 29 | -254.391 | 1.000 | |
| 30 | 2531.830 | 22.743 | 1.50140 |
| 31 | -476.179 | 1.000 | |
| 32 | 141.233 | 50.770 | 1.50140 |
| 33 | 550.246 | 3.129 | |
| 34 | 117.089 | 43.874 | 1.50140 |
| 35 | 271.650 | 6.116 | |
| 36 | 392.644 | 18.787 | 1.56020 |
| 37 | 83.993 | 6.558 | |
| 38 | 86.609 | 47.000 | 1.56020 |
| 39 | 316.957 | | | aspherical surfaces

| i | K | A | B |
|---|---|---|---|
| 2 | 4.160031e-001 | 2.884143e-008 | 6.582259e-013 |
| 10 | -1.359457e+000 | 1.735654e-007 | 1.154047e-012 |
| 11 | -2.480087e-001 | 4.977349e-008 | 3.201767e-012 |
| 17 | 5.040159e-001 | 8.569390e-010 | -2.159964e-014 |
| 23 | 1.984249e-001 | -2.580296e-008 | 5.027557e-012 |
| 27 | -2.942081e-002 | 1.540566e-010 | 6.050464e-013 |
| 30 | 1.078454e+001 | -8.926844e-011 | -1.049507e-014 |
| 38 | -1.504836e-001 | -6.739257e-009 | -8.785331e-012 |

| i | C | D | E |
|---|---|---|---|
| 2 | -7.423743e-017 | 1.346767e-020 | -1.692505e-024 |
| 10 | -1.526172e-015 | 1.015673e-018 | -5.010171e-022 |
| 11 | 1.930247e-016 | 1.184675e-018 | -2.420938e-022 |
| 17 | -1.113895e-017 | -2.193301e-022 | 7.842541e-027 |
| 23 | 2.016255e-016 | 3.503224e-020 | -5.218697e-024 |
| 27 | -9.832385e-018 | 5.668874e-021 | -5.021468e-025 |
| 30 | -7.767053e-018 | 3.904718e-022 | -2.840378e-026 |
| 38 | -1.376541e-015 | -6.840122e-019 | 7.189611e-023 |

| i | F | G | |
|---|---|---|---|
| 2 | 7.844268e-029 | 0.000000e+000 | |
| 10 | 4.485536e-026 | 0.000000e+000 | |
| 11 | 2.859077e-026 | 0.000000e+000 | |
| 17 | -4.643321e-031 | 0.000000e+000 | |
| 23 | 2.670135e-028 | 0.000000e+000 | |
| 27 | 2.055561e-029 | 0.000000e+000 | |
| 30 | 6.584930e-031 | 0.000000e+000 | |
| 38 | -2.842751e-026 | 0.000000e+000 | |

Numerical Example 22

Object to First Surface Distance: 98.214 mm

| i | ri | di | ni |
|---|---|---|---|
| 1 | 0.000 | 35.283 | 1.56020 |
| 2 | -202.253 | 1.000 | |
| 3 | 196.472 | 21.687 | 1.56020 |
| 4 | 0.000 | 1.000 | |
| 5 | 163.840 | 20.913 | 1.56020 |
| 6 | 108.642 | 18.007 | |
| 7 | 0.000 | 11.000 | 1.56020 |
| 8 | 142.097 | 21.663 | |
| 9 | -196.412 | 11.000 | 1.56020 |
| 10 | 211.337 | 68.733 | |
| 11 | 0.000 | 26.757 | 1.56020 |
| 12 | -223.854 | 1.000 | |
| 13 | 693.208 | 33.377 | 1.56020 |
| 14 | -259.524 | 1.000 | |
| 15 | 349.600 | 29.343 | 1.56020 |
| 16 | -488.748 | 59.416 | |
| 17 | 0.000 | 11.000 | 1.56020 |
| 18 | 177.628 | 22.570 | |
| 19 | -171.815 | 11.000 | 1.56020 |
| 20 | 148.088 | 96.964 | |
| 21 | 0.0(stop) | 31.152 | |
| 22 | 0.000 | 25.233 | 1.56020 |
| 23 | -283.913 | 8.408 | |
| 24 | 274.841 | 38.513 | 1.56020 |
| 25 | -1832.307 | 100.711 | |
| 26 | 239.348 | 33.960 | 1.56020 |
| 27 | 0.000 | 1.033 | |
| 28 | 169.199 | 32.449 | 1.56020 |
| 29 | 540.334 | 1.000 | |
| 30 | 120.352 | 44.300 | 1.56020 |
| 31 | 86.480 | 3.768 | |
| 32 | 93.410 | 41.306 | 1.56020 |
| 33 | 100.526 | | | aspherical surfaces

| i | K | A | B |
|---|---|---|---|
| 3 | 0.000000e+000 | 3.650790e-008 | -9.230325e-013 |
| 8 | 0.000000e+000 | 1.769184e-007 | 1.795818e-012 |
| 12 | 0.000000e+000 | -1.662398e-009 | 1.085256e-013 |

-continued

Object to First Surface Distance: 98.214 mm

| | | | |
|---|---|---|---|
| 18 | 0.000000e+000 | −1.731542e−008 | −4.620024e−012 |
| 23 | 0.000000e+000 | 9.562980e−009 | 1.835166e−013 |
| 26 | 0.000000e+000 | −5.523449e−009 | −4.344737e−013 |
| 33 | 0.000000e+000 | 2.159918e−007 | 1.616246e−011 |

| i | C | D | E |
|---|---|---|---|
| 3 | 5.957551e−017 | −2.805723e−020 | 4.592119e−024 |
| 8 | −3.786678e−016 | −3.120635e−019 | 7.179478e−023 |
| 12 | −3.042158e−018 | 7.706400e−022 | −3.545587e−026 |
| 18 | −2.904976e−016 | −2.146101e−020 | −1.843132e−025 |
| 23 | 4.699629e−018 | 1.232888e−022 | −1.671856e−027 |
| 26 | −4.397292e−018 | −1.896027e−022 | 1.392972e−027 |
| 33 | 8.393394e−016 | −2.980107e−018 | 7.162464e−022 |

| i | F | G |
|---|---|---|
| 3 | −2.738347e−028 | 0.000000e+000 |
| 8 | −7.666732e−027 | 0.000000e+000 |
| 12 | 3.177747e−030 | 0.000000e+000 |
| 18 | −3.621190e−028 | 0.000000e+000 |
| 23 | 1.331041e−031 | 0.000000e+000 |
| 26 | −2.305348e−031 | 0.000000e+000 |
| 33 | −2.675240e−025 | 0.000000e+000 |

Numerical Example 23

Object to First Surface Distance: 106.385 mm

| i | ri | di | ni |
|---|---|---|---|
| 1 | 0.000 | 18.041 | 1.56020 |
| 2 | −247.429 | 1.000 | |
| 3 | 239.985 | 22.003 | 1.56020 |
| 4 | 0.000 | 68.685 | |
| 5 | 0.000 | 10.923 | 1.56020 |
| 6 | 120.000 | 27.648 | |
| 7 | −108.637 | 10.923 | 1.56020 |
| 8 | 214.504 | 71.415 | |
| 9 | 0.000 | 35.572 | 1.56020 |
| 10 | −224.080 | 1.000 | |
| 11 | 1433.942 | 38.955 | 1.56020 |
| 12 | −280.000 | 1.000 | |
| 13 | 519.014 | 36.927 | 1.56020 |
| 14 | −450.000 | 1.000 | |
| 15 | 138.532 | 33.304 | 1.56020 |
| 16 | 294.593 | 39.798 | |
| 17 | ∞ | 10.923 | 1.56020 |
| 18 | 105.077 | 38.260 | |
| 19 | −170.288 | 10.923 | 1.56020 |
| 20 | 148.736 | 65.400 | |
| 21 | 0.0(stop) | 23.213 | |
| 22 | 0.000 | 29.628 | 1.56020 |
| 23 | −237.930 | 1.000 | |
| 24 | 313.490 | 47.271 | 1.56020 |
| 25 | −503.041 | 64.620 | |
| 26 | 287.758 | 27.098 | 1.56020 |
| 27 | 0.000 | 4.702 | |
| 28 | 269.078 | 38.857 | 1.56020 |
| 29 | −669.791 | 1.000 | |
| 30 | 129.185 | 33.484 | 1.56020 |
| 31 | 155.969 | | | aspherical surfaces

| i | K | A | B |
|---|---|---|---|
| 3 | 0.000000e+000 | 2.528207e−008 | 4.962350e−013 |
| 6 | 0.000000e+000 | −2.819139e−008 | −9.031712e−012 |
| 8 | −6.736209e−001 | 3.050101e−008 | 4.262540e−012 |
| 10 | 0.000000e+000 | −5.618244e−009 | 1.626901e−013 |

-continued

Object to First Surface Distance: 106.385 mm

| | | | |
|---|---|---|---|
| 18 | 0.000000e+000 | 2.731662e−008 | −4.745926e−012 |
| 23 | 0.000000e+000 | 1.506776e−008 | 2.875274e−014 |
| 26 | 0.000000e+000 | −9.390134e−009 | −1.137122e−012 |

| i | C | D | E |
|---|---|---|---|
| 3 | 3.071542e−017 | 3.550497e−021 | −1.267417e−024 |
| 6 | −5.509380e−016 | −4.368963e−019 | 1.610697e−022 |
| 8 | −8.456760e−017 | −9.973877e−021 | 2.488445e−023 |
| 10 | −7.890662e−018 | −8.409742e−023 | 5.405900e−027 |
| 18 | −4.360318e−016 | 2.047793e−020 | −2.603323e−023 |
| 23 | 9.782798e−018 | −1.279117e−022 | 1.352392e−026 |
| 26 | 1.260621e−017 | −8.405644e−022 | 3.517040e−026 |

| i | F | G |
|---|---|---|
| 3 | 2.105416e−028 | −9.135087e−033 |
| 6 | −6.691954e−026 | 1.018697e−029 |
| 8 | −6.291342e−027 | 2.742974e−031 |
| 10 | −1.183796e−030 | 9.723656e−035 |
| 18 | 4.124923e−027 | −4.240206e−031 |
| 23 | −5.887927e−031 | −1.075106e−035 |
| 26 | −1.261846e−030 | 1.403193e−035 |

Numerical Example 24

Object to First Surface Distance: 70 mm

| i | ri | di | ni |
|---|---|---|---|
| 1 | 208.834 | 40.000 | 1.56020 |
| 2 | −2204.367 | 48.301 | |
| 3 | 117.104 | 40.000 | 1.56020 |
| 4 | 136.645 | 23.945 | |
| 5 | −141.268 | 10.000 | 1.56020 |
| 6 | 153.903 | 29.127 | |
| 7 | −86.471 | 22.693 | 1.56020 |
| 8 | −2380.713 | 74.228 | |
| 9 | 13162.964 | 54.046 | 1.56020 |
| 10 | −197.958 | 3.000 | |
| 11 | 1153.120 | 50.098 | 1.56020 |
| 12 | −272.743 | 3.000 | |
| 13 | 164.261 | 55.052 | 1.56020 |
| 14 | 695.660 | 65.937 | |
| 15 | −792.673 | 18.178 | 1.56020 |
| 16 | 163.351 | 43.522 | |
| 17 | −154.770 | 10.000 | 1.56020 |
| 18 | 465.852 | 25.418 | |
| 19 | 0.0(stop) | 44.864 | |
| 20 | 1313.769 | 39.444 | 1.56020 |
| 21 | −230.952 | 3.401 | |
| 22 | 230.618 | 41.629 | 1.56020 |
| 23 | −1095.767 | 4.457 | |
| 24 | 162.697 | 36.856 | 1.56020 |
| 25 | 521.931 | 56.084 | |
| 26 | 126.480 | 36.438 | 1.56020 |
| 27 | 394.895 | | | aspherical surfaces

| i | K | A | B |
|---|---|---|---|
| 1 | −3.466662e−001 | 1.433507e−007 | −2.133046e−012 |
| 2 | 2.000000e+000 | 7.959536e−008 | −3.744217e−012 |
| 5 | 1.004511e+000 | −1.573887e−007 | −6.456960e−012 |
| 6 | −6.754456e−001 | −1.134021e−007 | 2.106544e−011 |
| 11 | 1.323098e+000 | −1.227290e−008 | 1.434144e−013 |
| 12 | 1.664589e−001 | −1.227018e−009 | 1.626884e−013 |
| 15 | −2.000000e+000 | −5.085760e−008 | 4.139140e−012 |
| 16 | 9.336532e−001 | −2.144321e−008 | −9.878780e−014 |
| 22 | −3.149396e−001 | −2.740779e−009 | −2.124860e−013 |

-continued

Object to First Surface Distance: 70 mm

| | | | |
|---|---|---|---|
| 23 | −4.067584e−001 | 9.667551e−009 | 2.056572e−014 |
| 26 | −2.127815e−001 | −5.135833e−008 | −3.003067e−012 |
| 27 | 1.283433e−001 | −8.510284e−008 | 6.429230e−012 |

| i | C | D |
|---|---|---|
| 1 | 5.836183e−017 | 0.000000e+000 |
| 2 | −1.133348e−016 | 0.000000e+000 |
| 5 | 8.518749e−016 | 0.000000e+000 |
| 6 | −3.105587e−016 | 0.000000e+000 |
| 11 | −4.525546e−018 | 0.000000e+000 |
| 12 | −1.920513e−018 | 0.000000e+000 |
| 15 | −8.151887e−017 | 0.000000e+000 |
| 16 | −1.742585e−017 | 0.000000e+000 |
| 22 | 5.859505e−018 | 0.000000e+000 |
| 23 | 4.774158e−018 | 0.000000e+000 |
| 26 | −5.838412e−018 | 0.000000e+000 |
| 27 | −1.847620e−016 | 0.000000e+000 |

Numerical Example 25

| i | ri | di | ni | Obj-distance = 64.400 |
|---|---|---|---|---|
| 1 | 0.000 | 21.483 | 1.56020 | |
| 2 | −234.117 | 32.837 | | |
| 3 | −217.725 | 11.000 | 1.56020 | |
| 4 | 417.996 | 33.850 | | |
| 5 | 0.000 | 22.468 | 1.56020 | |
| 6 | −187.357 | 0.700 | | |
| 7 | 146.365 | 26.864 | 1.56020 | |
| 8 | 2044.065 | 74.989 | | |
| 9 | −217.939 | 11.000 | 1.56020 | |
| 10 | 218.942 | 19.185 | | |
| 11 | −111.200 | 11.000 | 1.56020 | |
| 12 | 162.388 | 83.304 | | |
| 13 | 4095.070 | 42.510 | 1.56020 | |
| 14 | −165.000 | 0.700 | | |
| 15 | 203.723 | 45.798 | 1.56020 | |
| 16 | −760.044 | 82.340 | | |
| 17 | −193.459 | 11.000 | 1.56020 | |
| 18 | 188.694 | 20.034 | | |
| 19 | 0.0(stop) | 68.080 | | |
| 20 | −2875.458 | 19.965 | 1.56020 | |
| 21 | −387.830 | 0.700 | | |
| 22 | 366.325 | 37.399 | 1.56020 | |
| 23 | −613.820 | 45.002 | | |
| 24 | 243.386 | 40.478 | 1.56020 | |
| 25 | −4311.737 | 0.700 | | |
| 26 | 181.915 | 35.797 | 1.56020 | |
| 27 | 981.126 | 0.700 | | |
| 28 | 119.183 | 27.705 | 1.56020 | |
| 29 | 256.810 | 9.045 | | |
| 30 | 770.652 | 11.000 | 1.56020 | |
| 31 | 80.000 | 10.112 | | |
| 32 | 122.097 | 47.000 | 1.56020 | |
| 33 | 275.295 | | | | aspherical surfaces

| i | K | A | B |
|---|---|---|---|
| 2 | 0.000000e+000 | −1.114212e−007 | 1.060175e−011 |
| 3 | 0.000000e+000 | −7.330288e−008 | 1.877977e−011 |
| 7 | 0.000000e+000 | 1.794366e−008 | −1.746620e−012 |
| 11 | 0.000000e+000 | −1.072701e−007 | −1.342596e−012 |
| 17 | 0.000000e+000 | −1.232061e−008 | 1.881593e−012 |
| 23 | 0.000000e+000 | 5.143208e−009 | 1.895658e−013 |
| 32 | 0.000000e+000 | 2.598513e−008 | 5.141410e−012 |

-continued

| i | C | D | E |
|---|---|---|---|
| 2 | −7.279118e−016 | 4.276504e−020 | −7.962637e−025 |
| 3 | −1.654304e−015 | 1.154005e−019 | −3.636200e−024 |
| 7 | 2.819556e−016 | −1.250857e−020 | 4.866995e−025 |
| 11 | 7.030022e−016 | 5.449568e−020 | 5.143056e−023 |
| 17 | 2.948112e−017 | −2.584618e−021 | 1.229520e−026 |
| 23 | −2.954221e−018 | 5.204719e−023 | −5.427645e−028 |
| 32 | −1.743487e−016 | 4.963194e−020 | −1.947370e−023 |

| i | F | G |
|---|---|---|
| 2 | 0.000000e+000 | 0.000000e+000 |
| 3 | 0.000000e+000 | 0.000000e+000 |
| 7 | 0.000000e+000 | 0.000000e+000 |
| 11 | 0.000000e+000 | 0.000000e+000 |
| 17 | 0.000000e+000 | 0.000000e+000 |
| 23 | 0.000000e+000 | 0.000000e+000 |
| 32 | 0.000000e+000 | 0.000000e+000 |

Numerical Example 26

| i | ri | di | ni | Obj-distance = 64.400 |
|---|---|---|---|---|
| 1 | 0.000 | 21.483 | 1.56020 | |
| 2 | −271.019 | 30.857 | | |
| 3 | −186.431 | 11.000 | 1.56020 | |
| 4 | 377.095 | 90.375 | | |
| 5 | 0.000 | 35.430 | 1.56020 | |
| 6 | −185.000 | 0.700 | | |
| 7 | 151.070 | 39.238 | 1.56020 | |
| 8 | 1525.179 | 108.989 | | |
| 9 | −184.857 | 11.000 | 1.56020 | |
| 10 | 158.888 | 22.082 | | |
| 11 | −115.966 | 11.000 | 1.56020 | |
| 12 | 200.996 | 49.352 | | |
| 13 | 1443.076 | 22.804 | 1.56020 | |
| 14 | −240.000 | 0.700 | | |
| 15 | 592.928 | 23.665 | 1.56020 | |
| 16 | −355.050 | 0.700 | | |
| 17 | 625.018 | 20.144 | 1.56020 | |
| 18 | −499.230 | 50.000 | | |
| 19 | −250.000 | 11.000 | 1.56020 | |
| 20 | 277.792 | 12.891 | | |
| 21 | 0.0(stop) | 82.481 | | |
| 22 | −1590.684 | 20.499 | 1.56020 | |
| 23 | −351.242 | 0.700 | | |
| 24 | 404.653 | 33.976 | 1.56020 | |
| 25 | −683.152 | 9.822 | | |
| 26 | 209.688 | 43.949 | 1.56020 | |
| 27 | 6079.638 | 0.700 | | |
| 28 | 180.000 | 34.764 | 1.56020 | |
| 29 | 822.298 | 0.700 | | |
| 30 | 126.160 | 36.259 | 1.56020 | |
| 31 | 255.231 | 7.763 | | |
| 32 | 787.363 | 11.000 | 1.56020 | |
| 33 | 80.000 | 25.213 | | |
| 34 | 105.503 | 32.765 | 1.56020 | |
| 35 | 223.176 | | | | aspherical surfaces

| i | K | A | B |
|---|---|---|---|
| 2 | 0.000000e+000 | −1.827721e−007 | 8.436255e−012 |
| 3 | 0.000000e+000 | −1.541073e−007 | 9.297673e−012 |
| 7 | 0.000000e+000 | −3.457815e−009 | −4.045005e−013 |
| 11 | 0.000000e+000 | −3.488911e−008 | 2.531397e−012 |
| 19 | 0.000000e+000 | −1.645970e−008 | 8.280400e−013 |
| 25 | 0.000000e+000 | 5.665653e−009 | 1.466511e−013 |
| 34 | 0.000000e+000 | −1.182366e−008 | −8.975848e−012 |

-continued

| i | C | D | E |
|---|---|---|---|
| 2 | -1.730566e-016 | -2.453104e-020 | 2.289130e-024 |
| 3 | 1.092750e-016 | -6.194075e-020 | 3.780862e-024 |
| 7 | 8.652080e-019 | 1.619763e-022 | -2.365878e-026 |
| 11 | 4.332109e-016 | 5.967441e-022 | 9.321880e-024 |
| 19 | 2.969915e-017 | -8.774617e-022 | -1.320677e-026 |
| 25 | 2.030552e-019 | 7.156711e-025 | 6.628893e-028 |
| 34 | -2.065253e-015 | -1.730388e-019 | -1.610493e-022 |

| i | F | G |
|---|---|---|
| 2 | 0.000000e+000 | 0.000000e+000 |
| 3 | 0.000000e+000 | 0.000000e+000 |
| 7 | 0.000000e+000 | 0.000000e+000 |
| 11 | 0.000000e+000 | 0.000000e+000 |
| 19 | 0.000000e+000 | 0.000000e+000 |
| 25 | 0.000000e+000 | 0.000000e+000 |
| 34 | 0.000000e+000 | 0.000000e+000 |

Numerical Example 27

| i | ri | di | ni | Obj-distance = 59.534 |
|---|---|---|---|---|
| 1 | 0.000 | 16.600 | 1.56020 | |
| 2 | -202.380 | 0.800 | | |
| 3 | 280.147 | 18.709 | 1.56020 | |
| 4 | -445.924 | 22.855 | | |
| 5 | 0.000 | 18.941 | 1.56020 | |
| 6 | 107.558 | 15.137 | | |
| 7 | 0.000 | 11.000 | 1.56020 | |
| 8 | 106.669 | 39.484 | | |
| 9 | 0.000 | 22.061 | 1.56020 | |
| 10 | -180.483 | 0.800 | | |
| 11 | 187.380 | 24.573 | 1.56020 | |
| 12 | -623.254 | 10.000 | | |
| 13 | 140.566 | 23.964 | 1.56020 | |
| 14 | 107.526 | 29.179 | | |
| 15 | -151.972 | 11.000 | 1.56020 | |
| 16 | 171.516 | 30.143 | | |
| 17 | -112.343 | 11.000 | 1.56020 | |
| 18 | 0.000 | 30.281 | | |
| 19 | -435.825 | 46.381 | 1.56020 | |
| 20 | -127.000 | 0.800 | | |
| 21 | 325.622 | 46.741 | 1.56020 | |
| 22 | -410.690 | 0.800 | | |
| 23 | 187.578 | 45.209 | 1.56020 | |
| 24 | 0.000 | 46.773 | | |
| 25 | -482.595 | 11.000 | 1.56020 | |
| 26 | 157.836 | 41.196 | | |
| 27 | -175.762 | 11.000 | 1.56020 | |
| 28 | 253.867 | 15.534 | | |
| 29 | 0.0(stop) | 31.669 | | |
| 30 | 0.000 | 40.310 | 1.56020 | |
| 31 | -213.855 | 1.457 | | |
| 32 | 794.896 | 33.225 | 1.56020 | |
| 33 | -385.054 | 0.800 | | |
| 34 | 308.035 | 38.589 | 1.56020 | |
| 35 | -847.571 | 0.800 | | |
| 36 | 145.851 | 47.000 | 1.56020 | |
| 37 | 284.015 | 70.097 | | |
| 38 | 232.327 | 44.283 | 1.56020 | |
| 39 | 0.000 | | | | aspherical surfaces

| i | K | A | B |
|---|---|---|---|
| 2 | 0.000000e+000 | 3.441391e-008 | -2.616189e-012 |
| 6 | 0.000000e+000 | -7.554035e-008 | -8.113440e-012 |
| 8 | 0.000000e+000 | -1.174998e-007 | 1.010874e-011 |
| 10 | 0.000000e+000 | -7.107743e-008 | -5.995307e-012 |
| 17 | 0.000000e+000 | -6.901972e-008 | -6.690174e-012 |

-continued

| 23 | 0.000000e+000 | 3.462617e-010 | 2.376572e-013 |
| 31 | 0.000000e+000 | 1.055515e-009 | -3.651336e-014 |
| 38 | 0.000000e+000 | 7.064793e-009 | -9.877785e-012 |

| i | C | D | E |
|---|---|---|---|
| 2 | 9.176226e-017 | -2.861419e-020 | 8.104470e-024 |
| 6 | 4.320580e-015 | 6.099900e-019 | -1.472017e-022 |
| 8 | -5.601546e-015 | -5.325149e-019 | 1.095341e-022 |
| 10 | -3.259545e-016 | 3.029660e-021 | -4.964934e-024 |
| 17 | -3.236268e-016 | 7.966691e-020 | -2.373952e-023 |
| 23 | 1.798095e-018 | 4.781755e-022 | -1.877652e-026 |
| 31 | -1.317019e-018 | 7.398814e-023 | -1.025990e-026 |
| 38 | -4.240566e-017 | -3.792715e-020 | -1.452718e-024 |

| i | F | G |
|---|---|---|
| 2 | -7.296145e-028 | 0.000000e+000 |
| 6 | 2.367379e-026 | 0.000000e+000 |
| 8 | -7.413466e-027 | 0.000000e+000 |
| 10 | 2.870385e-028 | 0.000000e+000 |
| 17 | 5.464713e-027 | 0.000000e+000 |
| 23 | 1.189180e-030 | 0.000000e+000 |
| 31 | 6.116071e-031 | 0.000000e+000 |
| 38 | 1.117639e-027 | 0.000000e+000 |

Numerical Example 28

| i | ri | di | ni | Obj-distance = 65.000 |
|---|---|---|---|---|
| 1 | -103485.230 | 17.433 | 1.56020 | |
| 2 | -201.292 | 0.800 | | |
| 3 | 370.683 | 17.976 | 1.56020 | |
| 4 | -407.200 | 30.000 | | |
| 5 | -456.784 | 11.000 | 1.56020 | |
| 6 | 145.860 | 16.510 | | |
| 7 | -503.955 | 11.000 | 1.56020 | |
| 8 | 203.717 | 34.000 | | |
| 9 | -424.708 | 21.358 | 1.56020 | |
| 10 | -129.351 | 0.800 | | |
| 11 | 801.838 | 28.215 | 1.56020 | |
| 12 | -175.733 | 20.000 | | |
| 13 | 159.132 | 11.676 | 1.56020 | |
| 14 | 100.036 | 23.873 | | |
| 15 | -515.415 | 11.000 | 1.56020 | |
| 16 | 178.045 | 27.455 | | |
| 17 | -115.893 | 11.000 | 1.56020 | |
| 18 | 541.607 | 40.357 | | |
| 19 | -1434.439 | 37.615 | 1.56020 | |
| 20 | -151.851 | 0.800 | | |
| 21 | 358.551 | 36.516 | 1.56020 | |
| 22 | -463.136 | 0.800 | | |
| 23 | 165.301 | 40.791 | 1.56020 | |
| 24 | 1423.496 | 53.909 | | |
| 25 | -2299.149 | 11.000 | 1.56020 | |
| 26 | 121.688 | 38.458 | | |
| 27 | -170.387 | 11.000 | 1.56020 | |
| 28 | 283.691 | 11.212 | | |
| 29 | 0.0(stop) | 32.285 | | |
| 30 | 772.565 | 47.000 | 1.56020 | |
| 31 | -258.987 | 35.908 | | |
| 32 | 377.097 | 34.035 | 1.56020 | |
| 33 | -636.486 | 0.800 | | |
| 34 | 184.387 | 37.630 | 1.56020 | |
| 35 | 702.528 | 5.509 | | |
| 36 | 150.000 | 44.788 | 1.56020 | |
| 37 | 253.503 | 29.946 | | |
| 38 | 99.159 | 47.000 | 1.56020 | |
| 39 | 110.423 | | | |

-continued aspherical surfaces

| i | K | A | B |
|---|---|---|---|
| 3 | 0.000000e+000 | 2.751774e-008 | -1.770975e-012 |
| 5 | 0.000000e+000 | 1.175464e-008 | -2.132585e-011 |
| 6 | 0.000000e+000 | 2.045218e-007 | -2.001742e-011 |
| 11 | 0.000000e+000 | 2.891834e-008 | 4.645221e-012 |
| 22 | 0.000000e+000 | 1.029482e-009 | -2.160423e-014 |
| 32 | 0.000000e+000 | -5.277072e-009 | 1.078635e-015 |
| 33 | 0.000000e+000 | 1.288563e-010 | 1.294359e-013 |
| 38 | 0.000000e+000 | 4.179479e-009 | 2.916225e-012 |
| 39 | 0.000000e+000 | 2.193704e-007 | 3.821860e-011 |

| i | C | D | E |
|---|---|---|---|
| 3 | 4.138130e-016 | -3.614801e-021 | 4.102479e-024 |
| 5 | -2.485640e-015 | 3.535714e-019 | 9.142663e-023 |
| 6 | -4.217326e-015 | -8.965853e-019 | 4.937104e-022 |
| 11 | -1.114191e-017 | -3.826417e-020 | 1.329561e-024 |
| 22 | 1.886393e-020 | 1.290161e-022 | -6.301310e-027 |
| 32 | 3.853875e-018 | -9.041445e-023 | -2.442106e-026 |
| 33 | 3.817123e-018 | 1.912098e-024 | -2.856921e-026 |
| 38 | 1.437591e-016 | 1.965879e-019 | -4.239874e-023 |
| 39 | 9.758402e-015 | 3.844117e-018 | -1.364150e-021 |

| i | F | G |
|---|---|---|
| 3 | -7.556172e-028 | 0.000000e+000 |
| 5 | -1.206849e-026 | 0.000000e+000 |
| 6 | -4.929568e-026 | 0.000000e+000 |
| 11 | 2.686166e-029 | 0.000000e+000 |
| 22 | 1.073452e-031 | 0.000000e+000 |
| 32 | 1.631503e-030 | 0.000000e+000 |
| 33 | 1.805409e-030 | 0.000000e+000 |
| 38 | 7.557044e-027 | 0.000000e+000 |
| 39 | 9.820195e-026 | 0.000000e+000 |

TABLE 1

[Example 1]

| SURFACE No. | GROUP No. | $|hb/h|$ | $|\Delta asph/L|$ |
|---|---|---|---|
| 10 | 2 | 1.766 | 0.001525 |
| 12 | 2 | 1.023 | 0.000101 |
| 20 | 3 | 0.104 | 0.004805 |
| 23 | 3 | 0.069 | 0.003056 |
| 25 | 3 | 0.114 | 0.004921 |
| 33 | 3 | 0.384 | 0.000364 |

$|L \times \phi o| = 28.408$

TABLE 2

[Example 2]

| SURFACE No. | GROUP No. | $|hb/h|$ | $|\Delta asph/L|$ |
|---|---|---|---|
| 2 | 1 | 4.361 | 0.001782 |
| 5 | 1 | 1.844 | 0.001381 |
| 11 | 2 | 0.781 | 0.000373 |
| 15 | 2 | 0.375 | 0.000425 |
| 20 | 3 | 0.037 | 0.001950 |
| 23 | 3 | 0.127 | 0.002467 |
| 27 | 3 | 0.169 | 0.000395 |
| 32 | 3 | 0.300 | 0.000368 |
| 33 | 3 | 0.312 | 0.000621 |

$|L \times \varnothing O| = 21.068$

TABLE 3

[Example 3]

| SURFACE No. | GROUP No. | $|hb/h|$ | $|\Delta asph/L|$ |
|---|---|---|---|
| 2 | 1 | 3.970 | 0.000974 |
| 7 | 1 | 2.357 | 0.000878 |
| 12 | 2 | 0.992 | 0.000365 |
| 20 | 3 | 0.085 | 0.004119 |
| 23 | 3 | 0.078 | 0.003725 |
| 25 | 3 | 0.106 | 0.005833 |
| 33 | 3 | 0.229 | 0.001500 |

$|L \times \varnothing O| = 32.030$

TABLE 4

[Example 4]

| SURFACE No. | GROUP No. | $|hb/h|$ | $|\Delta asph/L|$ |
|---|---|---|---|
| 7 | 1 | 1.868 | 0.004140 |
| 8 | 1 | 1.712 | 0.000568 |
| 9 | 2 | 1.235 | 0.000355 |
| 10 | 2 | 1.123 | 0.001114 |
| 18 | 3 | 0.057 | 0.003483 |
| 23 | 3 | 0.109 | 0.006516 |
| 29 | 3 | 0.214 | 0.000567 |
| 30 | 3 | 0.268 | 0.000155 |

$|L \times \varnothing O| = 26.233$

TABLE 5

[Example 5]

| SURFACE No. | GROUP No. | $|hb/h|$ | $|\Delta asph/L|$ |
|---|---|---|---|
| 7 | 1 | 2.216 | 0.001748 |
| 8 | 1 | 1.939 | 0.000180 |
| 9 | 2 | 1.085 | 0.000233 |
| 10 | 2 | 0.971 | 0.000429 |
| 17 | 3 | 0.094 | 0.000127 |
| 18 | 3 | 0.077 | 0.004611 |
| 21 | 3 | 0.093 | 0.007132 |
| 22 | 3 | 0.110 | 0.001873 |
| 27 | 3 | 0.257 | 0.000947 |
| 28 | 3 | 0.387 | 0.000046 |

$|L \times \varnothing O| = 25.150$

TABLE 6

[Example 6]

| SURFACE No. | GROUP No. | $|hb/h|$ | $|\Delta asph/L|$ |
|---|---|---|---|
| 13 | 2 | 0.883 | 0.000335 |
| 53 | 5 | 0.304 | 0.000542 |

$|L \times \varnothing O| = 34.291$

TABLE 7

[Example 7]

| SURFACE No. | GROUP No. | \|hb/h\| | \|Δasph/L\| |
|---|---|---|---|
| 10 | 2 | 1.221 | 0.000531 |
| 11 | 2 | 0.955 | 0.000226 |

\|L × ØO\| = 31.965

TABLE 8

[Example 8]

| SURFACE No. | GROUP No. | \|hb/h\| | \|Δasph/L\| |
|---|---|---|---|
| 3 | 1 | 2.991 | 0.000317 |
| 4 | 1 | 2.691 | 0.000209 |
| 9 | 2 | 1.387 | 0.000178 |
| 10 | 2 | 1.233 | 0.000040 |
| 20 | 3 | 0.507 | 0.000460 |
| 35 | 5 | 0.042 | 0.000251 |
| 47 | 5 | 0.311 | 0.000072 |

\|L × ØO\| = 30.670

Table 9

[Example 9]

| SURFACE No. | GROUP No. | \|hb/h\| | \|Δasph/L\| |
|---|---|---|---|
| 3 | 1 | 2.944 | 0.001305 |
| 8 | 2 | 1.347 | 0.000952 |
| 12 | 3 | 0.495 | 0.000591 |
| 18 | 4 | 0.245 | 0.000983 |
| 22 | 5 | 0.051 | 0.001685 |
| 25 | 5 | 0.128 | 0.002088 |
| 31 | 5 | 0.275 | 0.001076 |

\|L × ØO\| = 24.425

TABLE 10

[Example 10]

| SURFACE No. | GROUP No. | \|hb/h\| | \|Δasph/L\| |
|---|---|---|---|
| 3 | 1 | 2.870 | 0.000521 |
| 4 | 1 | 2.555 | 0.000844 |
| 9 | 2 | 1.337 | 0.000677 |
| 10 | 2 | 1.212 | 0.000634 |
| 13 | 3 | 0.610 | 0.004306 |
| 14 | 3 | 0.561 | 0.002989 |
| 19 | 4 | 0.267 | 0.000720 |
| 20 | 4 | 0.233 | 0.000588 |
| 21 | 5 | 0.042 | 0.000371 |
| 22 | 5 | 0.061 | 0.002088 |
| 25 | 5 | 0.133 | 0.003329 |
| 26 | 5 | 0.151 | 0.000751 |

\|L × ØO\| = 25.020

TABLE 11

[Example 11]

| SURFACE No. | GROUP No. | \|hb/h\| | \|Δasph/L\| |
|---|---|---|---|
| 12 | 2 | 2.074 | 0.000703 |
| 13 | 2 | 1.847 | 0.000539 |
| 29 | 4 | 0.195 | 0.001078 |
| 32 | 4 | 0.082 | 0.000153 |
| 47 | 5 | 0.340 | 0.000407 |

\|L × ØO\| = 35.737

TABLE 12

[Example 12]

| SURFACE No. | GROUP No. | \|hb/h\| | \|Δasph/L\| |
|---|---|---|---|
| 3 | 1 | 2.955 | 0.000154 |
| 8 | 2 | 1.712 | 0.000505 |
| 9 | 2 | 1.403 | 0.000303 |
| 33 | 5 | 0.208 | 0.000070 |
| 52 | 7 | 0.457 | 0.000321 |

\|L × ØO\| = 51.483

TABLE 13

[Example 13]

| SURFACE No. | GROUP No. | \|hb/h\| | \|Δasph/L\| |
|---|---|---|---|
| 19 | 4 | 0.663 | 0.000228 |
| 21 | 4 | 0.504 | 0.000003 |
| 49 | 7 | 0.120 | 0.002189 |

\|L × ØO\| = 49.149

TABLE 14

[Example 14]

| SURFACE No. | GROUP No. | \|hb/h\| | \|Δasph/L\| |
|---|---|---|---|
| 3 | 1 | 3.061 | 0.000822 |
| 8 | 2 | 1.691 | 0.000950 |
| 13 | 3 | 0.962 | 0.000358 |
| 43 | 7 | 0.318 | 0.000784 |

\|L × ØO\| = 35.577

TABLE 15

[Example 15]

| SURFACE No. | GROUP No. | \|hb/h\| | \|Δasph/L\| |
|---|---|---|---|
| 2 | 1 | 4.345 | 0.000742 |
| 8 | 2 | 1.491 | 0.000214 |
| 10 | 3 | 0.867 | 0.002127 |
| 15 | 4 | 0.422 | 0.000665 |
| 18 | 5 | 0.263 | 0.001040 |
| 25 | 6 | 0.015 | 0.000453 |

TABLE 15-continued

[Example 15]

| SURFACE No. | GROUP No. | |hb/h| | |Δasph/L| |
|---|---|---|---|
| 30 | 7 | 0.114 | 0.000968 |
| 39 | 7 | 0.341 | 0.000253 |

|L × ØO| = 34.550

TABLE 16

[Example 16]

| SURFACE No. | GROUP No. | |hb/h| | |Δasph/L| |
|---|---|---|---|
| 1 | 1 | 4.822 | 0.002485 |
| 2 | 1 | 4.040 | 0.000098 |
| 3 | 2 | 2.368 | 0.001695 |
| 4 | 2 | 2.136 | 0.001942 |
| 9 | 4 | 0.719 | 0.000030 |
| 10 | 4 | 0.655 | 0.000473 |
| 33 | 7 | 0.358 | 0.000358 |
| 34 | 7 | 0.590 | 0.001244 |

|L × ØO| = 29.054

TABLE 17

[Example 17]

| SURFACE No. | GROUP No. | |hb/h| | |Δasph/L| |
|---|---|---|---|
| 2 | 1 | 5.341 | 0.000029 |
| 13 | 2 | 1.224 | 0.000386 |
| 27 | 5 | 0.248 | 0.000321 |
| 34 | 6 | 0.856 | 0.000547 |
| 47 | 7 | 7.731 | 0.000533 |

|L × ØO| = 21.930

TABLE 18

[Example 18]

| SURFACE No. | GROUP No. | |hb/h| | |Δasph/L| |
|---|---|---|---|
| 2 | 1 | 4.030 | 0.001160 |
| 5 | 1 | 1.475 | 0.004369 |
| 10 | 2 | 0.634 | 0.001383 |
| 12 | 2 | 0.345 | 0.000287 |
| 19 | 3 | 0.089 | 0.003157 |

|L × ØO| = 19.546

TABLE 19

[Example 19]

| SURFACE No. | GROUP No. | |hb/h| | |Δasph/L| |
|---|---|---|---|
| 1 | 1 | 2.101 | 0.000237 |
| 2 | 1 | 1.999 | 0.000351 |
| 8 | 2 | 1.018 | 0.02759 |
| 9 | 2 | 0.594 | 0.000913 |
| 10 | 2 | 0.523 | 0.001881 |

TABLE 19-continued

[Example 19]

| SURFACE No. | GROUP No. | |hb/h| | |Δasph/L| |
|---|---|---|---|
| 16 | 3 | 0.062 | 0.004013 |
| 21 | 3 | 0.112 | 0.005985 |
| 27 | 3 | 0.211 | 0.000182 |

|L × ØO| = 26.006

TABLE 20

[Example 20]

| SURFACE No. | GROUP No. | |hb/h| | |Δasph/L| |
|---|---|---|---|
| 5 | 1 | $5.0e^{-4}$ | 2.51 |
| 10 | 2 | $1.8e^{-3}$ | 1.66 |
| 15 | 3 | $2.9e^{-4}$ | 0.73 |

|L × ØO| = 23.85

TABLE 21

[Example 21]

| SURFACE No. | GROUP No. | |hb/h| | |Δasph/L| |
|---|---|---|---|
| 2 | 1 | $8.2e^{-4}$ | 2.92 |
| 10 | 2 | $7.0e^{-4}$ | 0.91 |
| 11 | 2 | $6.4e^{-4}$ | 0.72 |

|L × ØO| = 31.67

TABLE 21

[Example 21]

| SURFACE No. | GROUP No. | |hb/h| | |Δasph/L| |
|---|---|---|---|
| 3 | 1 | $1.0e^{-3}$ | 2.63 |
| 8 | 2 | $1.9e^{-3}$ | 1.53 |
| 12 | 3 | $4.0e^{-5}$ | 0.67 |

|L × ØO| = 22.55

TABLE 23

[Example 23 ]

| SURFACE No. | GROUP No. | |Δasph/L| | |hb/h| |
|---|---|---|---|
| 3 | 1 | $8.2e^{-4}$ | 2.71 |
| 6 | 2 | $7.0e^{-4}$ | 1.13 |
| 8 | 2 | $6.4e^{-4}$ | 0.78 |
| 10 | 3 | $6.7e^{-4}$ | 0.46 |

|L × ØO| = 27.70

TABLE 24

[Example 24]

| SURFACE No. | GROUP No. | $|\Delta \text{asph}/L|$ | $|hb/h|$ |
|---|---|---|---|
| 1 | 1 | $3.2e^{-3}$ | 4.66 |
| 2 | 1 | $1.3e^{-3}$ | 3.35 |
| 5 | 2 | $1.4e^{-3}$ | 1.03 |
| 6 | 2 | $5.3e^{-4}$ | 0.90 |

$|L \times \varnothing O| = 30.58$

TABLE 25

[Example 25]

| SURFACE No. | GROUP No. | $|\Delta \text{asph}/L|$ | $|hb/h|$ |
|---|---|---|---|
| 2 | 1 | $1.5e^{-3}$ | 4.35 |
| 3 | 2 | $2.9e^{-4}$ | 2.94 |
| 7 | 3 | $5.4e^{-4}$ | 1.76 |
| 11 | 4 | $6.6e^{-4}$ | 0.59 |
| 17 | 6 | $8.4e^{-5}$ | 0.04 |
| 23 | 7 | $1.7e^{-3}$ | 0.10 |
| 32 | 7 | $4.1e^{-4}$ | 0.31 |

$|L \times \varnothing O| = 24.79$

TABLE 26

[Example 26]

| SURFACE No. | GROUP No. | $|\Delta \text{asph}/L|$ | $|hb/h|$ |
|---|---|---|---|
| 2 | 1 | $3.5e^{-3}$ | 4.33 |
| 3 | 2 | $2.4e^{-3}$ | 2.98 |
| 7 | 3 | $7.2e^{-4}$ | 1.38 |
| 11 | 4 | $1.8e^{-4}$ | 0.42 |
| 19 | 6 | $4.7e^{-4}$ | 0.03 |
| 25 | 7 | $1.8e^{-3}$ | 0.12 |
| 34 | 7 | $1.8e^{-4}$ | 0.45 |

$|L \times \varnothing O| = 24.58$

TABLE 27

[Example 27]

| SURFACE No. | GROUP No. | $|\Delta \text{asph}/L|$ | $|hb/h|$ |
|---|---|---|---|
| 2 | 1 | $5.2e^{-4}$ | 4.83 |
| 6 | 2 | $4.6e^{-4}$ | 2.35 |
| 8 | 2 | $1.8e^{-3}$ | 1.77 |
| 10 | 3 | $2.4e^{-3}$ | 1.10 |
| 17 | 4 | $1.2e^{-3}$ | 0.43 |
| 23 | 5 | $1.0e^{-3}$ | 0.22 |
| 31 | 7 | $7.1e^{-3}$ | 0.06 |
| 38 | 7 | $3.4e^{-4}$ | 0.30 |

$|L \times \varnothing O| = 36.28$

TABLE 28

[Example 28]

| SURFACE No. | GROUP No. | $|\Delta \text{asph}/L|$ | $|hb/h|$ |
|---|---|---|---|
| 3 | 1 | $6.5e^{-4}$ | 4.24 |
| 5 | 2 | $1.0e^{-3}$ | 2.51 |
| 6 | 2 | $1.1e^{-3}$ | 2.21 |
| 11 | 3 | $1.6e^{-3}$ | 1.13 |
| 22 | 5 | $1.6e^{-4}$ | 0.26 |
| 32 | 7 | $1.0e^{-3}$ | 0.11 |
| 33 | 7 | $4.7e^{-4}$ | 0.13 |
| 38 | 7 | $5.8e^{-4}$ | 0.28 |
| 39 | 7 | $1.4e^{-3}$ | 0.41 |

$|L \times \varnothing O| = 34.21$

Figure 89:
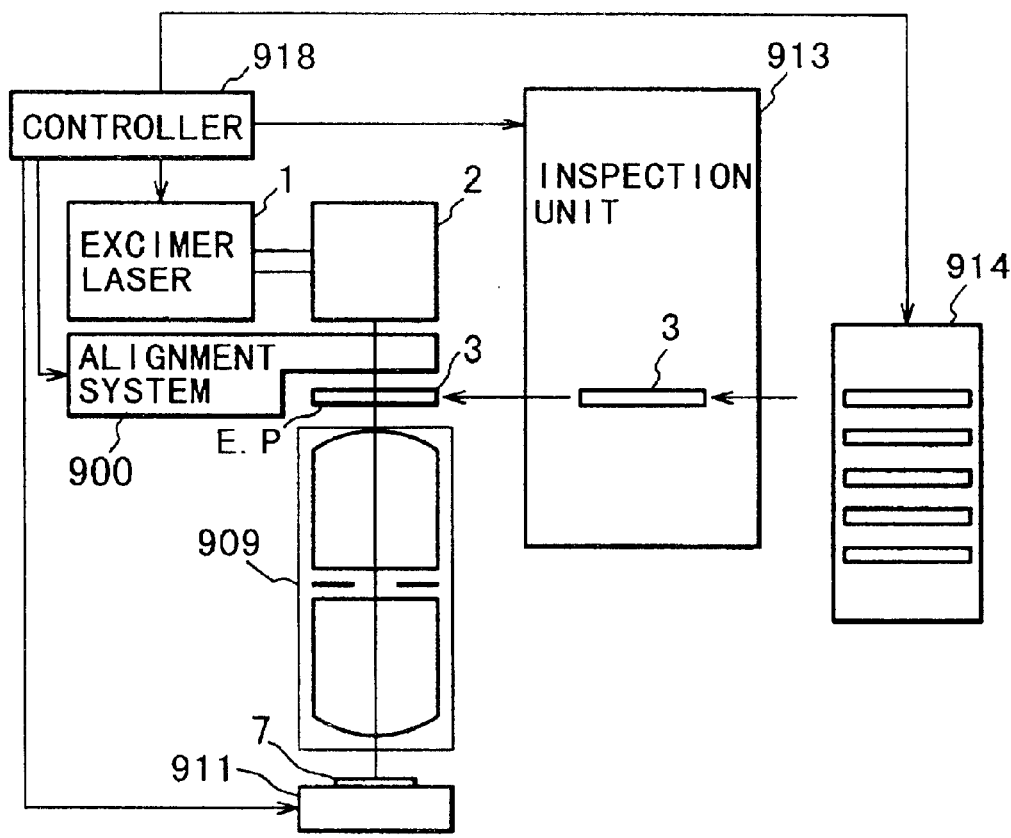
FIG. 89 is a block diagram of a main portion of a semiconductor device manufacturing system according to an embodiment of the present invention.

FIG. 89 is a schematic view of a main portion of a semiconductor device manufacturing system which uses a projection optical system according to the present invention. The manufacturing system of this embodiment is arranged to produce semiconductor devices, by printing a circuit pattern formed on a reticle or photomask (first object), on a wafer or photosensitive substrate (second object). Generally, the system includes a projection optical system, a mask accommodating unit, a mask inspection unit, and a controller, all of which are disposed in a clean room.

Denoted in FIG. 89 at 1 is an excimer laser as a light source, and denoted at 2 is an illumination optical system which is provided as a unit. A reticle or mask (first object) 3 is placed at an exposure position EP, and then the mask is illuminated from the above with a predetermined numerical aperture (NA). Denoted at 909 is a projection optical system according to Numerical Example 1 of FIG. 1, for example, and it it serves to project a circuit pattern of the reticle 3 onto a silicon substrate (wafer) 7 and to print the pattern thereon.

Denoted at 900 is an alignment system for aligning the reticle 3 and the wafer 7, prior to execution of the exposure process. The alignment system 900 includes at least one reticle observation microscope system. Denoted at 911 is a wafer stage. The elements described above are components of the projection exposure apparatus.

Denoted at 914 is a mask accommodating unit, for accommodating plural masks therein. Denoted at 913 is an inspection unit for inspecting presence/absence of any foreign particles on masks. This inspection unit 913 is used to perform particle inspection when a selected mask is moved out of the mask accommodating unit 914, and before it is fed to the exposure position EP.

The controller 918 serves to control the whole sequence of the system. Specifically, it controls the sequences for operations of the accommodating unit 914 and the inspection unit 913, as well as basic operations of the projection exposure apparatus, such as alignment operation, exposure operation and wafer stepwise motion, for example.

Next, an embodiment of a semiconductor device manufacturing method based on such a device manufacturing system described above, will be explained.

Figure 90:
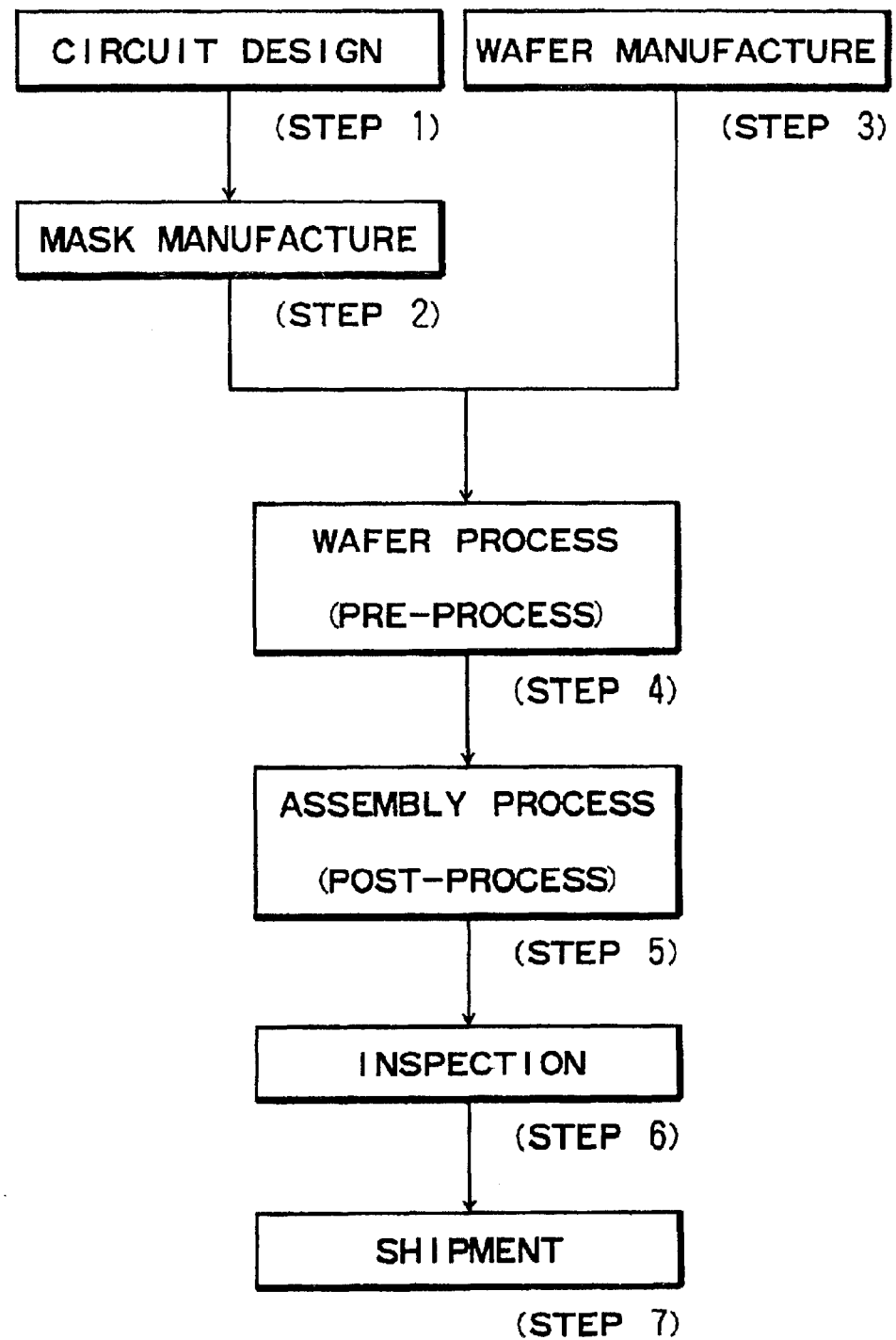
FIG. 90 is a flow chart of semiconductor device manufacturing processes.

FIG. 90 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 91:
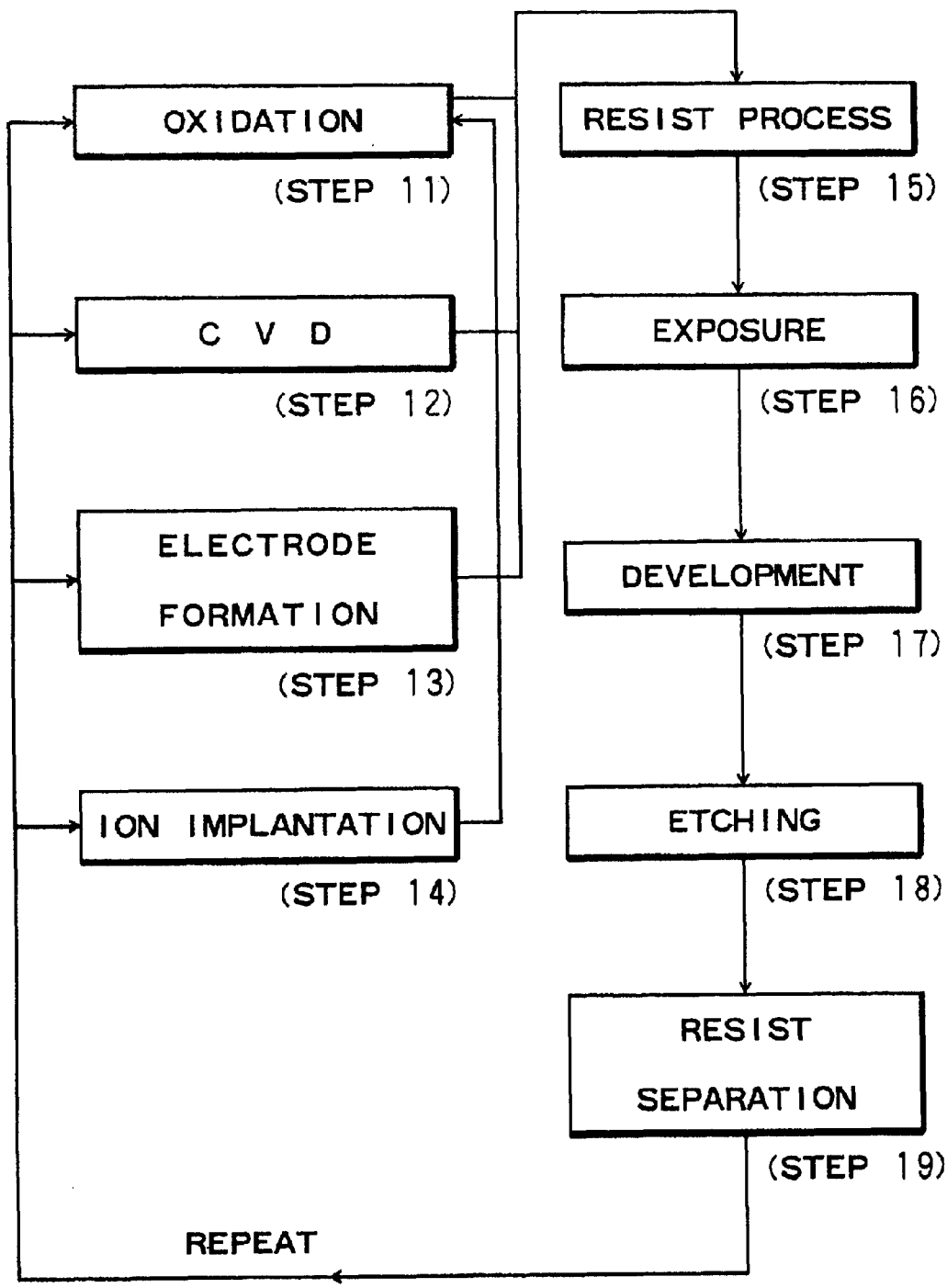
FIG. 91 is a flow chart for explaining details of a wafer process in the procedure of the flow chart of FIG. 90.

FIG. 91 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In the embodiment described above, the projection exposure apparatus is of the type that the whole circuit pattern of a reticle 3 is printed at once on a wafer. In place of it, the present invention is applicable to a projection exposure apparatus of scanning type wherein light from a laser light source is projected to a portion of a circuit pattern of a reticle through an illumination optical system and, while the reticle and a wafer are scanningly moved relative to the projection optical system and in a direction perpendicular to the optical axis direction of the projection optical system, the circuit pattern of the reticle is projected and printed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A projection optical system for projecting an image of an object onto an image plane, said projection optical system including, in order from an object side, a first lens group having a positive refractive power and a second lens group having a negative refractive power, said projection optical system comprising:

two aspherical surfaces being disposed at positions satisfying a relation $$15 > |h_b/h| > 0.35$$

where h is a height of an axial marginal light ray and $h_b$ is a height of a most abaxial chief ray, wherein a relation $$0.02 > |\Delta ASPH/L| > 1.0 \times 10^{-6}$$

is satisfied where $\Delta ASPH$ is an aspherical amount of each aspherical surface and L is a conjugate distance of said projection optical system, wherein said two aspherical surfaces include regions in which, from a central portion to a peripheral portion of the surface, their local curvature powers change with mutually opposite signs, wherein a relation $$70 > |L \times \phi_0| > 17$$

is satisfied where, in the case that said projection optical system has only one negative lens group, $\phi_0$ is the power of the negative lens group of said projection optical system, and in the case that said projection optical system has more than one negative lens group, $\phi_0$ is the total power of the negative lens group of said projection optical system, and wherein one of said two aspherical surfaces is provided in said first lens group and the other aspherical surface is provided in said second lens group, or both of said two aspherical surfaces are provided in said second lens group.

2. A projection optical system according to claim 1, wherein said two aspherical surfaces are provided on successive surfaces, which satisfy a relation $$15 > |h_b/h| > 0.35.$$

3. A projection optical system according to claim 1, wherein at least one of said two aspherical surfaces is provided in a negative lens group, and wherein said at least one aspherical surface includes a region in which, from a central portion to a peripheral portion of the surface, a local curvature power thereof gradually increases in a negative direction or gradually decreases in a positive direction.

4. A projection exposure apparatus comprising:

an illumination optical system for illuminating an object with light from a light source; and a projection optical system, as recited in claim 1, for projecting a light from the object onto an image plane.

5. A device manufacturing method comprising the steps of:

exposing a wafer, disposed on an image plane, by use of a projection exposure apparatus as recited in claim 4; and developing the exposed wafer.

6. A projection exposure apparatus according to claim 1, wherein there is only one negative lens group in said projection optical system.

7. A projection exposure apparatus according to claim 1, wherein the total number of negative lens groups in said projection optical system is two.

8. A projection exposure apparatus according to claim 1, wherein the total number of negative lens groups in said projection optical system is three.

9. A projection exposure apparatus according to claim 1, wherein said projection optical system has at least two negative lens groups.

10. A projection optical system for projecting an image of an object onto an image plane, said projection optical system including, in order from an object side, a first lens group having a positive refractive power and a second lens group having a negative refractive power, said projection optical system comprising:

a plurality of aspherical surfaces being disposed at predetermined positions, within said first and second lens groups, which satisfy a relation $$15 > |h_b/h| > 0.35$$

where h is a height of an axial marginal light ray and $h_b$ is a height of a most abaxial chief ray, wherein a relation $$0.02 > |\Delta ASPH/L| > 1.0 \times 10^{-6}$$

is satisfied where $\Delta ASPH$ is an aspherical amount of at least one aspherical surface of said plurality of aspherical surfaces, and L is a conjugate distance of said projection optical system, wherein said at least one aspherical surface includes a region in which, from a central portion to a peripheral portion of the surface, a local curvature power thereof gradually increases in a negative direction or gradually decreases in a positive direction, and wherein a relation $$70 > |L \times \phi_0| > 17$$

is satisfied where, in the case that said projection optical system has only one negative lens group, $\phi_0$ is the power of the negative lens group of said projection optical system, and in the case that said projection optical system has more than one negative lens group, $\phi_0$ is the total power of the negative lens groups of said projection optical system.

11. A projection optical system according to claim 10, wherein said plurality of aspherical surfaces are provided in said second lens group.

12. A projection optical system according to claim 10, wherein said positive lens group has at least one aspherical surface at a position satisfying a relation $$15 > |h_b/h| > 0.35,\ \text{and}$$

wherein said at least one aspherical surface includes a region in which, from a central portion to a peripheral portion of the surface, a local curvature power thereof gradually increases in a positive direction or gradually decreases in a negative direction.

13. A projection exposure apparatus comprising:

an illumination optical system for illuminating an object with light from a light source; and a projection optical system, as recited in claim 10, for projecting light from the object onto an image plane.

14. A device manufacturing method comprising the steps of:

exposing a wafer, disposed on an image plane, by use of a projection exposure apparatus as recited in claim 13; and developing the exposed wafer.

15. A projection exposure apparatus according to claim 10, wherein there is only one negative lens group in said projection optical system.

16. A projection exposure apparatus according to claim 10, wherein the total number of negative lens groups in said projection optical system is two.

17. A projection exposure apparatus according to claim 10, wherein the total number of negative lens groups in said projection optical system is three.

18. A projection exposure apparatus according to claim 10, wherein said projection optical system has at least two negative lens groups.

* * * * *

UNITED STATES PATENT AND TRADEMARK OFFICE
CERTIFICATE OF CORRECTION

PATENT NO.     : 6,867,922 B1
DATED          : March 15, 2005
INVENTOR(S)    : Chiaki Terasawa et al It is certified that error appears in the above-identified patent and that said Letters Patent is hereby corrected as shown below:

Column 1,
Line 16, "CCDs ," should read -- CCDs, --.
Line 30, "if" should read -- of --.
Line 35, "he" should read -- the --.

Column 5,
Line 41, "Φ¢27-30 mm," should read -- Φ27-30 mm, --.
Line 42, "(15)." should read -- (15). --.

Column 7,
Line 44, "$|h_b/h>0.35$" should read -- $|h_b/h|>0.35$ --.

Column 9,
Line 19, "$\Delta ASPH/L|<0.02$" should read -- $|\Delta ASPH/L|<0.02$ --.

Column 11,
Line 49, "where Φ" should read -- where $\Phi_{0i}$ --.

Column 12,
Line 8, "pattern" should read -- a pattern --.

Column 15,
Line 42, "numerical" should read -- Numerical --.
Line 55, "optical system for use in a" should be deleted.
Lines 56 and 66, "projection" should be deleted.
Line 65, "optical system for use in a" should be deleted.

Column 17,
Line 46, "sually" should read -- usually --.
Line 50, "satisfactority." should read -- satisfactorily. --.

Column 18,
Line 13, "lens" should read -- lines --.
Line 15, "bi-telectnric," should read -- bi-telecentric, --.
Line 21, "numeral" should read -- numerical --.
Line 35, "h and" should read -- h, and --.

UNITED STATES PATENT AND TRADEMARK OFFICE
CERTIFICATE OF CORRECTION

PATENT NO. : 6,867,922 B1
DATED : March 15, 2005
INVENTOR(S) : Chiaki Terasawa et al It is certified that error appears in the above-identified patent and that said Letters Patent is hereby corrected as shown below:

Column 19,
Line 50, the right margin should be closed up after "performance." and a new paragraph should begin with "For example, if the conjugate".
Line 59, "asperical" should read -- aspherical --.

Column 20,
Line 23, the right margin should be closed up.
Line 24, the left margin should be closed up.

Column 22,
Line 1, "filed," should read -- field, --.

Column 23,
Line 17, "step" should read -- stop --.
Line 45, "filed," should read -- field, --.
Line 47, "dual-telecentricy." should read -- dual-telecentricity. --.

Column 24,
Line 37, "telecentrity." should read -- telecentricity. --.
Line 46, "points" should read -- point --.
Line 61, "numeral" should read -- numerical --.

Column 25,
Line 44, "$\Delta ASPh$" should read -- $\Delta ASPH$ --.
Line 51, "$|\Delta ASPH/L|>10\times 10^{-5}$" should read -- $|\Delta ASPH/L|1.0\times 10^{-5}$ --.

Column 27,
Line 18, "from" should read -- form --.
Line 23, "filed" should read -- field --.

Column 28,
Line 31, "aberration" should read -- aberrations --.

Column 29,
Line 4, "of it," should read -- of the above, --.

Column 30,
Line 33, "become" should read -- becomes --.

UNITED STATES PATENT AND TRADEMARK OFFICE
CERTIFICATE OF CORRECTION

PATENT NO. : 6,867,922 B1
DATED : March 15, 2005
INVENTOR(S) : Chiaki Terasawa et al It is certified that error appears in the above-identified patent and that said Letters Patent is hereby corrected as shown below:

Column 32,
Line 29, "of it," should read -- of the above, --.

Column 33,
Line 30, "pad 405" should read -- pad 504 --.
Line 59, "direction" should read -- directions --.

Column 34,
Line 42, "magnification , β=1:4," should read -- magnification β=1:4, --.

Column 35,
Line 2, "surface" should read -- surfaces --.

Column 43,
Line 23, "second lens" should be deleted.
Line 24, the entire line should be deleted.
Line 25, "face lens) are placed in the" should be deleted.

Column 44,
Line 19, "direction" should read -- directions --.

Column 45,
Line 2, "193 inn," should read -- 193 nm, --.

Column 46,
Line 25, "surface." should read -- surfaces. --.

Column 48,
Line 58, "such at" should read -- such that --.

Column 49,
Line 62, "group," should read -- group G5, --.

Column 51,
Lines 2 and 10, "following the" should read -- the following --.

Column 52,
Line 17, "surface" should read -- surfaces --.
Line 29, "r12include" should read -- r12 include --.

UNITED STATES PATENT AND TRADEMARK OFFICE
CERTIFICATE OF CORRECTION

PATENT NO. : 6,867,922 B1
DATED : March 15, 2005
INVENTOR(S) : Chiaki Terasawa et al It is certified that error appears in the above-identified patent and that said Letters Patent is hereby corrected as shown below:

Column 54,
Line 50, "bioconcave" should read -- biconcave --.

Column 59,
Line 18, "with the with the" should read -- with the --.

Column 62,
Line 56, "plane-convex" should read as follows,
-- function of condition (C1).
    The third lens group L3 comprises, in an order
  from the object side, a positive lens of plane-convex --.

Column 64,
Line 62, "direction" should read -- direction, --.

Column 65,
Line 10, "lenses" should read -- lens --.
Line 30, "comma" should read -- coma --.

Column 66,
Line 1, "i-th lens lens" should read -- i-th lens --.

Column 67,
Line 26, "33    -1.181280e - 022    1.258543e - 026    0.000000e = 000" should
read -- 33    -1.181280e - 022    1.258843e - 0.26    0.000000e = 000 --.
Line 39, "ASP  2    241.459    89.729" should read
-- ASP  2    241.465    89.729 --.
Line 41, "4    -721.262    16.736" should read -- 4    -721.262    15.736 --.

Column 68,
Line 7, "2    0.000000    -8.89977    4.468913    -6.084916
-3.783704e - 022" should read
-- 2    0.000000    -8.899777    4.468913    -6/084916
-3.783704e - 022 --.
Line 13, "20    0.000000    1.7596618    1.555047    -4.699964
-5.339673e - 023" should read
-- 20    0.000000    1.759961    1.55047    -4.699964
-5.339673e - 023 --.
Line 23, "2    7.421051e -0 025    0.000000e = 000    0.000000e = 000" should
read -- 2    7.42105e - 025  0.000000e = 000    0.000000e = 000 --.

UNITED STATES PATENT AND TRADEMARK OFFICE
CERTIFICATE OF CORRECTION

PATENT NO.      : 6,867,922 B1
DATED           : March 15, 2005
INVENTOR(S)     : Chiaki Terasawa et al It is certified that error appears in the above-identified patent and that said Letters Patent is hereby corrected as shown below:

<u>Column 68 (cont'd),</u>
Line 30, "33    1.903936e - 0230.000000e = 000        0.000000 = 000" should read
-- 33    1.903938e - 0230.000000e = 000        0.000000e = 000 --.
Line 46, "5  632.276  36.661     1.56020" should read
-- 5  632.275  36.6661   1.56020 --.

<u>Column 69,</u>
Line 11, "2      0.000000 3.736230     1.03822       -3.965564
-5.505777e - 021" should read
-- 2     0.000000        3.736230       1.038222       -3.965564
-5.505777e - 021 --.
Line 20, "33     0.000000       6.8128365       5.847001       -1.362069
8.105142e - 020" should read
-- 33    0.000000       6.812835        5.847001       -1.362069
8.105142e - 020 --.
Line 64, "ASP   29      203.124        1.113    1.56020" should read
-- ASP   29      203.124        37.891          1.56020 --.

<u>Column 70,</u>
Line 11, "10     8.962335       3.597303       1251516        5.836732
1.516663e - 020" should read
-- 10    8.962335        3.597303       1.251516       5.836732
1.516663e - 020 --.
Line 24, "10    -2.368293e - 022    1.602413e - 026    -126581e - 029" should
read -- 10    -2.368293e - 022    1.602413e - 026    -1.126581e - 029 --.
Line 56, "ASP   17      -63212.427     38.888  1.56020" should read
-- ASP   17      -63212.427     38.988  1.56020 --.

<u>Column 71,</u>
Line 8, "8      0.000000        -996999         -7.964895       3.960131
2.894002e - 019" should read
-- 8     0.000000        4.996999        -7.964895       3.960131
2.894002e - 019 --.
Line 11, "10    0.000000        -9.122145       2.638660       1.484569
-1.164586e - 019" should read
-- 10    0.000000        -9.122145       2.638660       1.484569
3.164586e - 019 --.
Line 16, "21    0.000000        -2.460447       -8.025827       5.5851226
-6.974895e - 023" should read
-- 21    0.000000        -2.460447       -8.025827       5.851226
-6.974895e - 023 --.

UNITED STATES PATENT AND TRADEMARK OFFICE
CERTIFICATE OF CORRECTION

PATENT NO. : 6,867,922 B1
DATED : March 15, 2005
INVENTOR(S) : Chiaki Terasawa et al It is certified that error appears in the above-identified patent and that said Letters Patent is hereby corrected as shown below:

Column 71 (cont'd),
Line 18, "22    0.000000    4.392679    1.790428    -3.316430 -7.037122e - 019" should read
-- 22    0.000000    4.392679    1.790428    -3.316430 -7.037122e - 023 --.
Line 21, "28    0.000000    -3.758336    2.767725    2.230693e-018 -049151    2.230695e - 018" should read
-- 28    0.000000    -3.758336    2.767725    2.239683e-018  1.049151  2.230695e-018 --.
Line 52, "10    118.870    16.187" should read -- 10    118.870    16.687 --.
Line 58, "17    -281.698    15.983  1.50850" should read
-- 17    -281.598    15.983  1.50850 --.

Column 72,
Line 12, "39  851.165  26.541  1.50850" should read -- 39  861.165  26.541  1.50850 --.
Line 24, "ASP  53    85.289  58.176  1.50850" should read
-- ASP  53    85.289  58.676  1.50850 --.
Line 29, "13    1.374331    -1.584636    1.915550    -5.383453  2.253367e - 0.19" should read
-- 13    1.374337    -1.584636    1.915550    -5.383453  2.253367e - 019 --.
Line 53, "7    3055.587    27.236  1.50850" should read
-- 7    305.587    27.236  1.50850 --.
Line 58, "13    -149.765    11.000  1.50850" should read
-- 13    -149.755    11.000  1.50850 --.
Line 66, "23    215.803    31.871  1.50850" should read
-- 23    215.803    31.877  1.50850 --.

Column 73,
Line 39, "11    -8.052113e - 022    1.108873e - 025    0.000000e + 000" should read
-- 11    -8052133e - 022    1.108873e - 025    0.000000e+ 000 --.
Line 50, "i    ri    di    ni    Obj - distance = 64.486" should read
-- i    ri    di    ni    Obj - distance = 94.486 --.
Line 63, "15    -236.025    16.914  1.50850" should read
-- 15    -236.025    15.914  1.50850 --.
Line 64, "17    719.273    35.407  1.50850" should read
-- 17    779.273    35.407  1.50850 --.

UNITED STATES PATENT AND TRADEMARK OFFICE
CERTIFICATE OF CORRECTION

PATENT NO. : 6,867,922 B1
DATED : March 15, 2005
INVENTOR(S) : Chiaki Terasawa et al It is certified that error appears in the above-identified patent and that said Letters Patent is hereby corrected as shown below:

Column 74,
Line 30, "3   -467540   -8.951376   -2.285210   3.324945 2.628948e - 020" should read
-- 3   -1.467540   -8.951376   -2.285210   3.324945 2.628948e - 020 --.

Column 75,
Line 10, "15   226.018   41.814 1.56020" should read
-- 15   226.078   41.874 1.56020 --.

Column 76,
Line 4, "4   -1273.958   1.799" should read
-- ASP  4 -1273.958   1.799 --.
Line 5, "ASP" should be deleted.
Line 18, "ASP  21   15043.030   27.617 1.50140" should read
-- ASP  21   1504.030   27.617 1.50140 --.
Line 22, "ASP  26   -599.659   1.000" should read
-- ASP  26   -599.669   1.000 --.
Line 33, "4   0.000000   1.336794   -1.397714   3.7082893 6.224425e - 020" should read
-- 4   0.000000   1.336794   -1.397714   3.702893 6.224425e - 020 --.
Line 38, "13   -1.680764   -5.776339   -1.148440   -2.490235 -5.242050e - 022" should read
-- 13   -1.680764   -5.776339   -1.148440   -2.490235 5.242060e - 022 --.
Line 46, "22   -5.933867   1.096609   1.175524   5.758625 1.039016e - 022" should read
-- 22   -5.933867   1.096606   1.175524   5.758625 1.039016e - 022 --.
Line 61, "25   6.340859e - 028   -9453066e - 032   0.000000e + 000" should read
-- 25   6.340859e - 028   -9.453066e - 032   0.000000e + 000 --.

Column 77,
Line 5, "i   $r_i$   $d_i$   $a_i$   Obj-distance = 100.000" should read
-- i   $r_i$   $d_i$   $n_i$   Obj-distance = 100.000 --.

UNITED STATES PATENT AND TRADEMARK OFFICE
CERTIFICATE OF CORRECTION

PATENT NO. : 6,867,922 B1
DATED : March 15, 2005
INVENTOR(S) : Chiaki Terasawa et al It is certified that error appears in the above-identified patent and that said Letters Patent is hereby corrected as shown below:

Column 79,
Line 5, "i    ri    di    ai    Obj-distance = 100.00" should read
-- i    ri    di    ni    Obj-distance = 100.000 --.
Line 43, "8    0.000000+000    -2.925267e-008    -4.791237e-012
-1.125265e-016" should read -- 8    0.000000+000    -2.925267e-008
-4.791237e-012    -1.125265e-015 --.

Column 81,
Line 5, "i    ri    di    ai    Obj-distance: 110.304" should read
-- i    ri    di    ni    Obj-distance: 110.304 --.
Line 6, "1    566.117    17.071  1.56020" should read
-- 1    566.177    17.071  1.56020 --.
Line 13, "9    -464515    11.000  1.56020" should read
-- 9    -464.515    11.000  1.56020 --.
Line 19, "16    -184258    0.902" should read
-- 16    -184.258    0.902 --.
Line 33, "34    468.888    11.670" should read
-- 34    468.888    14.670 --.

Column 83,
Line 5, "i    ri    di    ai    Obj-distance = 90.862" should read
-- i    ri    di    ni    Obj-distance = 90.862 --.
Line 11, "7    -2878.732    11.000  1.55020" should read
-- 7    -2878.732    11.000  1.56020 --.
Line 26, "21    -253.401    11.000  1.56020" should read
-- 27    -253.401    11.000  1.56020 --.
Line 53, "13    3.589327e-022    -8.997418e-026    -3.648511e-030
0 000000e+000" should read
-- 13    3.589327e-022  8.997418e-026  -3.648511e-030    0.000000e+000 --.
Line 61, "i    ri    di    ai    Obj-distance = 64.400" should read
-- i    ri    di    ni    Obj-distance = 64.400 --.

Column 85,
Line 36, "8    0.000000e+000    1.330433e-008  3.996524e-012
-6.425340e-015" should read
-- 8    0.000000e+000  1.330433e-008  3.996524e-012  -6.425340e-016 --.
Line 38, "15    0.000000e+000    -8.288231e-008    4.470040e-012
7.953928e-016" should read
-- 15    0.000000+000  -8.288231e-008    4.470040e-012
9.953928e-016 - --.

UNITED STATES PATENT AND TRADEMARK OFFICE
CERTIFICATE OF CORRECTION

PATENT NO. : 6,867,922 B1  
DATED : March 15, 2005  
INVENTOR(S) : Chiaki Terasawa et al Page 9 of 10

It is certified that error appears in the above-identified patent and that said Letters Patent is hereby corrected as shown below:

Column 87,  
Line 8, "11      -383.725         11.000  1.56020" should read  
-- 17     -383.725         11.000  1.56020 --.  
Line 27, "2     0.000000e+000    1.984808e-0009    -2.379609e-012  -1.777691e-015" should read  
-- 2     0.000000e+000     1.984808e-009     -2.379609e-012  1.277691e-015 --.  
Line 28, "3     0.000000e+000       -6.127062e-005     -2.439639e-011  4.940348e-015" should read  
-- 3     0.000000e+000      -6.127062e-008     -2.439639e-011  4.940348e-015 --.  
Line 36, "2     2.269844e-019      2.746013e-023      6.870022e-028  0.000000e+000" should read  
-- 2     2.269844e-019      2.746013e-023      6.870822e-028  0.000000e+000 --.

Column 89,  
Line 30, "2     0.000000e+000      1.732651e-010      8.978816e-014  6.676870e-019" should read  
-- 2     0.000000e+000      1.732651e-010      8.978816e-014  6.675870e-019 --.  
Line 49, "3     -3359.229      37.768  1.56020" should read  
-- 3     -3359.229      32.768  1.56020 --.

Column 93,  
Line 5, "2     -6.146567e-021      3.857142e-025      1.130926e-128  -3.918967e-033" should read  
-- 2     -6.146567e-021      3.857142e-025      1.130926e-028  -3.918967e-033 --.  
Line 11, "27     -1.898429e-020      -9.051554e-026      1.144500e-028  -1.0468521-032" should read  
-- 27     -1.898429e-020     -9.051554e-0026     1.744600e-028  -1.046852e-032 --.

Column 95,  
Line 40, "29     -254.391     1.000" should read  
-- 29     -254.397     1.000 --.  
Line 55, "17     5.040159e-001  8.569390e-010  -2.159964e-014" should read  
-- 17     5.040159e-001  8.569390e-010  2.159964e-014 --.

UNITED STATES PATENT AND TRADEMARK OFFICE
CERTIFICATE OF CORRECTION

PATENT NO.      : 6,867,922 B1
DATED           : March 15, 2005
INVENTOR(S)     : Chiaki Terasawa et al It is certified that error appears in the above-identified patent and that said Letters Patent is hereby corrected as shown below:

Column 99,
Line 15, "15    -8.151887e     0.000000e+000" should read
-- 15    -8.157887e-017         0.000000e+000 --.
Line 65, "32    0.000000e+000          2.598513e-008  5.141410e-012" should read
-- 32    0.000000e+000          2.598613e-008         5.141410e-012 --.

Column 100,
Line 38, "13    1443.076      22.804  1.56020" should read
-- 13    1443.075         22.804  1.56020 --.

Column 102,
Line 8, "2     9.176226e-017        -2.861419e-020         8.104470e-024" should
read -- 2             9.175226e-017        -2.861419e-020         8.104470e-024 --.
Line 12, "23    1.798095e-018         4.781755e-022         -1.877652e-026" should
read -- 23    1.798095e-018         4.781755e-022         -1.877552e-026 --.

Column 107,
Line 64, "8     2     1.018   0.02759" should read
-- 8     2     1.018   0.002759 --.

Column 109,
Line 63, "31    7     7.1e$^{-3}$   0.06" should read -- 31  7      7.1e$^{-5}$   0.06 --.

Column 110,
Line 36, "it it" should read -- it --.

Signed and Sealed this

Twenty-fourth Day of January, 2006

JON W. DUDAS
*Director of the United States Patent and Trademark Office*

UNITED STATES PATENT AND TRADEMARK OFFICE
CERTIFICATE OF CORRECTION

PATENT NO. : 6,867,922 B1
DATED : March 15, 2005
INVENTOR(S) : Chiaki Terasawa et al.

It is certified that error appears in the above-identified patent and that said Letters Patent is hereby corrected as shown below:

<u>Column 112,</u>
Line 14, "group" should read -- groups --.
Lines 45, 48, 51 and 54, "claim 1," should read -- claim 4, --.

<u>Column 114,</u>
Lines 21, 24, 27 and 30, "claim 10," should read -- claim 13, --.

Signed and Sealed this

Twenty-fifth Day of April, 2006

JON W. DUDAS
*Director of the United States Patent and Trademark Office*